(12) United States Patent
Huynh

(10) Patent No.: US 11,973,512 B2
(45) Date of Patent: *Apr. 30, 2024

(54) BATTERYLESS WIRELESS SENSOR SYSTEM

(71) Applicant: SIGMASENSE, LLC., Wilmington, DE (US)

(72) Inventor: Phuong Huynh, Fairfax, VA (US)

(73) Assignee: SIGMASENSE, LLC., Austin, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 18/116,486

(22) Filed: Mar. 2, 2023

(65) Prior Publication Data

US 2023/0238979 A1    Jul. 27, 2023

Related U.S. Application Data

(63) Continuation of application No. 17/828,130, filed on May 31, 2022, now Pat. No. 11,632,123, which is a (Continued)

(51) Int. Cl.
*H02J 50/20* (2016.01)
*H02J 50/00* (2016.01)
(Continued)

(52) U.S. Cl.
CPC ............. *H03M 1/46* (2013.01); *H02J 50/001* (2020.01); *H02J 50/20* (2016.02); *H04B 5/0037* (2013.01); *H04B 5/02* (2013.01)

(58) Field of Classification Search
CPC .......... H02J 50/001; H02J 50/20; H03M 1/46; H04B 5/00; H04B 5/0025; H04B 5/0031; H04B 5/0037; H04B 5/0043; H04B 5/02
(Continued)

(56) References Cited

U.S. PATENT DOCUMENTS

| 5,437,178 A | 8/1995 | Esin et al. |
| 6,218,972 B1 | 4/2001 | Groshong |

(Continued)

FOREIGN PATENT DOCUMENTS

| CN | 104536627 A | 4/2015 |
| CN | 107771273 A | 3/2018 |

(Continued)

OTHER PUBLICATIONS

Baker; How delta-sigma ADCs work, Part 1; Analog Applications Journal; Oct. 1, 2011; 6 pgs.

(Continued)

*Primary Examiner* — William Hernandez
(74) *Attorney, Agent, or Firm* — Garlick & Markison; Timothy W. Markison; Shayne X. Short

(57) ABSTRACT

A batteryless wireless sensor system includes a data acquisition system, a radio frequency (RF) transceiver, and a batteryless wireless sensor device. The RF transceiver is in communication with the data acquisition system, transmits a RF signal, and receives sensor data and provide the sensor data to the data acquisition system. The batteryless wireless sensor device includes a RF transmitter, an analog to digital converter (ADC), and a sensor. The batteryless wireless sensor harvests energy from the RF signal and generates a DC signal based on the energy harvested from the RF signal, powers up and operates the ADC and the sensor based on the DC signal, and generates sensor data. The batteryless wireless sensor then transmits the sensor data via the RF transmitter to the RF transceiver. In certain examples, the ADC is implemented as a current mode ADC.

20 Claims, 64 Drawing Sheets

Related U.S. Application Data continuation of application No. 17/249,280, filed on Feb. 25, 2021, now Pat. No. 11,374,587.

(51) Int. Cl.
    *H03M 1/46*     (2006.01)
    *H04B 5/00*     (2006.01)
    *H04B 5/02*     (2006.01)

(58) Field of Classification Search
    USPC .......................................................... 455/41.1
    See application file for complete search history.

(56) References Cited

U.S. PATENT DOCUMENTS

| | | |
|---|---|---|
| 6,665,013 B1 | 12/2003 | Fossum et al. |
| 7,301,350 B2 | 11/2007 | Hargreaves |
| 7,476,233 B1 | 1/2009 | Wiener et al. |
| 7,528,755 B2 | 5/2009 | Hammerschmidt |
| 8,031,094 B2 | 10/2011 | Hotelling |
| 8,089,289 B1 | 1/2012 | Kremin et al. |
| 8,279,180 B2 | 10/2012 | Hotelling et al. |
| 8,547,114 B2 | 10/2013 | Kremin |
| 8,625,726 B2 | 1/2014 | Kuan |
| 9,081,437 B2 | 7/2015 | Oda |
| 9,201,547 B2 | 12/2015 | Elias |
| 2003/0052657 A1 | 3/2003 | Koernle et al. |
| 2004/0078662 A1* | 4/2004 | Hamel ................... H02N 2/186 714/22 |
| 2005/0235758 A1 | 10/2005 | Kowal et al. |
| 2011/0018686 A1* | 1/2011 | Fahley ................... H02J 50/20 340/10.1 |
| 2011/0063154 A1 | 3/2011 | Hotelling et al. |
| 2011/0298745 A1 | 12/2011 | Souchkov |
| 2012/0319878 A1 | 12/2012 | Bogner et al. |
| 2013/0278377 A1* | 10/2013 | Slupsky ................... G05B 1/01 340/5.1 |
| 2013/0278447 A1 | 10/2013 | Kremin |
| 2014/0085985 A1 | 3/2014 | Pan et al. |
| 2014/0170967 A1* | 6/2014 | Chateau ............... H04B 5/0037 455/41.1 |
| 2016/0013804 A1 | 1/2016 | Peluso |
| 2016/0188049 A1 | 6/2016 | Yang et al. |
| 2018/0034279 A1 | 2/2018 | Frenila et al. |
| 2018/0139698 A1* | 5/2018 | Quinlan ................... H04Q 9/00 |
| 2018/0157354 A1 | 6/2018 | Blondin et al. |
| 2018/0275824 A1 | 9/2018 | Li |
| 2019/0296755 A1 | 9/2019 | Mirhaj et al. |

FOREIGN PATENT DOCUMENTS

| | | |
|---|---|---|
| EP | 2284637 A1 | 2/2011 |
| KR | 101149248 B1 | 5/2012 |
| KR | 101505888 B1 | 3/2015 |
| KR | 20180058204 A | 5/2018 |
| KR | 1020190025157 A | 3/2019 |
| KR | 1020190080728 A | 7/2019 |

OTHER PUBLICATIONS

Brian Pisani, Digital Filter Types in Delta-Sigma ADCs, Application Report SBAA230, May 2017, pp. 1-8, Texas Instruments Incorporated, Dallas, Texas.

International Searching Authority; International Search Report and Written Opinion; International Application No. PCT/US2022/017483; dated Jun. 2, 2022; 10 pgs.

International Searching Authority; International Search Report; International Application No. PCT/US2020/058790; dated Feb. 22, 2021; 7 pgs.

European Patent Office; Extended European Search Report; Application No. 19853507.2; dated Jun. 13, 2023; 7 pgs.

* cited by examiner communication system 100 computing device 12

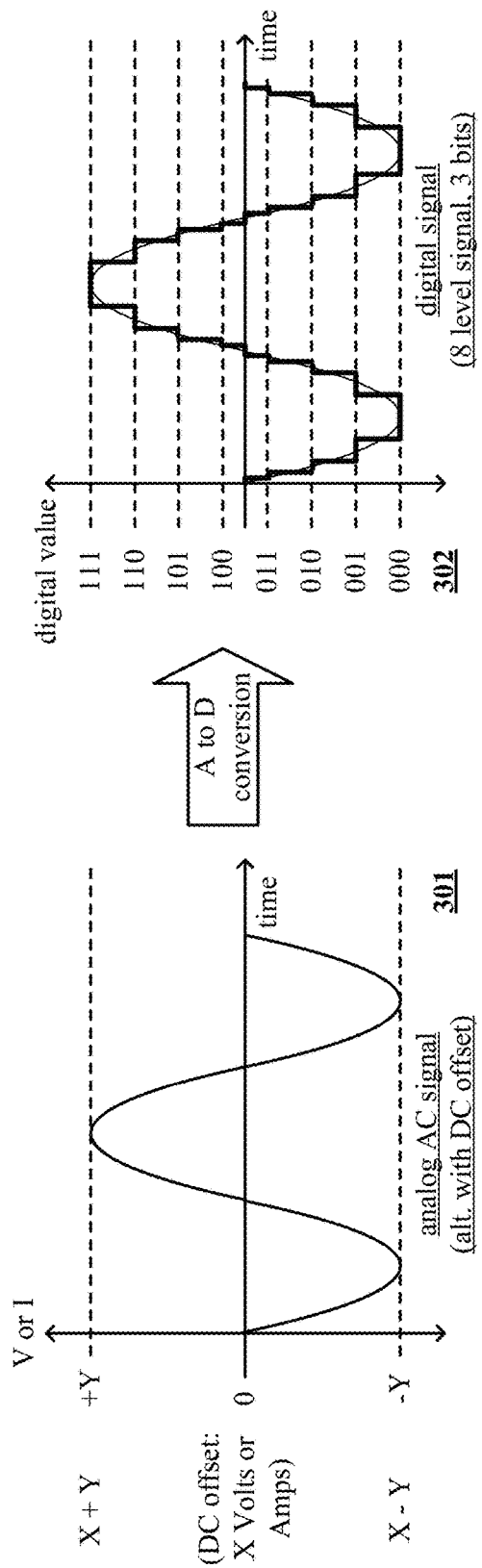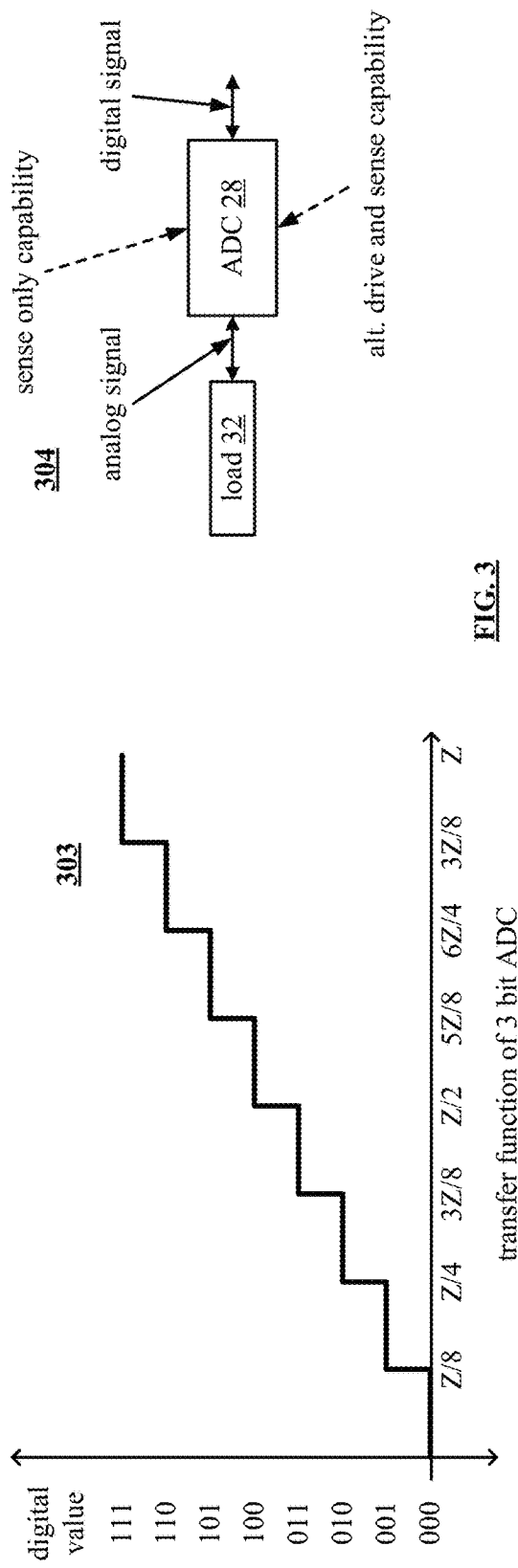
FIG. 3

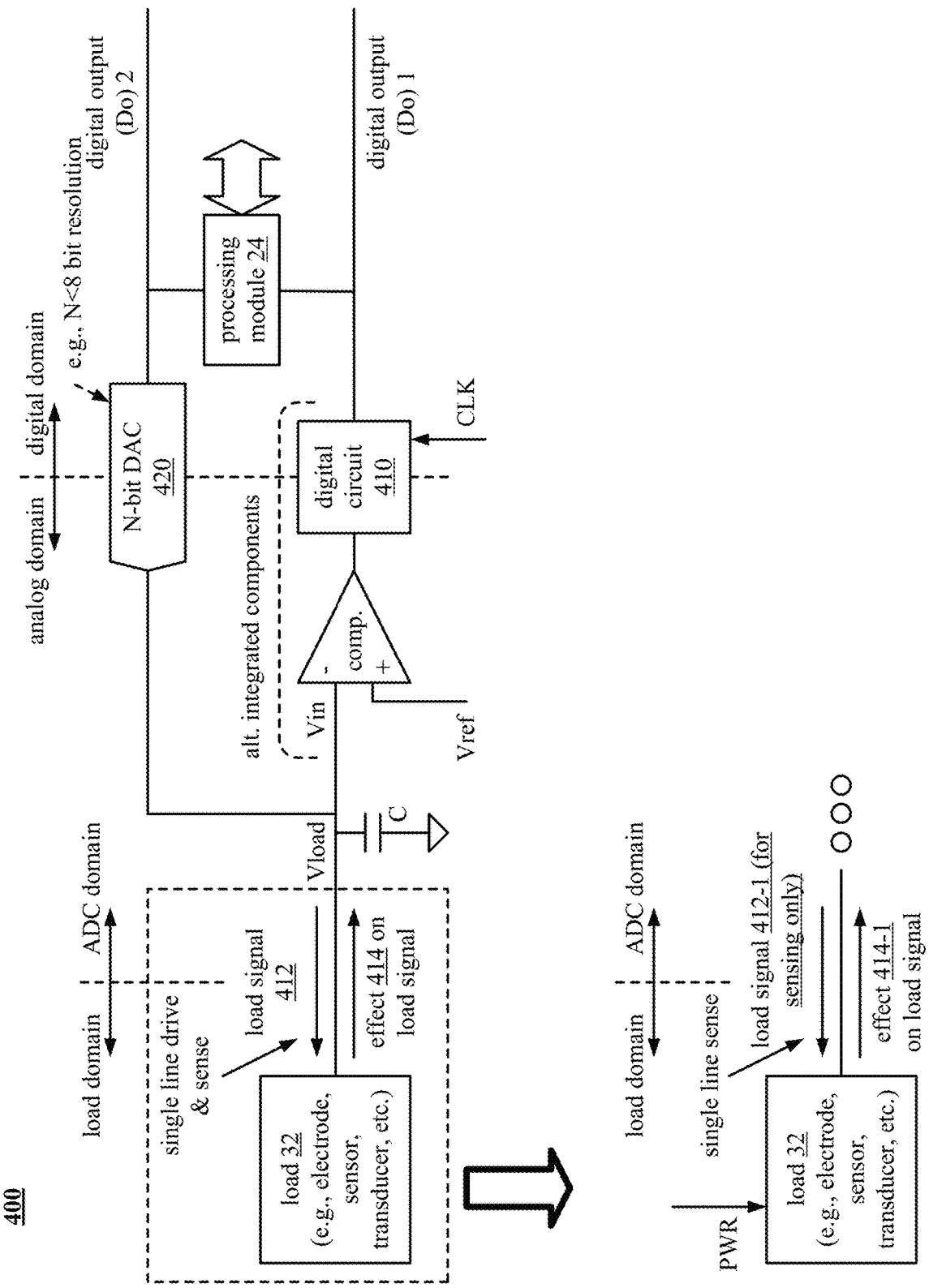

600

800

900

1000

1100

1200

1300

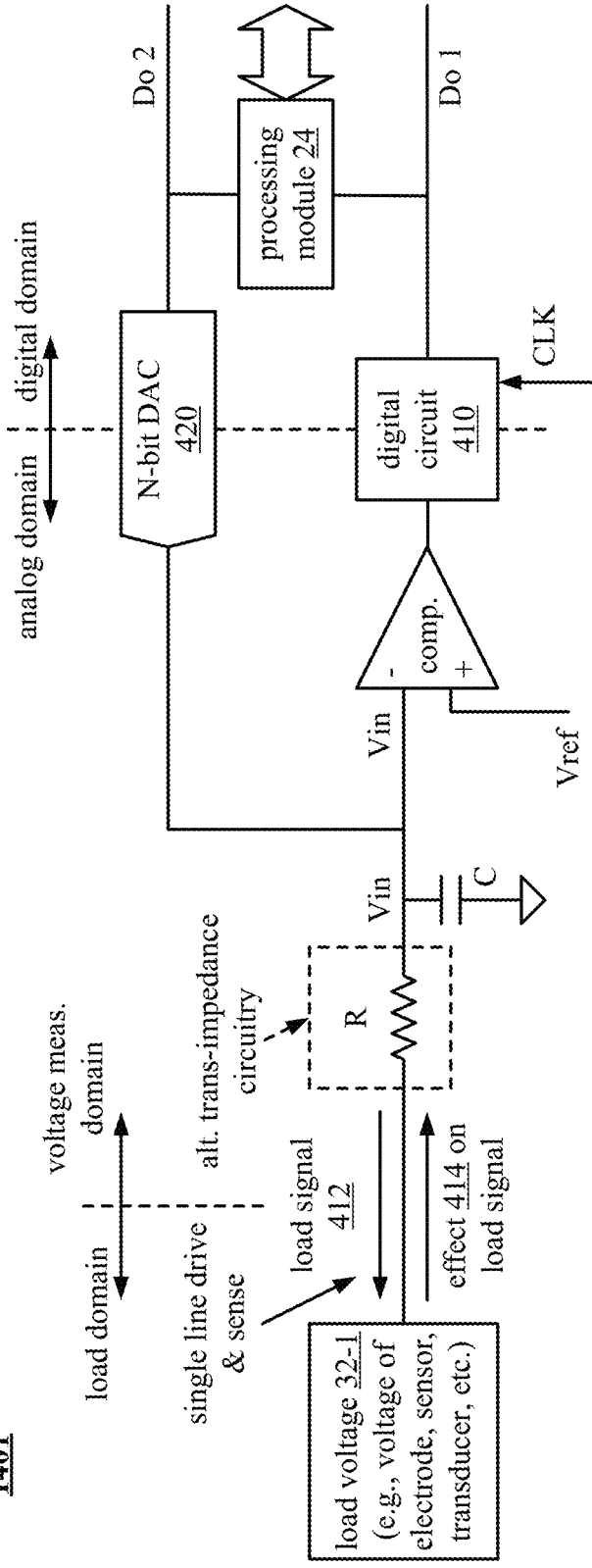
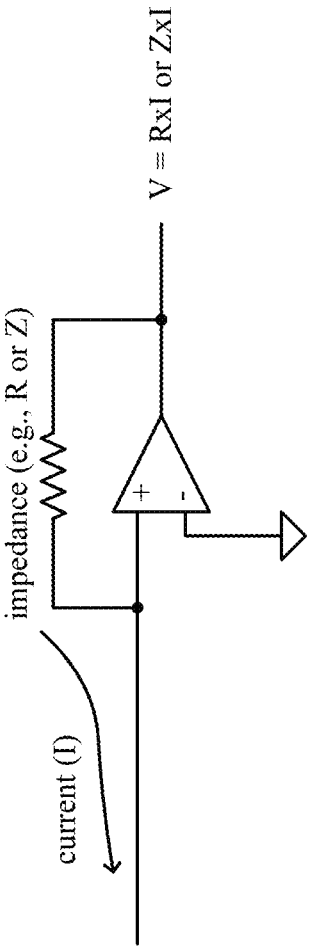
FIG. 14A
1401
FIG. 14B
1402

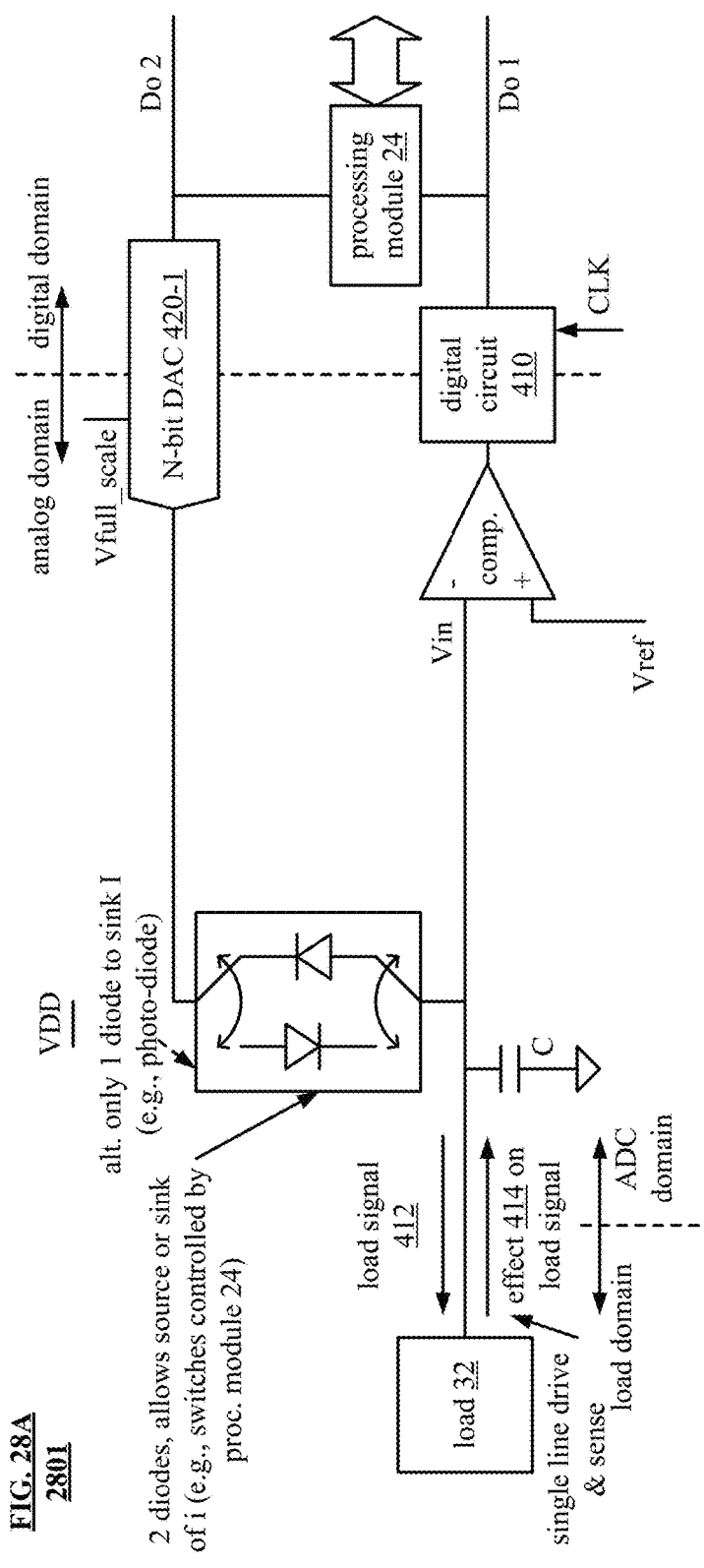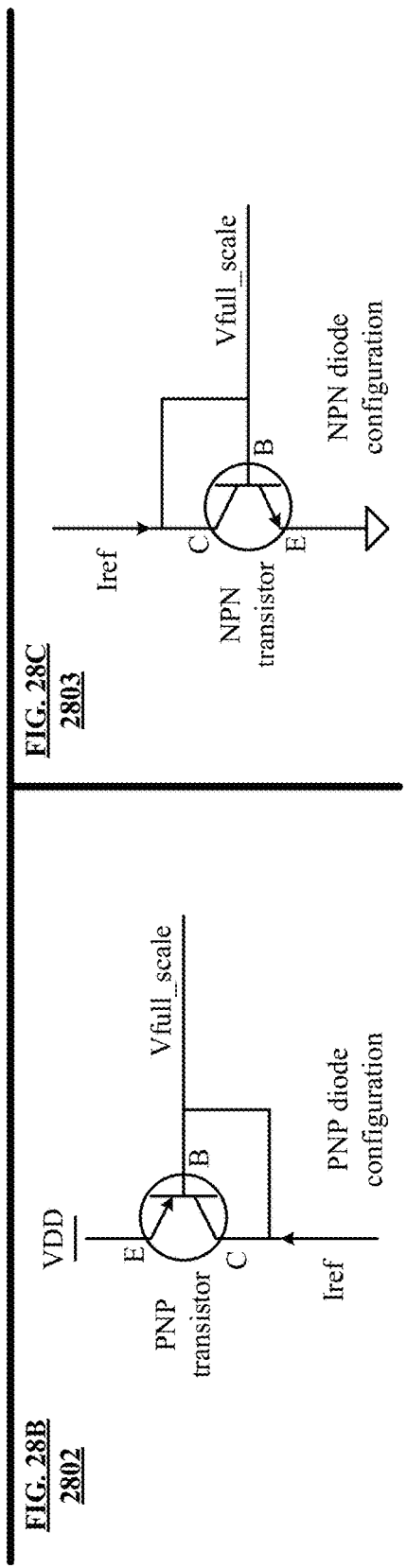

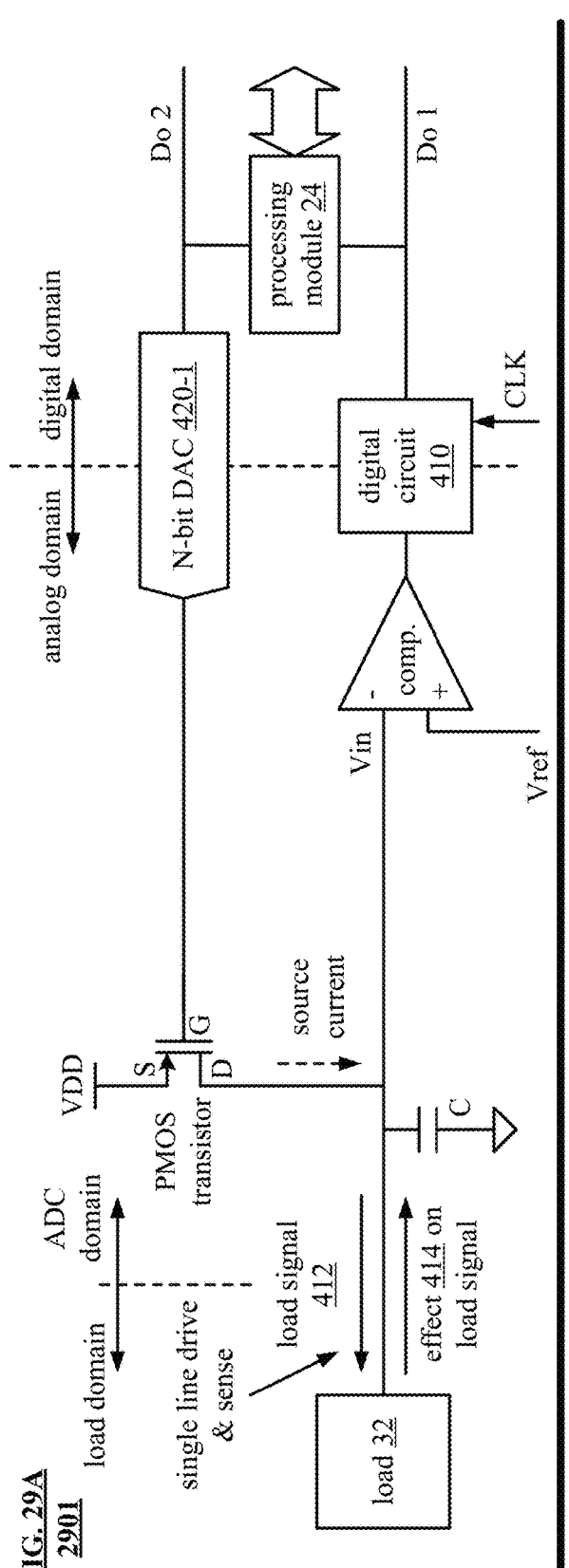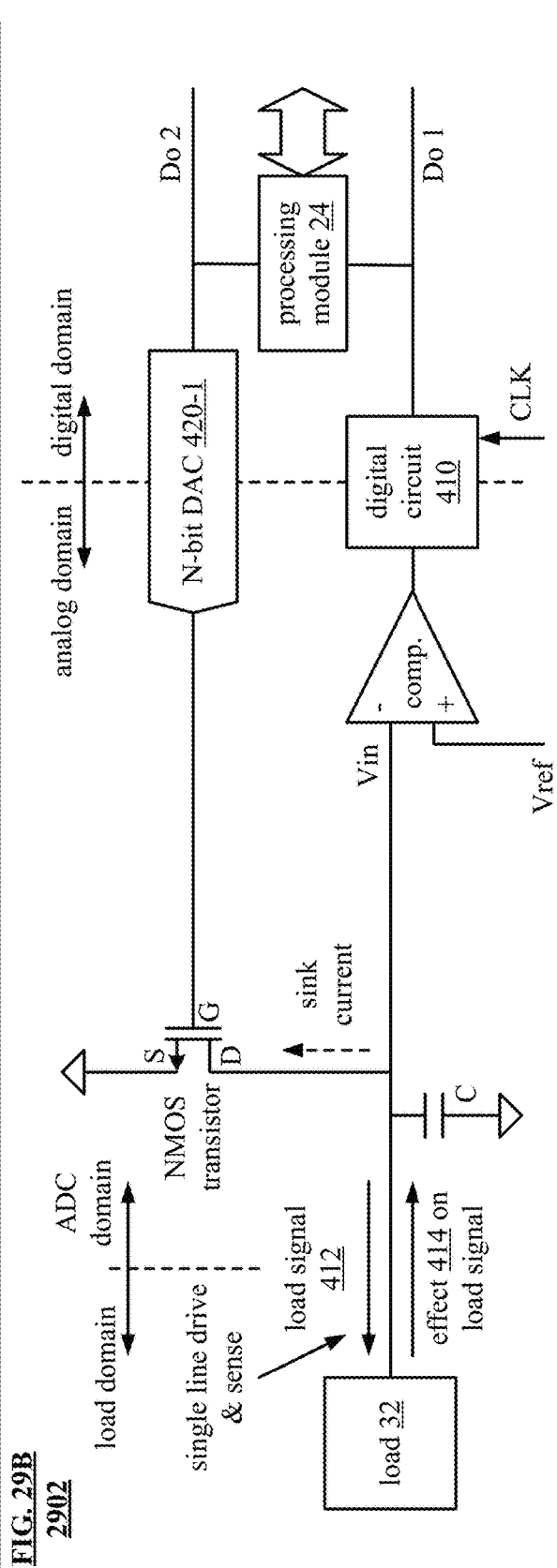

3000

3100

3200

3300

3400

3502

3503

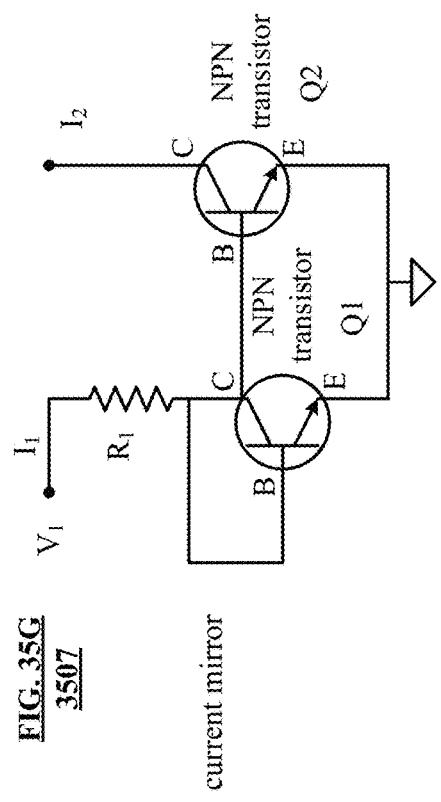
FIG. 35G
3507
current mirror
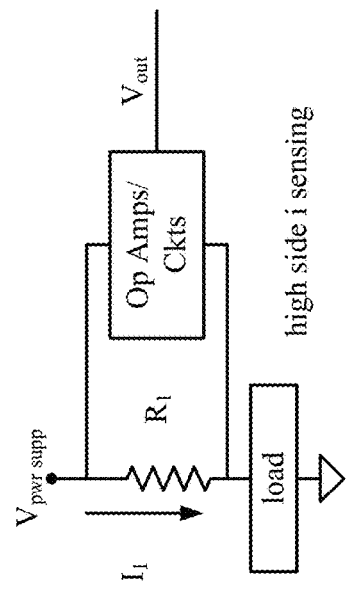
FIG. 35H
3508
high side i sensing
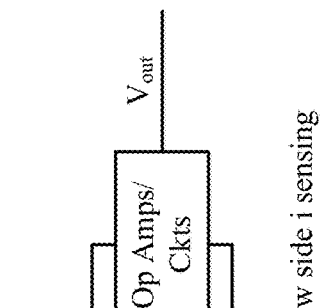
low side i sensing
FIG. 35I
3509
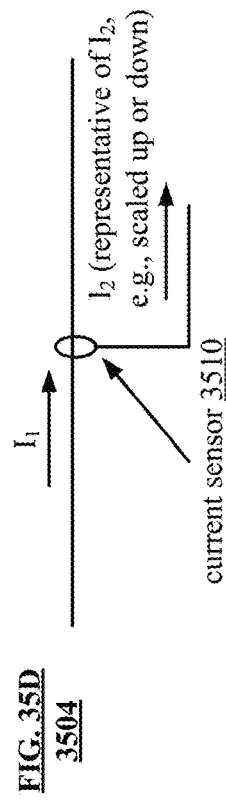
FIG. 35D
3504
FIG. 35E
3505
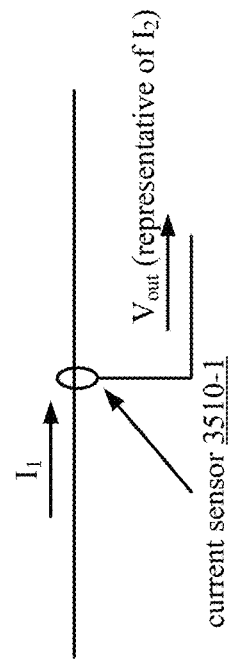
FIG. 35F
3506
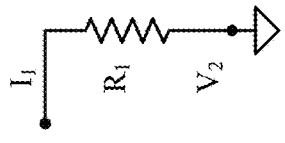

3521

MOSFET current splitter (PMOSs)

3522 bipolar current splitter (PNP BJTs)

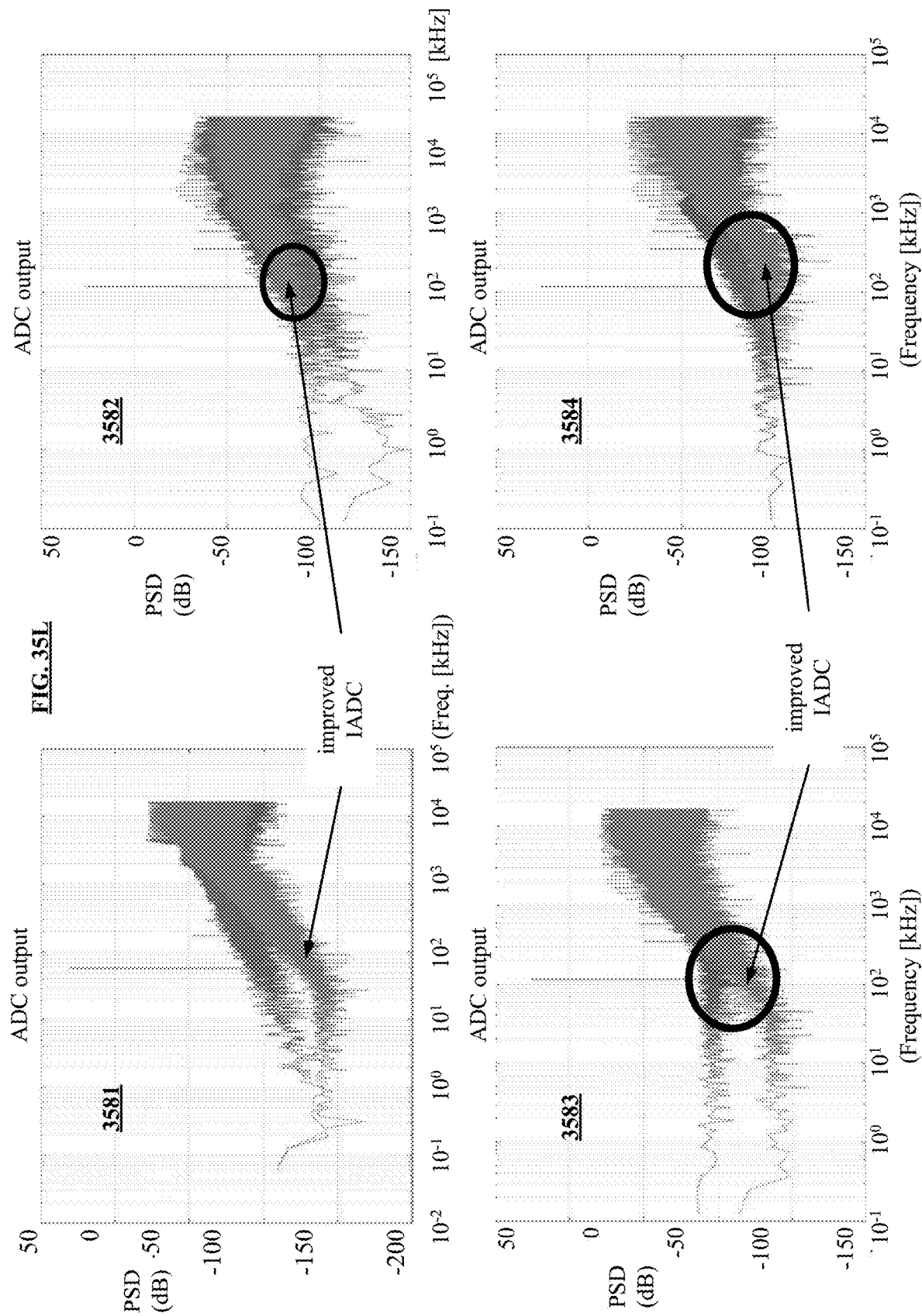

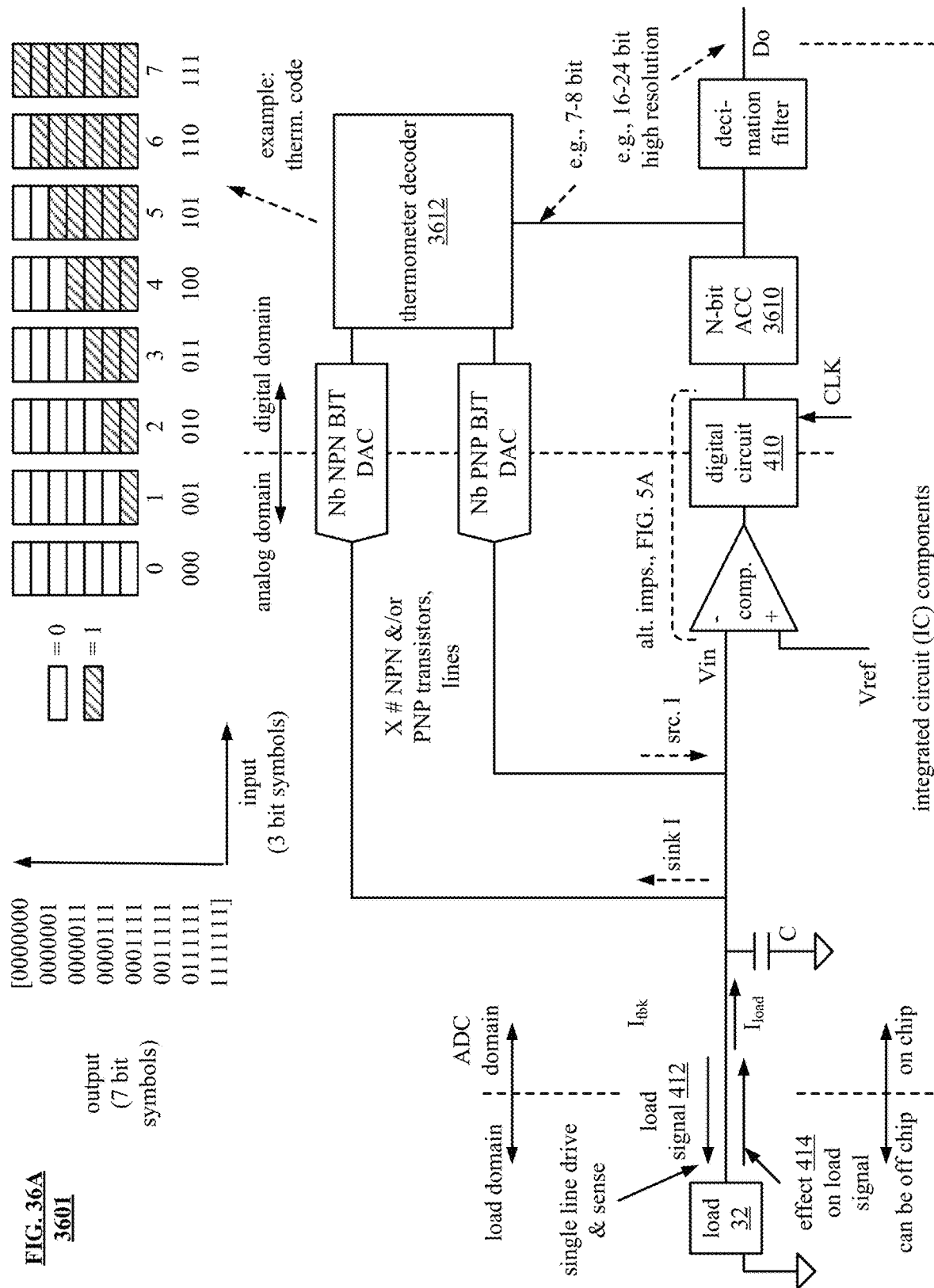

3602

3603

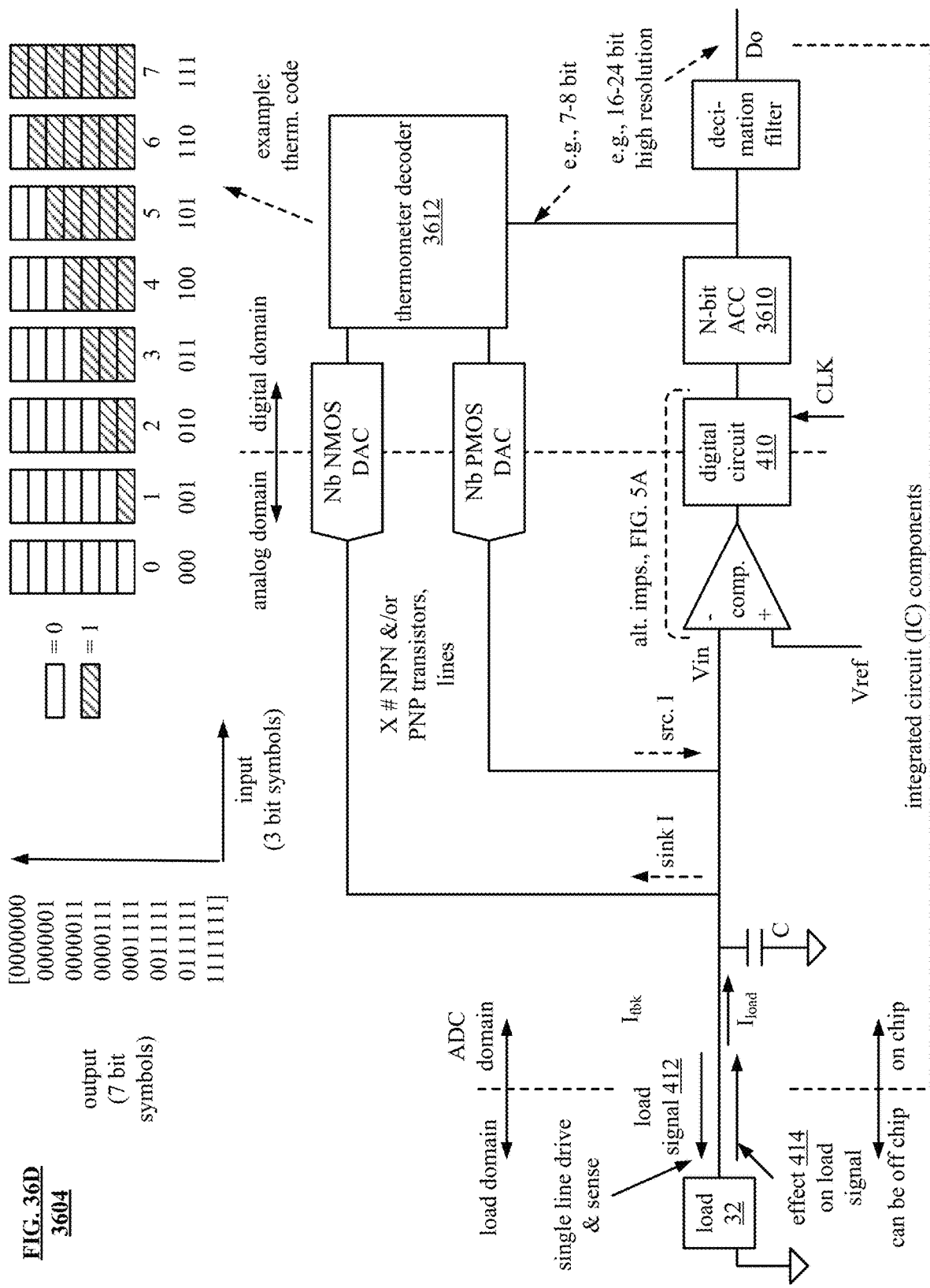

3606

3605

3607

3701

3702

3705

3707

3706

3800

3901

3902

3903

3904

3905

3906

3907

3908

3909

4000

4100

4200

BATTERYLESS WIRELESS SENSOR SYSTEM

CROSS REFERENCE TO RELATED PATENTS/PATENT APPLICATIONS

The present U.S. Utility Patent application claims priority pursuant to 35 U.S.C. § 120 as a continuation of U.S. Utility application Ser. No. 17/828,130, entitled "Batteryless Wireless Sensor System," filed May 31, 2022, pending, which is a continuation of U.S. Utility application Ser. No. 17/249,280, entitled "Batteryless Wireless Sensor System," filed Feb. 25, 2021, now issued as U.S. Pat. No. 11,374,587 on Jun. 28, 2022, all of which are hereby incorporated herein by reference in their entirety and made part of the present U.S. Utility Patent Application for all purposes.

BACKGROUND OF THE INVENTION

Technical Field of the Invention

This invention relates generally to analog to data communication systems and more particularly to sensed data collection and/or communication.

Description of Related Art

Within many electrical and electronic systems, conversion of signals between the analog domain and the digital domain, and vice versa, is performed. For example, sensors may be implemented to detect one or more conditions such as environmental conditions, operating conditions, device conditions, etc. Sensors are used in a wide variety of applications ranging from in-home automation, to industrial systems, to health care, to transportation, and so on. For example, sensors are placed in bodies, automobiles, airplanes, boats, ships, trucks, motorcycles, cell phones, televisions, touch-screens, industrial plants, appliances, motors, checkout counters, etc. for the variety of applications.

In general, a sensor converts a physical quantity into an electrical or optical signal. For example, a sensor converts a physical phenomenon, such as a biological condition, a chemical condition, an electric condition, an electromagnetic condition, a temperature, a magnetic condition, mechanical motion (position, velocity, acceleration, force, pressure), an optical condition, and/or a radioactivity condition, into an electrical signal.

A sensor includes a transducer, which functions to convert one form of energy (e.g., force) into another form of energy (e.g., electrical signal). There are a variety of transducers to support the various applications of sensors. For example, a transducer is capacitor, a piezoelectric transducer, a piezoresistive transducer, a thermal transducer, a thermal-couple, a photoconductive transducer such as a photoresistor, a photodiode, and/or phototransistor.

A sensor circuit is coupled to a sensor to provide the sensor with power and to receive the signal representing the physical phenomenon from the sensor. The sensor circuit includes at least three electrical connections to the sensor: one for a power supply; another for a common voltage reference (e.g., ground); and a third for receiving the signal representing the physical phenomenon. The signal representing the physical phenomenon will vary from the power supply voltage to ground as the physical phenomenon changes from one extreme to another (for the range of sensing the physical phenomenon).

The sensor circuits provide the received sensor signals to one or more computing devices for processing. A computing device is known to communicate data, process data, and/or store data. The computing device may be a cellular phone, a laptop, a tablet, a personal computer (PC), a work station, a video game device, a server, and/or a data center that support millions of web searches, stock trades, or on-line purchases every hour.

The computing device processes the sensor signals for a variety of applications. For example, the computing device processes sensor signals to determine temperatures of a variety of items in a refrigerated truck during transit. As another example, the computing device processes the sensor signals to determine a touch on a touchscreen. As yet another example, the computing device processes the sensor signals to determine various data points in a production line of a product.

In addition, within the operation of many devices and systems, conversion between the analog domain and the digital domain, and vice versa, is performed in accordance with the operation of such devices and systems. For example, many devices and systems operate using one or more digital signal processors (DSPs), microcontrollers, processors, etc. that operate within the digital domain. However, within certain devices and systems, one or more signals are received being in analog or continuous-time format. In order to utilize such one or more signals, they must be converted to being in digital or discrete-time format. Prior art analog to digital converters (ADCs) have many deficiencies including being highly consumptive of power, providing relatively low resolution, etc. There continues to be many applications that may not be appropriately service and provide high levels of performance using prior art ADCs. For example, certain applications do not have adequate power budget to facilitate effective operation of prior art ADCs. Also, certain applications cannot operate with high levels of performance based on the level of resolution and accuracy provided by prior art ADCs.

BRIEF DESCRIPTION OF THE SEVERAL VIEWS OF THE DRAWING(S)

FIG. 3 is a schematic block diagram showing various embodiments of analog to digital conversion as may be performed in accordance with the present disclosure;

FIG. 4 is a schematic block diagram of an embodiment of an analog to digital converter (ADC) in accordance with the present disclosure;

FIG. 14A is a schematic block diagram of an embodiment an ADC that is operative to perform voltage measurement in accordance with the present disclosure;

FIG. 14B is a schematic block diagram of an embodiment an transimpedance amplifier that may be implemented within an ADC that is operative to perform voltage measurement in accordance with the present disclosure;

FIG. 16 is a schematic block diagram showing an embodiment of digital domain filtering using cascaded filters within an ADC in accordance with the present disclosure;

FIG. 28A is a schematic block diagram of an embodiment an ADC that includes diodes implemented to source and/or sink current in accordance with the present disclosure;

FIG. 28B is a schematic block diagram of an embodiment a PNP transistor diode configuration operative to generate a full scale voltage signal in accordance with the present disclosure;

FIG. 28C is a schematic block diagram of an embodiment an NPN transistor diode configuration operative to generate a full scale voltage signal in accordance with the present disclosure;

FIG. 29A is a schematic block diagram of an embodiment an ADC that includes a P-channel or P-type metal-oxide-semiconductor field-effect transistor (MOSFET) (alternatively, PMOS transistor) implemented to source current in accordance with the present disclosure;

FIG. 29B is a schematic block diagram of an embodiment an ADC that includes an N-channel or N-type metal-oxide-semiconductor field-effect transistor (MOSFET) (alternatively, NMOS transistor) implemented to sink current in accordance with the present disclosure;

Figure 35A:
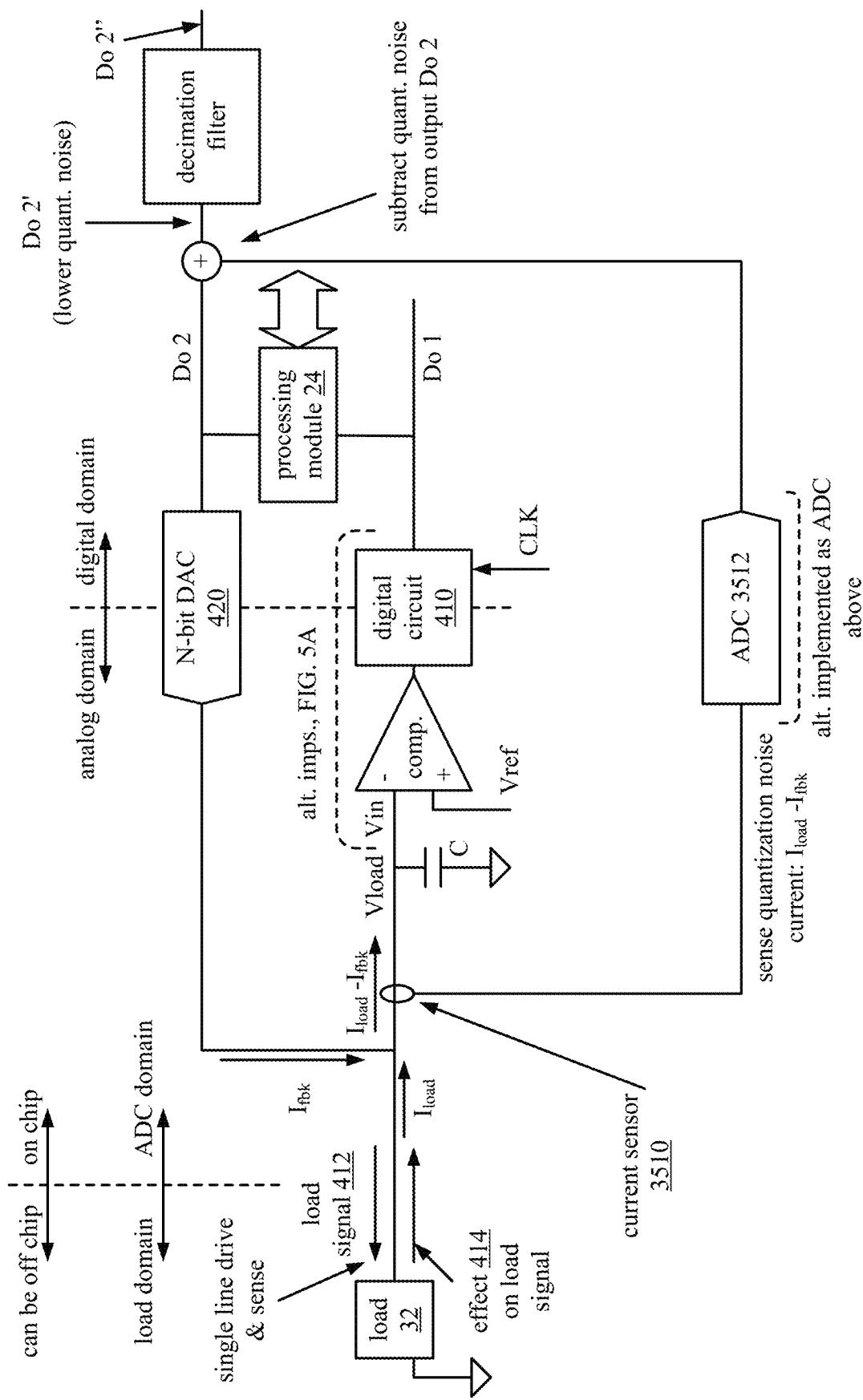
Figure 35B:
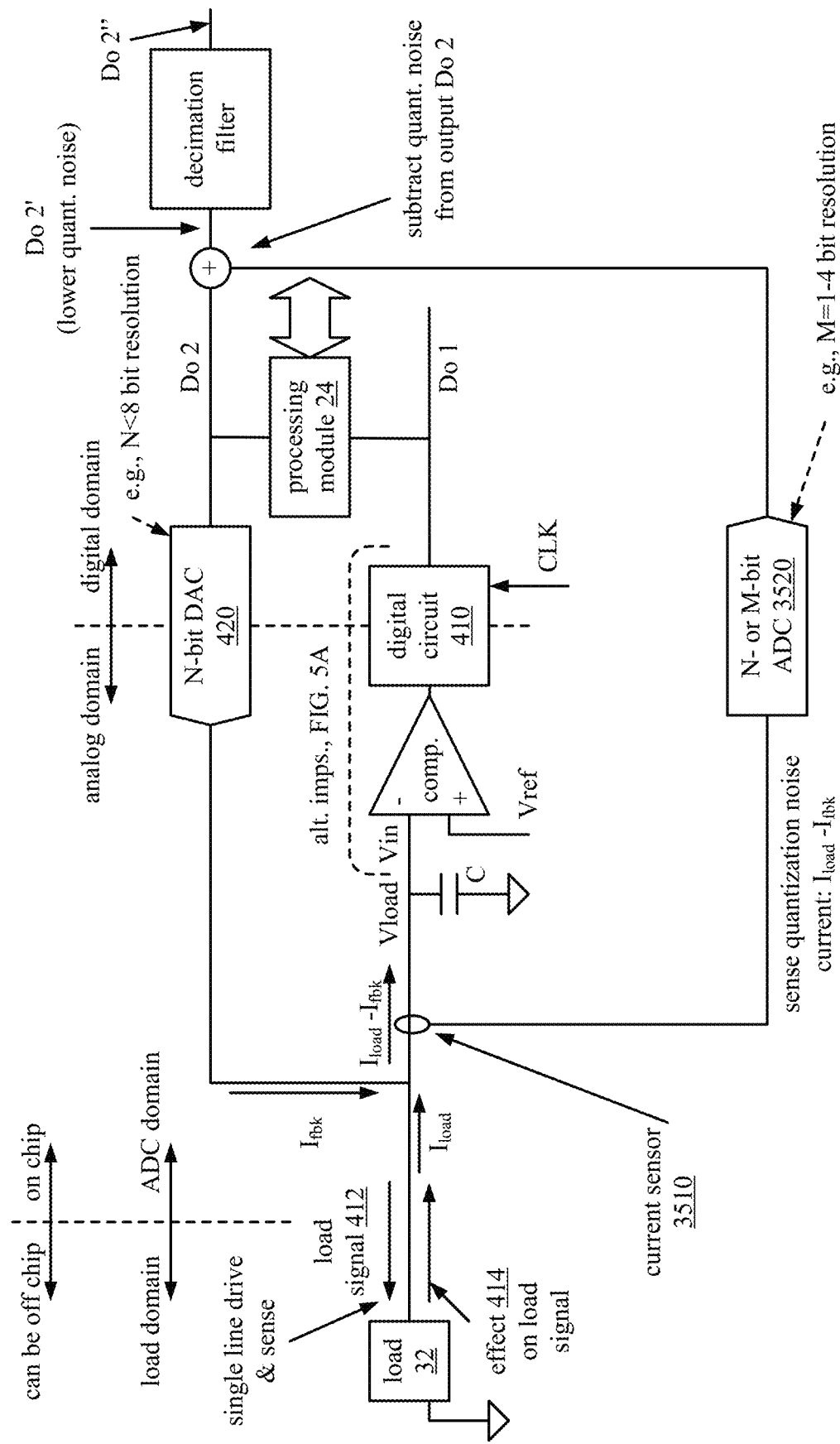
Figure 35C:
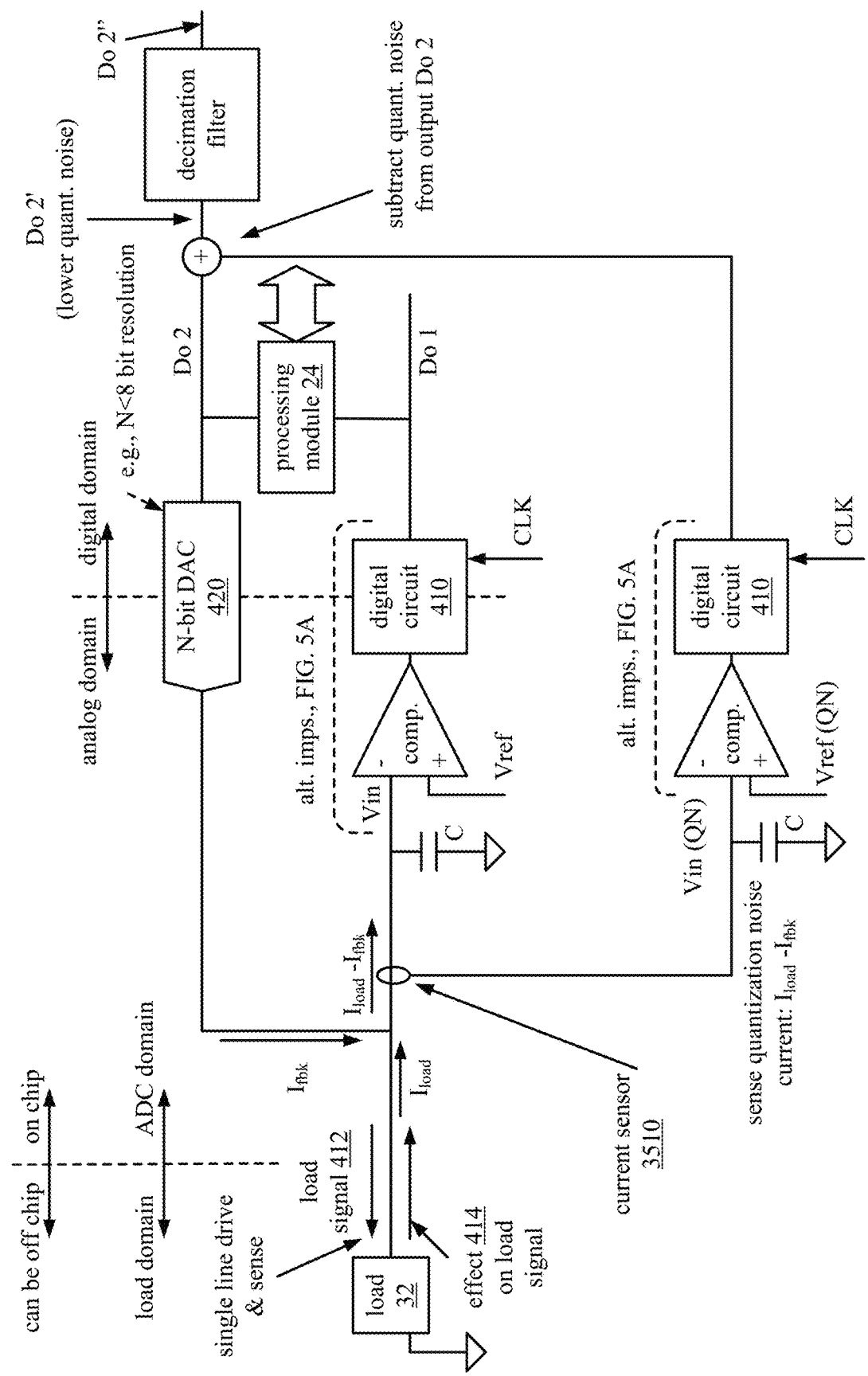
Figure 35J:
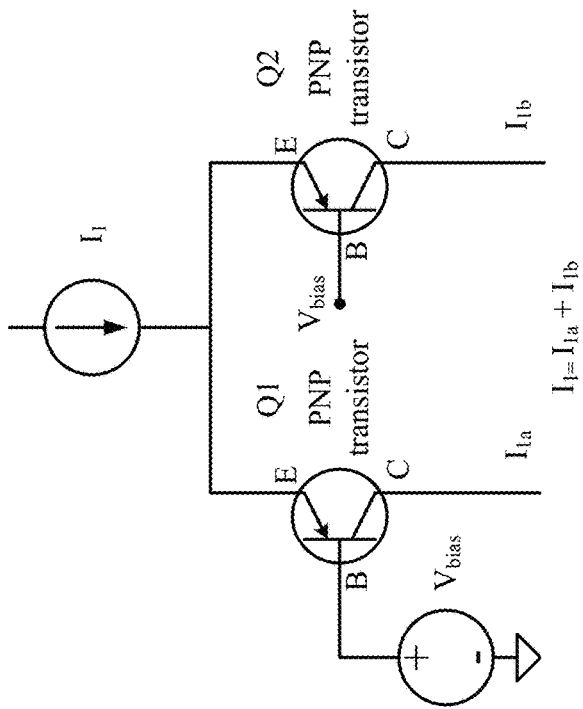
Figure 35K:
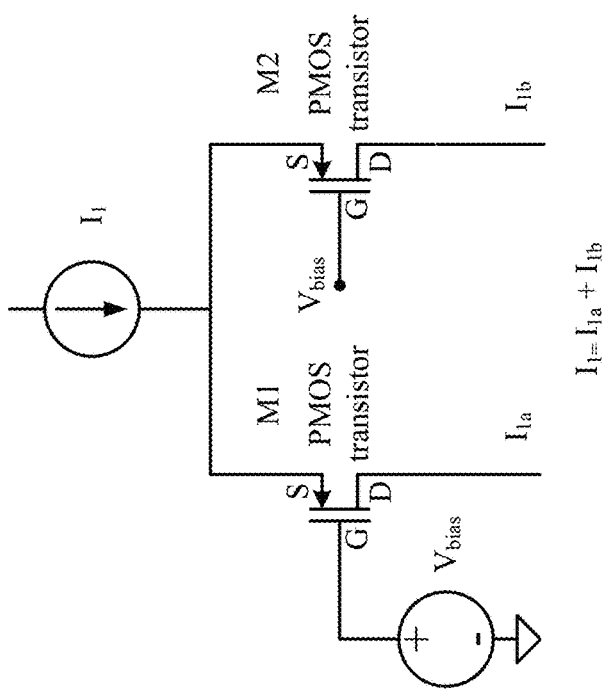
Figure 36B:
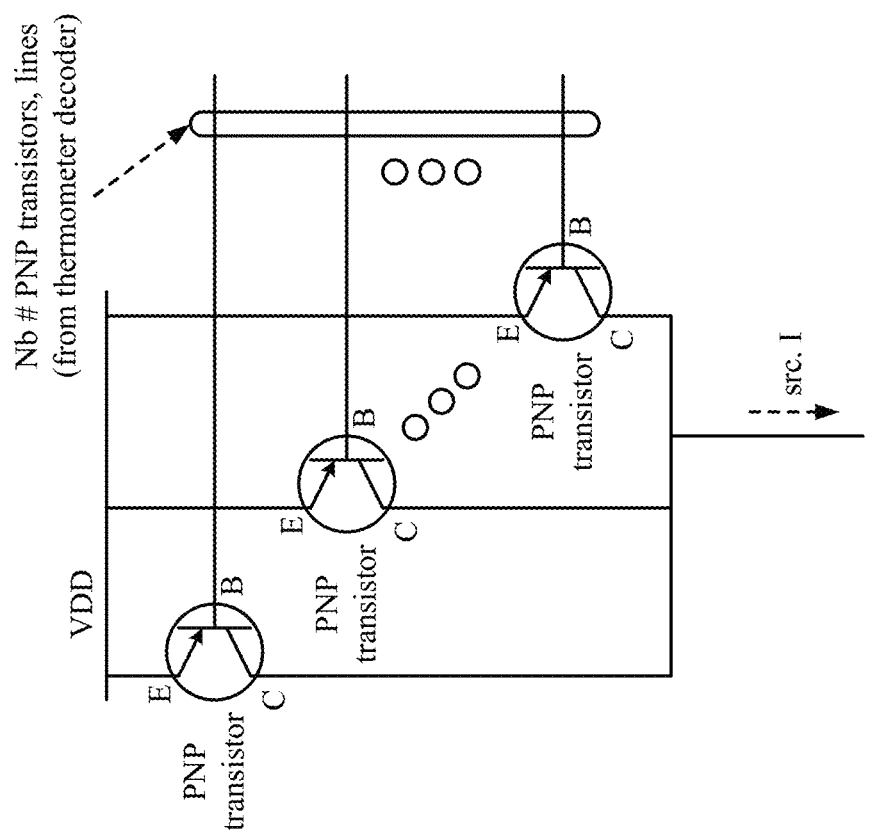
Figure 36C:
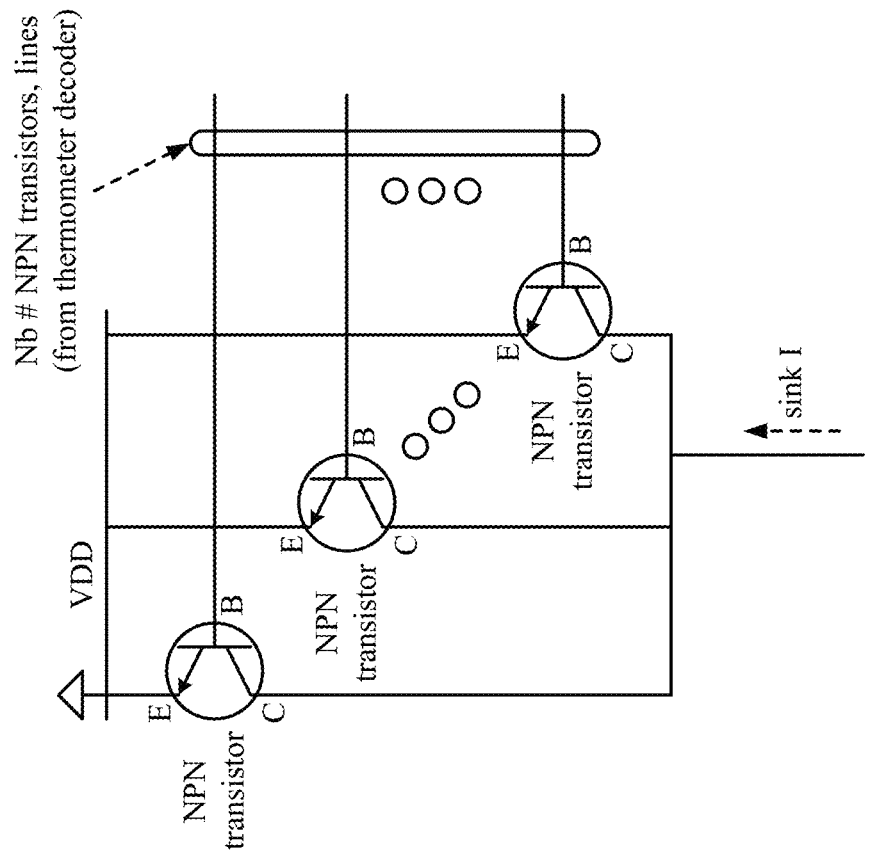
Figure 36F:
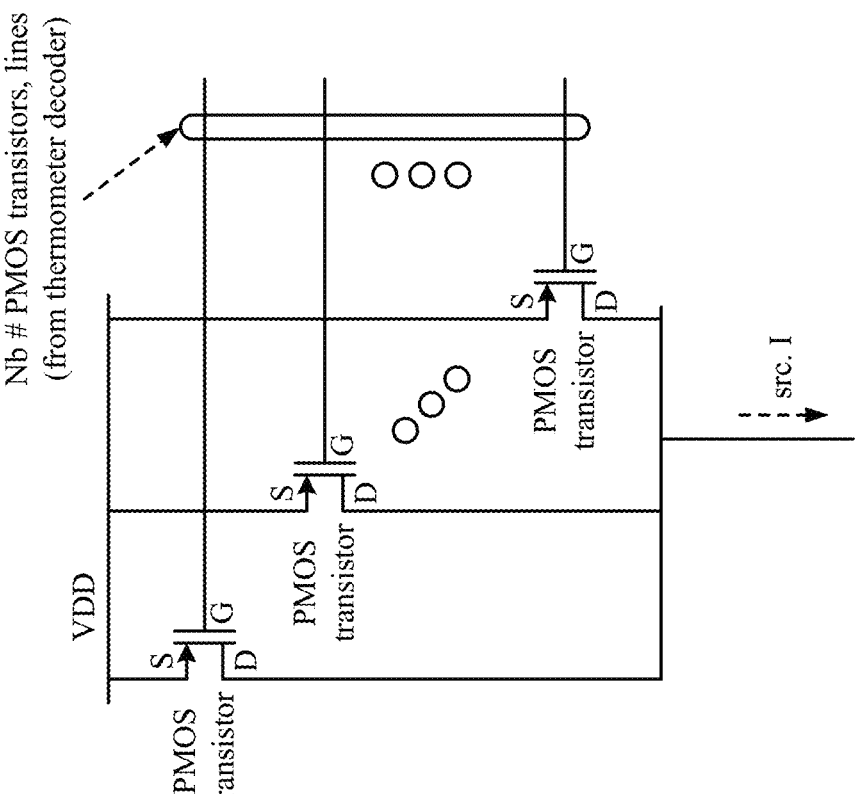
Figure 36E:
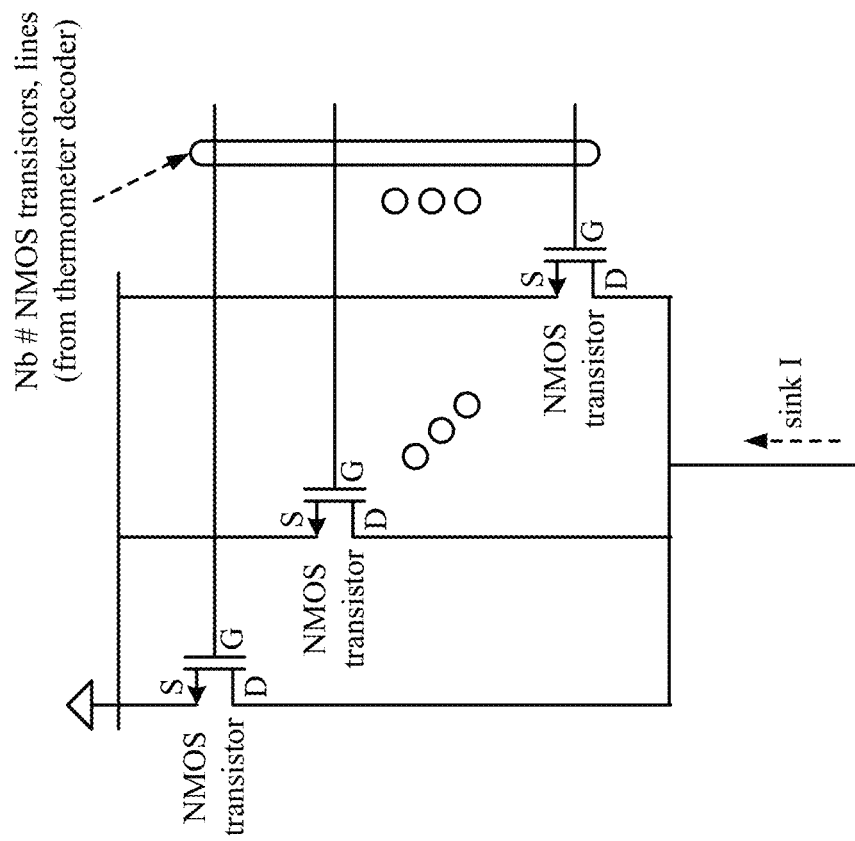
Figure 36G:
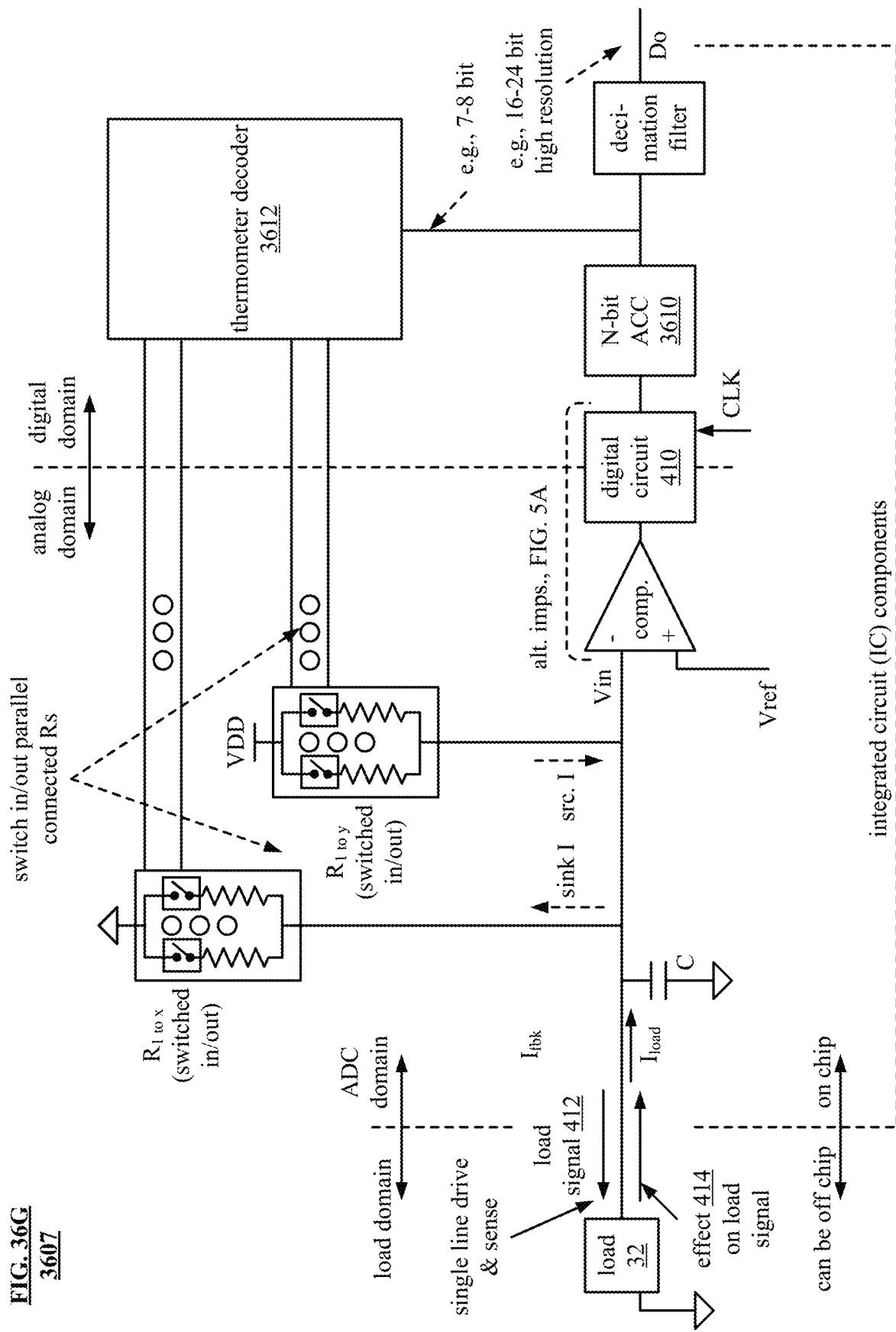
Figure 37A:
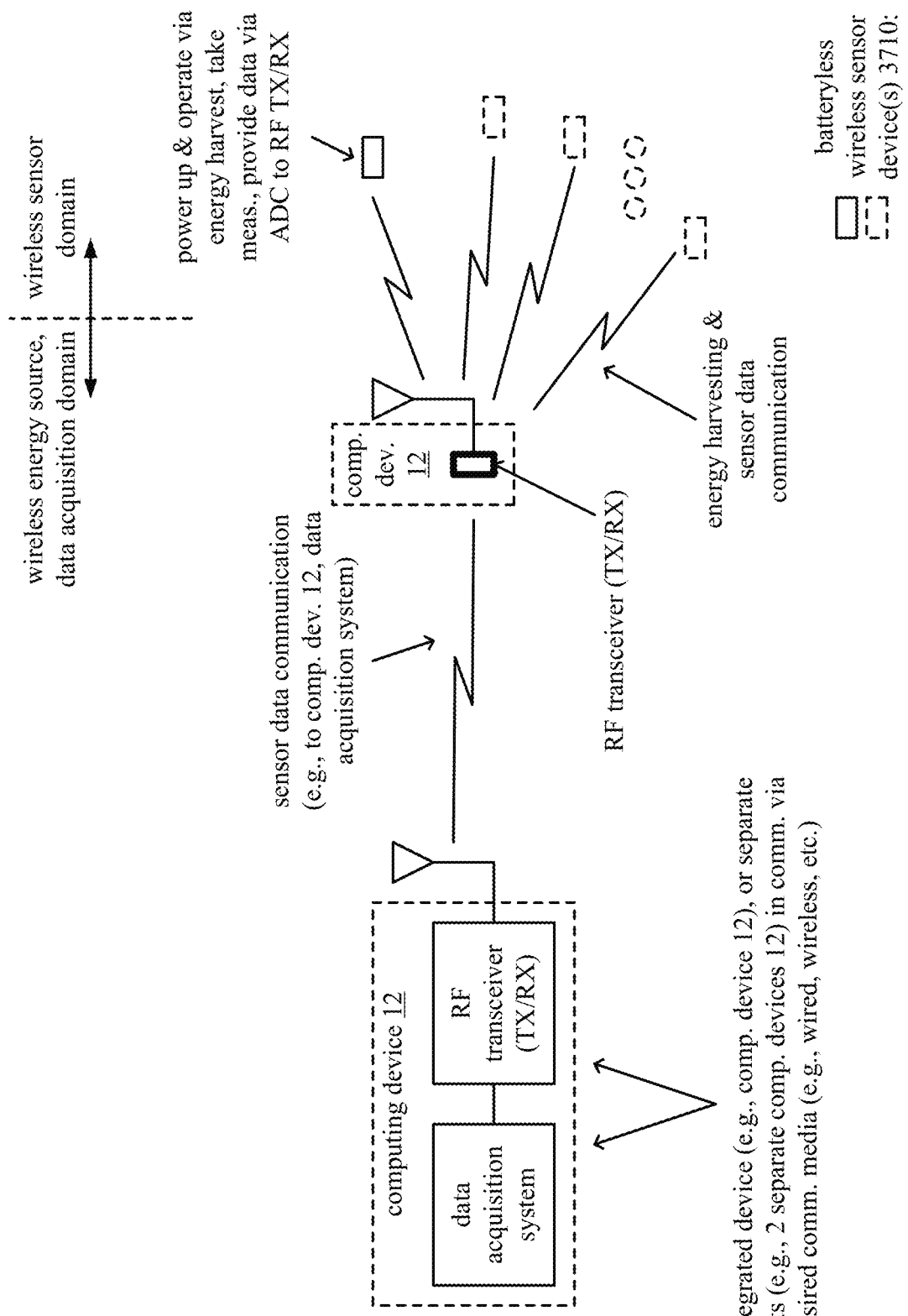
Figure 37B:
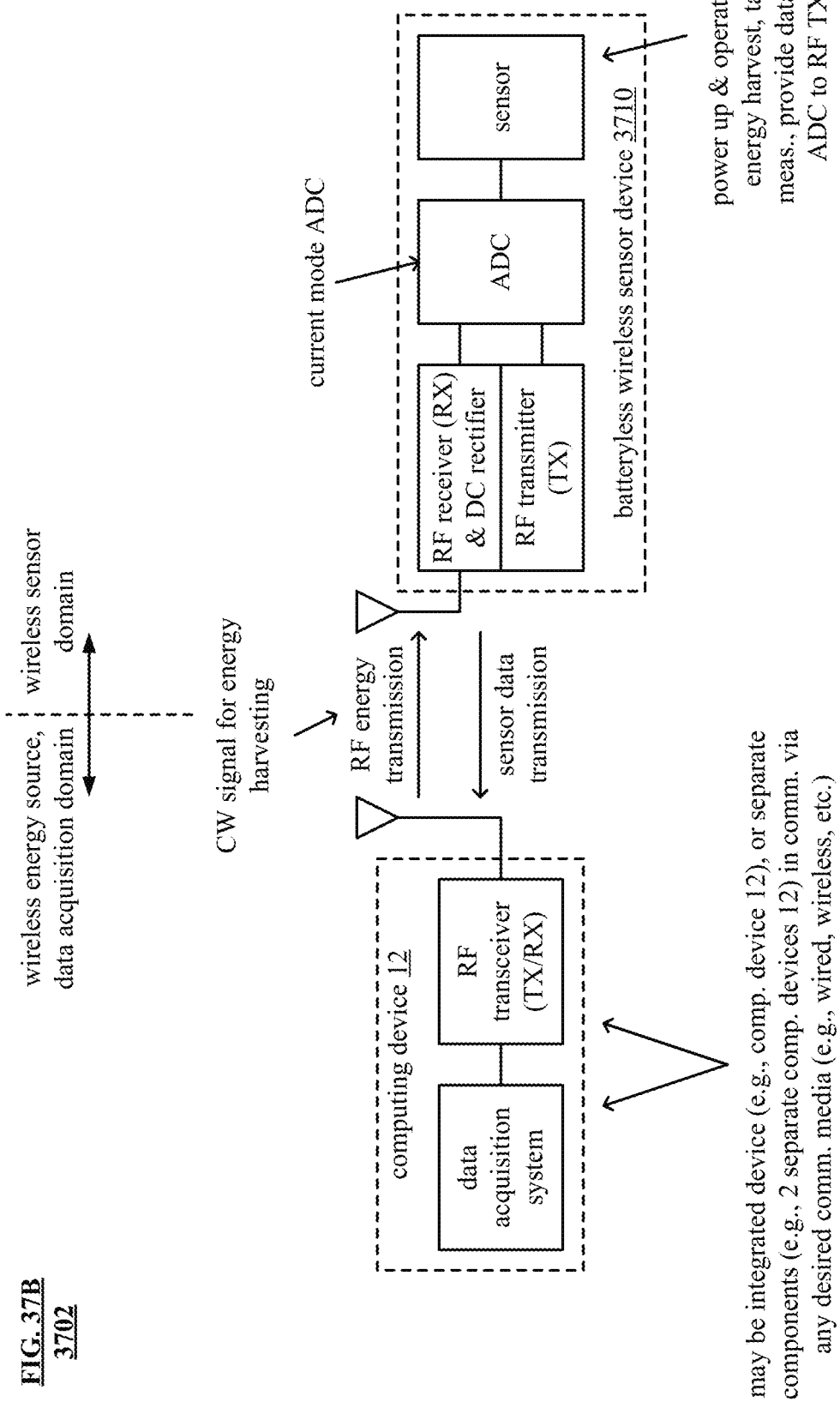
Figure 38:
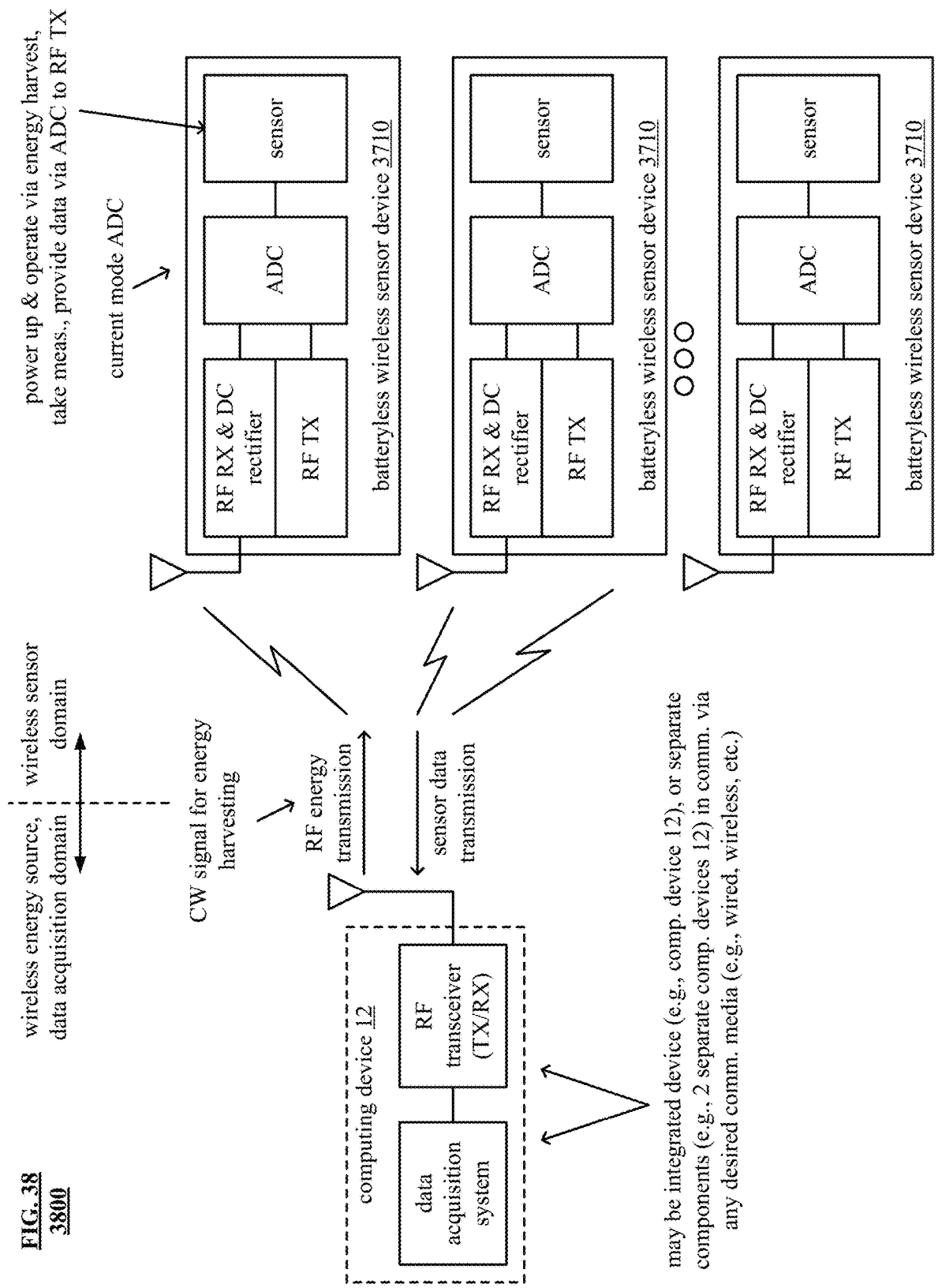
Figure 39A:
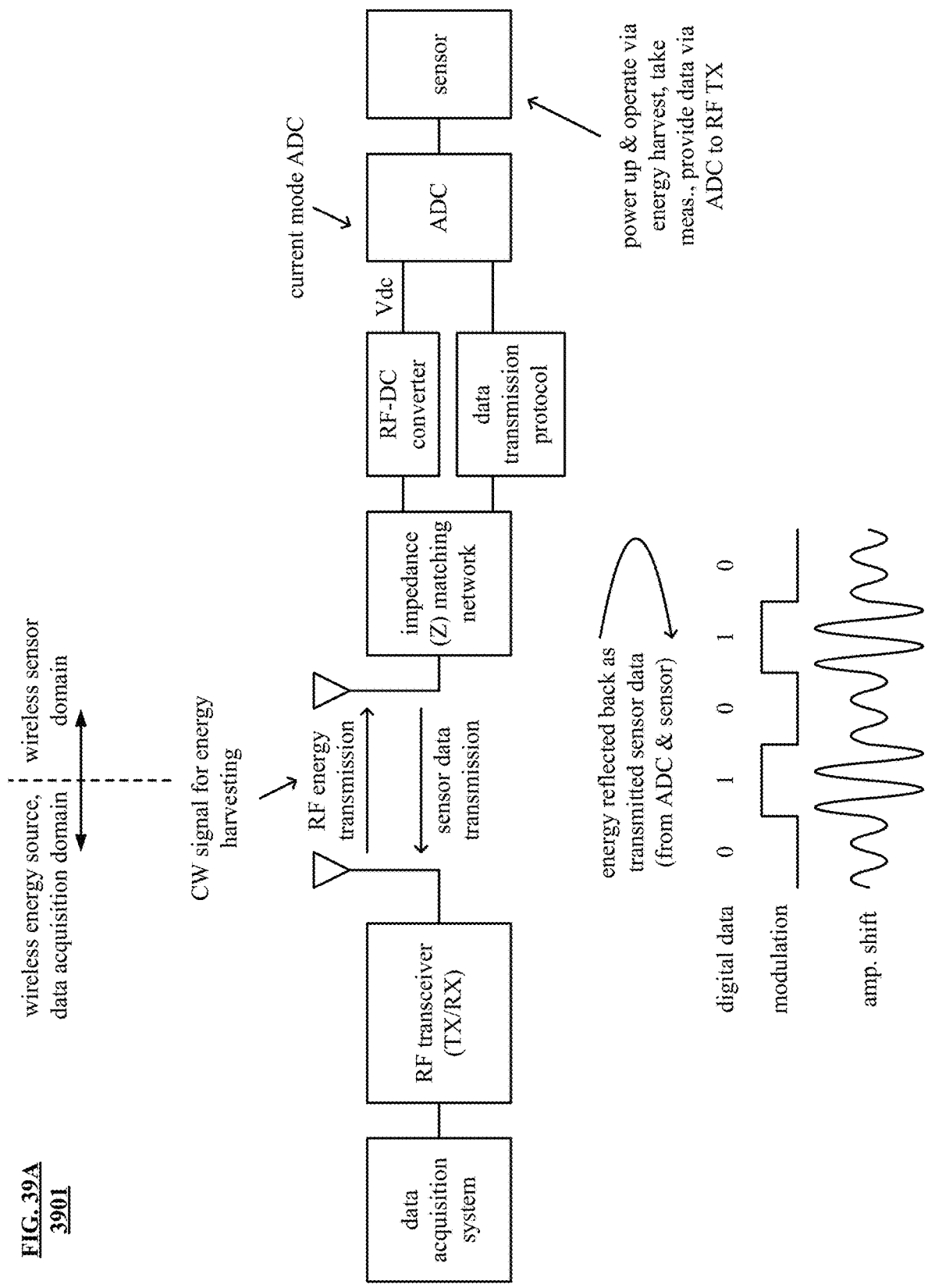
Figure 39B:
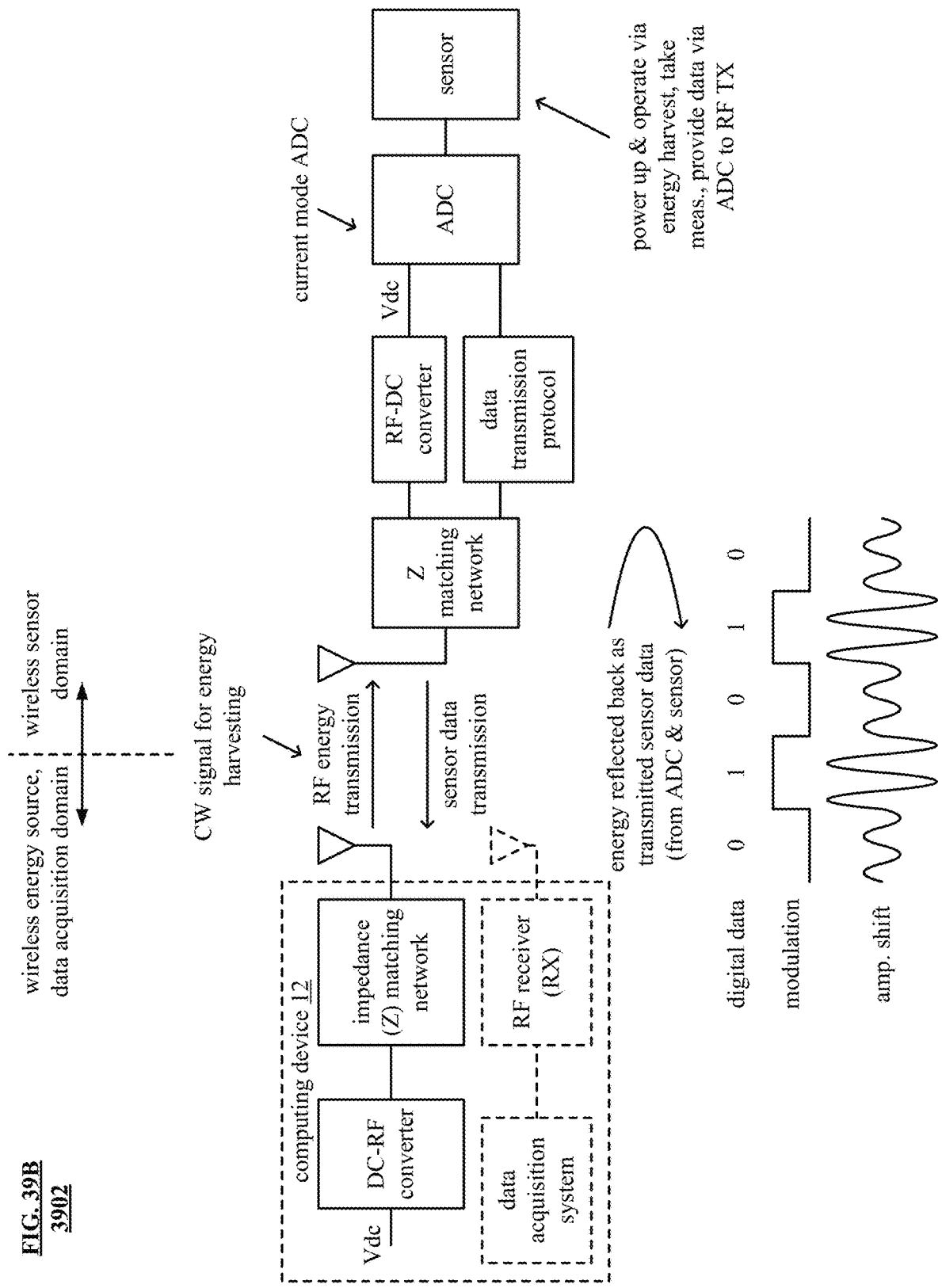
Figure 39C:
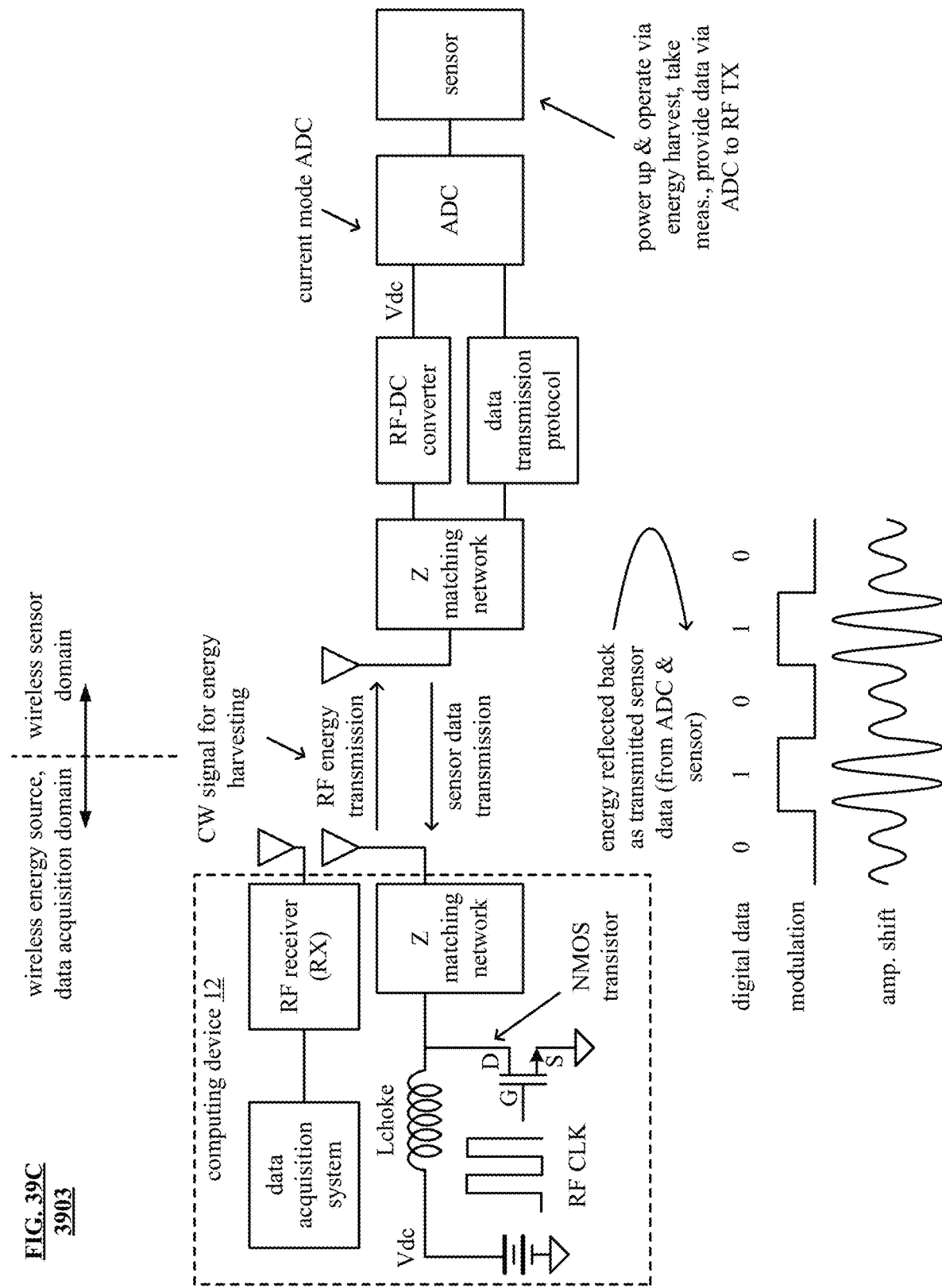
Figure 39D:
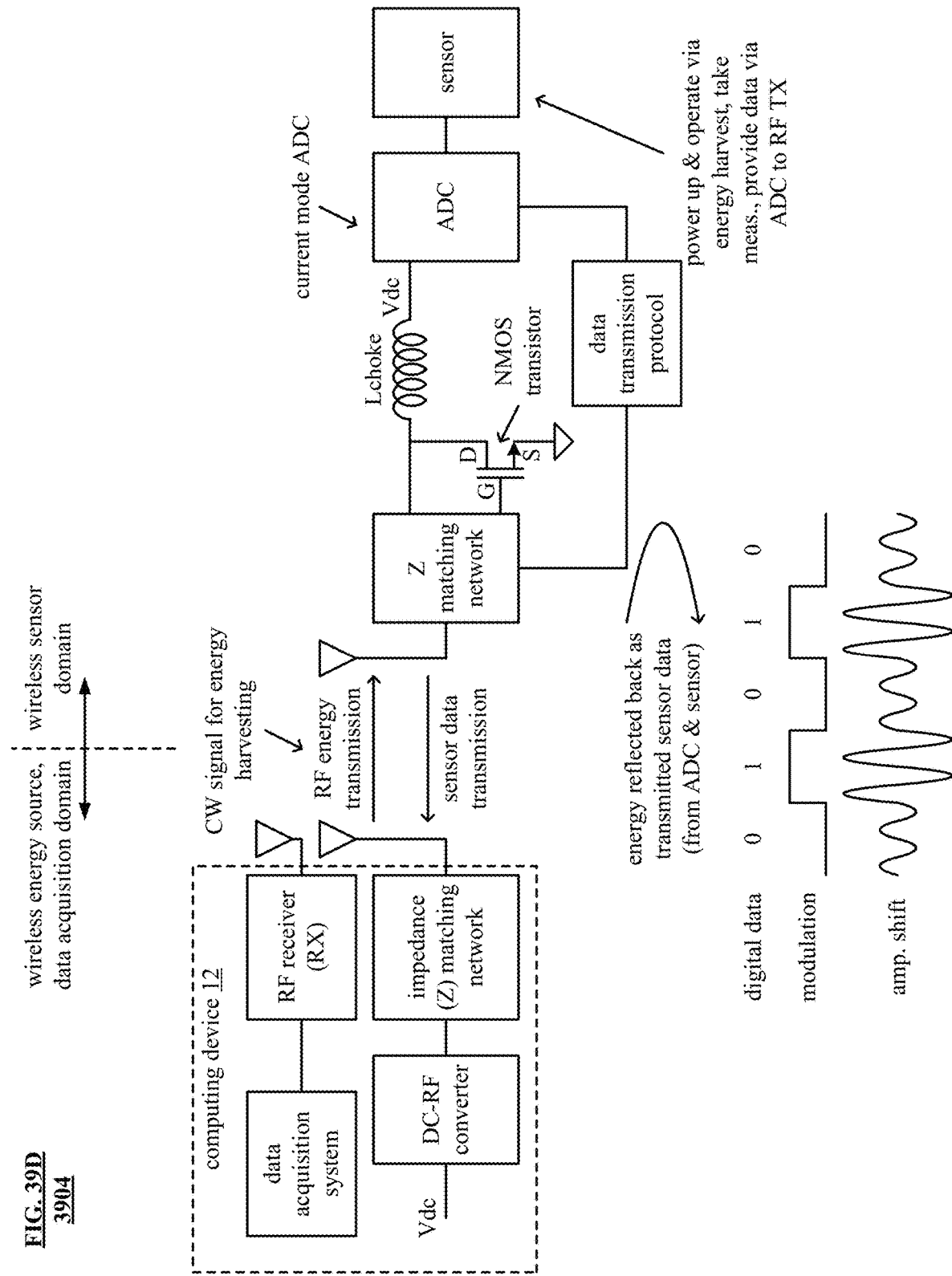
Figure 39E:
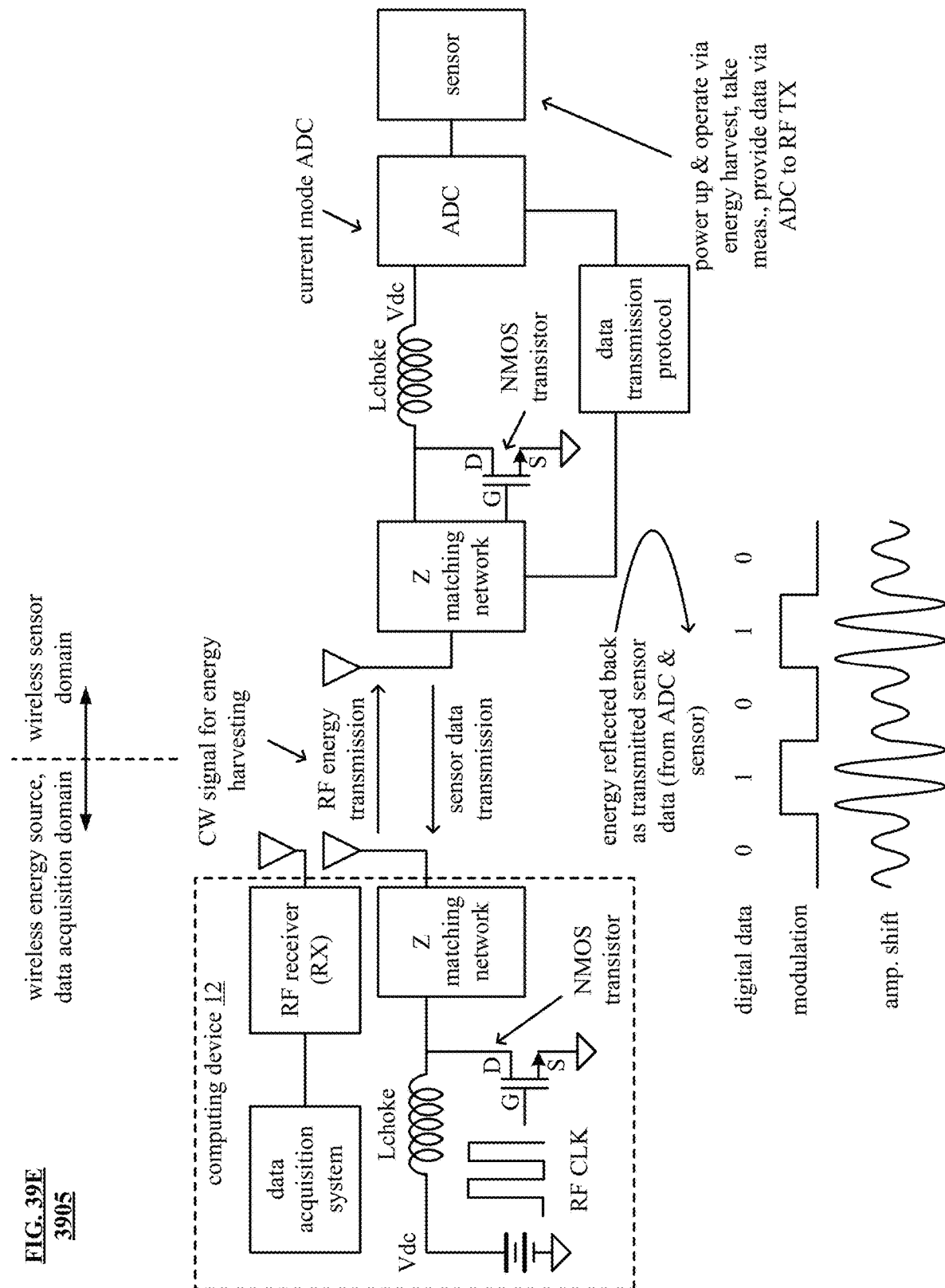
Figure 39F:
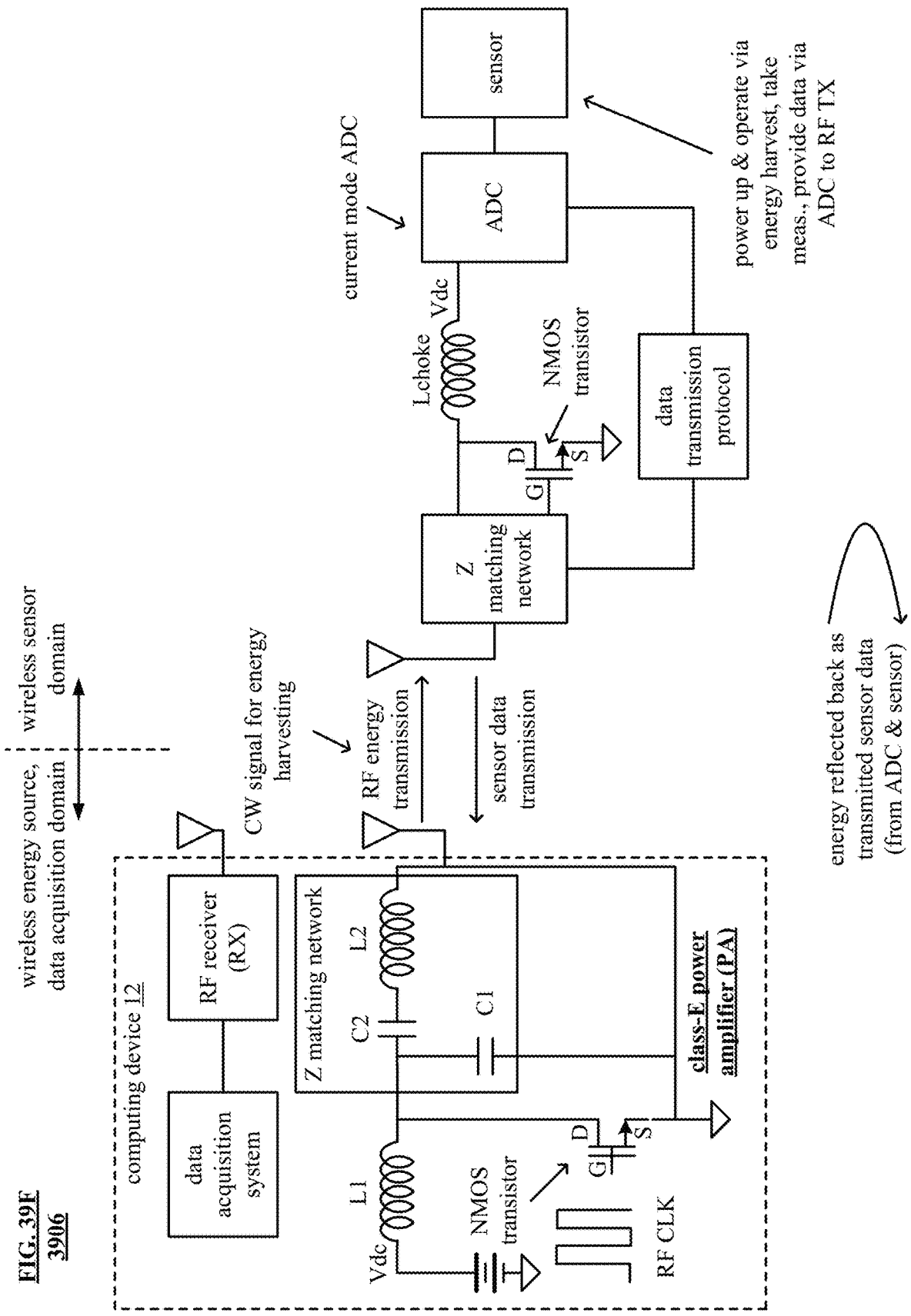
Figure 39G:
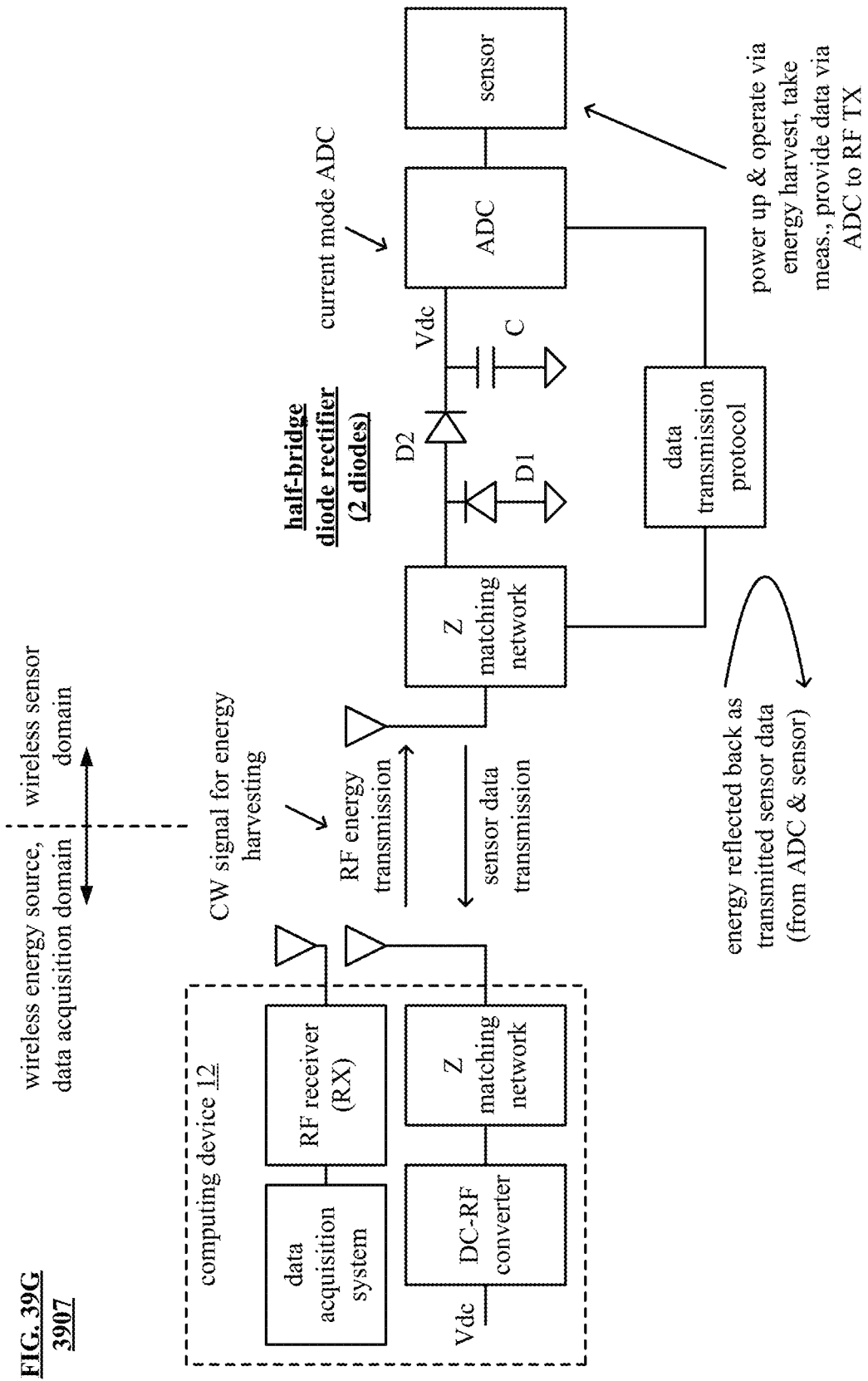
Figure 39H:
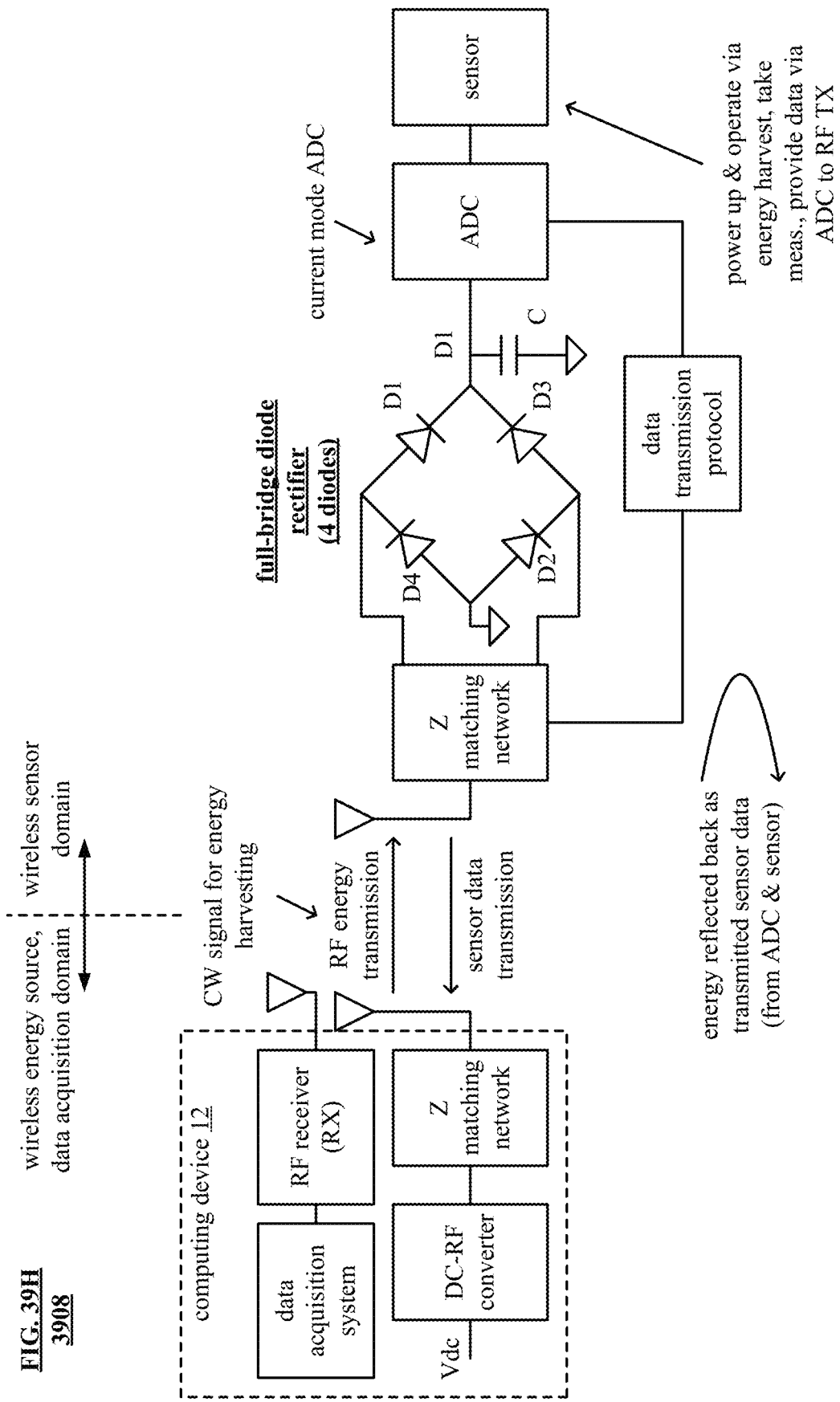
Figure 39I:
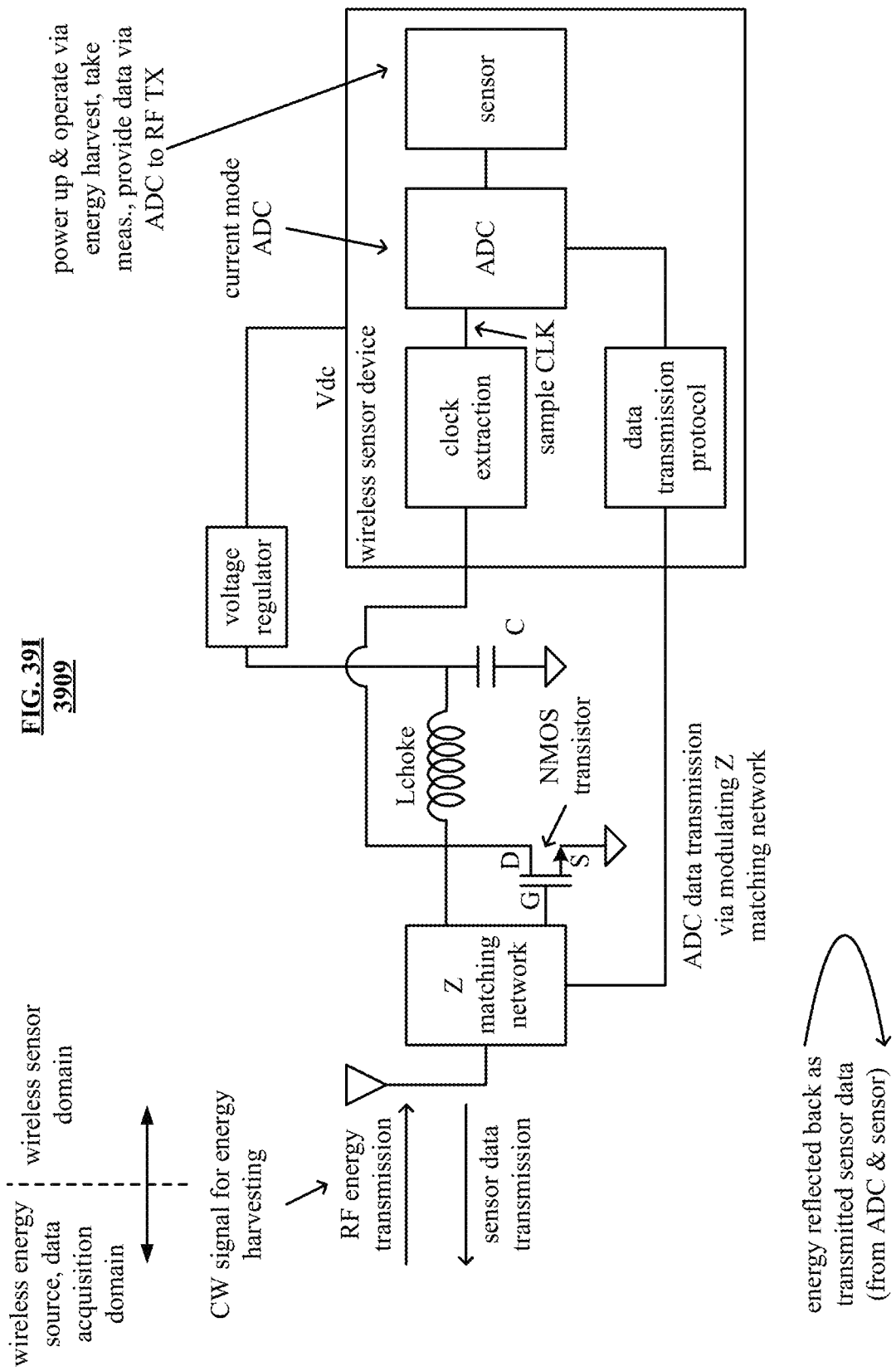
Figure 40:
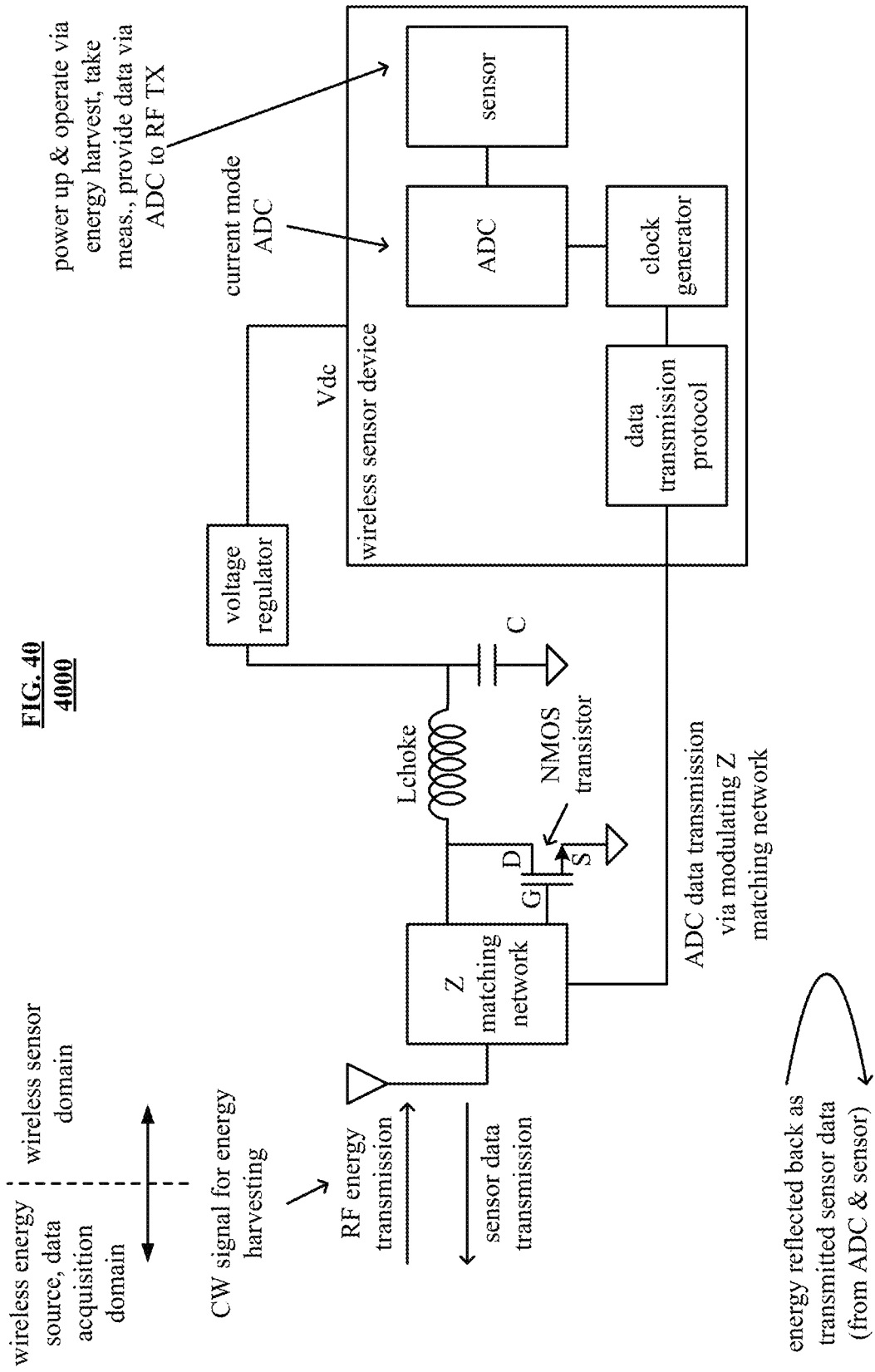
Figure 41:
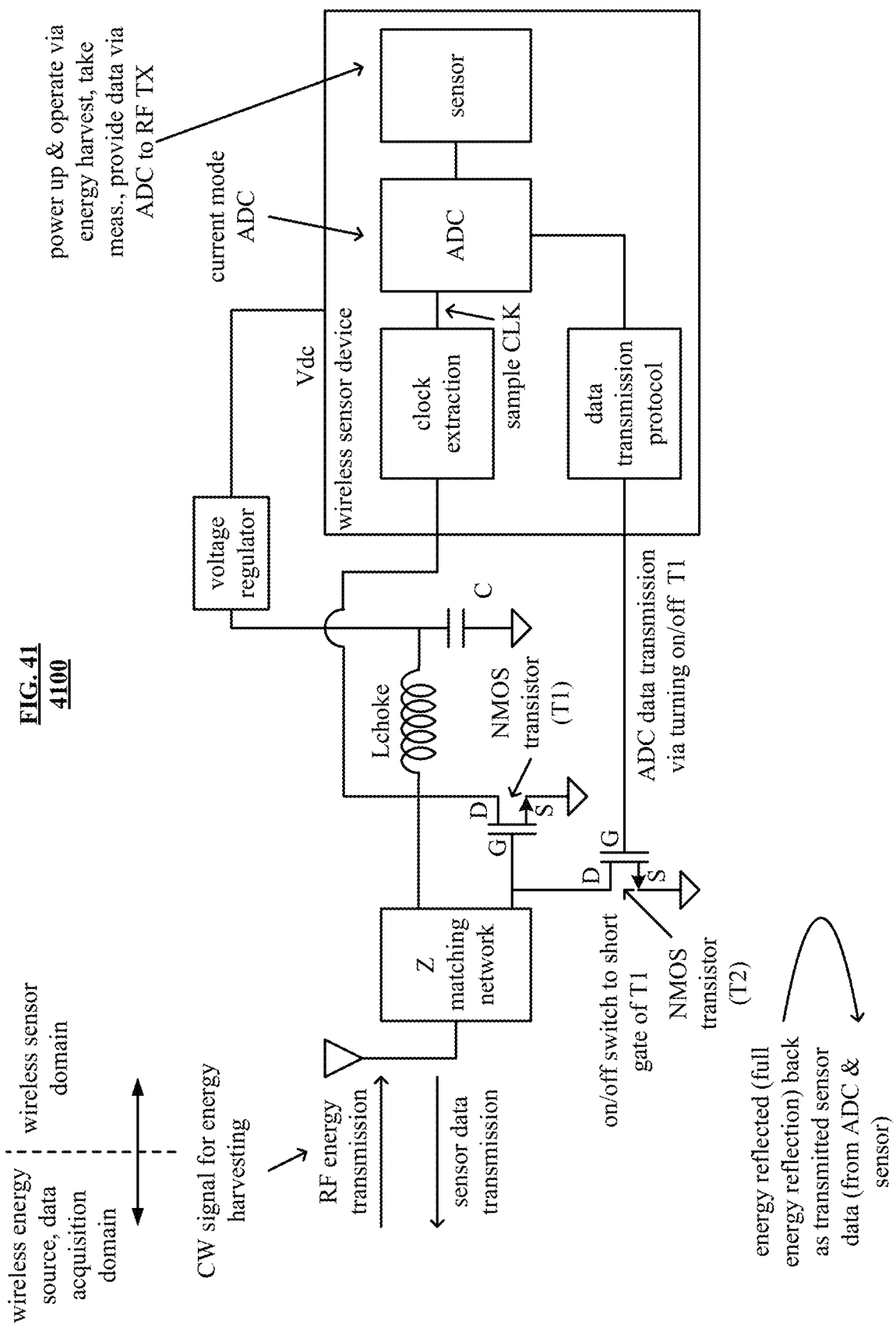
Figure 42:
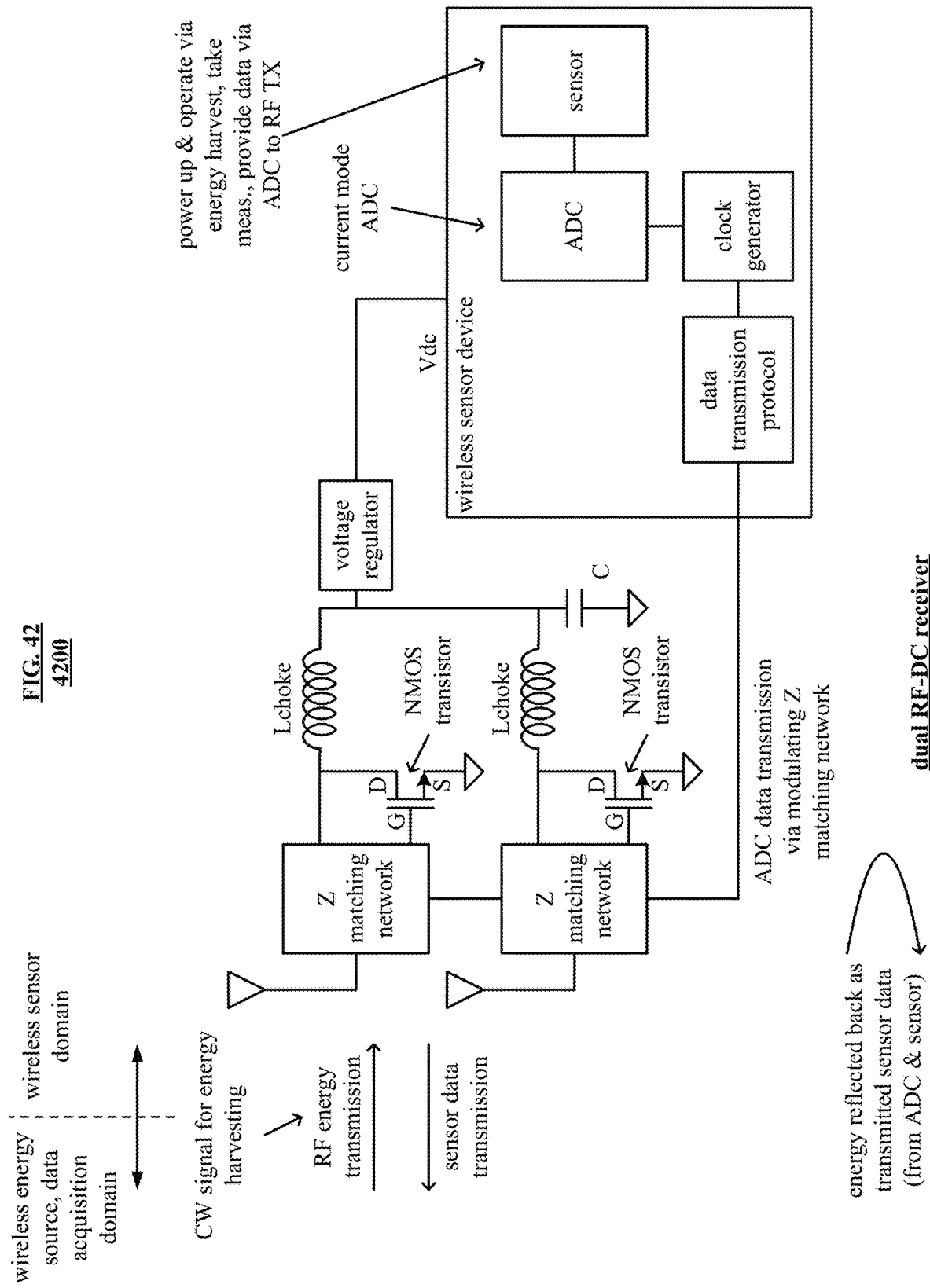

FIGS. 35A, 35B, and 35C are schematic block diagrams showing various embodiments of analog to digital converters (ADCs) with improved bandwidth in accordance with the present disclosure;

FIGS. 35D, 35E, 35F, 35G, 35H, 35I, 35J, and 35K are schematic block diagrams showing various embodiments of current sensor circuitry that may be implemented in accordance with the present disclosure;

FIG. 35L shows multiple performance diagrams of ADC output expressed as power spectral density (PSD [dB]) as a function of frequency (kilo-Hertz [kHz]) in accordance with the present disclosure;

FIG. 36A is a schematic block diagram showing an embodiment of an ADC implemented with a thermometer decoder in accordance with the present disclosure;

FIGS. 36B and 36C are schematic block diagrams showing embodiments of one or more PNP BJTs (alternatively, Positive-Negative-Positive Bipolar Junction Transistors) and NPN BJTs (alternatively, Negative-Positive-Positive BJT) implemented to sink and source current within embodiments of ADCs implemented with a thermometer decoder in accordance with the present disclosure;

FIG. 36D is a schematic block diagram showing an alternative embodiment of an ADC implemented with a thermometer decoder in accordance with the present disclosure;

FIGS. 36E and 36F are schematic block diagrams showing embodiments of one or more metal-oxide-semiconductor field-effect transistors (MOSFETs) including one or more PMOS transistors and NMOS transistors implemented to sink and source current within embodiments of ADCs implemented with a thermometer decoder in accordance with the present disclosure;

FIG. 36G is a schematic block diagram showing an alternative embodiment of an ADC implemented with a thermometer decoder in accordance with the present disclosure;

FIG. 37A is a schematic block diagram showing an embodiment of a batteryless wireless sensor system in accordance with the present disclosure;

FIG. 37B is a schematic block diagram showing another embodiment of a batteryless wireless sensor system in accordance with the present disclosure;

FIGS. 37C, 37D, 37E, 37F, and 37G are schematic block diagrams showing various alternative embodiments of batteryless wireless sensor systems in accordance with the present disclosure;

FIG. 38 is a schematic block diagram showing an embodiment of a batteryless wireless sensor system including multiple batteryless wireless sensor devices operative with coordinated data acquisition in accordance with the present disclosure;

FIG. 39A is a schematic block diagram showing an embodiment of a batteryless wireless sensor system including a batteryless wireless sensor device operative to perform impedance modulated data transmission in accordance with the present disclosure;

FIGS. 39B, 39C, 39D, 39E, and 39F are schematic block diagrams showing other embodiments of a batteryless wireless sensor system including a batteryless wireless sensor device operative to perform impedance modulated data transmission in accordance with the present disclosure;

FIG. 39G is a schematic block diagram showing an embodiment of a batteryless wireless sensor system including a batteryless wireless sensor device that includes a half-bridge diode rectifier and is operative to perform impedance modulated data transmission in accordance with the present disclosure;

FIG. 39H is a schematic block diagram showing an embodiment of a batteryless wireless sensor system including a batteryless wireless sensor device that includes a full-bridge diode rectifier and is operative to perform impedance modulated data transmission in accordance with the present disclosure;

FIG. 39I is a schematic block diagram showing an embodiment of a batteryless wireless sensor system including a batteryless wireless sensor device operative to perform clock extraction and impedance modulated data transmission in accordance with the present disclosure;

FIG. 40 is a schematic block diagram showing an embodiment of a batteryless wireless sensor system including a batteryless wireless sensor device with built-in clock generation and is operative to perform impedance modulated data transmission in accordance with the present disclosure;

FIG. 41 is a schematic block diagram showing an embodiment of a batteryless wireless sensor system including a batteryless wireless sensor device operative to perform clock extraction and impedance modulated data transmission based on full energy reflection in accordance with the present disclosure; and FIG. 42 is a schematic block diagram showing an embodiment of a batteryless wireless sensor system including a dual radio frequency (RF)-DC receiver batteryless wireless sensor device in accordance with the present disclosure.

DETAILED DESCRIPTION OF THE INVENTION

Figure 1:
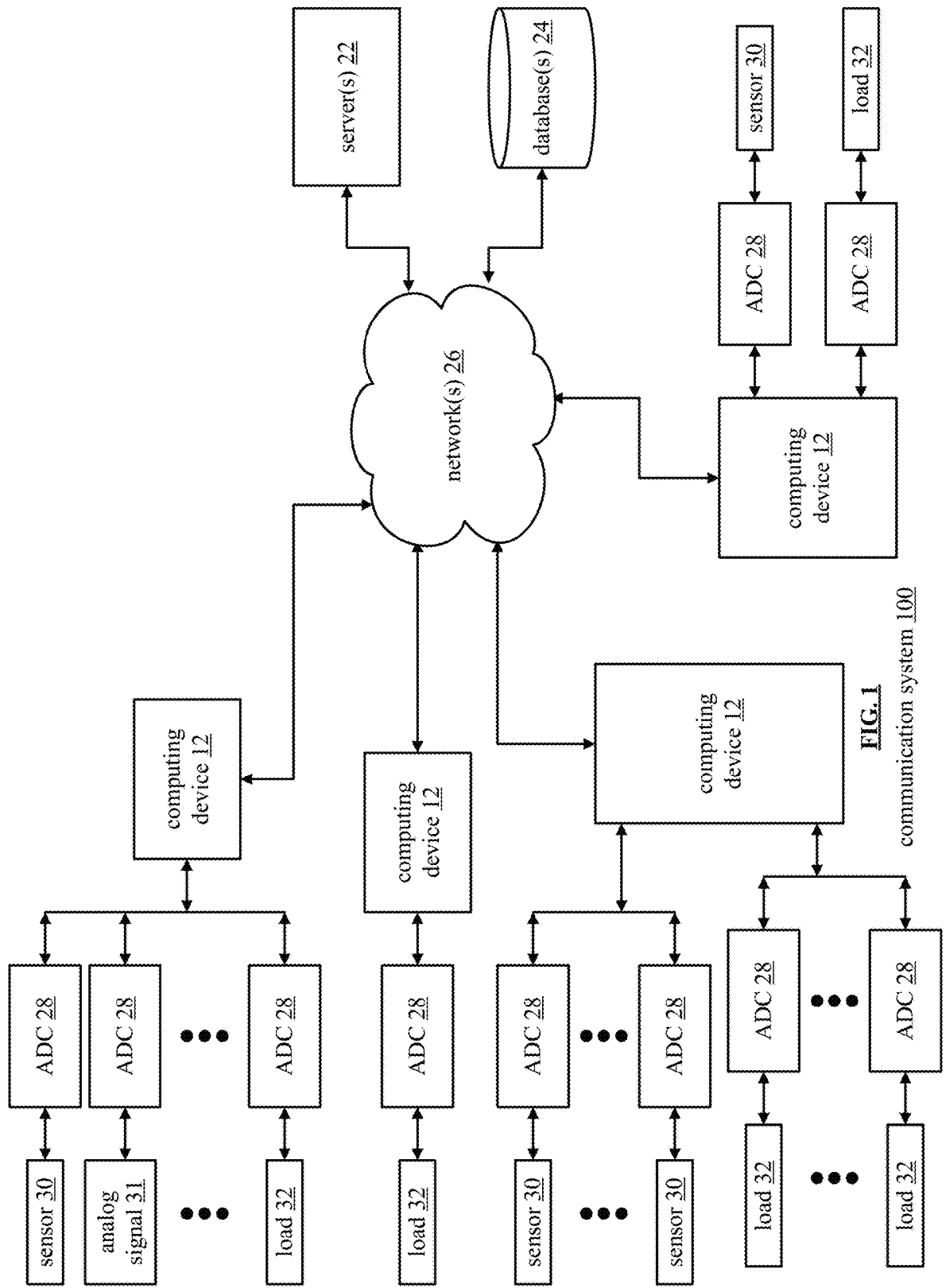
FIG. 1 is a schematic block diagram of an embodiment of a communication system in accordance with the present disclosure.

FIG. 1 is a schematic block diagram of an embodiment of a communication system 100 that includes a plurality of computing devices 12, one or more servers 22, one or more databases 24, one or more networks 26, a plurality of analog to digital converters (ADCs) 28, a plurality of sensors 30, and a plurality of loads 32. Generally speaking, an ADC 28 is configured to convert an analog signal 31 into a digital signal. In some examples, such an analog signal may be provided from and/or correspond a signal associated with a sensor 30, or generally speaking, a load 32 (e.g., such as which is consumptive of current, voltage, and/or power, and/or such as which produces a current, voltage, and/or power signal). Also, in some examples, note that any one of the computing devices 12 includes a touch screen with sensors 30, a touch & tactic screen that includes sensors 30, loads 32, and/or other components.

A sensor 30 functions to convert a physical input into an output signal (e.g., an electrical output, an optical output, etc.). The physical input of a sensor may be one of a variety of physical input conditions. For example, the physical condition includes one or more of, but is not limited to, acoustic waves (e.g., amplitude, phase, polarization, spectrum, and/or wave velocity); a biological and/or chemical condition (e.g., fluid concentration, level, composition, etc.); an electric condition (e.g., charge, voltage, current, conductivity, permittivity, eclectic field, which includes amplitude, phase, and/or polarization); a magnetic condition (e.g., flux, permeability, magnetic field, which amplitude, phase, and/or polarization); an optical condition (e.g., refractive index, reflectivity, absorption, etc.); a thermal condition (e.g., temperature, flux, specific heat, thermal conductivity, etc.); and a mechanical condition (e.g., position, velocity, acceleration, force, strain, stress, pressure, torque, etc.). For example, piezoelectric sensor converts force or pressure into an eclectic signal. As another example, a microphone converts audible acoustic waves into electrical signals.

There are a variety of types of sensors to sense the various types of physical conditions. Sensor types include, but are not limited to, capacitor sensors, inductive sensors, accelerometers, piezoelectric sensors, light sensors, magnetic field sensors, ultrasonic sensors, temperature sensors, infrared (IR) sensors, touch sensors, proximity sensors, pressure sensors, level sensors, smoke sensors, and gas sensors. In many ways, sensors function as the interface between the physical world and the digital world by converting real world conditions into digital signals that are then processed by computing devices for a vast number of applications including, but not limited to, medical applications, production automation applications, home environment control, public safety, and so on.

The various types of sensors have a variety of sensor characteristics that are factors in providing power to the sensors, receiving signals from the sensors, and/or interpreting the signals from the sensors. The sensor characteristics include resistance, reactance, power requirements, sensitivity, range, stability, repeatability, linearity, error, response time, and/or frequency response. For example, the resistance, reactance, and/or power requirements are factors in determining drive circuit requirements. As another example, sensitivity, stability, and/or linear are factors for interpreting the measure of the physical condition based on the received electrical and/or optical signal (e.g., measure of temperature, pressure, etc.).

Any of the computing devices 12 may be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. An example of the computing devices 12 is discussed in greater detail with reference to one or more of FIG. 2.

A server 22 is a special type of computing device that is optimized for processing large amounts of data requests in parallel. A server 22 includes similar components to that of the computing devices 12 with more robust processing modules, more main memory, and/or more hard drive memory (e.g., solid state, hard drives, etc.). Further, a server 22 is typically accessed remotely; as such it does not generally include user input devices and/or user output devices. In addition, a server may be a standalone separate computing device and/or may be a cloud computing device.

A database 24 is a special type of computing device that is optimized for large scale data storage and retrieval. A database 24 includes similar components to that of the computing devices 12 with more hard drive memory (e.g., solid state, hard drives, etc.) and potentially with more processing modules and/or main memory. Further, a database 24 is typically accessed remotely; as such it does not generally include user input devices and/or user output devices. In addition, a database 24 may be a standalone separate computing device and/or may be a cloud computing device.

The network 26 includes one more local area networks (LAN) and/or one or more wide area networks WAN), which may be a public network and/or a private network. A LAN may be a wireless-LAN (e.g., Wi-Fi access point, Bluetooth, ZigBee, etc.) and/or a wired network (e.g., Firewire, Ethernet, etc.). A WAN may be a wired and/or wireless WAN. For example, a LAN may be a personal home or business's wireless network and a WAN is the Internet, cellular telephone infrastructure, and/or satellite communication infrastructure.

In an example of operation, computing device 12 communicates with ADCs 28, that are in communication with a plurality of sensors 30. In some examples, the sensors 30 and/or ADCs 28 are within the computing device 12 and/or external to it. For example, the sensors 30 may be external to the computing device 12 and the ADCs 28 are within the computing device 12. As another example, both the sensors 30 and the ADCs 28 are external to the computing device 12. In some examples, when the ADCs 28 are external to the computing device, they are coupled to the computing device 12 via wired and/or wireless communication links.

The computing device 12 communicates with the ADCs 28 to; (a) turn them on, (b) obtain data from the sensors 30, loads 32, one or more analog signals 31, etc. individually and/or collectively), (c) instruct the ADC 28 on how to process the analog signals associated with the sensors 30, loads 32, one or more analog signals 31, etc. and to provide digital signals and/or information to the computing device 12, and/or (d) provide other commands and/or instructions.

In an example of operation and implementation, a computing device 12 is coupled to ADC 28 that is coupled to a sensor 30. The sensor 30 and/or the ADC 28 may be internal and/or external to the computing device 12. In this example, the sensor 30 is sensing a condition that is particular to the computing device 12. For example, the sensor 30 may be a temperature sensor, an ambient light sensor, an ambient noise sensor, etc. As described above, when instructed by the computing device 12 (which may be a default setting for continuous sensing or at regular intervals), the ADC 28 is configured to generate a digital signal and/or information associated with the sensor 30 and to provide that digital signal and/or information to the computing device 12.

Figure 2:
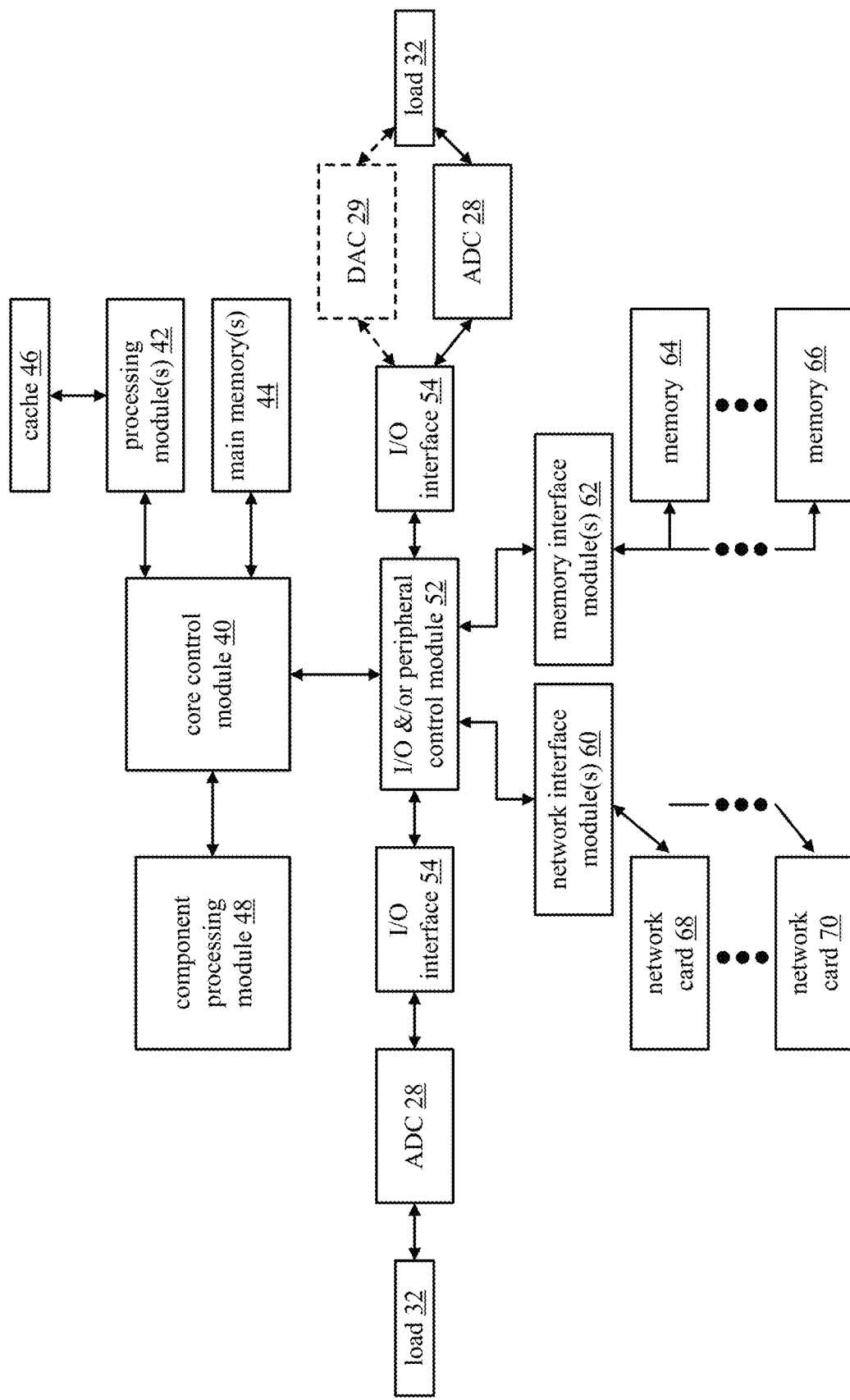
FIG. 2 is a schematic block diagram of an embodiment of a computing device in accordance with the present disclosure.

FIG. 2 is a schematic block diagram of an embodiment of a computing device 12 (e.g., any of the computing devices 12 in FIG. 1). The computing device 12 includes a core control module 40, one or more processing modules 42, one or more main memories 44, cache memory 46, an Input-Output (I/O) peripheral control module 52, one or more I/O interfaces 54, one or more ADCs 28 coupled to the one or more I/O interfaces 54 and one or more loads 32, optionally one or more digital to analog converters (DACs) 29 one or more I/O interfaces 54, one or more input interface modules 56, one or more output interface modules 58, one or more network interface modules 60, and one or more memory interface modules 62. In some examples, the computing device 12 also includes a component processing module 48. In an example of operation and implementation, such a component processing module 48 is implemented to facilitate operations associated with video graphics that may include any one or more of video graphics, display, a touch screen, a camera, audio output, audio input, and/or any other one or more computing device components, etc.

A processing module 42 is described in greater detail at the end of the detailed description of the invention section and, in an alternative embodiment, has a direction connection to the main memory 44. In an alternate embodiment, the core control module 40 and the I/O and/or peripheral control module 52 are one module, such as a chipset, a quick path interconnect (QPI), and/or an ultra-path interconnect (UPI).

Each of the main memories 44 includes one or more Random Access Memory (RAM) integrated circuits, or chips. For example, a main memory 44 includes four DDR4 ($4^{th}$ generation of double data rate) RAM chips, each running at a rate of 2,400 MHz. In general, the main memory 44 stores data and operational instructions most relevant for the processing module 42. For example, the core control module 40 coordinates the transfer of data and/or operational instructions from the main memory 44 and the memory 64-66. The data and/or operational instructions retrieve from memory 64-66 are the data and/or operational instructions requested by the processing module or will most likely be needed by the processing module. When the processing module is done with the data and/or operational instructions in main memory, the core control module 40 coordinates sending updated data to the memory 64-66 for storage.

The memory 64-66 includes one or more hard drives, one or more solid state memory chips, and/or one or more other large capacity storage devices that, in comparison to cache memory and main memory devices, is/are relatively inexpensive with respect to cost per amount of data stored. The memory 64-66 is coupled to the core control module 40 via the I/O and/or peripheral control module 52 and via one or more memory interface modules 62. In an embodiment, the I/O and/or peripheral control module 52 includes one or more Peripheral Component Interface (PCI) buses to which peripheral components connect to the core control module 40. A memory interface module 62 includes a software driver and a hardware connector for coupling a memory device to the I/O and/or peripheral control module 52. For example, a memory interface 62 is in accordance with a Serial Advanced Technology Attachment (SATA) port.

The core control module 40 coordinates data communications between the processing module(s) 42 and the network(s) 26 via the I/O and/or peripheral control module 52, the network interface module(s) 60, and a network card 68 or 70. A network card 68 or 70 includes a wireless communication unit or a wired communication unit. A wireless communication unit includes a wireless local area network (WLAN) communication device, a cellular communication device, a Bluetooth device, and/or a ZigBee communication device. A wired communication unit includes a Gigabit LAN connection, a Firewire connection, and/or a proprietary computer wired connection. A network interface module 60 includes a software driver and a hardware connector for coupling the network card to the I/O and/or peripheral control module 52. For example, the network interface module 60 is in accordance with one or more versions of IEEE 802.11, cellular telephone protocols, 10/100/1000 Gigabit LAN protocols, etc.

The core control module 40 coordinates data communications between the processing module(s) 42 and input device(s) 72 via the input interface module(s) 56 and the I/O and/or peripheral control module 52. An input device 72 includes a keypad, a keyboard, control switches, a touchpad, a microphone, a camera, etc. An input interface module 56 includes a software driver and a hardware connector for coupling an input device to the I/O and/or peripheral control module 52. In an embodiment, an input interface module 56 is in accordance with one or more Universal Serial Bus (USB) protocols.

The core control module 40 coordinates data communications between the processing module(s) 42 and output device(s) 74 via the output interface module(s) 58 and the I/O and/or peripheral control module 52. An output device 74 includes a speaker, etc. An output interface module 58 includes a software driver and a hardware connector for coupling an output device to the I/O and/or peripheral control module 52. In an embodiment, an output interface module 56 is in accordance with one or more audio codec protocols.

This disclosure presents novel analog to digital converter (ADC) designs, architectures, circuits, etc. that provide much improved performance in comparison to prior art ADCs. Various aspects, embodiments, and/or examples of the disclosure (and/or their equivalents) that may be used to perform analog to digital conversion of signals provide very high resolution digital format data. Certain examples of such analog-to-digital conversion is performed based on sensing an analog current signal associated with a sensor, a load, etc. or any source of an analog signal. In many examples provided herein, a load 32 is employed as the element having an associated analog signal that is sensed and converted to a digital signal. Generally speaking, such a load 32 may be any of a variety of types of sources, devices, systems, etc. that has an associated analog signal that may be sensed and converted to a digital signal including a sensor, a computing device, a circuit, etc. within any type of application context including industrial, medical, communication system, computing device, etc.

In addition, various aspects, embodiments, and/or examples of the disclosure (and/or their equivalents) that may be used to perform analog to digital conversion of signals may be implemented in accordance with providing both drive and sense capabilities such that a signal is driven from the ADC 28 to the load 32 to facilitate sensing of the analog signal associated with the load 32. In some examples, the signal is driven from the ADC 28 to energize the load 32 and to facilitate its effective operation. Consider an example in which the load 32 is a sensor 30. In such an example, the signal provided from the ADC 28 is operative to provide power to the sensor 30 and also simultaneously to sense the analog signal associated with the sensor 30 simultaneously via a single line. Alternatively, note that certain examples may operate such that the load 32 is provided power or energy from an alternative source. In such instances, the ADC 28 need not specifically be implemented to provide power or energy to the load 32 but merely to sense the analog signal associated with the sensor 30. In some examples, a sensing signal is provided from the ADC 28 to the load 32 such that detection of any change of the sensing signal is used and interpreted to determine one or more characteristics of the analog signal associated with the load 32. In certain examples, the providing of the sensing signal from the ADC 28 to the load 32 and the sensing of the analog signal associated with the load 32 are performed simultaneously via a single line that couples or connects the ADC 28 to the load 32.

FIG. 3 is a schematic block diagram showing various embodiments 301, 302, 303, and 304 of analog to digital conversion as may be performed in accordance with the present disclosure. In the upper left portion of the diagram, with respect to reference numeral 301, and analog AC signal is shown. Note that the analog AC signal may or may not have a DC offset. Consider an example in which the DC offset is X volts, and consider a sinusoidal analog AC signal oscillates and varies between a maximum of +Y volts to a minimum of —Y volts as a function of time based on a particular frequency of the analog AC signal. Note that this example of an analog AC signal is not exhaustive, and generally speaking, such an analog AC signal may have any variety of shapes, frequencies, characteristics, etc. Examples of such analog signals may include any one or more of a sinusoidal signal, a square wave signal, a triangular wave signal, a multiple level signal (e.g., has varying magnitude over time with respect to the DC component), and/or a polygonal signal (e.g., has a symmetrical or asymmetrical polygonal shape with respect to the DC component).

Note also that such an analog signal may alternatively have only a DC component with no AC component. Note that any of the respective implementations of an ADC has described herein, or their equivalents, is also operative to detect an analog signal having only a DC component. Note that a totally non-varying analog signal having only a DC component, after undergoing analog-to-digital conversion, would produce a digital signal having a constant digital value as a function of time. That is to say, such a discrete-time signal generated based on a DC signal.

In the upper right hand portion of the diagram, with respect reference numeral 302, the analog AC signal shown with respect to reference numeral 301 is shown as undergoing analog-to-digital conversion in accordance with generating a digital signal. Generally speaking, the resolution and granularity of such a digital signal may be of any desired format including performing analog-to-digital conversion based on a range spanning any number of desired levels and generating a digital signal having any number of desired bits, N, where N is a positive integer. This particular example shows generation of additional signal in accordance with a range having 8 levels such that the digital signal includes 3 bits. For example, consider an analog AC signal having no DC offset and varying between a range spanning +Y/−Y volts, then that range is divided into 8 respective sub-range is, and when the value of the analog AC signal crosses from one sub-range into another sub-range as a function of time, then the value of the digital signal correspondingly changes as a function of time. With respect to reference numeral 302, a digital representation of the analog AC signal shown with respect to reference numeral 301 is shown as a function of time.

In the lower left-hand portion of the diagram, with respect to reference numeral 303, a transfer function of a three bit ADC is shown with respect to a Z volt reference. As the magnitude of the analog AC signal varies as a function of time, a corresponding digital value is generated based on where the magnitude of the analog AC signal is within the range from zero to a Z volt reference. Note that this particular example shown with respect to reference numeral 303 is shown as varying between zero and a Z volt reference.

In another example, such a transfer function may be implemented based on using −Y volts as a baseline such that, along the horizontal axis, 0 corresponds to −Y volts, and Z is twice the magnitude of Y (e.g., Z=2×MAG[Y]). For example, consider the analog AC signal shown with respect to reference 301 as being an analog AC signal having no DC offset and varying between a range spanning +Y/−Y volts, then the Z volt reference could correspond to Y (or alternatively some value greater than Y to facilitate detection of the analog AC signal bearing outside of a particular or expected range), then such an 8 level, 3 bit digital signal may be generated such as shown with respect to reference numeral 302.

In the lower right hand portion of the diagram, with respect to reference numeral 304, an ADC 28 is shown as being coupled or connected to a load 32. The ADC 28 is configured to sense an analog signal associated with the load 32 and to generate a digital signal based thereon. Note that the ADC 28 may be implemented to facilitate both drive and sense capabilities such that the ADC 28 is configured to drive an analog current and/or voltage signal to the load 32 while concurrently or simultaneously sensing the analog signal associated with the load 32. In alternative examples, the ADC 28 is also operative to perform simultaneous driving and sensing of the analog signal associated with the load 32 when the load 32 is energized from another source such as from a battery, an external power source, etc.

Note that the ADC 28 includes capability and functionality to perform sensing only or alternatively, to perform both drive and sense. In some examples, the ADC 28 is configured to perform sensing only of an analog signal (e.g., having AC and/or DC components) associated with the load 32. In other example, the ADC 28 is configured to drive an analog current and/or voltage signal to the load 32 while concurrently and/or simultaneously sensing an analog signal (e.g., having AC and/or DC components) associated with the load 32. For example, the ADC 28 is configured to provide power to or energize the load 32 while also concurrently and/or simultaneously sensing an analog signal (e.g., having AC and/or DC components) associated with the load 32. Also, in certain alternative examples, the ADC 28 is also operative to perform simultaneous driving and sensing of the analog signal associated with the load 32 when the load 32 is energized from another source such as from a battery, an external power source, etc.

Various aspects, embodiments, and/or examples of the disclosure (and/or their equivalents) include an ADC that is operative to sense an analog current signal. The ADC is implemented to convert the sensed analog current signal into a very high resolution digital format of a desired resolution (e.g., of a certain sampling rate, resolution, or number of bits, etc.).

FIG. 4 is a schematic block diagram of an embodiment 400 of an analog to digital converter (ADC) in accordance with the present disclosure. In this diagram, an ADC is connected to or coupled to a load 32 via single line such that the ADC is configured to provide a load signal 412 via that single line and simultaneously to detect any effect 414 on that load signal via a single line. In certain examples, the ADC is configured to perform single line drive and sense of that load signal 412, including any effect 414 thereon via that single line.

Note that certain of the following diagrams show one or more processing modules 24. In certain instances, the one or more processing modules 24 is configured to communicate with and interact with one or more other devices including one or more of ADCs, one or more components implemented within an ADC (e.g., filters of various types including low pass filters, bandpass filters, decimation filters, etc., gain or amplification elements, digital circuits, digital to analog converters (DACs) of varying types include N-bit DACs, analog to digital converters (ADCs) of varying types include M-bit ADCs, etc. Note that any such implementation of one or more processing modules 24 may include integrated memory and/or be coupled to other memory. At least some of the memory stores operational instructions to be executed by the one or more processing modules 24. In addition, note that the one or more processing modules 24 may interface with one or more other devices, components, elements, etc. via one or more communication links, networks, communication pathways, channels, etc. (e.g., such as via one or more communication interfaces of the device, such as may be integrated into the one or more processing modules 24 or be implemented as a separate component, circuitry, etc.).

Also, within certain of the following diagrams, there is a demarcation shown between the analog domain and the digital domain (e.g., showing the portion of the diagram that operates in the analog domain based on continuous-time signaling, and the portion of the diagram that operates in the digital domain that operates in the digital domain based on discrete-time signaling). Moreover, within certain of the following diagrams, there is a demarcation shown between the load domain and the ADC domain (e.g., showing the connection or coupling between a load and/or an analog signal that is being sensed and the ADC that is sensing the analog signal, which may be associated with the load). In certain examples, an ADC is connected to or coupled to a load via a single line.

Also, such an ADC may be implemented to perform simultaneous driving and sensing of a signal via that single line that connects or couples to the load. For example, such an ADC is operative to drive an analog signal (e.g., current and/or voltage) of the load 32. With respect to implementations that operate in accordance with sensing analog current signals, such an ADC is operative to sense current signals within an extremely broad range including very low currents (e.g., currents below the 1 pico-amp range, within the 10 s of pico-amps range, below the 1 nano-amp range, within the 10 s of nano-amps range, below the 1 micro-amp range, within the 10 s of micro-amps range, etc.) and also up to relatively much larger currents (e.g., currents in the 10 s milli-amps range, 100 s milli-amps range, or even higher values of amps range, etc.). In some examples, such as with respect to detecting currents that are provided from a photodetection or photodiode component, such an ADC is operative to sense current signals below the 1 pico-amp range, currents within the 100 s of micro-amps range, etc.

Also, in some examples, when using appropriately provisioned components (e.g., higher current, higher power, etc.), much higher currents can also be sensed using architectures and topologies in accordance with an ADC as described herein. For example, such an ADC implemented based on architectures and topologies, as described herein, using appropriately provisioned components are operative to sense even higher currents (e.g., is of amps, 10 s of amps, or even higher values of amps range, etc.).

In addition, such an ADC may be implemented to provide for extremely low power consumption (e.g., less than 2 µW). Such an ADC may be particularly well-suited for low-power applications such as remote sensors, battery operated applications, etc. The architecture and design of such an ADC requires very few analog components. This provides a number of advantages and improve performance over prior art ADCs including very little continuous static current being consumed. In certain examples, such an ADC is described herein provides for a 10× lower power consumption in comparison to prior art ADC technologies. Such extremely low power consumption implementations may be particularly well-suited for certain applications such as bio-medical applications including sensing of vital signs on the patient, low current sensors, remote sensors, etc.

In addition, note that while such an ADC as described herein provides for significant improvement in a reduction in power consumption in comparison to prior art ADCs (e.g., including prior art ADCs such as successive approximation resolution (SAR) ADCs, D-sigma modulator ADCs, pipeline ADCs, etc.), such an ADC is described herein may be implemented as a general-purpose ADC in any of a variety of applications. Moreover, the bandwidth of analog signals that may be sensed using such an ADC is described herein is extremely broad, ranging from DC up to and over 10 MHz. In certain particular examples, such an ADC has described herein is implemented for very low frequency measurements, such as from DC up to 1 kHz.

Note also that an ADC as described herein may be designed and tailored particularly for a desired digital signal resolution to be generated based on a particular bandwidth to be sampled. In general, there may be a trade-off between bandwidth and power consumption within a particularly designed ADC. Consider an example in which a very high resolution digital signal is desired for a relatively low sampling bandwidth versus another example in which a relatively low resolution digital signal is desired for a relatively high sampling bandwidth. For example, consider a particularly designed ADC to provide a digital signal having 16-bit resolution for a sampling bandwidth below 100 kHz, then such an ADC may be implemented to consume less than 1 µW of energy.

Such an ADC may be appropriately designed to meet criteria for a particular application. Consider an example in which a 24-bit digital signal is desired for a relatively low sampling bandwidth from DC up to 100 kHz. Consider another example in which a 12 bit digital signal desired for a relatively higher sampling bandwidth from DC up to 1 MHz. In comparing these two examples, as the sampling bandwidth is extended higher and higher, the ADC will consume more current and thereby be more power consumptive. Depending on the particular application at hand, a relatively low sampling bandwidth may be acceptable for the particular application at hand, and very significant power consumption savings may be achieved. Generally speaking, a trade-off in design implementation may be viewed as higher resolution/lower sampling bandwidth/lower power consumption versus higher resolution/higher sampling bandwidth/higher power consumption.

In addition, note that many of the examples of an ADC included herein operate based on sensing a current signal as opposed to a voltage signal. In addition, when the ADC is implemented in an application to sense a voltage signal, an appropriately implemented voltage to current transforming element, such as the trans-impedance amplifier that is operative to transform voltage to current, or vice versa, may be implemented to generate a current signal from a voltage signal in any particular desired application.

In any of the various diagrams, note that such a load 32 may be of any of a variety of types including electrode, a sensor, a transducer, etc. Generally speaking, such a load 32 may be any of a variety of types of components. Examples of such components may include any one or more of sources, devices, systems, etc. that has an associated analog signal that may be sensed and converted to a digital signal including a sensor, a computing device, a circuit, etc. within any type of application context including industrial, medical, communication system, computing device, etc.

Also, note that such a load 32 as depicted within any diagram herein may be energized or powered based on the signal provided from the ADC or alternatively powered by another source such as a battery, external power source, etc. For example, consider the lower left-hand portion of the diagram and need demarcation between the load domain and the ADC domain, such that the load 32 is connected to the ADC via a single line. In certain examples, the ADC is implemented to facilitate single-line sense functionality such that a load signal 412-1 is provided to the load 32 for sensing only, and any effect 414-1 on that load signal is sensed and detected by the ADC. In such an example is this, power is provided to the load 32 from an external source.

Referring again to the top portion of the diagram, the ADC is connected to or coupled to a load 32 via single line such that the ADC is configured to provide a load signal 412 via that single line and simultaneously to detect any effect 414 on that load signal via a single line. For example, the load signal 412 is an analog current signal. An analog capacitor, C, is implemented to be charged in accordance with the load signal 412. Note that such an analog capacitor may alternatively be a load capacitance from the load 32 itself, such that a separate analog capacitor, C, is not needed when the load 32 itself provides a sufficient load capacitance.

In an example of operation and implementation, a load voltage, Vload, is generated based on any effect 414 on that load signal charging the capacitor. This load voltage, Vload, serves as an input voltage, Vin, to one of the inputs of a comparator that also receives a reference signal, Vref (e.g., a voltage reference signal). Note that the reference signal, Vref, may be internally generated, provided from an external source, provided from a processing module 24, etc. The comparator compares the input voltage, Vin, to the reference signal, Vref, and outputs a signal that is based on any difference between the input voltage, Vin, to the reference signal, Vref, that gets processed by a digital circuit 410 to generate a digital output (Do) 1 signal that may be viewed as being a digital stream of 0 s and/or is at a clock rate (CLK) at which the digital circuit 410 is clocked.

For example, consider that the input voltage, Vin, is greater than the reference signal, Vref, then the comparator output signal would be positive (e.g., such as a positive rail or power supply voltage of the ADC). Alternatively, consider that the input voltage, Vin, is less than or equal to the reference signal, Vref, then the comparator output signal would be negative (e.g., such as a negative rail or power supply voltage of the ADC).

In another example, consider that the input voltage, Vin, is greater than the reference signal, Vref, then the comparator output signal would be positive or negative (e.g., such as a positive or negative rail or power supply voltage of the ADC). Alternatively, consider that the input voltage, Vin, is less than or equal to the reference signal, Vref, then the comparator output signal would be zero (e.g., such as a ground voltage potential).

Generally speaking, the combined operation of the comparator and the digital circuit 410 may be viewed as performing the analog to digital conversion of a signal that is the difference (e.g., and error voltage, Ve) between the input voltage, Vin, and the reference signal, Vref (e.g., Ve=Vref−Vin) to generate a digital signal of a particularly desired resolution, which may be viewed as M bits, where M is a positive integer greater than or equal to 1.

A processing module 24 is operative to process the Do 1 to generate a digital output (Do) 2. Note that the processing module 24 may be implemented in any of a variety of examples to perform any desired digital signal processing on the Do 1 to generate the Do 2. Examples of such digital signal processing may be increasing the output resolution (e.g., consider Do 1 having a resolution of M bits and Do 2 having a resolution of N bits, where N and M are both positive integers, where M is a positive integer greater than or equal to 1, and N is greater than M), performing filtering on the Do 1 to generate the Do 2 (e.g., such as low pass filtering or bandpass filtering based on certain parameters such as a particular frequency cut off for low pass filtering or a particular frequency range for bandpass filtering).

The processing module 24 provides the Do 2 to an N-bit digital to analog converter (DAC) 420. In some examples, the N-bit DAC 420 has a resolution of N<8 bits. This N-bit DAC 420, based on the Do 2 provided from the processing module 24, forces and output current to the load 32 that follows or tracks the load signal 412 due to the operation of the comparator that compares the input voltage, Vin, to the reference signal, Vref, and, in conjunction with the digital circuit 410, generates Do 1.

From certain perspectives, considering the Do 1 and the Do 2, the Do 1 may be viewed as a digital signal corresponding to the unfiltered load current signal including quantization noise, and the Do 2 may be viewed as another digital signal corresponding to a filtered load current signal.

In this diagram, the positive input of the comparator is driven by the reference signal, Vref. The load voltage, Vload, will follow the reference signal, Vref, based on the comparator output signal that corresponds to the difference or error between the input voltage, Vin, and the reference signal, Vref. In many examples, the difference between the input voltage, Vin, and the reference signal, Vref, is very small (e.g., approaching 0, very close to 0, or actually 0) based on the Delta-sigma modulation operation of the comparator and the digital circuit 410. For example, when there is any difference between the input voltage, Vin, and the reference signal, Vref, the ADC adapts/modifies the output current from the N-bit DAC 420 to match the current of the load so that difference or error between the input voltage, Vin, and the reference signal, Vref, will be forced to 0.

Note that the comparator and the digital circuit 410 may be implemented using one or more other components and other examples while still providing the same overall functionality of the ADC. The following diagram shows some alternative possible examples of how the comparator and the digital circuit 410 may be implemented.

Note that this implementation of an ADC includes very few number of analog components. For example, there may be instances in which no capacitors required whatsoever given that the load 32 inherently includes sufficient load capacitance to generate the load voltage, Vload. In certain implementations, the comparator is implemented by a component that performs analog to digital conversion of the load voltage, Vload, directly thereby further reducing the number of analog components within the ADC.

Given the small number of analog components, such an ADC consumes little or no continuous static power thereby facilitating very low power consumption. The only static current being consumed is by the N-bit DAC 420. This N-bit DAC 420 drives and output current that is same as the sensed load current thereby tracking or following the load current. Therefore, within implementations in which the load current is small, so will the corresponding output current from the N-bit DAC 420 be small. The smaller the current provided from the N-bit DAC 420, which is based on the sensed load current, the lower the power consumption of the ADC. Note that there are certainly alternative implementations of an ADC that will consume some static current, such as when an M-bit analog to digital converter (ADC) is used or some other component that is implemented to perform the analog-to-digital conversion of the signal Vin to Do 1.

Also, note that the amount of power consumed by the DAC, particularly the digital power consumed by the DAC, scales with the clock rate, CLK. Note also that applications that are implemented to perform sensing of ADC signal, such as sensing ADC current signal, the clock frequency can be extremely low (e.g., within the range of 1 kHz to 100 kHz) thereby providing for a very small digital power consumption.

Figure 5A:
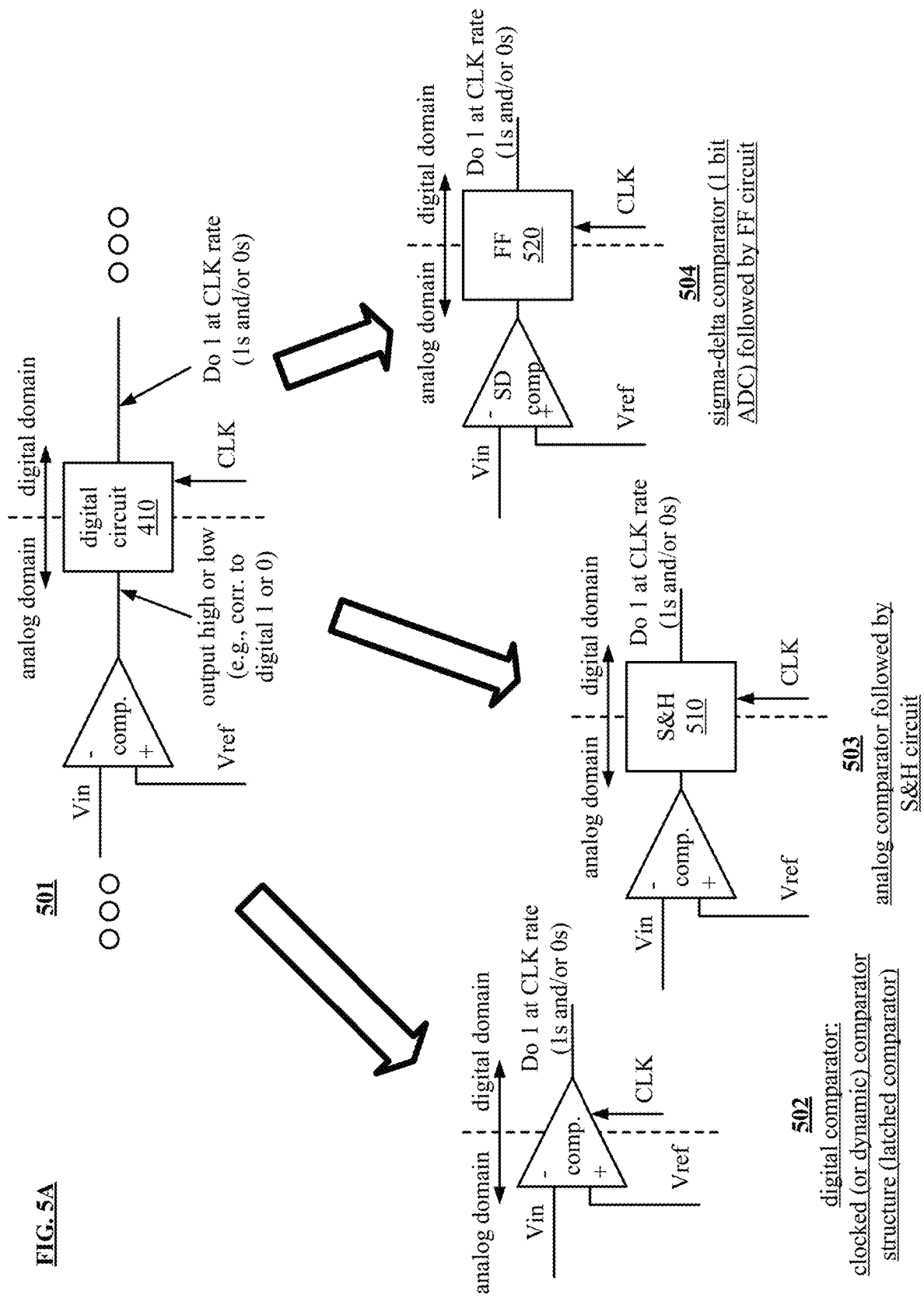
FIG. 5A is a schematic block diagram showing alternative embodiments of various components may be implemented within an ADC in accordance with the present disclosure.

FIG. 5 is a schematic block diagram showing alternative embodiments 501, 502, 503, and 504 of various components may be implemented within an ADC in accordance with the present disclosure. Considering reference numeral 501, a comparator operates in cooperation with the digital circuit 410 as described above such that the combined operation of the comparator and the digital circuit 410 may be viewed as performing the analog to digital conversion of a signal that is the difference (e.g., Ve) between the input voltage, Vin, and the reference signal, Vref (e.g., Ve=Vref−Vin) to generate a digital signal of a particularly desired resolution, which may be viewed as M bits, where M is a positive integer greater than or equal to 1.

However, note that comparator and the digital circuit 410 may be implemented using any of a variety of other means while still facilitating proper operation of an ADC. With respect to reference numeral 502, a digital comparator, which may alternatively be described as a clock (or dynamic) comparator structure (latched comparator) is shown. This singular device performs the operation of both a comparator and the digital circuit 410 within a single device. For example, the digital comparator is clocked at a particular clocking frequency (CLK) and outputs a stream of 1 s and/or 0 s based on the comparison of Vref and Vin. In comparison to a comparator that operates continuously and that will output one of two values, such as either a high signal or low signal, continually as a function of time, a digital comparator outputs a 1 or 0 at each clock cycle based on the comparison of Vref and Vin in accordance with generating the Do 1 (e.g., 1 when Vref>Vin and 0 when Vref<=Vin, or vice versa). Also note that by only clocking such a digital comparator at certain intervals, a higher accuracy and lower power consumption can be achieved in comparison to a comparator that operates continuously.

With respect to reference numeral 503, the output of the comparator is provided to a sample and hold circuit (S&H) 510. Generally speaking, a S&H 510 holds, locks, or freezes its value at a constant level for a specified minimum period of time. This signal may be viewed as interpreted as a digital stream of 1 s and/or 0 s at the clocking frequency (CLK) in accordance with generating the Do 1. Note that such a S&H 510 may be implemented in a variety of ways including a circuit that stores electric charge and a capacitor and also employs one or more switching elements such that the circuit stores electric charge is built up over each of certain intervals, and the switching element connects the output of the circuit that stores electric charge to the output at certain in the boroughs such as the clocking frequency (CLK) in accordance with generating the Do 1.

With respect to reference numeral 504, the comparator and the digital circuit for 10 are replaced with a sigma-delta comparator, such as a one bit ADC, followed by a flip-flop circuit (FF) 520. The sigma-delta comparator provides a high or low signal to the FF 520 based on comparison of Vref and Vin, and the FF 520 outputs a 1 or 0 at each clock cycle such as the clocking frequency (CLK) based on the comparison of Vref and Vin in accordance with generating the Do 1.

Generally speaking, note that the implementation of a comparator and the digital circuit 410 as shown within any of the diagrams herein may be alternatively implemented in a variety of different ways including those shown within this diagram and/or their equivalents.

Figure 5B:
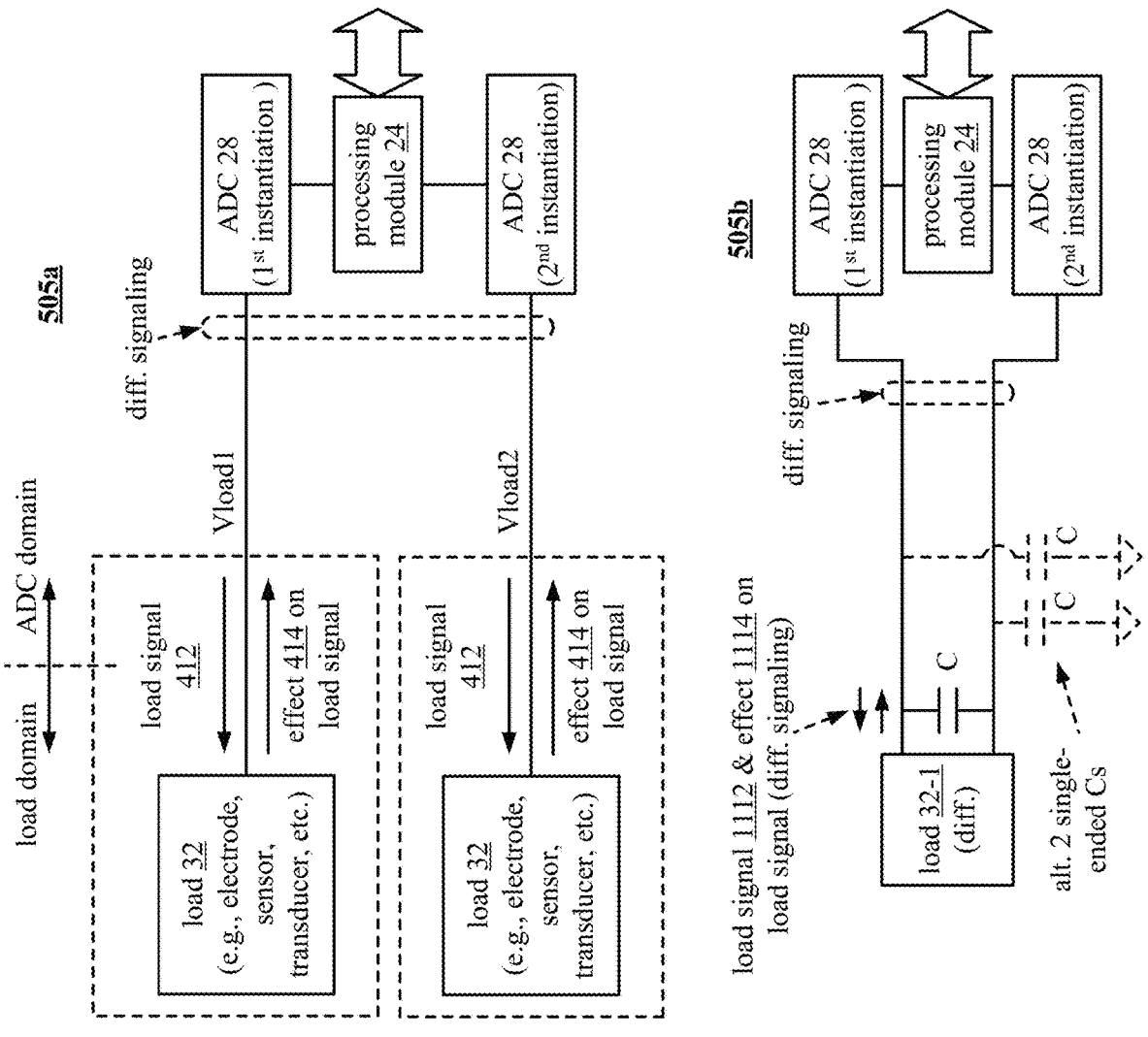
FIG. 5B is a schematic block diagram showing alternative embodiments of servicing differential signaling using ADCs in accordance with the present disclosure.

FIG. 5B is a schematic block diagram showing alternative embodiments 505a and 505b of servicing differential signaling using ADCs in accordance with the present disclosure. In addition to servicing and sensing single-ended lines and generating digital signals based thereon using ADCs as described herein, note that servicing and sensing of signals may also be performed. For example, with respect to reference numeral 505a, a first instantiation of an ADC 28 and the second instantiation of an ADC 28 are each respectively coupled via a respective single line to a different perspective load 32. Two respective load voltages, Vload1 and Vload2, are respectively received by the first and second instantiations of an ADC 28. Note that the first and second instantiation of an ADC 28 may be the same or may be different. Each respective instantiation of an ADC 28 in this example is operative to service and sense a respective single-ended line. Together, the first and second instantiations of an ADC 28 are operative to sense a differential signal that is based on the two load voltages, Vload1 and Vload2, and to generate a corresponding digital signal based thereon. In certain examples a processing module 24 is implemented to combine a first digital signal that is based on Vload1 and that is generated by the first instantiation of an ADC 28 and a second digital signal that is based on Vload2 and that is generated by the second instantiation of an ADC 28 to generate a resultant digital signal that corresponds to the differential voltage between the two load voltages, Vload1 and Vload2 (e.g., Vdiff=Vload1−Vload2, or Vdiff=Vload2−Vload1).

As another example, with respect to reference numeral 505b, a differential load 32-1 is serviced such that the two signal lines corresponding to the differential signaling provided by the differential load 32-1 are respectively provided to a first instantiation of an ADC 28 and a second instantiation of an ADC 28. Similarly, a processing module 24 may be implemented to generate a resulting digital signal that corresponds to the differential voltage associated with the differential load 32-1. The first instantiation of an ADC 28 in the second instantiation of an ADC 28 operate cooperatively to provide a load signal 1112 and to detect any effect 1114 on the load signal that is based on the differential load 32-1. A capacitor, C, is also implemented across the differential signal lines of the differential load 32-1. In alternative implementations, two respective single-ended capacitors, C, are respectively connected to the differential signal lines and to ground instead of the capacitor, C, connected to the differential lead lines (e.g., a first single ended capacitor, C, connected to one of the differential signal lines and to ground, and a second single ended capacitor, C, also connected to the other of the differential signal lines and to ground).

Note that any example, embodiment, etc. of any ADC described herein that is operative to sense an analog signal via a single line may be implemented within the first instantiation and the second instantiation of an ADC 28 in either of these examples corresponding to reference numerals 505a and 505b and/or their equivalents.

In an example of operation and implementation, an ADC (e.g., consider the ADC of FIG. 4) includes a capacitor that is operably coupled to a load and configured to produce a load voltage based on charging by a load current and a digital to analog converter (DAC) output current. In some examples, the ADC is coupled to the load via a single line. The ADC also includes a comparator. When enabled, the comparator operably coupled and configured to receive the load voltage via a first input of the comparator, receive a reference voltage via a second input of the comparator, and compare the load voltage to the reference voltage to generate a comparator output signal.

The ADC also includes a digital circuit that is operably coupled to the comparator. When enabled, the digital circuit operably coupled and configured to process the comparator output signal to generate a first digital output signal that is representative of a difference between the load voltage and the reference voltage.

The ADC also includes one or more processing modules operably coupled to the digital circuit and to memory, which may be included within the ADC or external to the ADC. When enabled, the one or more processing modules is configured to execute the operational instructions to process the first digital output signal to generate a second digital output signal that is representative of the difference between the load voltage and the reference voltage, wherein the second digital output signal includes a higher resolution than the first digital output signal.

The ADC also includes an N-bit digital to analog converter (DAC) that is operably coupled to the one or more processing modules. When enabled, the N-bit DAC operably coupled and configured to generate the DAC output current based on the second digital output signal. Note that N is a positive integer. The DAC output current tracks the load current, and the load voltage tracks the reference voltage.

Also, in some examples, the one or more processing modules, when enabled, is further configured to process the first digital output signal in accordance with performing band pass filtering or low pass filtering to generate the second digital output signal that is representative of the difference between the load voltage and the reference voltage.

In alternative examples, the comparator includes a sigma-delta comparator, and the digital circuit includes a clocked flip flop. In even other examples, a digital comparator includes both the comparator and the digital circuit (e.g., the digital comparator is operative to perform the functionality of both the comparator and the digital circuit). When enabled, the digital comparator operably coupled and configured to receive the load voltage via a first input of the comparator, receive a reference voltage via a second input of the comparator, and compare the load voltage to the reference voltage to generate the first digital output signal that is representative of the difference between the load voltage and the reference voltage.

In addition, in certain examples, the ADC includes a decimation filter coupled to the one or more processing modules. When enabled, the decimation filter is operably coupled and configured to process the second digital output signal to generate another digital output signal having a lower sampling rate and a higher resolution than the second digital output signal. Alternative to or in addition to, another decimation filter is coupled to the digital circuit. When enabled, the other decimation filter the operably coupled and configured to process the first digital output signal to generate another digital output signal having a lower sampling rate and a higher resolution than the first digital output signal.

Figure 6:
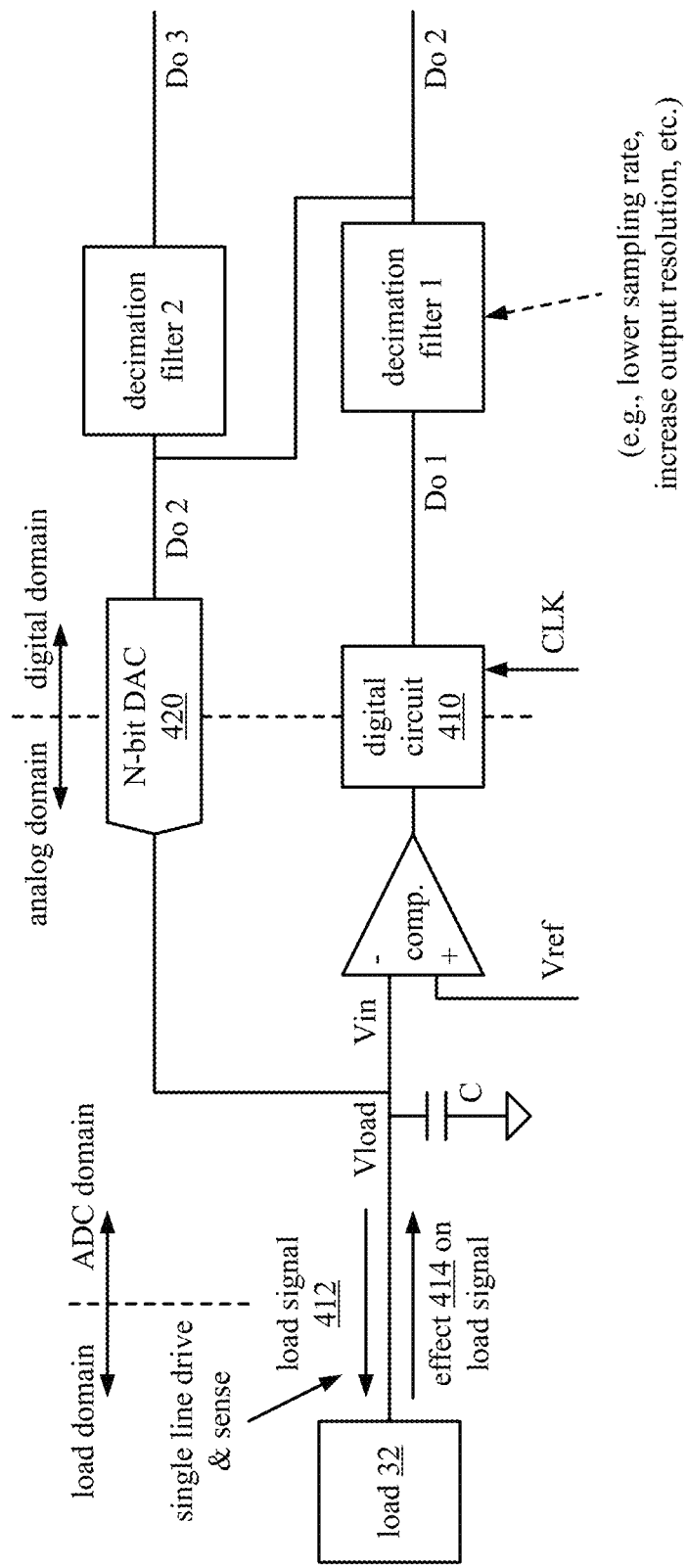
FIG. 6 is a schematic block diagram of another embodiment of an ADC that includes one or more decimation filters in accordance with the present disclosure.

FIG. 6 is a schematic block diagram of another embodiment 600 of an ADC that includes one or more decimation filters in accordance with the present disclosure. This diagram has similarities with respect to FIG. 4 with at least one difference being that a decimation filter 1 and/or a decimation filter 2 are implemented to process the Do 1 and the Do 2. For example, a decimation filter may be implemented to process a digital signal thereby lowering the sample rate thereof and increasing the output resolution. Consider a digital signal having a 12 bit resolution and a 100 kHz sampling rate. In one example, a decimation filter may operate to increase the resolution of that digital signal to be 24-bit resolution with a lower sampling rate of 50 kHz. In another example, decimation filter may operate to increase the resolution of that digital signal to be 18-bit resolution with a lower sampling rate of 75 kHz. generally speaking, any desired transformation of sampling rate and output resolution may be made performed using one or more decimation filters in accordance with any of the various examples of ADCs as described herein. In certain examples, only a decimation filter 1 is included thereby processing the Do 1 to generate the Do 2. In other examples, both a decimation filter 1 is included thereby processing the Do 1 to generate the Do 2 and a decimation filter 2 is included thereby processing the Do 2 to generate a Do 3 (e.g., Do 3 having a lower sampling rate and increased output resolution in comparison to the Do 2).

Figure 7:
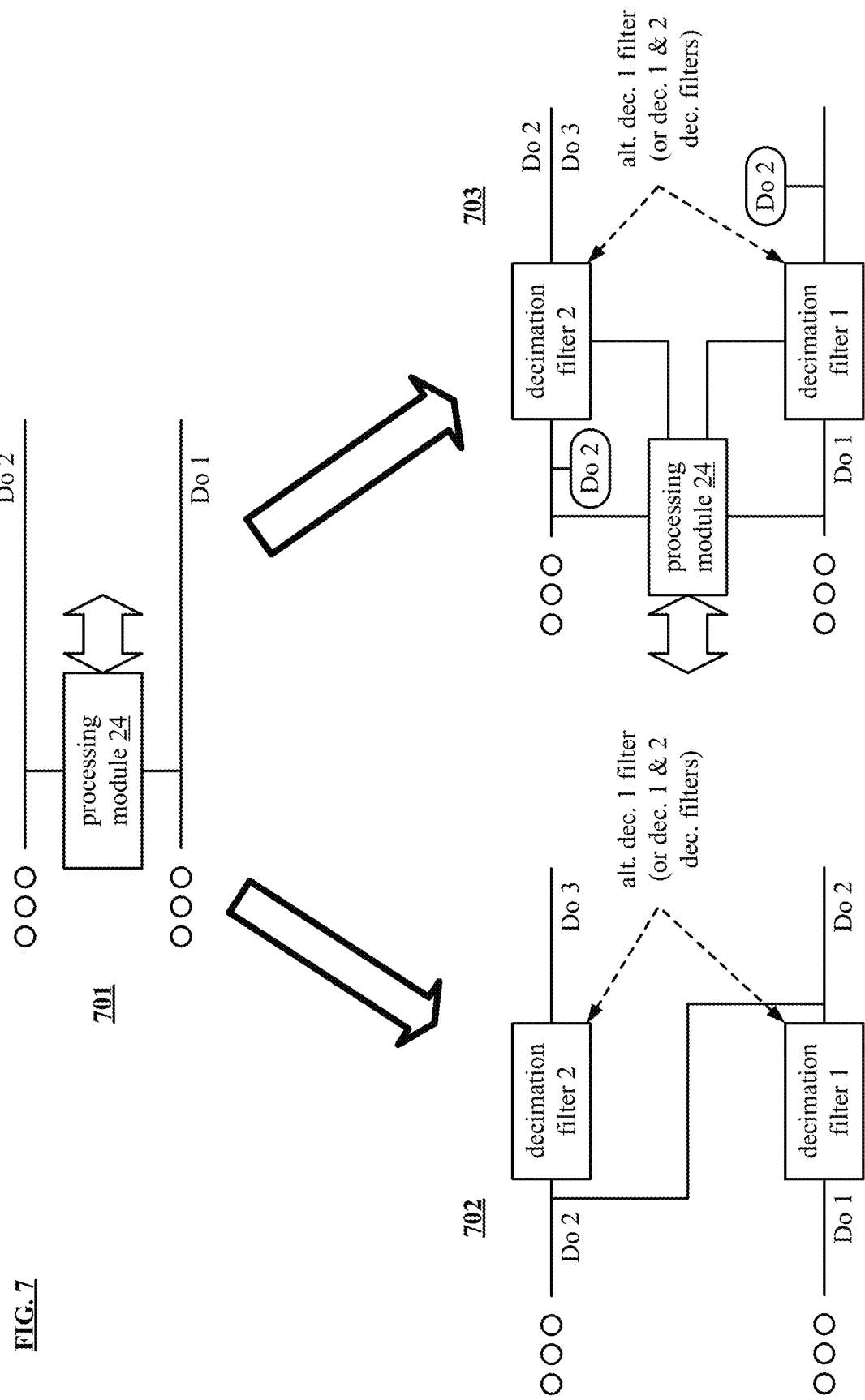
FIG. 7 is a schematic block diagram showing alternative embodiments of one or more decimation filters and/or processing modules that may be implemented to perform digital domain processing within an ADC in accordance with the present disclosure.

FIG. 7 is a schematic block diagram showing alternative embodiments 701, 702, and 703 of one or more decimation filters and/or processing modules that may be implemented to perform digital domain processing within an ADC in accordance with the present disclosure. With respect to reference numeral 701, a processing module 24 may be implemented to perform any of a variety of different digital signal processing operations on the Do 1 to generate the Do 2 such as decimation filtering, low pass filtering, bandpass filtering, etc. However, note that such an implementation of the output signals, such as Do 1 and the Do 2 may be implemented in different configurations as desired in particular applications.

For example, with respect to reference numeral 702, a decimation filter 1 and a decimation filter 2 may be implemented. As described above, only a decimation filter 1 may s included thereby processing the Do 1 to generate the Do 2. In other examples, both a decimation filter 1 is included thereby processing the Do 1 to generate the Do 2 and a decimation filter 2 is included thereby processing the Do 2 to generate a Do 3 (e.g., Do 3 having a lower sampling rate and increased output resolution in comparison to the Do 2).

With respect to reference numeral 703, the processing module 24 is configured to control the operation of the decimation filter 1 and decimation filter 2. For example, the processing module 24 is configured to the manner in which decimation filtering may be performed by the decimation filter 1 and/or decimation filter 2 (e.g., including the manner of conversion of digital signal resolution, the modification of sampling rate, etc.).

Note that any of the respective implementations shown within this diagram may be implemented within any other of the appropriate diagrams of an ADC as described herein.

Figure 8:
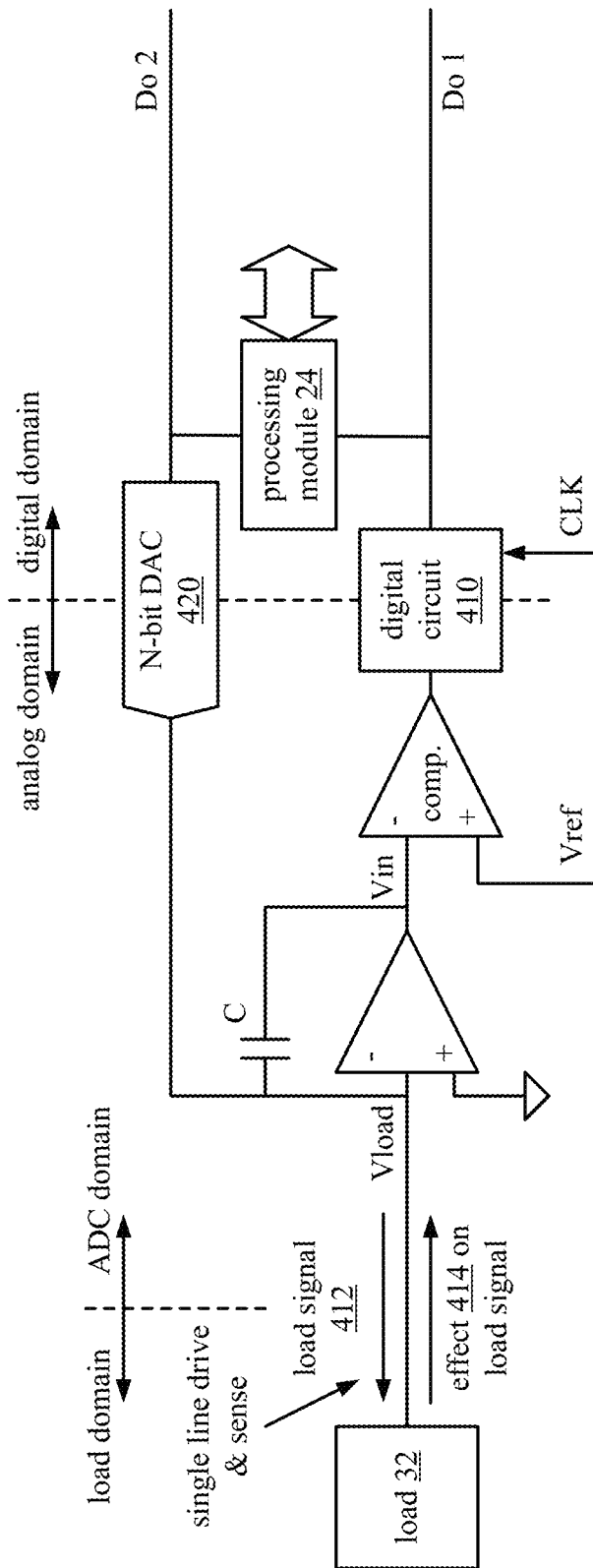
FIG. 8 is a schematic block diagram of another embodiment of an ADC in accordance with the present disclosure.

FIG. 8 is a schematic block diagram of another embodiment 800 of an ADC in accordance with the present disclosure. This diagram is similar to that of FIG. 4 with at least one difference being that the capacitor, C, is replaced by an integrator. The integrator is implemented as an operational amplifier with a feedback capacitor, C. The use of the operational amplifier in place of only the capacitor, C, may be used for applications that are tailored to serve greater power than that of FIG. 4. Generally speaking, the feedback capacitor, C, implemented in cooperation with the operational amplifier serves a similar purpose of the capacitor, C, in FIG. 4 of being charged based on the load current and the output current from the N-bit DAC 420 thereby generating the Vin to be provided to the comparator and compared with Vref.

In an example of operation and implementation, an ADC (e.g., consider the ADC of FIG. 800) includes an operational amplifier (op amp) that is operably coupled to a load via a first op amp input. Also, a capacitor is operably coupled to the first op amp input and an op amp output. When enabled, the op amp is operably coupled and configured to generate an output voltage at the op amp output that corresponds to a load voltage that is based on charging of the capacitor by a load current and a digital to analog converter (DAC) output current. In some examples, the ADC is coupled to the load via a single line.

The ADC also includes a comparator that is operably coupled to the op amp. When enabled, the comparator operably coupled and configured to receive the output voltage via a first input of the comparator, receive a reference voltage via a second input of the comparator, and compare the load voltage to the reference voltage to generate a comparator output signal.

The ADC also includes a comparator a digital circuit that is operably coupled to the comparator. When enabled, the digital circuit is operably coupled and configured to process the comparator output signal to generate a first digital output signal that is representative of a difference between the load voltage and the reference voltage.

The ADC also includes a comparator one or more processing modules operably coupled to the digital circuit and to memory, which may be included within the ADC or external to the ADC. When enabled, the one or more processing modules is configured to execute the operational instructions to process the first digital output signal to generate a second digital output signal that is representative of the difference between the load voltage and the reference voltage. Note that the second digital output signal includes a higher resolution than the first digital output signal.

The ADC also includes an N-bit digital to analog converter (DAC) that is operably coupled to the one or more processing modules. When enabled, the N-bit DAC operably coupled and configured to generate the DAC output current based on the second digital output signal. Note that N is a positive integer. Also, the DAC output current tracks the load current, and the load voltage tracks the reference voltage.

In some examples, the one or more processing modules, when enabled, is further configured to process the first digital output signal in accordance with performing band pass filtering or low pass filtering to generate the second digital output signal that is representative of the difference between the load voltage and the reference voltage.

In some examples, the comparator includes a sigma-delta comparator, and the digital circuit includes a clocked flip flop. Also, in some other examples, a digital comparator includes both the comparator and the digital circuit (e.g., the digital comparator is operative to perform the functionality of both the comparator and the digital circuit). When enabled, the digital comparator operably coupled and configured to receive the load voltage via a first input of the comparator, receive a reference voltage via a second input of the comparator, and compare the load voltage to the reference voltage to generate the first digital output signal that is representative of the difference between the load voltage and the reference voltage.

In addition, in certain examples, the ADC includes a decimation filter coupled to the one or more processing modules. When enabled, the decimation filter is operably coupled and configured to process the second digital output signal to generate another digital output signal having a lower sampling rate and a higher resolution than the second digital output signal. Alternative to or in addition to, another decimation filter is coupled to the digital circuit. When enabled, the other decimation filter the operably coupled and configured to process the first digital output signal to generate another digital output signal having a lower sampling rate and a higher resolution than the first digital output signal.

Figure 9:
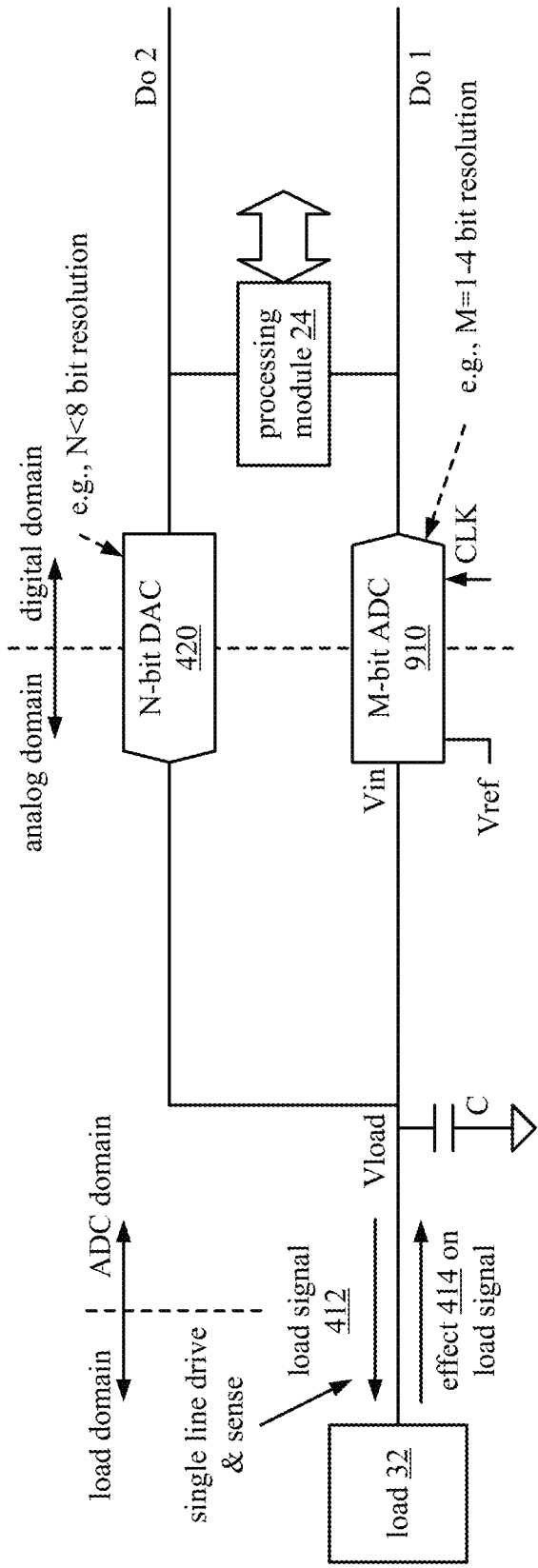
FIG. 9 is a schematic block diagram of another embodiment of an ADC in accordance with the present disclosure.

FIG. 9 is a schematic block diagram of another embodiment 900 of an ADC in accordance with the present disclosure. This diagram has certain similarities with one or more of the previous diagrams with at least one difference being that a comparator and the digital circuit 410, or a functionally equivalent component to the comparator and the digital circuit 410, is replaced by a low resolution analog to digital converter (ADC), specifically, an M-bit ADC 910, where M is a positive integer greater than or equal to 1. In certain particular examples, M is a positive integer within the range of 1-4 (e.g., 1, 2, 3, or 4). Also, in certain particular examples, N of the N-bit DAC 420 is less than or equal to M. In certain specific examples, N<8 bit resolution. For example, if N=4, then M=3, 2, or 1. The Do 2 may be viewed as a high-resolution digital signal (N bit resolution) compared to the Do 1 (M bit resolution), such that M<N. In addition, in some examples, the Do 2 is a modified version of the Do 1 after having undergone any desired digital signal processing within the processing module 24.

Note that the M-bit ADC 910 is operative to generate the Do 1 as being an error signal that corresponds to a difference between Vin and Vref and having a resolution of M bits and that is output based on the clocking rate, CLK. For example, the Do 1 is a digital signal that corresponds to corresponds to an error signal, Ve, such that Ve=Vref−Vin or Vin−Vref.

The use of such an M-bit ADC 910 provides many performance improvements for certain applications including a reduction of quantization noise and an increase of the output resolution of the ADC, particularly with respect to the Do 1. For example, instead of Do 1 being a single bit resolution digital signal (e.g., a digital stream of 1 s and/or 0 s), the Do 1 in this diagram is a digital signal having a higher resolution (e.g., of 2, 3, or 4 bits). In some examples, the Do 1 is then provided to the processing module 24, and the processing module 24 is configured to perform any desired digital signal processing operation on the Do 1 to generate the Do 2 (e.g., increase the output resolution and lower the sampling rate, perform low pass filtering, perform bandpass filtering, etc.).

In this diagram, note that the Do 1 may be passed directly to the N-bit DAC 420 such that the Do 1 is used to drive the N-bit DAC 420. However, in certain examples, the Do 2 is used to drive the N-bit DAC 420 such as when it is a filtered and/or digital signal processed version of the Do 1.

In an example of operation and implementation, an ADC (e.g., the ADC of FIG. 900) includes a capacitor that is operably coupled to a load and configured to produce a load voltage based on charging by a load current and a digital to analog converter (DAC) output current. In some examples, the ADC is coupled to the load via a single line.

The ADC also includes an M-bit analog to digital converter (ADC). When enabled, the M-bit ADC operably coupled and configured to receive the load voltage, receive a reference voltage, and compare the load voltage to the reference voltage and generate a first digital output signal that is representative of a difference between the load voltage and the reference voltage.

The ADC also includes a processing module operably coupled to the digital circuit and to memory, which may be included within the ADC or external to the ADC. When enabled, the processing module is configured to execute the operational instructions to process the first digital output signal to generate a second digital output signal that is representative of the difference between the load voltage and the reference voltage. Note that the second digital output signal includes a higher resolution than the first digital output signal.

The ADC also includes an N-bit digital to analog converter (DAC) that is operably coupled to the processing module. When enabled, the N-bit DAC is operably coupled and configured to generate the DAC output current based on the second digital output signal. Note that the DAC output current tracks the load current, and the load voltage tracks the reference voltage. N is a first positive integer, and M is a second positive integer greater than or equal to 1. In some examples, N is greater than M. In other examples, N is the first positive integer that is less than or equal to 8, and M is the second positive integer that is greater than or equal to 1 and less than or equal to 4.

In even other examples, the one or more processing modules, when enabled, is further configured to process the first digital output signal in accordance with performing band pass filtering or low pass filtering to generate the second digital output signal that is representative of the load voltage.

In addition, in certain examples, the ADC includes a decimation filter coupled to the one or more processing modules. When enabled, the decimation filter is operably coupled and configured to process the second digital output signal to generate another digital output signal having a lower sampling rate and a higher resolution than the second digital output signal. Alternative to or in addition to, another decimation filter is coupled to the digital circuit. When enabled, the other decimation filter the operably coupled and configured to process the first digital output signal to generate another digital output signal having a lower sampling rate and a higher resolution than the first digital output signal.

Figure 10:
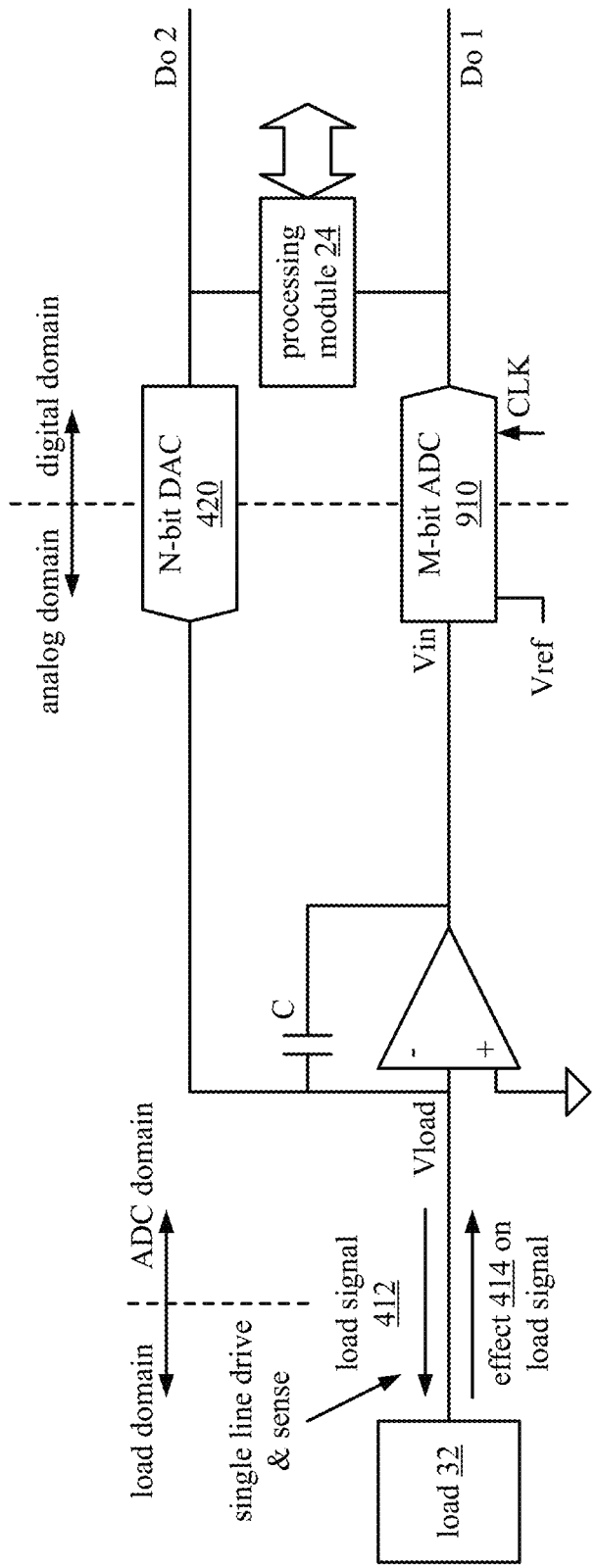
FIG. 10 is a schematic block diagram of another embodiment of an ADC in accordance with the present disclosure.

FIG. 10 is a schematic block diagram of another embodiment 1000 of an ADC in accordance with the present disclosure. This diagram is similar to the previous diagram with at least one difference being that the capacitor, C, is replaced by an integrator. The integrator is implemented as an operational amplifier with a feedback capacitor, C. The use of the operational amplifier in place of only the capacitor, C, may be used for applications that are tailored to serve greater power than that of the previous diagram. Generally speaking, the feedback capacitor, C, implemented in cooperation with the operational amplifier serves a similar purpose of the capacitor, C, in the previous diagram of being charged based on the load current and the output current from the N-bit DAC 420 thereby generating the Vin to be provided to the comparator and compared with Vref.

In addition, with respect to all of these examples of an ADC, the ADC operates by providing an output current to the load 32 to cancel out the load current. This may be viewed as providing an output current that is equal to and opposite polarity to the load current. Again, note that such an ADC may be implemented not only to sense an analog signal associated with the load 32 but also to provide power and/or energy to the load 32 within implementations where the load 32 is not energized via another source. In some examples, this providing of power and/or energy from the ADC to the load 32 is performed simultaneously via a single line via which the ADC senses and analog signal associated with the load 32. Also, such an ADC may be implemented to perform sensing only of an analog signal associated with the load 32 without providing power and/or energy to the load 32.

Figure 11:
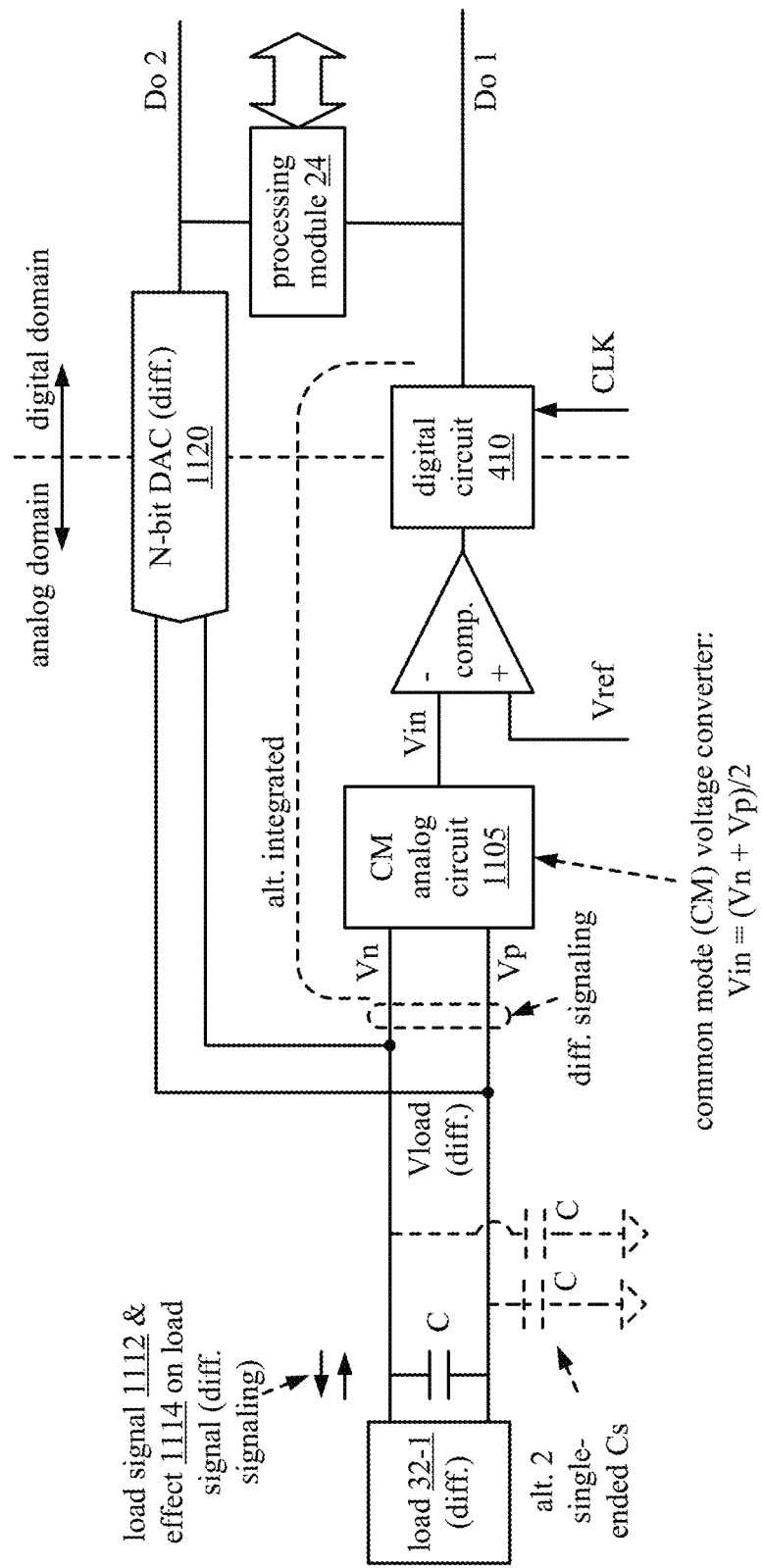
FIG. 11 is a schematic block diagram of an embodiment of an ADC that is operative to process an analog differential signal in accordance with the present disclosure.

FIG. 11 is a schematic block diagram of an embodiment 1100 of an ADC that is operative to process an analog differential signal in accordance with the present disclosure. This diagram shows an implementation of an ADC operating on a differential load 32-1 such that the ADC provides a load signal 1112 to the differential load 32-1 and also detects any effect 1114 on that load signal. In this diagram, a capacitor, C, is connected to the differential lead lines of the differential load 32-1. In alternative implementations, two respective single-ended capacitors, C, are respectively connected to the differential signal lines and to ground instead of the capacitor, C, connected to the differential lead lines (e.g., a first single ended capacitor, C, connected to one of the differential signal lines and to ground, and a second single ended capacitor, C, also connected to the other of the differential signal lines and to ground).

Also, the N-bit DAC 420 is replaced with a differential N-bit DAC 1120, wherein N is a positive integer. The N-bit DAC 420 is operative to generate a differential output current signal that is provided to the differential load 32-1 based on the Do 2.

A differential signal may be viewed as being composed of two respective voltages corresponding to the two differential signal lines, Vp and Vn (e.g., sometimes referred to as a positive voltage, Vp, is a negative voltage, Vn). In this diagram, a common mode (CM) analog circuit 1105 is implemented to convert the differential signal to a single-ended signal. For example, the CM analog circuit 1105 is operative to generate an input voltage, Vin, such that Vin=(Vn+Vp)/2. In some examples, note that the CM analog circuit 1105, the comparator, and the digital circuit 410 are all be implemented within a singular component or device that is operative to process a differential signal and to generate the Do 1 based thereon.

Figure 12:
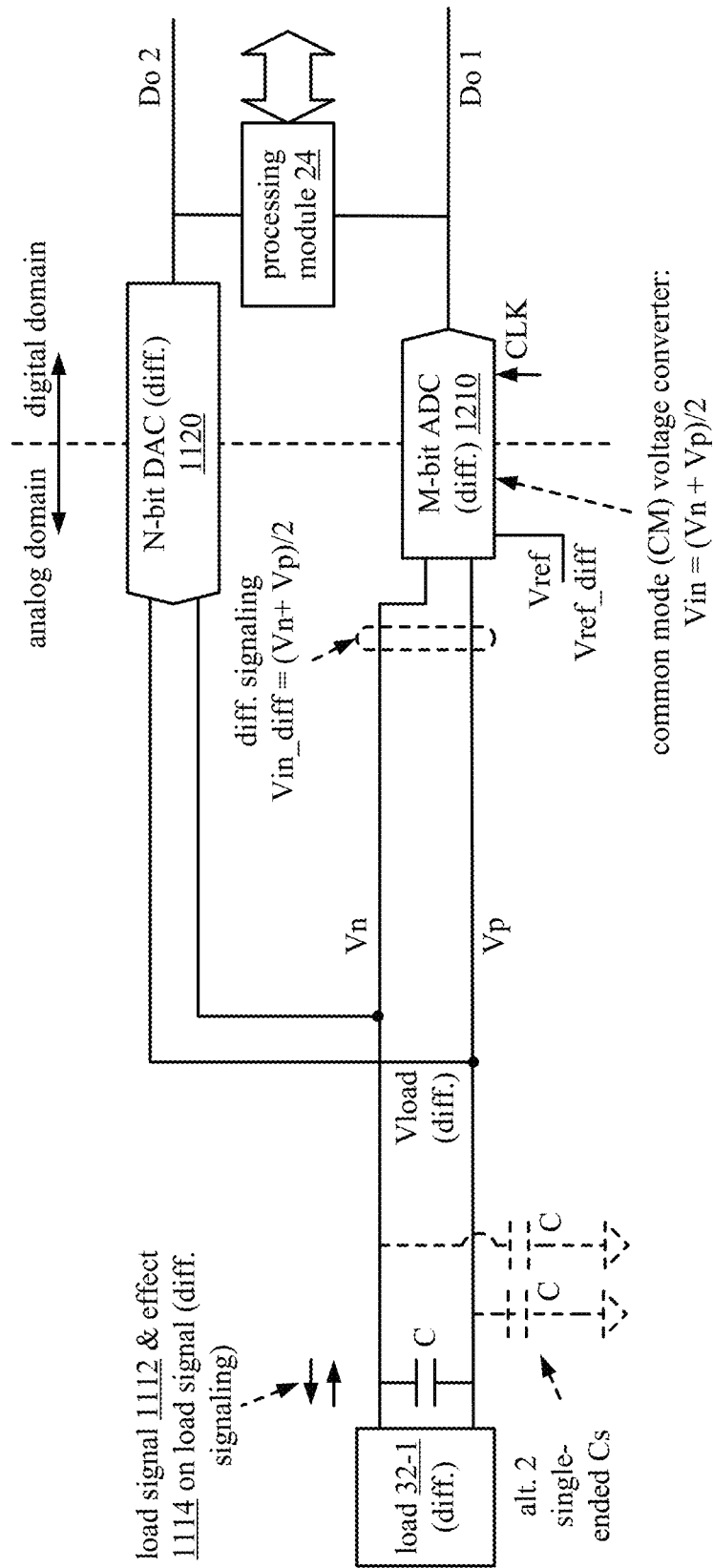
FIG. 12 is a schematic block diagram of another embodiment of an ADC that is operative to process an analog differential signal in accordance with the present disclosure.

FIG. 12 is a schematic block diagram of another embodiment 1200 of an ADC that is operative to process an analog differential signal in accordance with the present disclosure. This diagram has certain similarities with the previous diagram with at least one difference being that the CM analog circuit 1105, the comparator, and the digital circuit 410, or a functionally equivalent component to CM analog circuit 1105, the comparator, and the digital circuit 410, is replaced by a low resolution analog to digital converter (ADC), specifically, a differential M-bit ADC 1210, where M is a positive integer greater than or equal to 1. In certain particular examples, M is a positive integer within the range of 1-4 (e.g., 1, 2, 3, or 4).

Also, in certain particular examples, N of the differential N-bit DAC 1120 is less than or equal to M. In certain specific examples, N<8 bit resolution. For example, if N=4, then M=3, 2, or 1. The Do 2 may be viewed as a high-resolution digital signal (N bit resolution) compared to the Do 1 (M bit resolution), such that M<N. In addition, in some examples, the Do 2 is a modified version of the Do 1 after having undergone any desired digital signal processing within the processing module 24.

In certain examples, note that the differential M-bit ADC 1210 is operative to generate the Do 1 as being an error signal that corresponds to a difference between Vin (such that Vin=(Nv+Vp)/2) and Vref and having a resolution of M bits and that is output based on the clocking rate, CLK. For example, the Do 1 is a digital signal that corresponds to corresponds to an error signal, Ve, such that Ve=Vref−Vin or Vin−Vref.

In other examples, note that the differential M-bit ADC 1210 is operative to generate the Do 1 as being an error signal that corresponds to a difference between the differential input voltage signal, Vin_diff, that is composed of Vn and Vp and a differential reference signal, Vref_diff (e.g., Vref_diff being a differential signal that is composed two different reference voltages, such as Vref1 and Vref2, and having a resolution of M bits and that is output based on the clocking rate, CLK. For example, the Do 1 is a digital signal that corresponds to corresponds to an error signal, Ve_diff, that corresponds to the difference between the two differential signals, Ve_diff=Vref_diff−Vin_diff or Vin_diff−Vref_diff.

The use of such a differential M-bit ADC 1210 provides many performance improvements for certain applications including a reduction of quantization noise and an increase of the output resolution of the ADC, particularly with respect to the Do 1. For example, instead of Do 1 being a single bit resolution digital signal (e.g., a digital stream of is and/or 0 s), the Do 1 in this diagram is a digital signal having a higher resolution (e.g., of 2, 3, or 4 bits). In some examples, the Do 1 is then provided to the processing module 24, and the processing module 24 is configured to perform any desired digital signal processing operation on the Do 1 to generate the Do 2 (e.g., increase the output resolution and lower the sampling rate, perform low pass filtering, perform bandpass filtering, etc.).

In this diagram, note that the Do 1 may be passed directly to the differential N-bit DAC 1120 such that the Do 1 is used to drive the differential N-bit DAC 1120. However, in certain examples, the Do 2 is used to drive the differential N-bit DAC 1120 such as when it is a filtered and/or digital signal processed version of the Do 1.

Figure 13:
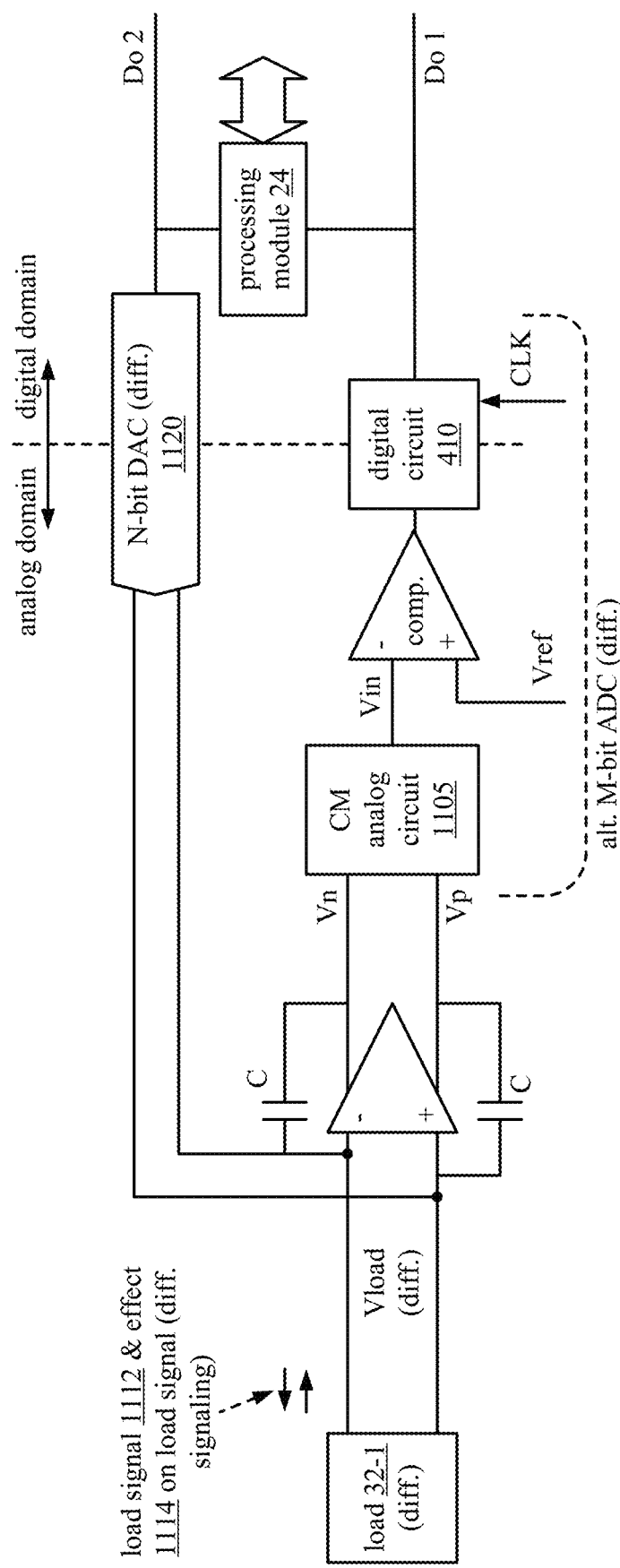
FIG. 13 is a schematic block diagram of another embodiment of an ADC that is operative to process an analog differential signal in accordance with the present disclosure.

FIG. 13 is a schematic block diagram of another embodiment 1300 of an ADC that is operative to process an analog differential signal in accordance with the present disclosure. This diagram has certain similarities to certain of the previous diagrams that operate based on differential signaling with at least one difference being that the capacitor, C, that was connected between the differential signal lines of the load 32-1 is replaced by a differential integrator with two respective feedback capacitors, C. The differential integrator is implemented as an operational amplifier with two respective feedback capacitors, C, and is operative to generate a differential input signal is based on Vn and Vp. The use of the operational amplifier in place of only the capacitor, C, two respective feedback capacitors, C may be used for applications that are tailored to serve greater power than that of the previous diagram. Generally speaking, the two respective feedback capacitors, C, implemented in cooperation with the differential operational amplifier serve a similar purpose of the capacitor, C, that was connected between the differential signal lines of the load 32-1 in the previous diagram of being charged based on the differential load current and the differential output current from the differential N-bit DAC 1120 thereby generating the Vin to be provided to the comparator and compared with Vref.

Note that the CM analog circuit 1105, the comparator, and the digital circuit 410 may alternatively be replaced with a differential M-bit ADC 1210 such as in accordance with the previous diagram.

FIG. 14A is a schematic block diagram of an embodiment 1401 an ADC that is operative to perform voltage measurement in accordance with the present disclosure. This diagram has some similarities with the previous diagrams with at least one difference being that the load 32 is replaced by the load voltage 32-1, which may be a voltage of any of a number of devices including the load 32. Examples of such a load voltage 32-1 include any of the voltage of an electrode, sensor, transducer, etc. Another difference within this diagram is that a resistor, R, is placed in line with the single line that connects her couples the ADC that is operative to perform voltage measurement and the load voltage 32-1. For example, the load voltage 32-1, when dropping across the resistor, R, to generate the input voltage, Vin, will provide a current signal that will charge the capacitor, C, that is provided to one of the inputs of the comparator. Generally speaking, a load voltage 32-1 can be measured by inserting a resistor, R, between the load voltage 32-1 and the ADC so as to facilitate conversion of the load voltage 32-1 to a current, Iin, that is equal to the difference between the load voltage 32-1, Vload, and Vin, such that Iin=(Vload−Vin)/R. note also that a prince impedance circuitry may alternatively be implemented that is operative to convert a voltage to a current signal such that the current signal may be sensed by an ADC as described herein.

FIG. 14B is a schematic block diagram of an embodiment 1402 an transimpedance amplifier that may be implemented within an ADC that is operative to perform voltage measurement in accordance with the present disclosure. The trans-impedance circuitry includes a buffer, operational amplifier, etc. having a first input coupled to the ground potential, and a second input coupled to a node that is sourcing or sinking current, such as the node connected to the N-bit DAC 420. An impedance (shown as an R or generically a Z, which may have inductive and/or capacitive reactants components) is also coupled from the second input to the output of the buffer, operational amplifier, etc. A current, I, that flows through the impedance generates an output voltage, V, that is based on the impedance times the current, I (e.g., V=R×I or Z×I). Such a trend impedance amplifier, or any appropriate circuit or component that is operative to perform voltage to current signal conversion, or vice versa, may be used in place of the resistor shown within the previous diagram.

Figure 15:
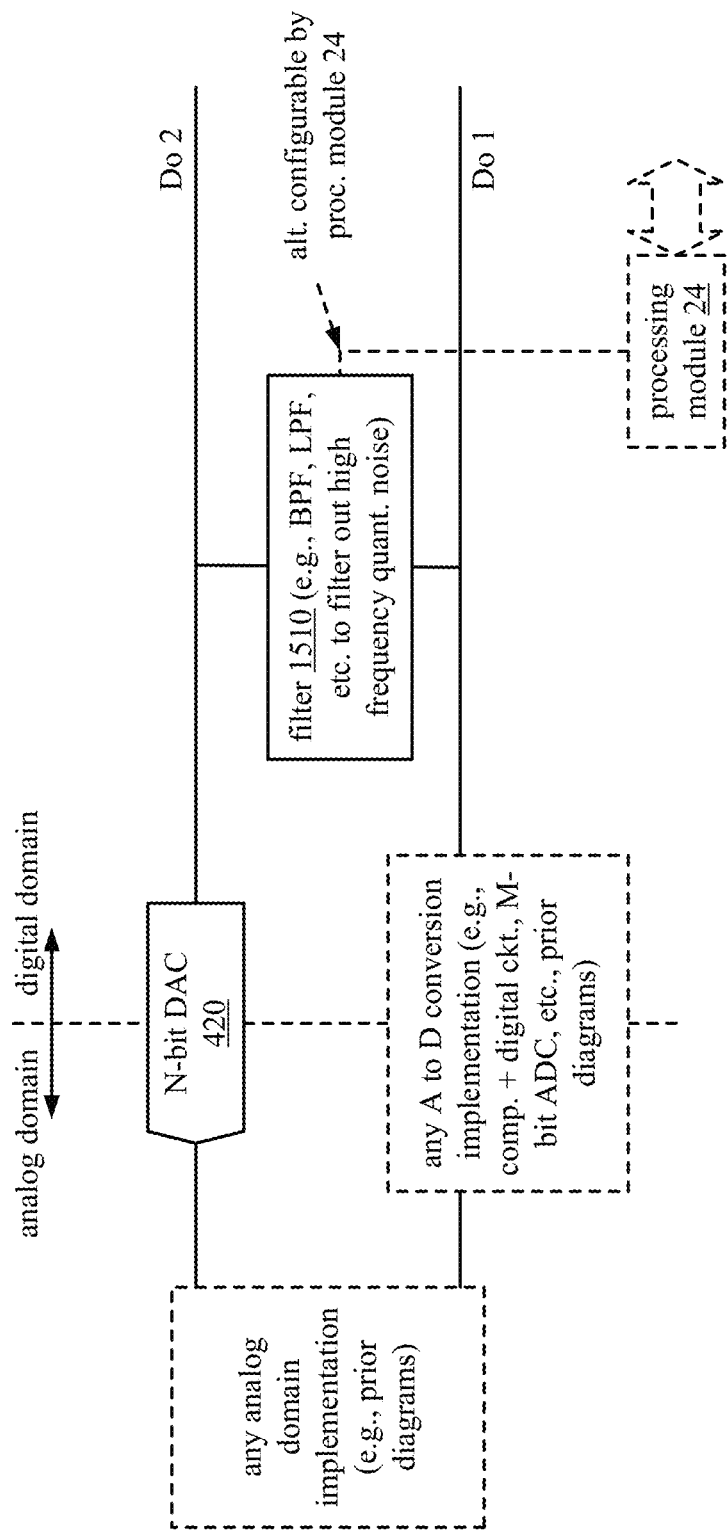
FIG. 15 is a schematic block diagram showing an embodiment of digital domain filtering within an ADC in accordance with the present disclosure.

FIG. 15 is a schematic block diagram showing an embodiment 1500 of digital domain filtering within an ADC in accordance with the present disclosure. This diagram shows an alternative implementation to having a processing module 24 implemented to receive him perform any desired digital signal processing on the Do 1 and to generate the Do 2. Specifically, a filter 1510 is implemented to process the Do 1 to generate the Do 2. Note that the filter 1510 may be of any desired type of digital filter. In certain examples, bandpass filtering or low pass filtering is performed by the filter 1510 to filter out high-frequency quantization noise within the Do 1 in accordance with generating the Do 2. Possible examples of a low pass filter or low pass filter operation may be implemented based on an accumulator or in integrator. For example, consider an application tailored for detecting a DC analog signal, or for detecting an analog signal having a frequency within the voice frequency bands such as 20 kHz to 100 kHz, then appropriate low pass filtering or bandpass filtering is performed by the filter 1510 to filter out high-frequency quantization noise within the Do 1 in accordance with generating the Do 2.

In certain examples, note that a processing module 24 may be in communication with the filter 1510 such that the particular filtering to be performed by the filter 1510 is configurable based on control signaling from the processing module 24. For example, consider the filter 1510 to be a configurable or selectable filter that includes one or more options of bandpass filtering or low pass filtering. The processing module 24 is configured to select a first type of filtering to be performed at or during a first time and a second type of filtering to be performed at or during a second time, and so on.

Figure 16:
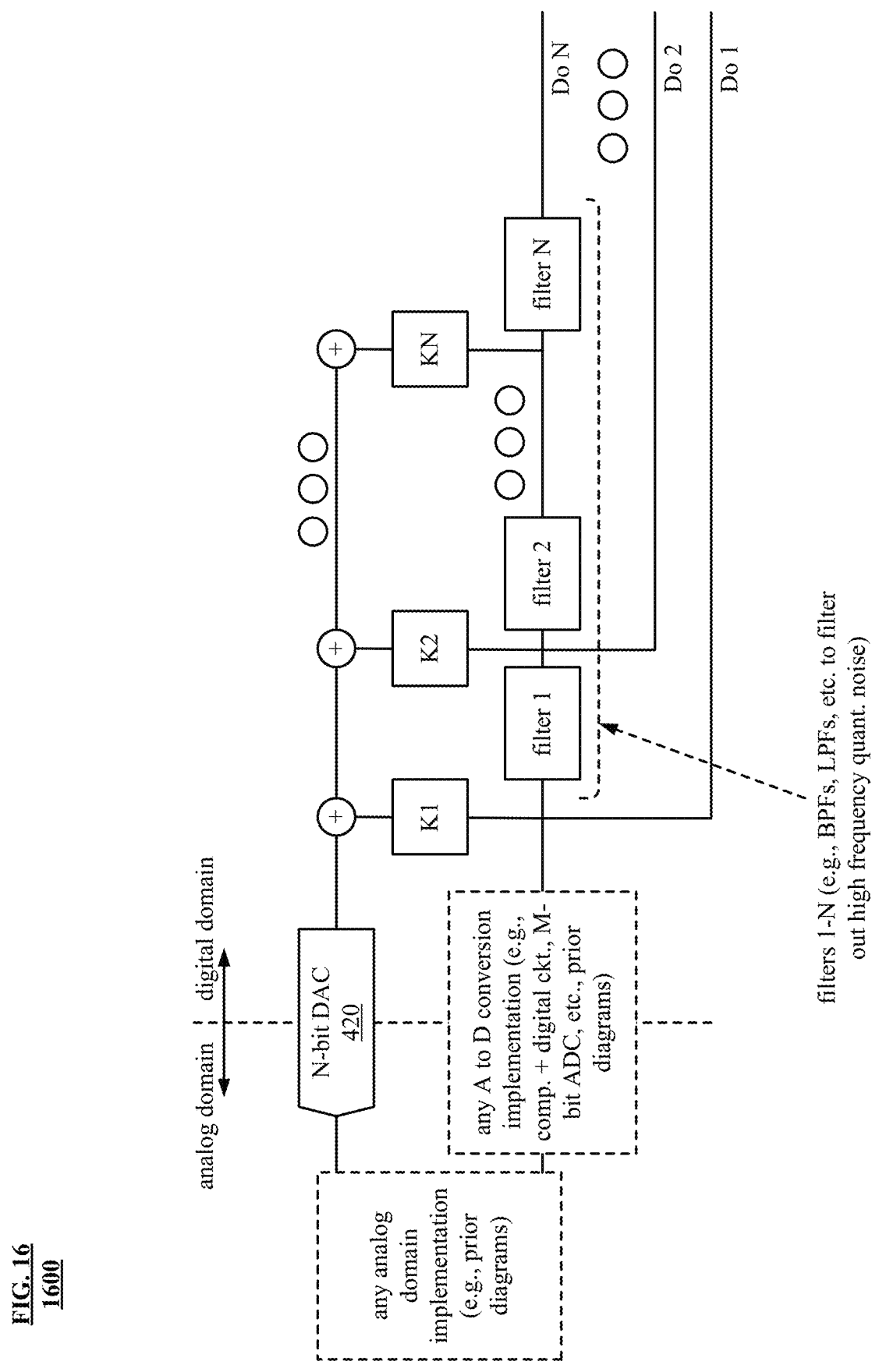

FIG. 16 is a schematic block diagram showing an embodiment 1600 of digital domain filtering using cascaded filters within an ADC in accordance with the present disclosure. This diagram shows digital signal processing based on a cascade of N and pass filters or N low pass filters. In a particular example, N=10. The gain elements, K1 through KN, are amplification constants that are used to stabilize the feedback loop from any digital output signal that is generated by the respective cascade of N filter (e.g., filter 1 through filter N) that provide the digital input control signal to the N-bit DAC 420. The different respective game factors operate to stabilize the feedback that is provided to the N-bit DAC 420. Note that this implementation is operative to provide a number of different respective digital output signals, shown as Do 1, Do 2 through Do N as corresponding to the respective outputs from the respective cascade of N filter (e.g., filter 1 through filter N). Note that any one or more decimation filters may also be implemented to perform decimation filtering of the digital output signals, shown as Do 1, Do 2 through Do N as corresponding to the respective outputs from the respective cascade of N filter (e.g., filter 1 through filter N).

Figure 17:
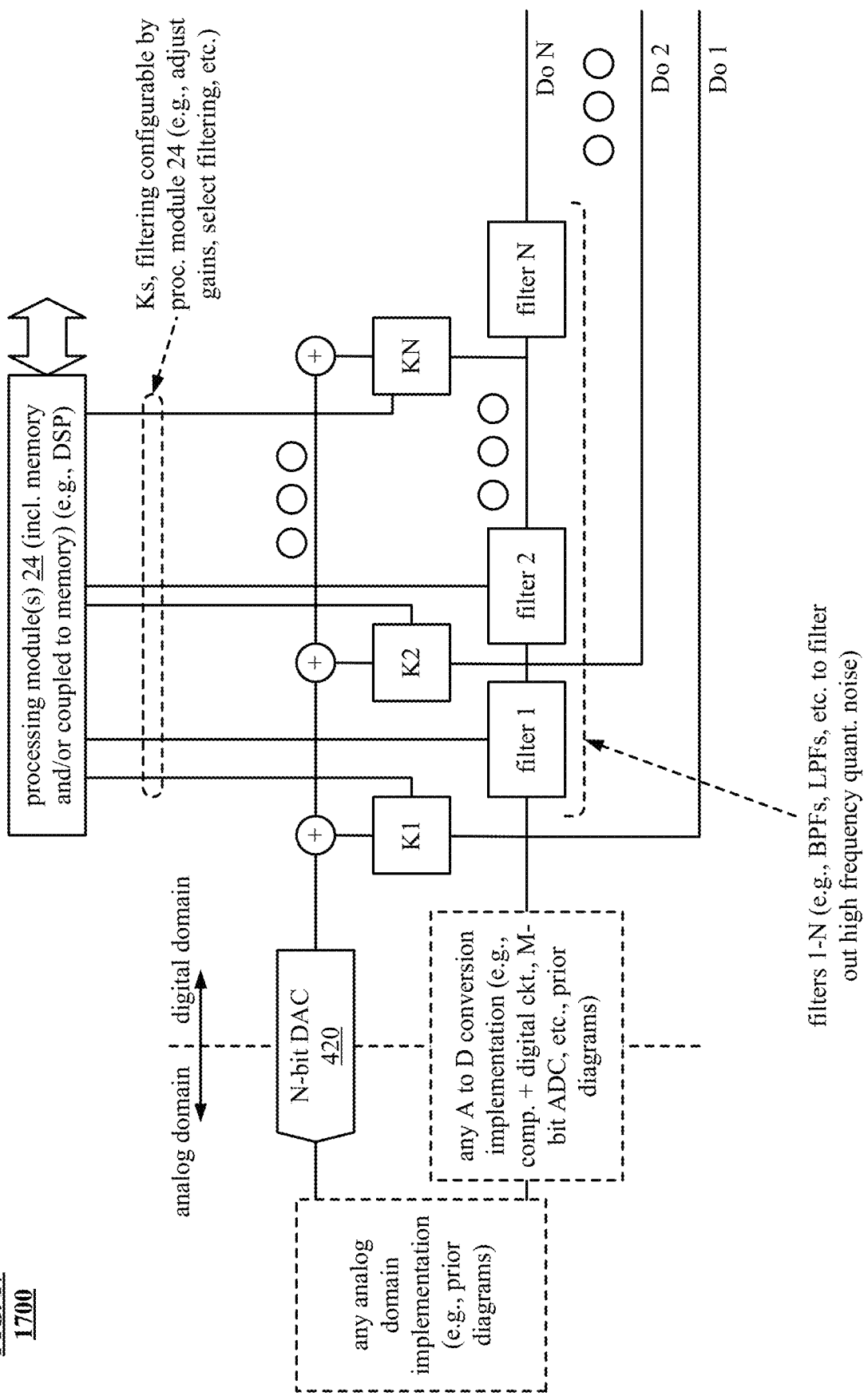
FIG. 17 is a schematic block diagram showing another embodiment of digital domain filtering using configurable/adjustable cascaded filters within an ADC in accordance with the present disclosure.

FIG. 17 is a schematic block diagram showing another embodiment 1700 of digital domain filtering using configurable/adjustable cascaded filters within an ADC in accordance with the present disclosure. This diagram is similar to the previous diagram with at least one difference being that one or more processing modules 24 is coupled or connected to each of the respective gain elements (K1 through KN) and the respective cascade of N filter (e.g., filter 1 through filter N). The one or more processing modules 24 is configured to adjust a gains of the respective gain elements (K1 through KN) and mean particular characteristics by which filtering is performed by the respective cascade of N filter (e.g., filter 1 through filter N).

For example, the one or more processing modules 24 is configured to select a first set of gains for the respective gain elements (K1 through KN) and a first type of filtering to be performed by the respective cascade of N filter (e.g., filter 1 through filter N) at or during a first time and a second set of gains for the respective gain elements (K1 through KN) and a second type of filtering to be performed by the respective cascade of N filter (e.g., filter 1 through filter N) at or during a second time.

Figure 18:
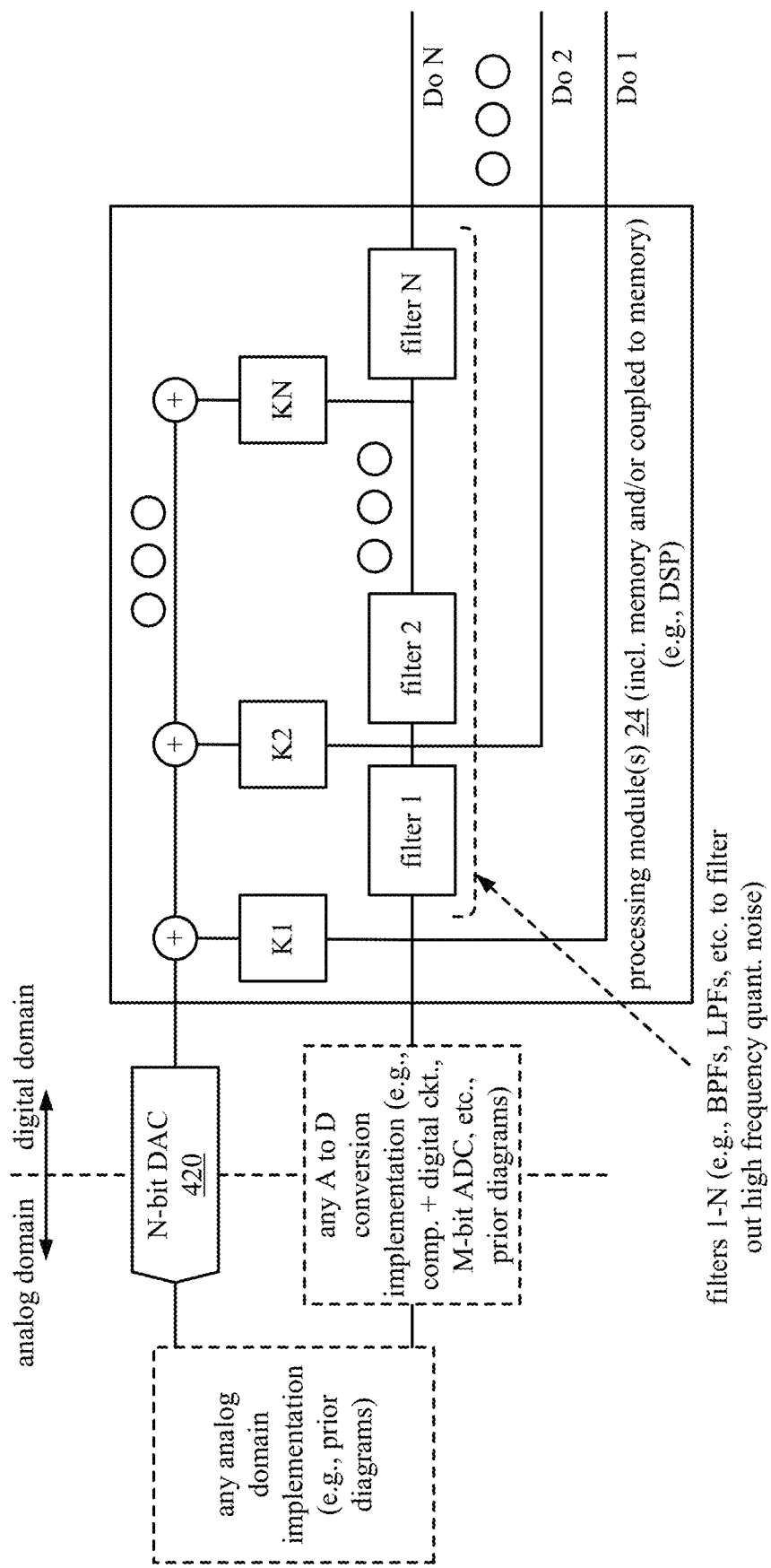
FIG. 18 is a schematic block diagram showing an embodiment of one or more processing modules implemented to perform digital domain filtering within an ADC in accordance with the present disclosure.

FIG. 18 is a schematic block diagram showing an embodiment 1800 of one or more processing modules implemented to perform digital domain filtering within an ADC in accordance with the present disclosure. This diagram includes one or more processing modules 24 that is operative to perform the filtering pictorially illustrated within the previous diagram. For example, one or more processing modules 24 may be implemented perform any desired digital signal processing of any of the respective digital output signals, shown as Do 1, Do 2 through Do N including the digital signal processing pictorially described with respect to the previous diagram. In this diagram, the one or more processing modules 24 itself for themselves performs the digital signal processing. In the previous diagram, separate and distinct digital signal processing components are implemented, ending one or more processing modules 24 of that diagram are operative to control and configure the manner in which those digital signal processing components operate.

In addition, alternative examples of an ADC may be implemented using a non-linear N-bit DAC that operates based on a non-linear function. For example, a non-linear N-bit DAC is operative to provide an output current based on the non-linear function of the digital input signal provided to it. Such a non-linear function may be described also as a non-linear companding function such that companding corresponds to a non-linear response of the ADC based on the signal it receives and/or senses. In such a non-linear N-bit DAC, the output current is a non-linear function of the input.

Considering one possible example of an ADC that includes a non-linear N-bit DAC, the digital output signal (e.g., the Do 1 and/or the Do 2 signal) that is generated by such an ADC is a non-linear function of the analog signal that it is sensing. Consider an ADC that includes a non-linear N-bit DAC and operates based on a logarithmic function when sensing a current signal, then the digital output signal (e.g., the Do 1 and/or the Do 2 signal) is a logarithmic function of the input current. Such an ADC that includes a non-linear N-bit DAC may be referred to as a companding ADC. Generally speaking, such an ADC that provides for a non-linear response when generating a digital output signal based on the analog signal that it is sensing may be referred to as a companding ADC.

Note that such a companding ADC may also be implemented to perform simultaneous driving and sensing of a signal via that single line that connects or couples to the load. For example, such an ADC is operative to drive an analog signal (e.g., current and/or voltage) of a load 32. With respect to implementations that operate in accordance with sensing analog current signals, such a companding ADC is also operative to sense current signals within an extremely broad range including very low currents (e.g., currents below the 1 pico-amp range, within the 10 s of pico-amps range, below the 1 nano-amp range, within the 10 s of nano-amps range, below the 1 micro-amp range, within the 10 s of micro-amps range, etc.) and also up to relatively much larger currents (e.g., currents in the 10 s milli-amps range, 100 s milli-amps range, or even higher values of amps range, etc.). In some examples, such as with respect to detecting currents that are provided from a photodetection or photodiode component, such a companding ADC is also operative to sense current signals below the 1 pico-amp range, currents within the 100 s of micro-amps range, etc.

Also, in some examples, when using appropriately provisioned components (e.g., higher current, higher power, etc.), much higher currents can also be sensed using architectures and topologies in accordance with a companding ADC as described herein. For example, such a companding ADC implemented based on architectures and topologies, as described herein, using appropriately provisioned components are operative to sense even higher currents (e.g., 1 s of amps, 10 s of amps, or even higher values of amps range, etc.).

In addition, note that various implementations of such a companding ADC may be implemented to cover a number of decades orders of magnitude. For example, consider a companding ADC that is implemented to detect current signals radiating from the 10 s of pico-amps to ones of milli-amps. Such a companding ADC would cover a dynamic range of 7-8 decades or 7-8 orders of magnitude. Within such an example, such a very broad dynamic range may be divided using a log scale into the 7-8 decades, such that there are a few data points within each particular decade. Note also that there is a trade-off regarding the resolution of the digital output signal (e.g., the Do 1 and/or the Do 2 signal) that is generated by such a companding ADC and range of current signals that may be sensed. For example, when the dynamic range of signals to be sensed by such a companding ADC is relatively large, then there can be limitations on sensing very low currents with a high degree of accuracy.

Generally speaking, the broader the dynamic range of signals to be sensed, then a higher resolution of the digital output signal (e.g., the Do 1 and/or the Do 2 signal) provides for a higher degree of accuracy, particularly when sensing very low currents. Consider an example in which currents within a dynamic range of 10 s of pico-amps to 100 s of micro-amps is to be sensed (e.g., within a photodetection or photodiode component), then generating a digital output signal using a certain number of bits (e.g., a resolution of 12 bits) may be insufficient to cover the entire range. Within such a particular example, increasingly resolution of the digital output signal (e.g., to a resolution of 16 bits) can help facilitate sensing of signals with higher resolution and also assist sensing very low currents with a high degree of accuracy.

Several the following diagrams have similarities to the prior diagrams with at least one difference being that a non-linear N-bit DAC 1920 is implemented to generate the current that is output to a load that matches or tracks the current of the load. Similarly, as described with respect to other examples of an ADC, the companding ADCs of these subsequent diagrams also operate by providing an output current to the load 32 to cancel out the load current. This may be viewed as providing an output current that is equal to and opposite polarity to the load current. Note also that such a companding ADC may be implemented not only to sense an analog signal associated with the load 32 but also to provide power and/or energy to the load 32 within implementations where the load 32 is not energized via another source. In some examples, this providing of power and/or energy from the companding ADC to the load 32 is performed simultaneously via a single line via which the companding ADC senses and analog signal associated with the load 32. Also, such a companding ADC may be implemented to perform sensing only of an analog signal associated with the load 32 without providing power and/or energy to the load 32.

Generally speaking, with respect to such non-linear N-bit DACs, such as the non-linear N-bit DAC 1920, the output current provided there from is a non-linear function of the Do 2. Therefore, the Do 2 itself is also an inverse function of the load current, given that the output current from the non-linear N-bit DAC 1920 is operative to match or track the current of the load (e.g., being equal and opposite of the current of the load thereby minimizing the error signal that is based on the difference between Vref and Vin).

Figure 19:
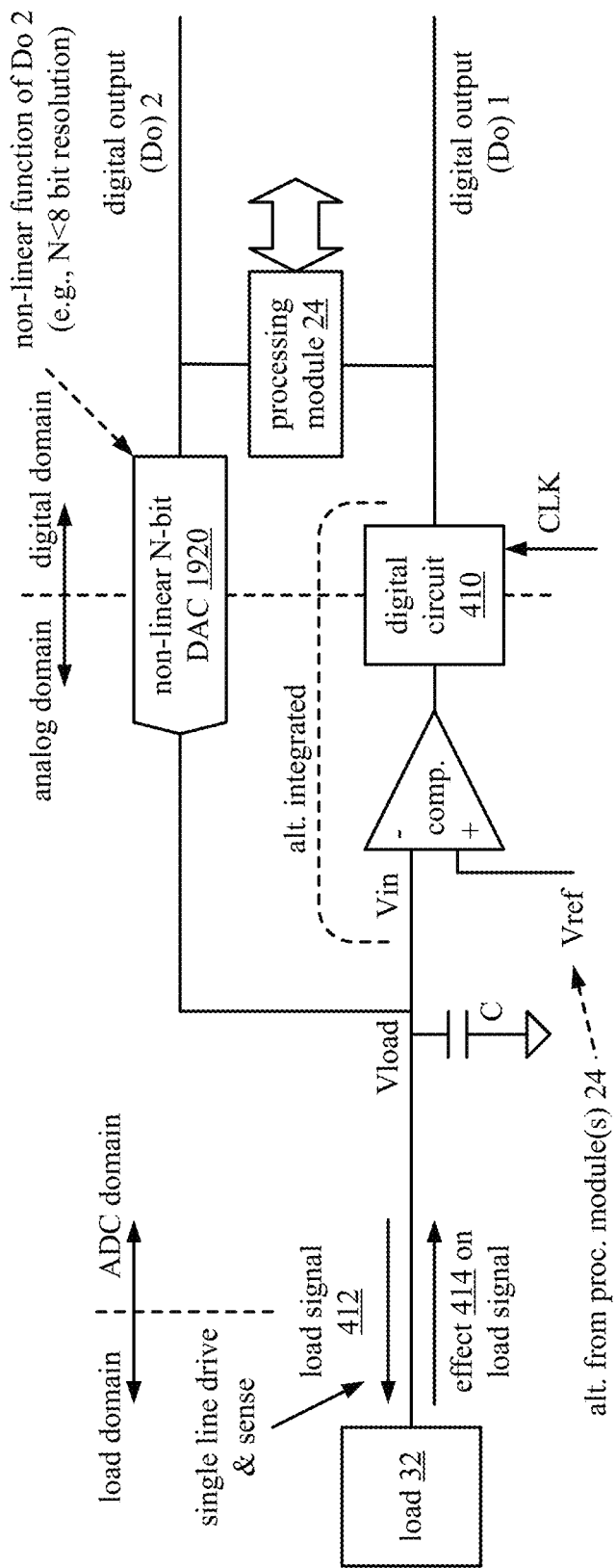
FIG. 19 is a schematic block diagram of an embodiment of an ADC that includes a non-linear N-bit digital to analog converter (DAC) in accordance with the present disclosure.

FIG. 19 is a schematic block diagram of an embodiment 1900 of an ADC that includes a non-linear N-bit digital to analog converter (DAC) in accordance with the present disclosure. This diagram is similar to certain of the previous diagrams (e.g., FIG. 4) that include a comparator and a digital circuit 410 that generates the Do 1 that is provided to the processing module 24. The processing module 24 processes the Do 1 to generate the Do 2. Also, an analog capacitor, C, is connected to a node that couples the load 32 to the companding ADC (e.g., an ADC that includes a non-linear N-bit digital to DAC, an ADC that provides for a non-linear response when generating a digital output signal based on the analog signal that it is sensing).

However, in this diagram, a non-linear N-bit DAC 1920 is implemented to generate the current signal that is provided to the node that connects or couples the companding ADC to the load 32 to match and track the current signal of the load.

Many of the subsequent diagrams include similar components and operate similarly with at least one difference being that they operate as companding ADCs such that they provide for a non-linear response when generating a digital output signal based on the analog signal that it is sensing. Many of the diagrams include a non-linear N-bit DAC 1920 is implemented in place of the N-bit DAC 420.

Figure 20:
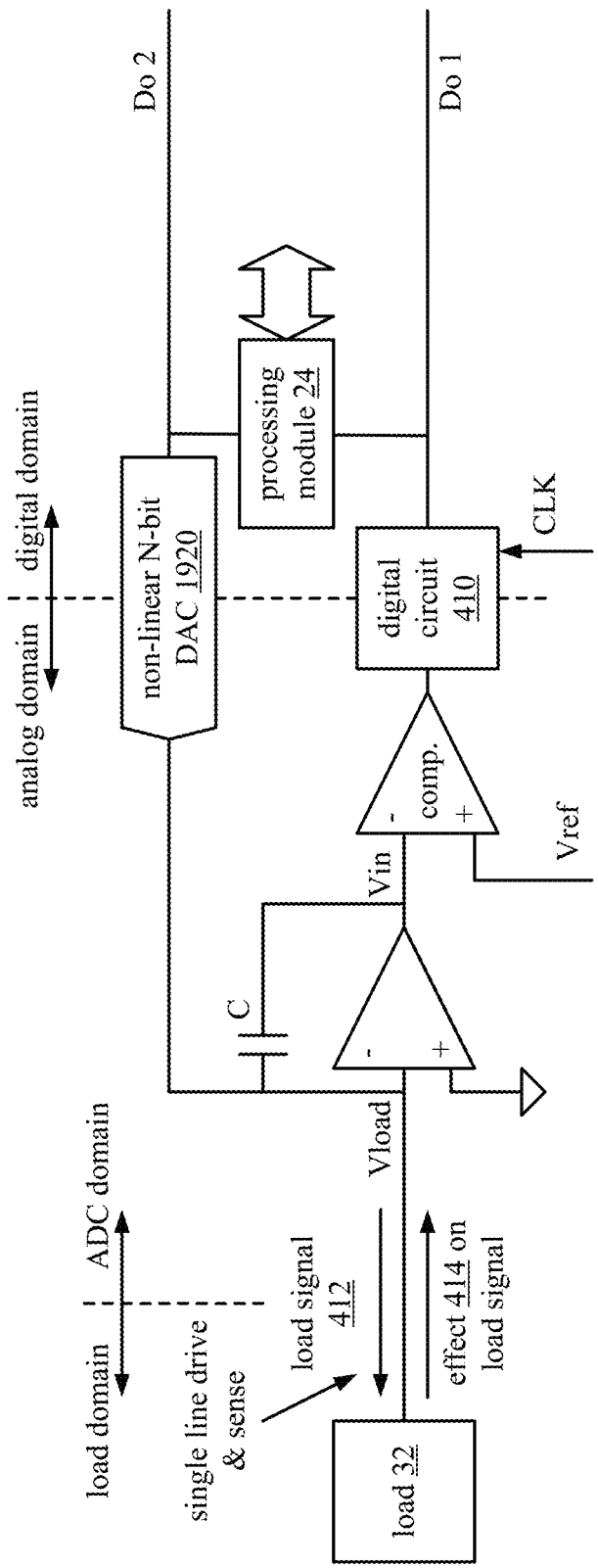
FIG. 20 is a schematic block diagram of another embodiment of an ADC that includes a non-linear N-bit DAC in accordance with the present disclosure.

FIG. 20 is a schematic block diagram of another embodiment 2000 of an ADC that includes a non-linear N-bit DAC in accordance with the present disclosure. This diagram is similar to FIG. 8 with a difference being that a non-linear N-bit DAC 1920 is implemented in place of the N-bit DAC 420.

Figure 21:
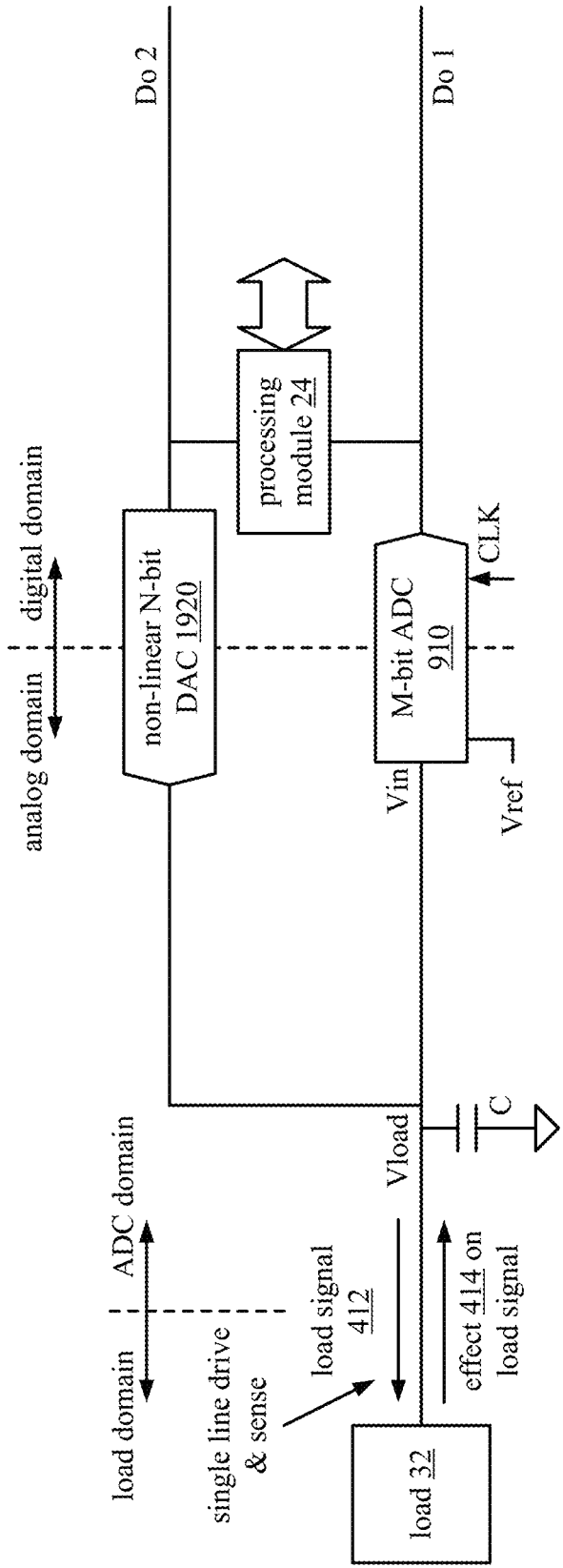
FIG. 21 is a schematic block diagram of another embodiment of an ADC that includes a non-linear N-bit DAC in accordance with the present disclosure.

FIG. 21 is a schematic block diagram of another embodiment 2100 of an ADC that includes a non-linear N-bit DAC in accordance with the present disclosure. This diagram is similar to FIG. 9 with a difference being that a non-linear N-bit DAC 1920 is implemented in place of the N-bit DAC 420.

Figure 22:
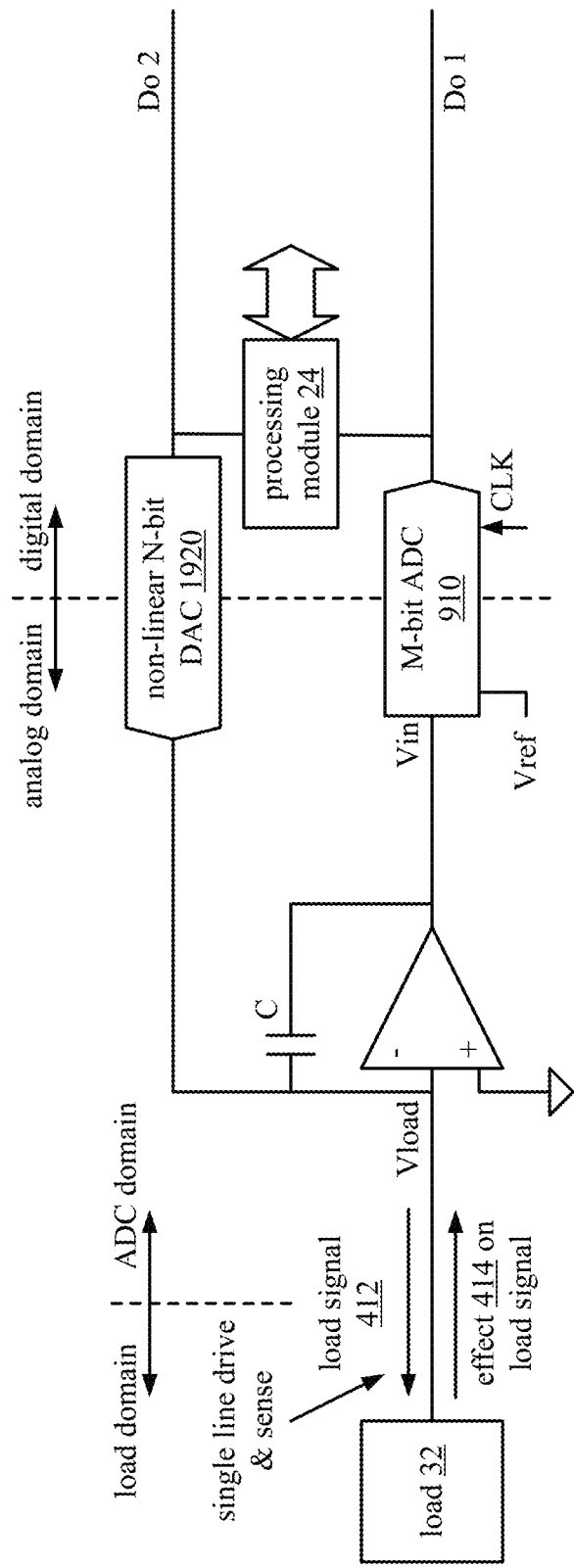
FIG. 22 is a schematic block diagram of another embodiment of an ADC that includes a non-linear N-bit DAC in accordance with the present disclosure.

FIG. 22 is a schematic block diagram of another embodiment 2200 of an ADC that includes a non-linear N-bit DAC in accordance with the present disclosure. This diagram is similar to FIG. 10 with a difference being that a non-linear N-bit DAC 1920 is implemented in place of the N-bit DAC 420.

Figure 23:
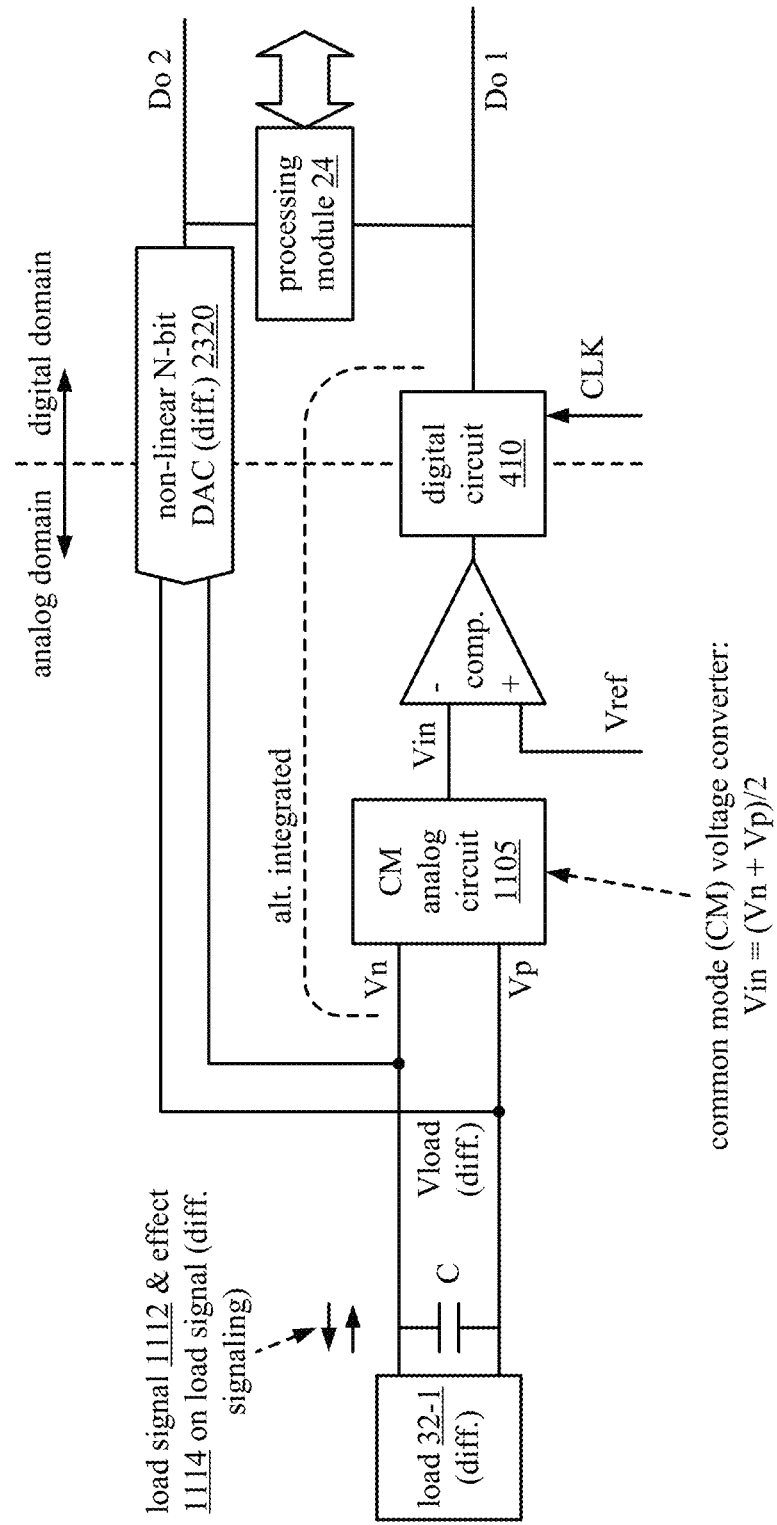
FIG. 23 is a schematic block diagram of an embodiment of an ADC that includes a non-linear N-bit DAC that is operative to process an analog differential signal in accordance with the present disclosure.

FIG. 23 is a schematic block diagram of an embodiment 2300 of an ADC that includes a non-linear N-bit DAC that is operative to process an analog differential signal in accordance with the present disclosure. This diagram is similar to FIG. 11 with a difference being that a differential non-linear N-bit DAC 2320 is implemented in place of the differential N-bit DAC 1120.

Figure 24:
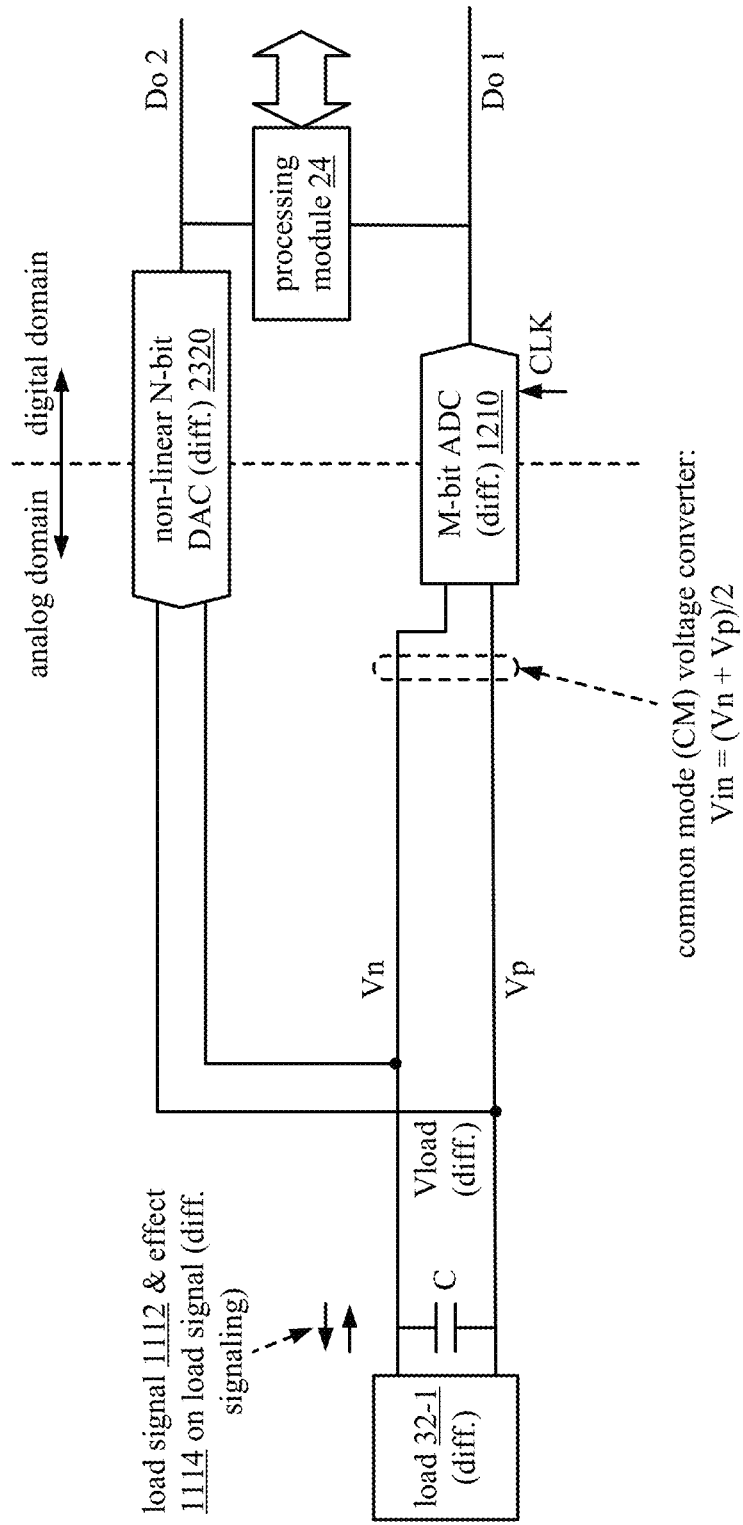
FIG. 24 is a schematic block diagram of another embodiment of an ADC that includes a non-linear N-bit DAC that is operative to process an analog differential signal in accordance with the present disclosure.

FIG. 24 is a schematic block diagram of another embodiment 2400 of an ADC that includes a non-linear N-bit DAC that is operative to process an analog differential signal in accordance with the present disclosure. This diagram is similar to FIG. 12 with a difference being that a differential non-linear N-bit DAC 2320 is implemented in place of the differential N-bit DAC 1120.

Figure 25:
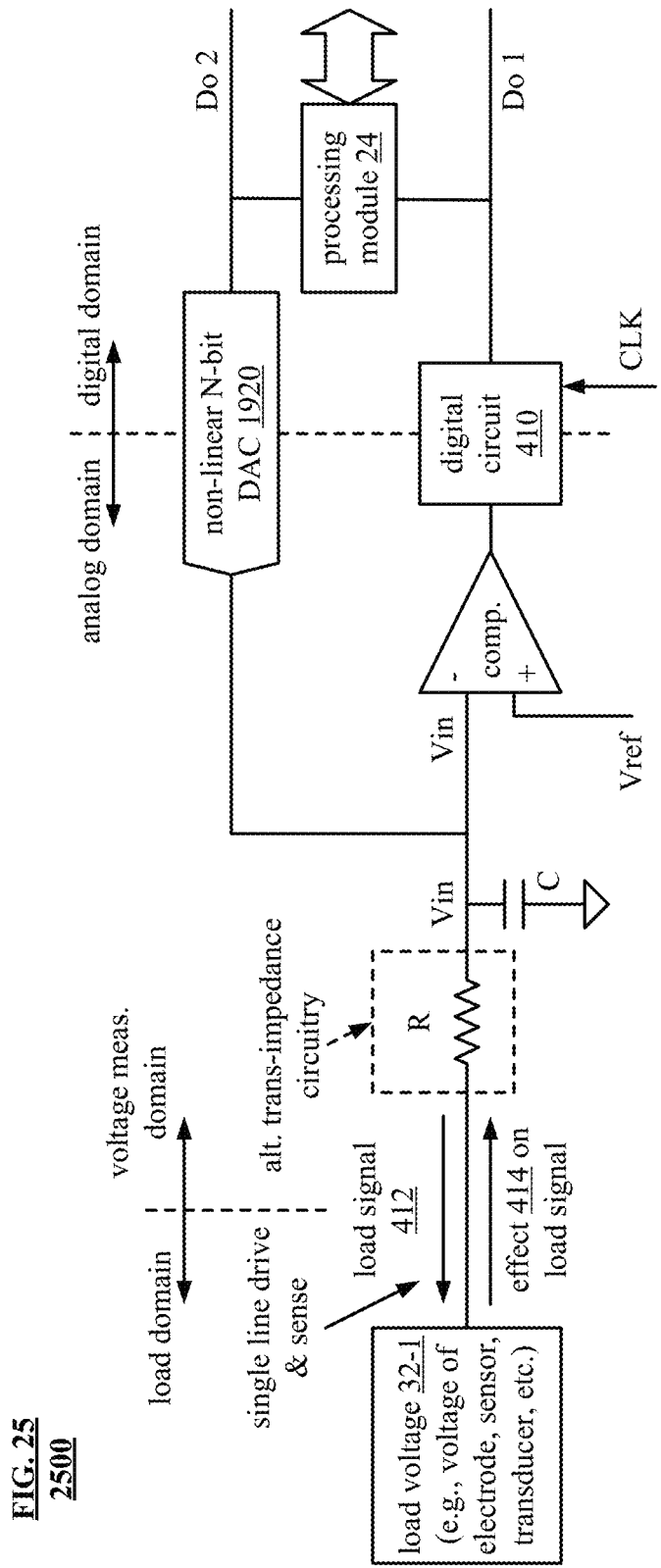
FIG. 25 is a schematic block diagram of an embodiment an ADC that includes a non-linear N-bit DAC and that is operative to perform voltage measurement in accordance with the present disclosure.

FIG. 25 is a schematic block diagram of an embodiment 2500 an ADC that includes a non-linear N-bit DAC and that is operative to perform voltage measurement in accordance with the present disclosure. This diagram is similar to FIG. 14A with a difference being that a non-linear N-bit DAC 1920 is implemented in place of the N-bit DAC 420. For example, implementing an appropriate element in-line between the companding ADC and a load voltage 32-1 (e.g., a resistor, R, a trans-impedance circuitry, and/or any appropriate complement to convert voltage to current, etc.) facilitates the conversion of the load voltage 32-1 to a load current that may be detected using such a companding ADC. In such an example, the non-linear N-bit DAC 1920 within the companding ADC operates based on a function of Do 2. In an example that includes a resistor, R, implemented non-linear N-bit DAC 1920, the Do 2 itself is an inverse function of the load voltage 32-1 divided by R (e.g., function of Vload/R).

Certain of the following diagrams show the use of one or both of a PNP transistor (alternatively, Positive-Negative-Positive Bipolar Junction Transistor (BJT)) or an NPN transistor (alternatively, Negative-Positive-Positive BJT) to implement the non-linear conversion function. For example, the use of one or both of a PNP transistor or NPN transistor may be used to implement a logarithmic conversion function.

In addition, certain of the following diagrams operate using a N-bit DAC 420-1 that provides an output voltage signal to be received by the base of an NPN transistor or a PNP transistor. In such examples, one or more of an NPN transistor or a PNP transistor is implemented to provide the current that matches or tracks the load current. Certain examples operate by sourcing current, and others operate by sinking current. Even other examples operate by providing both functionality of sourcing current and sinking current as may be required to match or track the load current.

Figure 26A:
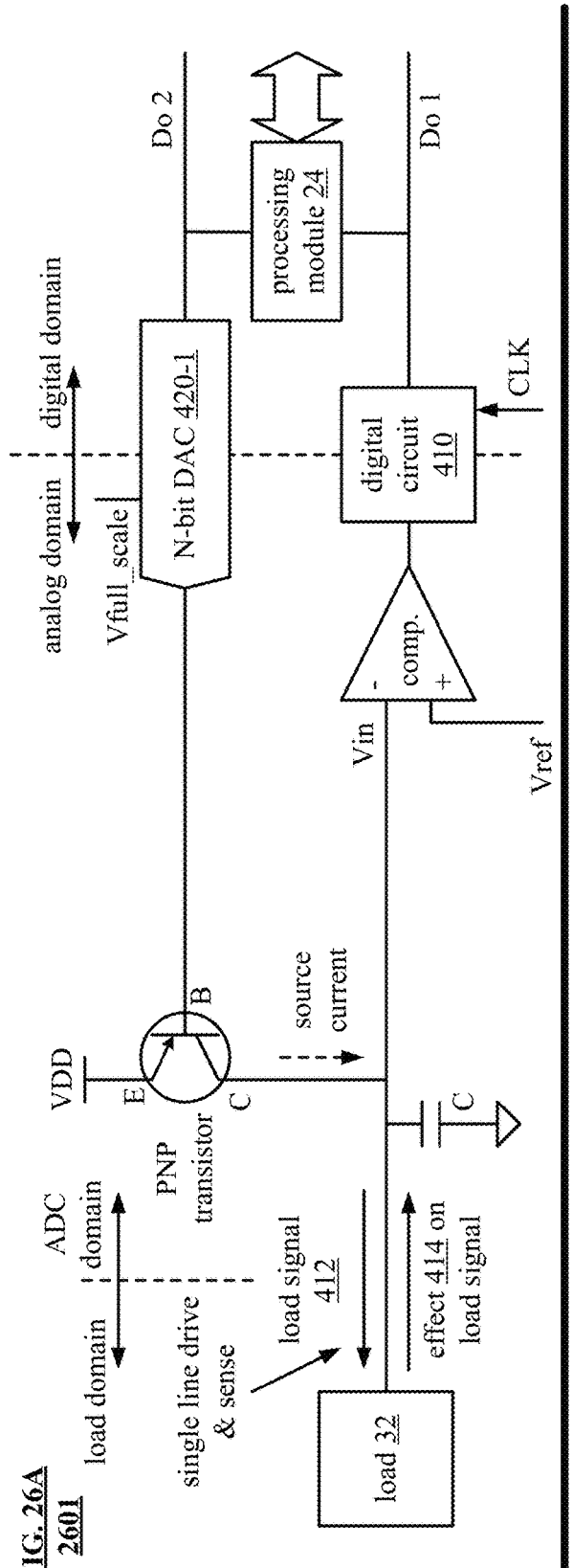
FIG. 26A is a schematic block diagram of an embodiment an ADC that includes a PNP transistor (alternatively, Positive-Negative-Positive Bipolar Junction Transistor (BJT)) implemented to source current in accordance with the present disclosure.

FIG. 26A is a schematic block diagram of an embodiment 2601 an ADC that includes a PNP transistor (alternatively, Positive-Negative-Positive Bipolar Junction Transistor (BJT)) implemented to source current in accordance with the present disclosure.

Generally speaking, a BJT is a type of transistor including three terminals, a base (B), a collector (C), and an emitter (E). Such a BJT includes two semiconductor junctions that share a thin doped region in between them. Considering an NPN transistor, a thin p-doped region is implemented in between two n-type semiconductor regions thereby forming the two semiconductor junctions. Considering an PNP transistor, a thin n-doped region is implemented in between two p-type semiconductor regions thereby forming the two semiconductor junctions.

With respect to such a transistor, the collector current, $I_c$, as a function of the voltage between the base (B) and emitter (E) is as follows:

$$I_C = I_S \left( e^{\frac{qV_{BE}}{kT}} - 1 \right),$$

where, based on the Shockley diode equation or the diode law, $I_s$ the reverse bias saturation current (alternatively referred to as scale current);

$V_{BE}$ is the voltage across the semiconductor junction;

$V_T$ is the thermal voltage, kT/q, which is the Boltzmann constant, k, times temperature, T, divided by electron charge, q.

As such, the value of $V_{BE}$ is the output voltage of the N-bit DAC 420-1, which operates based on a full-scale voltage shown as Vfull_scale, such that the N-bit DAC 420-1 is operative to provide an output voltage up to and including the full-scale voltage shown as Vfull_scale.

Given that $V_{BE}$ is the output voltage of the N-bit DAC 420-1, then it is also the conversion of the Do 2 to an analog signal.

Therefore, the Do 2 is a an inverse function of the above equation showing the collector current, $I_c$, as follows:

$$Do2 = V_{BE} \approx \frac{kT}{q} \ln\left(\frac{I_C}{I_S}\right)$$

The full-scale voltage shown as Vfull_scale is a reference voltage for the N-bit DAC 420-1, which also operates to control the full-scale output current. FIG. 28B and FIG. 28C show examples by which a temperature independent full-scale reference circuit may be implemented.

Referring again to FIG. 26A, this diagram shows a PNP transistor implemented to source current to a node that connects to the load 32 to match and track the load current.

Figure 26B:
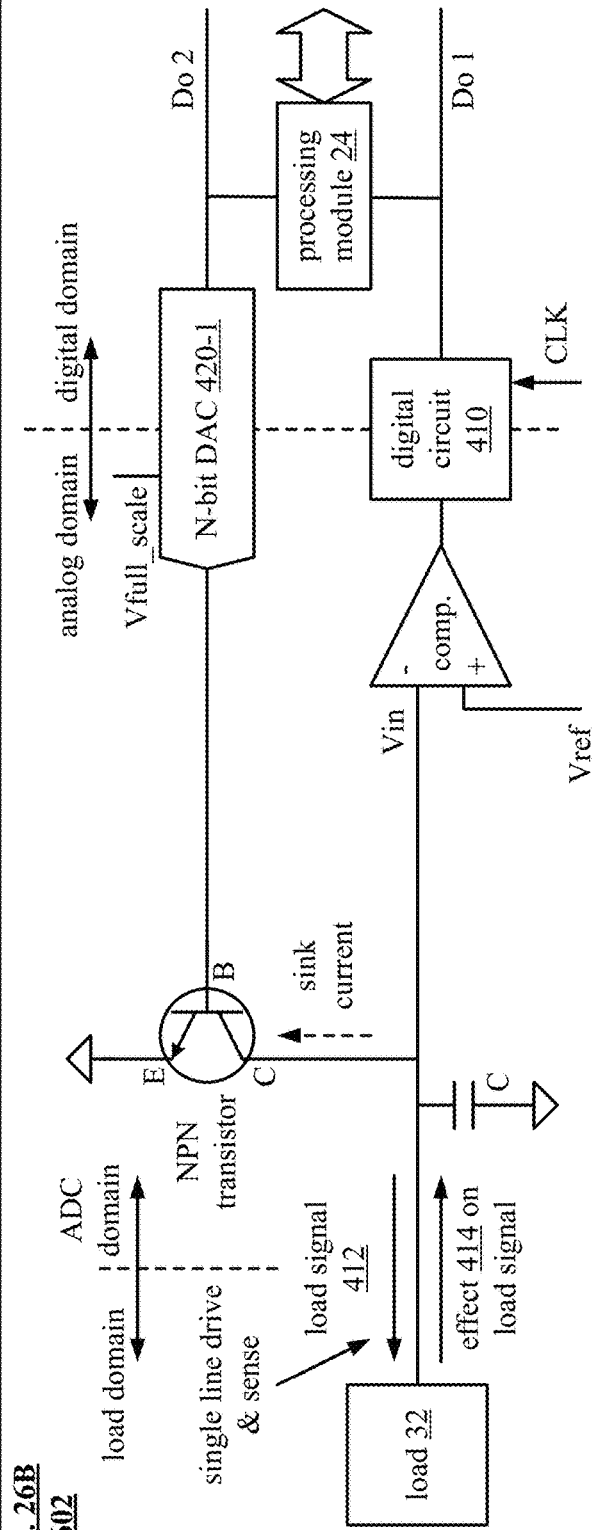
FIG. 26B is a schematic block diagram of an embodiment an ADC that includes an NPN transistor (alternatively, Negative-Positive-Positive BJT) implemented to sink current in accordance with the present disclosure.

FIG. 26B is a schematic block diagram of an embodiment 2602 an ADC that includes an NPN transistor (alternatively, Negative-Positive-Positive BJT) implemented to sink current in accordance with the present disclosure. This diagram shows an NPN transistor implemented to sink current from a node that connects to the load 32 to match and track the load current.

Figure 27:
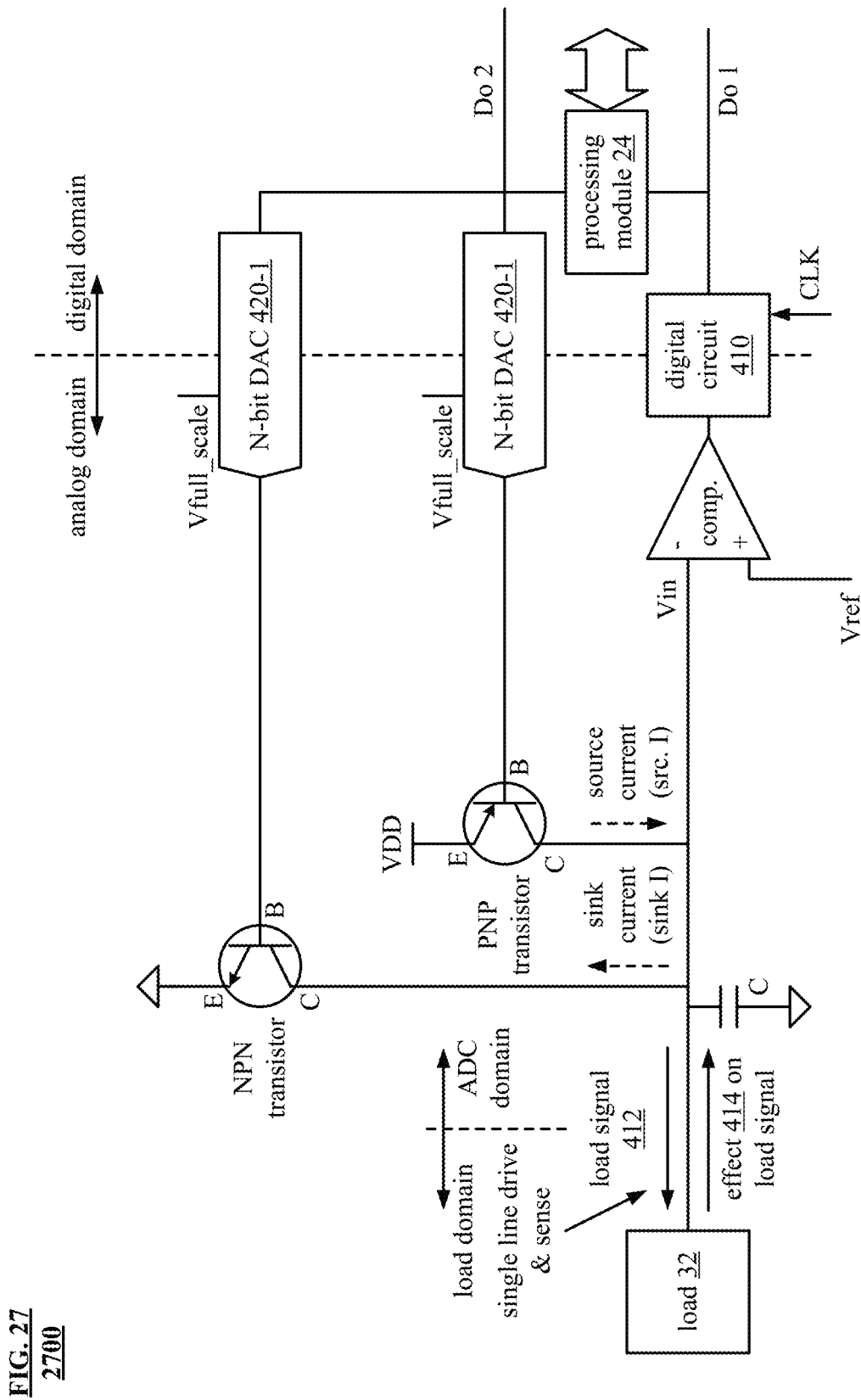
FIG. 27 is a schematic block diagram of an embodiment an ADC that includes both a PNP transistor implemented to source current and an NPN transistor implemented to sink current in accordance with the present disclosure.

FIG. 27 is a schematic block diagram of an embodiment 2700 an ADC that includes both a PNP transistor implemented to source current and an NPN transistor implemented to sink current in accordance with the present disclosure. This diagram shows both a PNP transistor implemented to source current to a node that connects to the load 32 to match and track the load current and also an NPN transistor implemented to sink current from a node that connects to the load 32 to match and track the load current. In cooperation with one another, both the PNP transistor and the NPN transistor can operate either to sink or source current as may be needed to match and track the load current.

FIG. 28A is a schematic block diagram of an embodiment 2801 an ADC that includes diodes implemented to source and/or sink current in accordance with the present disclosure. This diagram shows the two diodes implemented and controlled using switches, such as being controlled by the processing module 24, to provide for sinking or sourcing current to or from the node that connects to the load 32 to match and track the load current.

FIG. 28B is a schematic block diagram of an embodiment 2802 a PNP transistor diode configuration operative to generate a full scale voltage signal in accordance with the present disclosure. In addition, note that one way to have a temperature independent full-scale reference current is to use a PNP or NPN diode configuration to generate the full-scale voltage (Vfull_scale) based on an applied reference current Iref. This is to form a current mirror. The output bipolar transistor current to the load is a mirror copy of the reference current, Iref, which is scaled by the voltage value provided by the N-bit DAC 420-1. The reference current is applied to the collector of the PNP (or NPN) and the base is connected to the collector to form a diode configuration. The base voltage of the PNP is the full-scale voltage (Vfull_scale) that is applied to the N-bit DAC. Such a configuration for a PNP transistor is shown with respect to FIG. 28B. Such a configuration for an NPN transistor is shown with respect to FIG. 28B.

FIG. 28C is a schematic block diagram of an embodiment 2803 an NPN transistor diode configuration operative to generate a full scale voltage signal in accordance with the present disclosure.

Such implementations of a companding ADC using one or more NPN transistors, PNP transistors, and/or diodes provide a number of advantages over prior art ADCs. For example, they may be operated using extremely low power. Also, they operate to provide direct conversion of a digital output (e.g., Do 2) that is logarithmically proportional to the input current. Moreover, using an appropriate implementation, such as that described to provide a temperature independent full-scale reference current, such a companding ADC is temperature independent as opposed to the prior art ADCs, which are temperature dependent. Also, the accuracy and operation of such a companding ADC is independent of the $I_s$ current of the bipolar transistor [reverse bias saturation current (alternatively referred to as scale current)], which can have very wide tolerance across components.

Certain of the following diagrams show the use of one or both of a P-channel or P-type metal-oxide-semiconductor field-effect transistor (MOSFET) (alternatively, PMOS transistor) or an N-channel or N-type metal-oxide-semiconductor field-effect transistor (MOSFET) (alternatively, NMOS transistor) to implement the non-linear conversion function. For example, the use of one or both of a PMOS transistor or an NMOS transistor may be used to implement a logarithmic conversion function.

In addition, certain of the following diagrams operate using a N-bit DAC 420-1 that provides an output voltage signal to be received by the gate of an NMOS transistor or a PMOS transistor. In such examples, one or more of an NMOS transistor or a PMOS transistor is implemented to provide the current that matches or tracks the load current. Certain examples operate by sourcing current, and others operate by sinking current. Even other examples operate by providing both functionality of sourcing current and sinking current as may be required to match or track the load current.

FIG. 29A is a schematic block diagram of an embodiment 2901 an ADC that includes a P-channel or P-type metal-oxide-semiconductor field-effect transistor (MOSFET) (alternatively, PMOS transistor) implemented to source current in accordance with the present disclosure.

For example, the use of one or both of an NMOS transistor or a PMOS transistor operates as a square root conversion function. For example, the drain current, ID, of a MOSFET is as follows:

$$I_D = \frac{\mu C_{OX}}{2} \frac{W}{L}(V_{GS} - V_T)^2,$$

where
- $V_{GS}$ is the voltage across the gate (G) to source (S) junction of the MOSFET;
- $V_T$ is the thermal voltage, kT/q, which is the Boltzmann constant, k, times temperature, T, divided by electron charge, q;
- W is gate width;
- L is gate length;
- µCox is a process transconductance parameter; and
- µCox (W/L) is a MOSFET transconductance parameter.

As such, the voltage across the gate (G) to source (S) junction of the MOSFET, $V_{GS}$, is the output voltage of the N-bit DAC 420-1. As such, the value of $V_{GS}$ is the output voltage of the N-bit DAC 420-1.

Given that $V_{GS}$ is the output voltage of the N-bit DAC 420-1, then it is also the conversion of the Do 2 to an analog signal.

Therefore, the Do 2 (shown as Do in the equation below) is a an inverse function of the above equation showing the drain current, $I_D$, as follows:

$$Do = V_{GS} = \sqrt{\frac{2L}{\mu C_{OX} W} I_D} - V_T$$

As can be seen, this shows the Do 2 (shown as Do in the equation above) as being a square root function of the input current, which is the drain current, $I_D$.

Also, note that parallel measurement similar to the log ratio-metric measurement may be used to remove the dependence on $V_T$, which is the thermal voltage, kT/q, and which varies as a function of temperature. For example, a similar diode configuration and Iref current mirror as in the bipolar transistor variant can be applied here with respect to MOSFET devices.

For example, consider generating a first digital output signal, shown as Do 1 below, and also a first digital output signal, shown as Do2 below:

$$Do_1 = V_{GS} = \sqrt{\frac{2L}{\mu C_{ox} W} I_{D1}} - V_T,$$

and $$Do_2 = V_{GS} = \sqrt{\frac{2L}{\mu C_{ox} W} I_{D2}} - V_T,$$

then the difference between them is as follows:

$$Do_1 - Do_2 = \sqrt{\frac{2L}{\mu C_{OX} W} I_{D1}} - \sqrt{\frac{2L}{\mu C_{OX} W} I_{D2}},$$

which is temperature independent and has no dependence on $V_T$, which is the thermal voltage, kT/q.

Referring again to FIG. 29A, this diagram shows a PMOS transistor implemented to source current to a node that connects to the load 32 to match and track the load current.

FIG. 29B is a schematic block diagram of an embodiment 2902 an ADC that includes an N-channel or N-type metal-oxide-semiconductor field-effect transistor (MOSFET) (alternatively, NMOS transistor) implemented to sink current in accordance with the present disclosure. This diagram shows an NMOS transistor implemented to sink current from a node that connects to the load 32 to match and track the load current.

Figure 30:
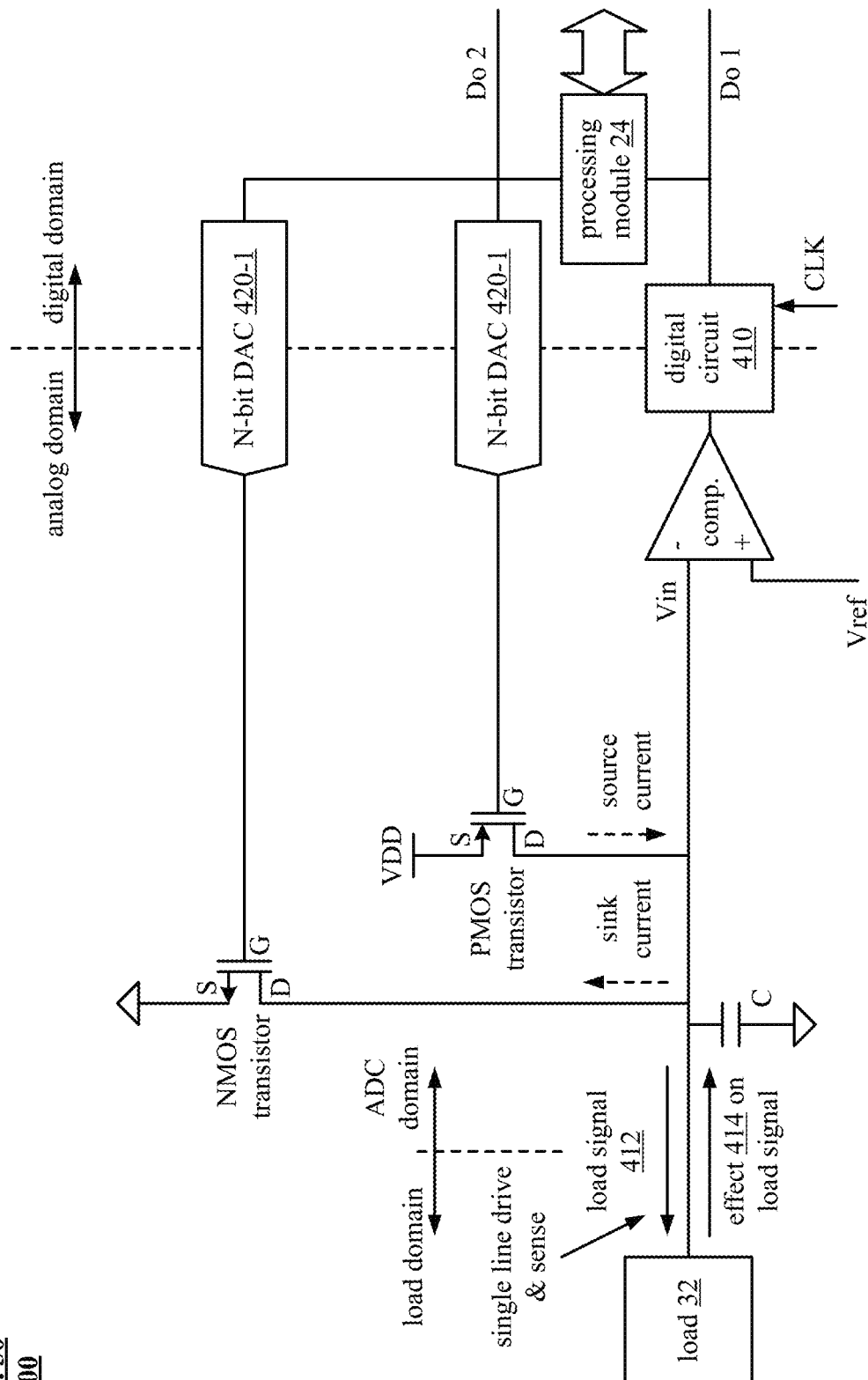
FIG. 30 is a schematic block diagram of an embodiment an ADC that includes both a PMOS transistor implemented to source current and an NMOS transistor implemented to sink current in accordance with the present disclosure.

FIG. 30 is a schematic block diagram of an embodiment 3000 an ADC that includes both a PMOS transistor implemented to source current and an NMOS transistor implemented to sink current in accordance with the present disclosure. This diagram shows both a PMOS transistor implemented to source current to a node that connects to the load 32 to match and track the load current and also an NMOS transistor implemented to sink current from a node that connects to the load 32 to match and track the load current. In cooperation with one another, both the PMOS transistor and the NMOS transistor can operate either to sink or source current as may be needed to match and track the load current.

Figure 31:
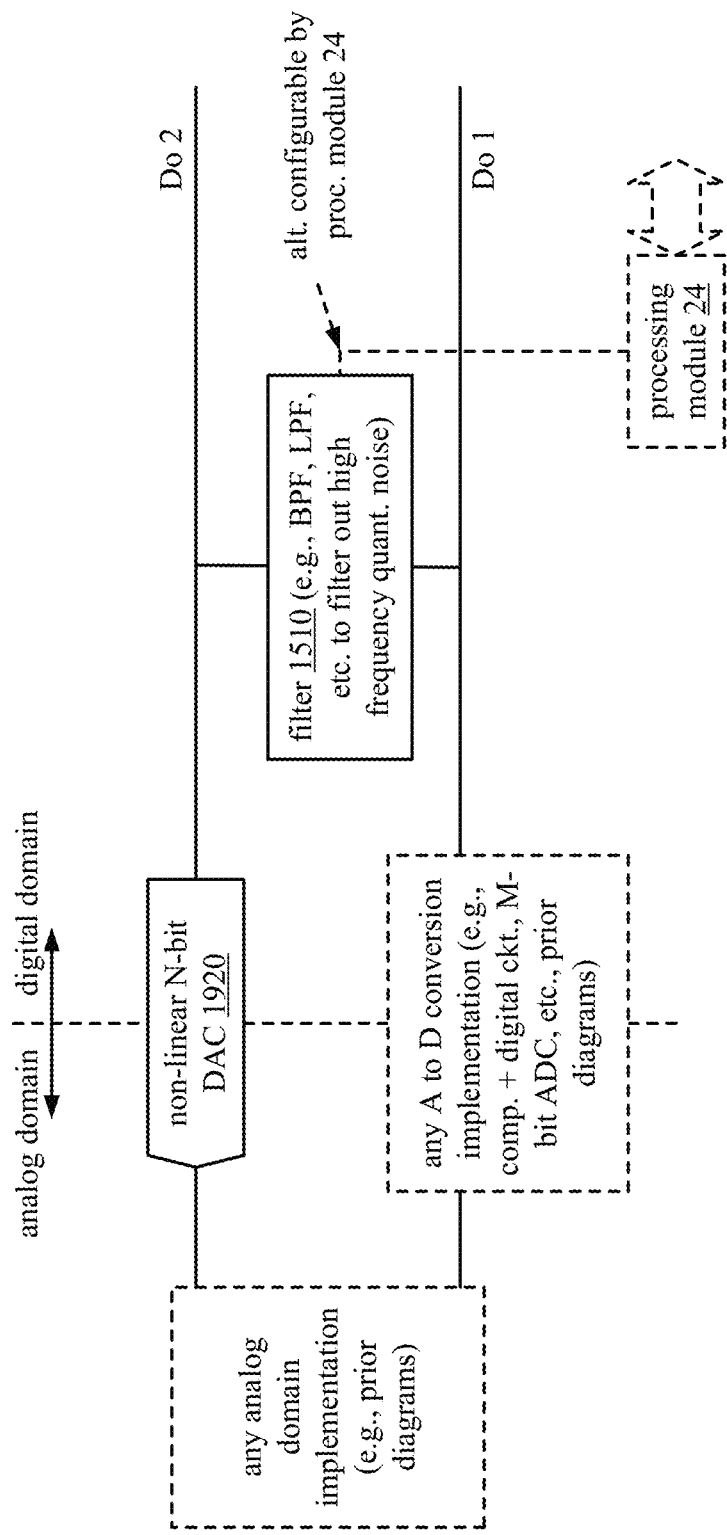
FIG. 31 is a schematic block diagram showing an embodiment of digital domain filtering within an ADC that includes a non-linear N-bit DAC in accordance with the present disclosure.

FIG. 31 is a schematic block diagram showing an embodiment 3100 of digital domain filtering within an ADC that includes a non-linear N-bit DAC in accordance with the present disclosure. This diagram is similar to FIG. 15 with a difference being that a non-linear N-bit DAC 1920 is implemented in place of the N-bit DAC 420.

Figure 32:
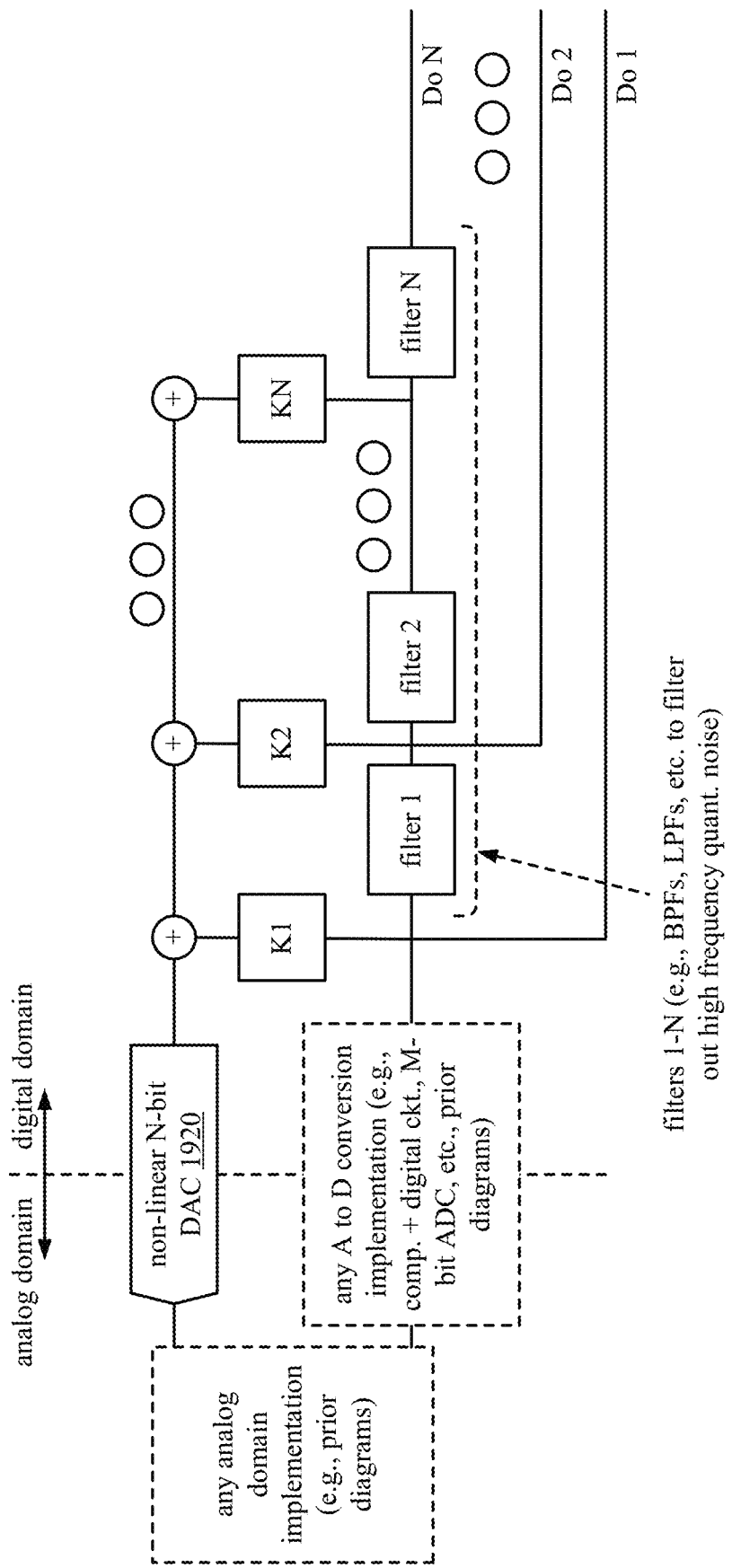
FIG. 32 is a schematic block diagram showing an embodiment of digital domain filtering using cascaded filters within an ADC that includes a non-linear N-bit DAC in accordance with the present disclosure.

FIG. 32 is a schematic block diagram showing an embodiment 3200 of digital domain filtering using cascaded filters within an ADC that includes a non-linear N-bit DAC in accordance with the present disclosure. This diagram is similar to FIG. 16 with a difference being that a non-linear N-bit DAC 1920 is implemented in place of the N-bit DAC 420.

Figure 33:
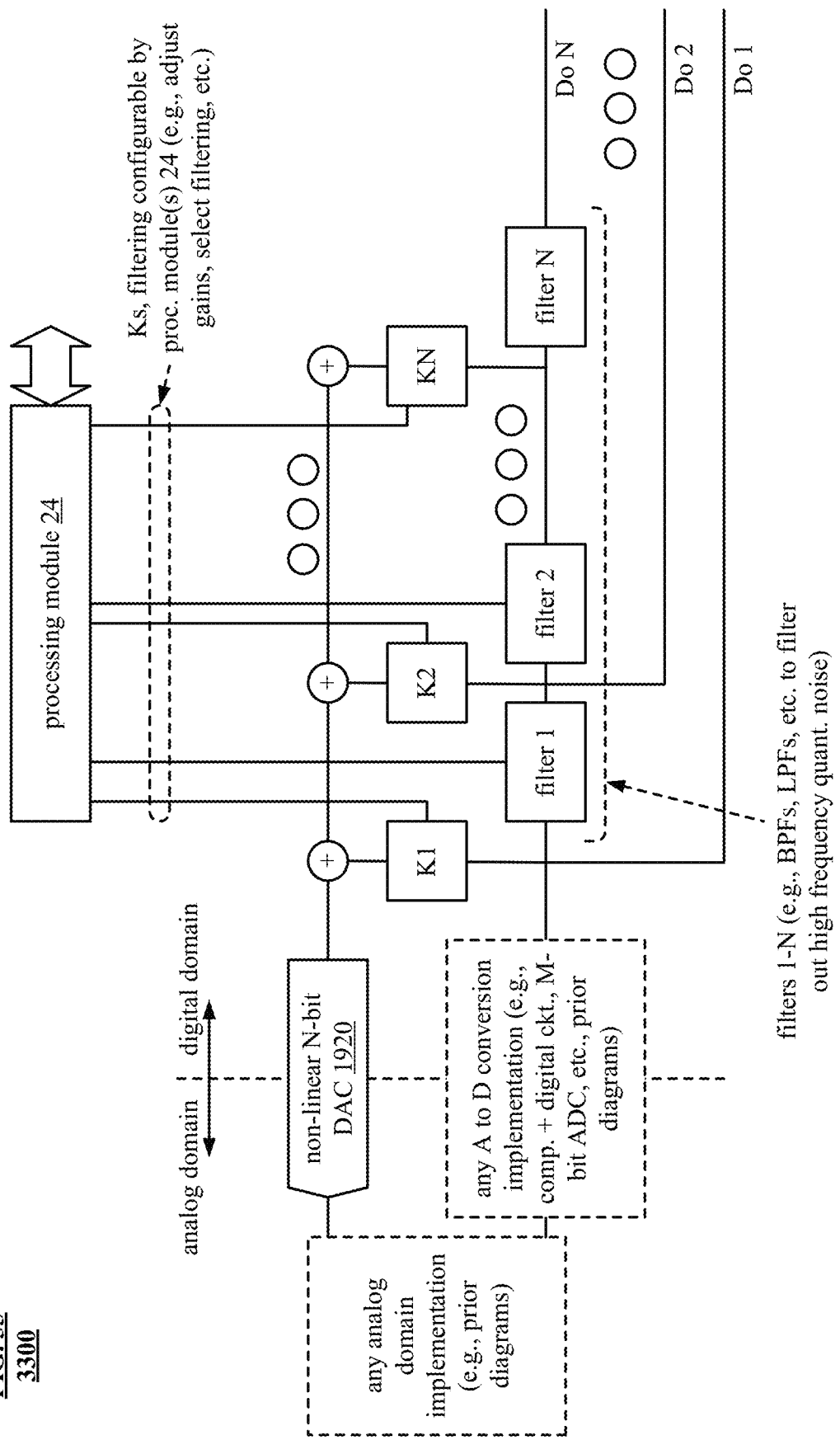
FIG. 33 is a schematic block diagram showing another embodiment of digital domain filtering using configurable/adjustable cascaded filters within an ADC that includes a non-linear N-bit DAC in accordance with the present disclosure.

FIG. 33 is a schematic block diagram showing another embodiment 3300 of digital domain filtering using configurable/adjustable cascaded filters within an ADC that includes a non-linear N-bit DAC in accordance with the present disclosure. This diagram is similar to FIG. 17 with a difference being that a non-linear N-bit DAC 1920 is implemented in place of the N-bit DAC 420.

Figure 34:
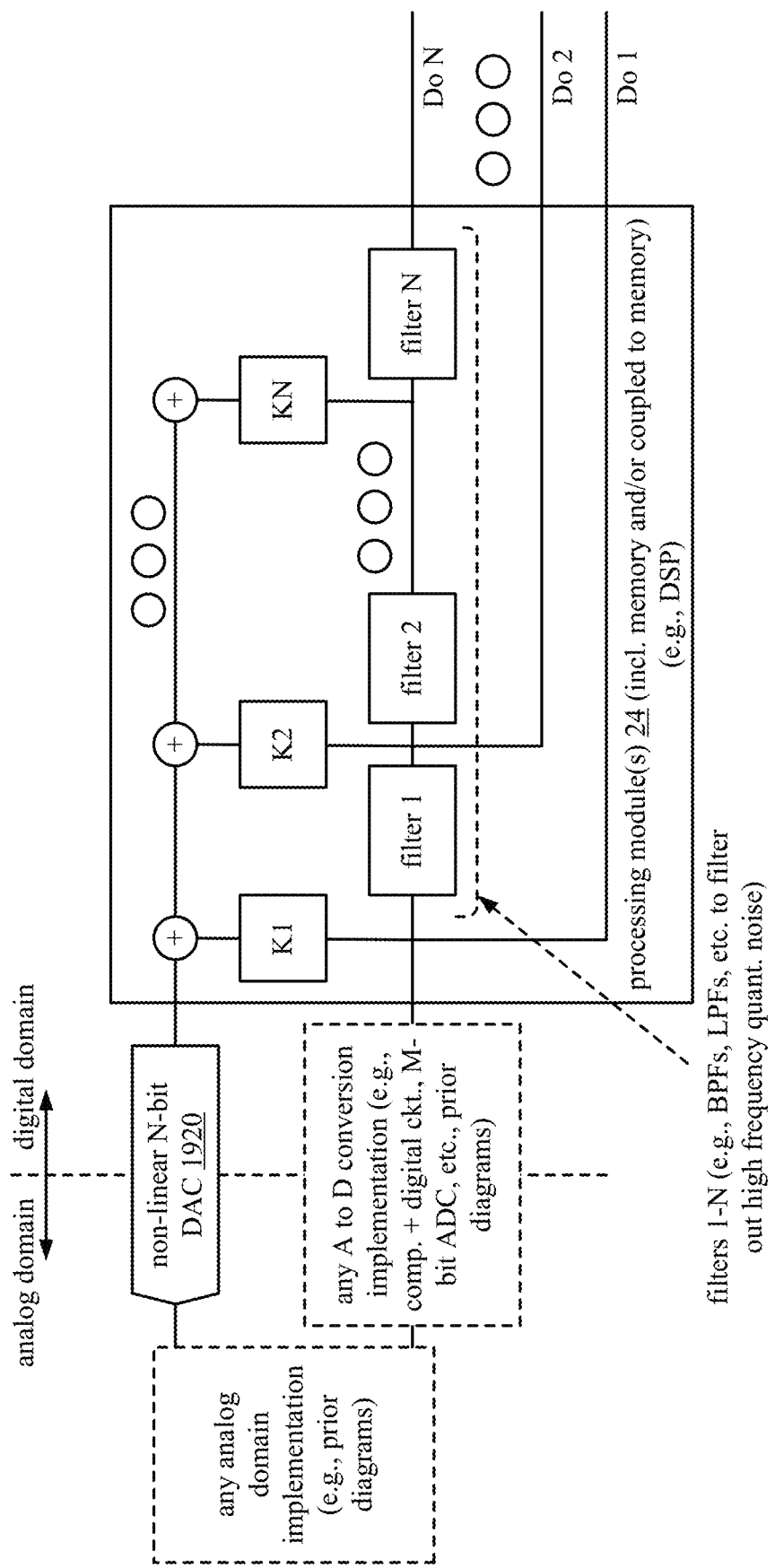
FIG. 34 is a schematic block diagram showing an embodiment of one or more processing modules implemented to perform digital domain filtering within an ADC that includes a non-linear N-bit DAC in accordance with the present disclosure.

FIG. 34 is a schematic block diagram showing an embodiment 3400 of one or more processing modules implemented to perform digital domain filtering within an ADC that includes a non-linear N-bit DAC in accordance with the present disclosure. This diagram is similar to FIG. 18 with a difference being that a non-linear N-bit DAC 1920 is implemented in place of the N-bit DAC 420.

FIGS. 35A, 35B, and 35C are schematic block diagrams showing various embodiments 3501, 3502, and 3503, respectively, of analog to digital converters (ADCs) with improved bandwidth in accordance with the present disclosure.

Referring to embodiment 3501, this diagram has certain similarities with other diagrams, for example, FIG. 4. An ADC is connected to or coupled to a load 32 via single line such that the ADC is configured to provide a load signal 412 via that single line and simultaneously to detect any effect 414 on that load signal via a single line (including any change thereof). In certain examples, the ADC is configured to perform single line drive and sense of that load signal 412, including any effect 414 thereon via that single line. This embodiment similarly includes a charging capacitor, C, that is coupled to one or the inputs of a comparator as voltage signal, yin. The other input of the comparator receives a reference voltage signal, Vref. The output of the comparator is provided to a digital circuit 410 (e.g., which is clocked by a clock signal CLK and is configured to generate a digital output signal Do 1 at the particular clock rate of the clock signal CLK). Note that while a comparator coupled to a digital circuit 410 is shown in this diagram note that such a combination of elements may be alternatively implemented using any of the variations found in certain other diagrams herein, such as with respect to FIG. 5A. Note that any of the various implementations 501, 502, 503, 504, may alternatively be implemented in place of the combination of a comparator and a digital circuit 410 within this diagram and any other diagram herein. The output of the digital circuit 410 provides a digital output signal Do 1. As may be desired, the digital output signal Do 1 is provided to one or more processing modules 24 that is configured to communicate and interact with one or more other devices as described herein.

In some examples, the one or more processing modules 24 is configured to process the digital output signal Do 1 to generate another digital output signal Do 2 that is fed back to the N-bit DAC 420 that is configured to generate a feedback current signal $I_{fbk}$. That interacts with the load current Load to generate a quantization noise current, $I_{load}$-$I_{fbk}$, that charges the capacitor C thereby generating the voltage is provided to the input of the comparator that is coupled to that capacitor C.

In this diagram, a current sensor 3510 is implemented and configured to measure the quantization noise current, $I_{load}$-$I_{fbk}$, that charges the capacitor C and thereby generates a signal that is representative of the quantization noise current, $I_{load}$-$I_{fbk}$. Note that the signal that is representative of the quantization noise current, $I_{load}$-$I_{fbk}$, maybe a scaled version of the quantization noise current, $I_{load}$-$I_{fbk}$ (e.g., scaled by some scaling factor k<1). Note that any of a variety of types of current sensors may be implemented to effectuate the operation of the current sensor 3510. Note that any such scheming information as may be performed by the current sensor 3510 when generating the signal that is representative of the quantization noise current, $I_{load}$-$I_{fbk}$, that it gets provided to the ADC 3512 will be compensated for as the ADC 3512 generates the output digital signal from the ADC 3512 that undergoes combination with the digital output signal Do 2. For example, any appropriate information regarding scaling of the signal generated by the current sensor 3510 will be included within the digital signal that is generated by the ADC 3512 (e.g., if the signal generated by the current sensor 3510 corresponds to a scaled representation of the quantization noise current, $I_{load}$-$I_{fbk}$, by a factor of ½ then the ADC 3512 will scale up the digital output signal by a factor of 2; if the signal generated by the current sensor 3510 corresponds to a scaled representation of the quantization noise current, $I_{load}$-$I_{fbk}$, by a factor of ¼ then the ADC 3512 will scale up the digital output signal by a factor of 4; and so on). Some various options (non-exhaustive) by which current sensing and current sensing circuits may be implemented are shown with respect to FIGS. 35D through 35K.

The current measurement signal that is provided from the current sensor 3510 is a signal that is representative of the sensed quantization noise current, $I_{load}$-$I_{fbk}$, that charges the capacitor C and thereby generates the voltage signal, yin, that is provided to one of the inputs of the comparator. Note that this current measurement signal may be viewed as a signal that is representative of the quantization noise current, $I_{load}$-$I_{fbk}$. This current measurement signal is provided to an ADC 3512 that is configured to generate additional signal that is provided to a combiner (e.g., a subtract or a summer such that one of the inputs is inverted before combination) to be combined with the other digital output signal Do 2 to subtract the quantization noise from that other digital output signal Do 2. The output of the combiner, after combination of the other digital output signal Do 2 and the digital signal that is generated by the ADC 3512 that corresponds to the quantization noise current (e.g., representative of the quantization noise current, $I_{load}$-$I_{fbk}$), is yet another/third digital output signal Do 2' that has significantly lower quantization noise than the other digital output signal Do 2. Note that the ADC 3512 may be implemented similar to an ADC as shown in the top portion of the diagram, such as similar to that of FIG. 4 and/or other implementations of an ADC as described herein.

An ADC implemented based on this embodiment 3501 and others presented herein provide much improved bandwidth compared to other ADCs. For example, by sensing and subtracting the quantization noise current, or effectively within the digital domain by subtracting the quantization noise from the other digital output signal Do 2, a signal having a much higher bandwidth may be achieved with relatively little complexity, if any. For example, an ADC as implemented based on this embodiment 3501 and others presented herein provide the benefits of a third or fourth quarter modulator, such as a sigma delta modulator, without any extra added complexity. By subtracting out the quantization noise from the digital output signal Do 2, the other digital output signal Do 2' is generated that has a significantly extended operational bandwidth in comparison to the digital output signal Do 2. In addition, such an ADC as implemented based on this embodiment 3501 and others presented herein may be implemented much more economically than prior art ADCs. Not only can such an ADC as implemented based on this embodiment 3501 and others presented herein be implemented to provide much improved performance including in terms of improved bandwidth, but it may also be implemented without any extra added complexity, and may be implemented more economically than prior art ADCs.

As may be desired in certain implementations, the decimation filter may be implemented to process the other/third digital output signal Do 2' to generate yet another/fourth digital output signal Do 2" having a lower sampling rate and a higher resolution than the other/third digital output signal Do 2'.

In certain examples, note that the other/fourth digital output signal Do 2" is provided to one or more other devices such as one or more processing modules that is configured to process the other/fourth digital output signal Do 2" to interpret information contained therein. Also, many other embodiments, diagrams, etc. show one or more digital output signals being generated by the various components therein. Similarly, in certain examples, note that any such one or more digital output signals is provided to one or more other devices such as one or more processing modules that is configured to process the one or more digital output signals to interpret information contained therein.

Within this diagram as well as any other diagram herein that includes a decimation filter, note that information included within the digital signal being provided to the decimation filter and the digital signal being output from the decimation filter both include comparable information. The decimation filter is operative to modify the sampling rate and resolution between digital signal being provided to the decimation filter and the digital signal being output from the decimation filter.

The quantization noise current, $I_{load}$-$I_{fbk}$, that is provided to one of the inputs of the comparator that operates in cooperation with the digital circuit 410 is configured to generate a digital signal that is oversampled with a high-frequency clock in the digital circuit 410. Again, the comparator and the digital circuit 410 may be implemented in an alternative implementation, yet the clock signal is such that it generates an oversampled digital output signal Do 1. The N-bit DAC 420 is configured to generate the feedback current signal, $I_{fbk}$, that undergoes combination with the load current signal to generate the quantization noise current, $I_{load}$-$I_{fbk}$. In an ideal implementation, N of the N-bit DAC 420 is infinite such that the N-bit DAC four and 20 generates a feedback current signal having zero quantization noise. However, in a real application implementation, N of the N-bit DAC 420 is finite such that the feedback current signal, $I_{fbk}$, does include some effect that is caused by the quantization noise.

Such an implementation of an ADC as shown in this diagram significantly expands the bandwidth of operation having a very high signal to noise ratio (SNR). For example, the operational frequency range extends significantly, in some instances up to 200-300 kHz (e.g., with a 20 MHz sampling rate), by sensing and removing the effects of the quantization noise current via the sensing of the quantization noise current, $I_{load}$-$I_{fbk}$, and combination with the digital output signal Do 2 thereby generating a digital output signal Do 2' having much lower quantization noise. The sensing of and subtracting of the quantization noise from the digital output Do 2 significantly improves the overall functionality of the ADC by extending the bandwidth having a very high SNR.

Also, note that such an ADC is configured to consume a very low-power in operation. For example, in once this example, the entire power consumption of the ADC is approximately 6 milli-Watts (mW) (e.g., consuming less than 6 mW during operation). Note that the implementation of such an ADC includes a mixture of approximately 90% digital circuitry and 10% analog circuitry. One of the larger components in the overall ADC is the and—bit DAC 420. Given the significant amount of digital circuitry within such an implementation, the power consumption of the ADC is very low. In addition, given the significantly small number of analog components within the ADC, thermal noise is significantly reduced. Generally speaking, reducing the number of analog components will facilitate reduction in thermal noise of the overall circuit. In some implementations, the digital output signal Do 2' (after subtraction of the quantization noise from the digital output signal Do 2) or the other digital output signal Do 2" (output from the decimation filter) is implemented to have 14-16 bits of resolution. In some specific implementations when the bandwidth is extended even more significantly, and the resolution of these digital output signals Do2' or Do 2" may be even greater, such as more than 20 bits of resolution (e.g., 21 bits of resolution in one specific example).

With such an extension of bandwidth to an upper range of approximately 200-300 kHz (e.g., with a 20 MHz sampling rate), such an ADC that is operative to consume very little power and provide very high accuracy while also providing such a broad operational bandwidth, such an ADC may be implemented in a broad range of applications. For example, by providing an operational bandwidth up to approximately 100 kHz, such an ADC may be implemented within audio applications while providing high accuracy and while consuming very low-power. For example, considering audio applications, such as processing of human speech, such an ADC is configured to detect with very high accuracy even very small variations within a person's voice.

Also, with respect to the ADC 3512 implemented near the bottom of the diagram, note that the ADC 3512 may be as simple as that 1-bit ADC. Such an ADC may be approximately ¼ of the size of the N-bit DAC 420 located towards the top of the diagram. In other implementations, the ADC 3512 is replaced with a single comparator.

In addition, note that the one or more processing modules 24 may be viewed as operating as an integrator in certain examples. For example, consider a 6-bit digital output signal Do 2 coming out of the one or more processing modules 24 as being representative of the signal plus noise (e.g., as including quantization noise).

In an example of operation and implementation, the analog to digital converter (ADC) includes a capacitor that is operably coupled to a load and configured to produce a load voltage based on charging by a load current and a digital to analog converter (DAC) output current. Note that the ADC is coupled to the load via a single line. The ADC also includes a current sensor that is operably coupled and configured to sense a quantization noise current that is based on the load current and the DAC output current and to generate a signal that is representative of the quantization noise current. The ADC also includes a comparator operably coupled and configured to receive the load voltage via a first input of the comparator, receive a reference voltage via a second input of the comparator, and compare the load voltage to the reference voltage to generate a comparator output signal. The ADC also includes a digital circuit that is operably coupled to the comparator and configured to process the comparator output signal to generate a first digital output signal that is representative of a difference between the load voltage and the reference voltage.

The ADC also includes one or more processing modules that is operably coupled to the digital circuit and the memory and configured to execute operational instructions (e.g., such as operational instructions stored in memory) to process the first digital output signal to generate a second digital output signal that is representative of the difference between the load voltage and the reference voltage. In certain examples, the second digital output signal includes a higher resolution than the first digital output signal.

The ADC also includes an N-bit digital to analog converter (DAC) that is operably coupled to the one or more processing modules and configured to generate the DAC output current based on the second digital output signal. Note that N is a positive integer. Also, the DAC output current tracks the load current, and the load voltage tracks the reference voltage.

The ADC also includes another ADC that is operably coupled to the current sensor and configured to generate a digital signal that is representative of the quantization noise current based on the signal that is representative of the quantization noise current.

The ADC also includes a combining circuit that is operably coupled to the another ADC and the one or more processing modules and configured to subtract the digital signal that is representative of the quantization noise current from the second digital output signal to generate a third digital output signal.

In certain examples, the one or more processing modules is further configured to process the first digital output signal in accordance with performing band pass filtering or low pass filtering to generate the second digital output signal that is representative of the difference between the load voltage and the reference voltage.

In certain other examples, the comparator includes a sigma-delta comparator, and the digital circuit includes a clocked flip flop. In even other examples, a digital comparator includes both the comparator and the digital circuit. The digital comparator operably coupled and configured to receive the load voltage via a first input of the comparator, receive a reference voltage via a second input of the comparator, and compare the load voltage to the reference voltage to generate the first digital output signal that is representative of the difference between the load voltage and the reference voltage.

In certain alternative examples, the ADC also includes a decimation filter coupled to the combining circuit. When enabled, the decimation filter operably coupled and configured to process the third digital output signal to generate a fourth digital output signal having a lower sampling rate and a higher resolution than the third digital output signal.

Note that the load may be of any of a variety of types including an electrode, a sensor, or a transducer. In certain examples, the ADC includes an operational bandwidth having an upper range of 200 kHz or 300 kHz. Also, in certain specific implementations, the ADC is configured to consume less than 6 mW during operation.

Referring to embodiment 3502, this diagram is similar to the previous diagram with the least one difference being that the ADC 3512 shown at the bottom of the previous diagram is replaced with an N- or M-bit ADC 3520. For example, this ADC at the bottom of the diagram may be implemented as an N-bit ADC 3520 similar to the N-bit DAC 420 at the top of the diagram (e.g., N corresponds to a positive integer less than or equal to 8 bit resolution, N<8). In one particular implementation, N corresponds to a positive integer less than or equal to 8 bit resolution (N<8), and M corresponds to a positive integer between 1 and 4 bit resolution (M=1 to 4), inclusive. In certain implementations as described above, the N- or M-bit ADC 3520 may be implemented using an M-bit ADC 3520, such that M<N, given that the signal that is representative of the quantization noise current, $I_{load}-I_{ibk}$, that is generated by the current sensor 3510 will generally be a much smaller signal (e.g., a much smaller current signal in terms of magnitude) than the quantization noise current, $I_{load}-I_{ibk}$, itself.

In this diagram, the N- or M-bit ADC 3520 is implemented instead of the ADC 3512 of the previous diagram. For example, the N- or M-bit ADC 3520 is operably coupled to the current sensor and configured to generate a digital signal that is representative of the quantization noise current based on the signal that is representative of the quantization noise current. Note that M is a positive integer that is less than or equal to N.

Referring to embodiment 3503, this diagram has certain similarities with the previous two diagrams with at least one difference being that the ADC at the bottom of the prior two diagrams is replaced with a comparator operating in conjunction with a digital circuit 410 that is clocked by a clock signal CLK. In this diagram, a charging capacitor C is connected to one of the inputs of the comparator to generate a voltage signal at that input of the comparator. In addition, a reference voltage Vref (QN) is provided to the other input of the comparator to facilitate detection of a voltage signal corresponding to the quantization noise current, $I_{load}-I_{ibk}$. Also note that the combination of the comparator and the digital circuit 410 may alternatively be implemented using any of a number of variations including those described with respect to FIG. 5A. In this diagram, a first and second charging capacitor C, a first and second comparator, and a first and second digital circuit 410 are implemented. The second charging capacitor C, the second comparator, and the second digital circuit 410 are implemented instead of the ADC 3512 or the N- or M-bit ADC 3520 of the previous diagrams.

FIGS. 35D, 35E, 35F, 35G, 35H, 35I, 35J, and 35K are schematic block diagrams showing various embodiments 3504, 3505, 3506, 3507, 3508, 3509, 3521, and 3522, respectively, of current sensor circuitry that may be implemented in accordance with the present disclosure. These diagrams show some samples of various means by which current may be sensed. Note that these examples are non-not exhaustive and any other equivalent type current sensing capable device may alternatively be used.

Referring to embodiment 3504, a current sensor 3510 generates a current signal $I_2$ that is representative of the current flowing through the line from left to right $I_1$. For example, the current signal $I_2$ may be a scaled up or scale down versions of the current signal $I_1$. Such a current sensor 3510 may be implemented in a variety latest including a ferromagnetic current sensor that encompasses the wire or line that includes the current signal $I_1$ being sensed. Based on the coupling of magnetic field is generated by the current signal $I_1$ within the ferromagnetic current sensor, the current signal $I_2$ is induced within the magnetic core of the ferromagnetic current sensor.

Referring to embodiment 3505, a current sensor 3510-1 generates a voltage signal $V_{out}$ that is representative of the current flowing through the line from left to right $I_1$. For example, the voltage signal $V_{out}$ may is a signal that is representative of the current signal $I_1$. There may be some instances in which a voltage signal $V_{out}$ that is representative of the current signal $I_1$ is more desirable than a current signal $I_2$ that is representative of the current signal $I_1$.

Referring to embodiment 3506, in this diagram, the current signal $I_1$ is provided to a resistor $R_1$. The difference in voltage between the two ends of the resistor $R_1$ (V1 and V2) along with the value of the resistor $R_1$ are used to determine the current signal $I_1$ based on Ohm's Law (Delta $V=\Delta V=V1-V2=I_1 \times R_1$, and $I_1=(V1-V2)/R_1$). Note that the symbol $\Delta$ is sometimes used in place of the word Delta herein, and vice versa; they both mean the same thing being the difference of, change of, difference between two values, etc. as is understood in the art.

Referring to embodiment 3507, this diagram shows a current mirror circuit. This included two transistor implementation of the current mirror that is based on the relationship that two equal sized transistors at the same temperature with the same characteristics, such as the $V_{BE}$ (voltage drop between the base and emitter of an NPN transistor in this implementation of two NPN BJTs (alternatively, Negative-Positive-Negative Bipolar Junction Transistors)) have the same collector current Ic. The current mirror is a circuit that functions to produce a copy of the current flowing into or out of an input terminal, such as the current signal $I_1$ that is flowing through the resistor $R_1$ and into the collector of the transistor Q1 on the left-hand side of the diagram. The collector and the base of the transistor Q1 are connected together. Also, the collector of the transistor Q1 is connected to the base of the transistor Q2. The voltage at the collector note of the transistor Q1 corresponds to the $V_{BE}$ of that same transistor Q1. This same voltage potential is provided to the base of the transistor Q2. As such, of the current signal $I_2$ that will be induced to flow at the collector note of the transistor Q2 will be the same as the current signal $I_1$.

Referring to embodiment 3508 and 3509, these diagrams correspond to high side current sensing and low side current sensing, respectively based on a load being implemented above or below a resistor $R_1$. A power supply voltage, $V_{pwr\ supp}$, provides a voltage potential that is higher than ground and thereby facilitates the flow of current signal $I_1$ via the load and the resistor $R_1$. One or more operational amplifiers/circuits is implemented to generate an output voltage signal $V_{out}$ that is representative of the current signal $I_1$ that is flowing via the load and the resistor $R_1$.

Referring to embodiment 3508, this diagram depicts high side current sensing such that the current sensing connects to the resistor between the power supply of the load. The sensed voltage signal may be scaled, such as amplified, by one or more operational amplifiers/circuits to generate the output voltage signal $V_{out}$ that is representative of the current signal $I_1$ that is flowing via the load and the resistor $R_1$. Some advantages of performing include eliminating ground disturbance, detecting the high load current caused by accidental electrical shorts, having the load connecting to the system ground directly, etc.

Referring to embodiment 3509, this diagram depicts low side current sensing such that the current sensing connects to the resistor between the load and ground. The sensed voltage signal may be scaled, such as amplified, by one or more operational amplifiers/circuits to generate the output voltage signal $V_{out}$ that is representative of the current signal $I_1$ that is flowing via the load and the resistor $R_1$. Some advantages of performing low side current sensing include providing a low input common mode voltage, a ground referenced input and output, and a relatively simple and low-cost implementations, etc.

Referring to embodiment 3521, this diagram shows a metal-oxide-semiconductor field-effect transistor (MOSFET) current splitter implemented using PMOS transistors. For example, consider a current signal $I_1$ entering the node connected to the sources of the PMOS transistors of the MOSFET current splitter. Also, a voltage bias, Vbias is provided to the gates of the PMOS transistors of the MOSFET current splitter. Considering a MOSFET current splitter that includes two PMOS transistors M1 and M2 of the same size, then the current signal $I_1$ will be evenly split between the two PMOS transistors M1 and M2 as follows: $I_1=I_{1a}+I_{1b}$, and $I_{1a}=I_{1b}$. Alternatively, considering a MOSFET current splitter that includes two PMOS transistors M1 and M2 of not of the same size, and PMOS transistor M1 is less in size than the PMOS transistor M2, then the current signal $I_1$ will be split between the two PMOS transistors M1 and M2 as follows: $I_1=I_{1a}+I_{1b}$, and $I_{1a}<I_{1b}$. In an alternative implementation, considering a MOSFET current splitter that includes two PMOS transistors M1 and M2 of not of the same size, and PMOS transistor M1 is greater in size than the PMOS transistor M2, then the current signal $I_1$ will be split between the two PMOS transistors M1 and M2 as follows: $I_1=I_{1a}+I_{1b}$, and $I_{1a}>I_{1b}$.

Referring to embodiment 3522, this diagram shows a bipolar current splitter implemented using PNP transistors (alternatively, Positive-Negative-Positive Bipolar Junction Transistors (BJT)). For example, consider a current signal $I_1$ entering the node connected to the emitters of the PNP BJT transistors of the bipolar current splitter. Also, a voltage bias, Vbias is provided to the bases of the PNP BJT transistors of the bipolar current splitter. Considering a bipolar current splitter that includes two PNP BJT transistors Q1 and Q2 of the same size, then the current signal $I_1$ will be evenly split between the two PNP BJT transistors Q1 and Q2 as follows: $I_1=I_{1a}+I_{1b}$, and $I_{1a}=I_{1b}$. Alternatively, considering a bipolar current splitter that includes two PNP BJT transistors Q1 and Q2 of not of the same size, and PNP BJT transistor Q1 is less in size than the PNP BJT transistors Q2, then the current signal h will be split between the two PNP BJT transistors Q1 and Q2 as follows: $I_1=I_{1a}+I_{1b}$, and $I_{1a}<I_{1b}$. In an alternative implementation, considering a bipolar current splitter that includes two PNP BJT transistors Q1 and Q2 of not of the same size, and PNP BJT transistor Q1 is greater in size than the PNP BJT transistors Q2, then the current signal h will be split between the two PNP BJT transistors Q1 and Q2 as follows: $I_1=I_{1a}+I_{1b}$, and $I_{1a}>I_{1b}$.

Note that any one of these examples of different ways in which to perform current sensing may be limited within an ADC as described herein. Generally speaking, any desired current sensor implementations may be used in various embodiments of the disclosure.

FIG. 35F shows multiple performance diagrams of ADC output 3581, 3582, 3583, and 3584, respectively, expressed as power spectral density (PSD [dB]) as a function of frequency (kilo-Hertz [kHz]) in accordance with the present disclosure.

Referring to diagram 3581, this diagram shows the ADC output with no thermal noise in the clock jitter effect. The ADC providing improved bandwidth as described herein by subtracting out the quantization noise from the digital output Do 2 (e.g., shown as improved IADC in the diagram). As can be seen, the operational bandwidth of the ADC is significantly extended in the upper frequency ranges (e.g., into the 100 s of kHz and even the low/10 s of MHz upper limits).

Referring to diagram 3582, this diagram shows the ADC output with thermal noise and also with clock jitter effect. The thermal noise raises the overall noise floor within the ADC providing improved bandwidth, but the ADC providing improved bandwidth still provides improved bandwidth as described herein by subtracting out the quantization noise from the digital output Do 2 (e.g., shown as improved IADC in the diagram). Note that the thermal noise dominates at lower frequencies in the quantization noise dominates at higher frequencies. By subtracting out quantization noise from the digital output Do 2, the operational bandwidth of the ADC is it significantly extended (e.g., into the 100 s of kHz and even the low/10s of MHz upper limits).

Referring to diagram 3583, this diagram shows the ADC output with thermal noise and also shows that quantization noise is largely negligible at lower frequencies. Although quantization noise can become exacerbated at higher frequencies, the ADC providing improved bandwidth does provide an operational bandwidth extending into the higher frequencies (e.g., into the 100 s of kHz and even the low/10s of MHz upper limits). As can be seen in this diagram, such an ADC providing improved bandwidth as described herein helps lower the quantization noise at higher frequencies. As can also be seen in this diagram, the ADC providing improved bandwidth provides improved bandwidth as described herein by subtracting out the quantization noise from the digital output Do 2 (e.g., shown as improved IADC in the diagram).

Referring to diagram 3584, this diagram also shows the ADC output with thermal noise and also with clock jitter effect. As can also be seen in this diagram, the ADC providing improved bandwidth provides improved bandwidth as described herein by subtracting out the quantization noise from the digital output Do 2 (e.g., shown as improved IADC in the diagram).

FIG. 36A is a schematic block diagram showing an embodiment 3601 of an ADC implemented with a thermometer decoder in accordance with the present disclosure. Referring to embodiment 3601, this diagram has certain similarities to others herein including a single line that is coupled from the ADC to a load 32, thereby facilitating single line drive and sense by providing a load signal 412 and detecting an effect 414 on that load signal, a charging capacitor C, a comparator implemented with a digital circuit 410 (which may alternatively be implemented using any of the variations including those in FIG. 5A), etc.

However, this diagram has certain differences from other diagrams herein as well. For example, a N-bit accumulator 3610 (shown as N-bit ACC 3610 and the diagram) is implemented to process the digital output signal from the digital circuit 410 (or alternative one or more components that generates the digital output signal generated by those one or more components). For example, the N-bit accumulator 3610 is configured to convert the digital output signal to a digital signal having a certain number of bits. In some examples, this operation involves converting a digital output signal that includes one bit every clock signal of the clocking signal that is provided to the digital circuit 410 to an N-bit signal that includes N-bits every clock signal. In one specific example, this operation involves conversion of a one-bit digital signal to a 7-bit signal or an 8-bit signal. Generally speaking, the N-bit accumulator 3610 may be configured in various alternative implementations to generate an N-bit signal having any desired number of bits, such that N is a positive integer greater than or equal to 2.

Note also that the decimation filter may be implemented to process the output digital signal from the N-bit accumulator 3610 as well. For example, the decimation filter is configured to process the digital output signal provided from the N-bit accumulator 3610 to generate another digital output signal having a lower sample rate and a higher resolution.

In addition, the digital signal that is generated by the N-bit accumulator 3610 is provided to a thermometer decoder 3612. The thermometer decoder 3612 is configured to generate an output symbol that includes a sequence of 0 s followed by a sequence of is in most instances, or alternatively all 0 s or all 1 s. For example, with respect to a thermometer code, there cannot be any 0 s in between two 1 s. Generally speaking, with respect to a thermometer code, an input value representing a particular number (e.g., 3=011 binary) generates an output value such that the lowermost bits are all of value 1, and the other uppermost bits or all of value 0. Generally speaking, for an n-bit binary code, the corresponding thermometer code will have 2n-1 symbols. As such, as many bits are needed to represent the thermometer code.

The top portion of the diagram pictorially illustrates an example of a thermometer code with 8 symbols each having 7 bits. Consider 8 binary input symbols composed of 3 bits each: 0=000, 1=001, 2=010, 3=011, 4=100, 5=101, 6=110, and 7=111.

Based on the input value, the thermometer code will generate the following output symbols.
Input 0=000, then output=0000000
Input 1=001, then output=0000001
Input 2=010, then output=0000011
Input 3=011, then output=0000111
Input 4=100, then output=0001111
Input 5=101, then output=0011111
Input 6=110, then output=0111111
Input 7=111, then output=1111111

Note that while this example corresponds to a thermometer code operating on input symbols composed of three bits each and generating output symbols composed of seven bits each, different sized thermometer codes may alternatively be implemented using the thermometer decoder 3612. For example, consider input symbols composed of 7 or 8 bits each, then corresponding output symbols in accordance with the thermometer code may be generated based on these principles.

In an example of operation and implementation, the thermometer decoder 3612 outputs thermometer code symbols based on the inputs provided from the N-bit accumulator 3610. A number of PNP BJTs (alternatively, Positive-Negative-Positive Bipolar Junction Transistors) and NPN BJTs (alternatively, Negative-Positive-Positive BJTs) are implemented to perform digital to analog conversion of the output symbols provided from the thermometer decoder 3612. Generally speaking, any desired total number X of PNP BJTs and NPN BJTs are implemented (e.g., consider Nb PNP BJTs and also Nb NPN BJTs, such that Nb is a positive integer greater than or equal to 2). By using a thermometer decoder 3612 to provide the inputs to and facilitate the operation of the Nb PNP BJTs and also Nb NPN BJTs that are implemented to perform digital to analog conversion thereby generating a source current and/or a sink current, as few as only one current source for current sink is switched on or off at a time during any transition between two successive respective values output by the thermometer decoder 3612. For example, consider the input to the thermometer decoder 3612 transitioning from 2=010 to 3=011, then the output from the thermometer decoder 3612 would transition from 0000011 to 0000111. Note that only one bit of the output from the thermometer decoder 3612 changes during such a transition. By using a thermometer decoder 3612 to facilitate operation of the Nb PNP BJTs and also Nb NPN BJTs that are implemented to perform digital to analog conversion, a significant reduction in noise may be facilitated with respect to the adaptation of a source current and/or a sink current that is set back within the ADC to regulate the input voltage (Vin) to the comparator to the input reference voltage (Vref) to the comparator. This implementation provides a significant improvement over alternative implementations that would switch on or off a large number of current sources and/or current sinks. The thermometer decoder 3612 facilitates adaptation of the feedback source current and/or a sink current in a manner that is very low noise, high precision, etc.

In certain examples, note that the sampling rate within such an ADC implemented with a thermometer decoder is programmable. For example, the sampling rate may be anywhere within the range of 400 kHz to 40 MHz in certain implementations. In addition, the reference currents that may be used within such an ADC implemented with a thermometer decoder may be of extremely low value, such as varying between 1 μA to 100 μA in certain implementations. Also, in certain examples, note that the input reference voltage signal Vref is provided as a programmable sinusoidal signal. Note that such an ADC implemented with a thermometer decoder is operative to operate using very low power, and can sink and or source current to the load 32.

FIGS. 36B and 36C are schematic block diagrams showing embodiments 3602 and 3603, respectively, of one or more PNP BJTs (alternatively, Positive-Negative-Positive Bipolar Junction Transistors) and NPN BJTs (alternatively, Negative-Positive-Positive BJTs) implemented to sink and source current within embodiments of ADCs implemented with a thermometer decoder in accordance with the present disclosure.

Referring to embodiment 3602, this diagram shows the number of NPN BJTs (e.g., Nb NPN BJTs) that are implemented such that an output symbol from a thermometer decoder is provided to the respective base terminals of the NPN BJTs. For example, each of the respective bits of the output symbol from the thermometer decoder is provided via a respective line to a respective one of the base terminals of the NPN BJTs. Considering an example of an output symbol from the thermometer decoder being 0000011, then the respective bits that are provided via the respective lines to the base terminals of the NPN BJTs are as follows: 0 is provided to 5 of the NPN BJTs, and 1 is provided to 2 of the NPN BJTs (e.g., 0 to NPN BJT 1, 0 to NPN BJT 2, 0 to NPN BJT 3, 0 to NPN BJT 4, 0 to NPN BJT 5, 1 to NPN BJT 6, and 1 to NPN BJT 7). As mentioned above, when the output from the thermometer decoder changes up or down by a particular value, only one of the bits of the output symbol of the thermometer decoder changes, and as such, only one of the respective NPN BJTs is switched on or off. Such an implementation of a number of NPN BJTs is configured to sink current based on the number of NPN BJTs that are switched on in response to the output symbol from the thermometer decoder.

Referring to embodiment 3603, this diagram shows the number of PNP BJTs (e.g., Nb PNP BJTs) that are implemented such that an output symbol from a thermometer decoder is provided to the respective base terminals of the PNP BJTs. This operates similarly to the implementation of the previous diagram with a difference being that the number of PNP BJTs is configured to source current based on the number of PNP BJTs that are switched on in response to the output symbol from the thermometer decoder. As such, the desired sink current and/or source current is provided to the single line that is connected to and/or coupled to the load 32.

Implementing both the embodiments 3602 and 3603, as such, the desired sink current and/or source current is provided to the single line that is connected to and/or coupled to the load 32.

Note that various implementations may include the structure of one or both of the embodiments 3602 and/or 3603 as may be desired in various implementations that may operate by sinking and/or sourcing current.

FIG. 36D is a schematic block diagram showing an alternative embodiment 3604 of an ADC implemented with a thermometer decoder in accordance with the present disclosure. This diagram is similar to the embodiment 3601 of FIG. 36A with at least one difference being that the PNP BJTs (alternatively, Positive-Negative-Positive Bipolar Junction Transistors) and NPN BJTs (alternatively, Negative-Positive-Positive BJTs) are replaced respectively with PMOS and NMOS metal-oxide-semiconductor field-effect transistors (MOSFETs) SFET s) (PMOS and NMOS transistors). The PMOS and NMOS transistors operate similarly to source and/or sink current based on the to the single line that is connected to and/or coupled to the load 32. In certain examples, it is preferable to implement PMOS and NMOS transistors instead of PNP and NPN BJTs to source and/or sink current.

FIGS. 36E and 36F are schematic block diagrams showing embodiments of one or more metal-oxide-semiconductor field-effect transistors (MOSFETs) including one or more PMOS transistors and NMOS transistors implemented to sink and source current within embodiments of ADCs implemented with a thermometer decoder in accordance with the present disclosure.

Referring to embodiments 3605 and 3606, these diagrams are similar to the embodiments 3602 and 3603 of FIG. 36B and FIG. 36C, respectively, with at least one difference being that the PNP BJTs (alternatively, Positive-Negative-Positive Bipolar Junction Transistors) and NPN BJTs (alternatively, Negative-Positive-Positive BJTs) are replaced respectively with PMOS and NMOS metal-oxide-semiconductor field-effect transistors (MOSFETs) SFET s) (PMOS and NMOS transistors).

Referring to embodiment 3605, this diagram shows the number of NMOS transistors that are implemented such that an output symbol from a thermometer decoder is provided to the respective gate terminals of the NMOS transistors. For example, each of the respective bits of the output symbol from the thermometer decoder is provided via a respective line to a respective one of the gate terminals of the NMOS transistors. Such an implementation of a number of NMOS transistors is configured to sink current based on the number of NMOS transistors that are switched on in response to the output symbol from the thermometer decoder. As such, the desired sink current is provided to the single line that is connected to and/or coupled to the load 32.

Referring to embodiment 3606, this diagram shows the number of PMOS transistors that are implemented such that an output symbol from a thermometer decoder is provided to the respective gate terminals of the PMOS transistors. This operates similarly to the implementation of the previous diagram with a difference being that the number of PMOS transistors is configured to source current based on the number of PMOS transistors that are switched on in response to the output symbol from the thermometer decoder. As such, the desired source current is provided to the single line that is connected to and/or coupled to the load 32.

Implementing both the embodiments 3605 and 3606, as such, the desired sink current and/or source current is provided to the single line that is connected to and/or coupled to the load 32.

Note that various implementations may include the structure of one or both of the embodiments 3605 and/or 3606 as may be desired in various implementations that may operate by sinking and/or sourcing current.

FIG. 36G is a schematic block diagram showing an alternative embodiment 3607 of an ADC implemented with a thermometer decoder in accordance with the present disclosure. Referring to embodiment 3607, this diagram has similarity to the embodiment 3601 and embodiment 3604 with at least one difference being that the Nb PNP BJTs and also Nb NPN BJTs or replaced by resistor banks that operate to sink and/or source current. For example, consider a number of resistors (e.g., $R_1$ to $R_x$ connected to ground to sink current and/or $R_1$ to $R_x$ connected to ground to a power supply such as VDD to source current) that are implemented within respective resistor banks such that any desired number of those resistors in each of the respective banks may be connected or disconnected as desired to facilitate a particular current sink and/or current source to be fed back to the single line that is connected to and/or coupled to the load 32.

In an example of operation and implementation, a smaller sink current and/or smaller source current is provided from the respective resistor banks based on all of the resistors therein being switched in. For example, number of resistors implemented in parallel provides a lower resistance than any one of the respective resistor is singularly switched in while the others are not connected. Based on the value of the output symbol from the thermometer decoder 3612, the appropriate number of resistors are switched in within the one or more resistor banks thereby facilitating the desired current sink and/or current source to be fed back to the single line that is connected to and/or coupled to the load 32.

Note that alternative implementations, circuits, etc., may be implemented to provide the desired current sink and/or current source to be fed back to the single line that is connected to and/or coupled to the load 32 based on the value of the output symbol from the thermometer decoder 3612. For example, a number of independent and/or dependent current sources may alternatively be implemented and controlled based on the output symbol from the thermometer decoder 3612, a number of current buffers may alternatively be implemented and controlled based on the output symbol from the thermometer decoder 3612, etc.

Note that various aspects, embodiments, and/or examples of the disclosure (and/or their equivalents) include analog to digital converters (ADCs) including current mode ADCs (IADCs). Note that any of the embodiment, implementation, and/or example of an ADC as described herein (and/or their equivalents) may be implemented within various devices and/or systems as described herein. In addition, other alternative implementations of ADCs are described in U.S. Utility patent application Ser. No. 17/132,241, "Single-ended direct interface dual DAC feedback photo-diode sensor," filed Dec. 23, 2020, pending. Any instantiation of an ADC as described herein may also be implemented using any of the various implementations of various ADCs described in U.S. Utility patent application Ser. No. 17/132,241 including the additional U.S. Utility Patent Application that are claimed priority therein and/or incorporated by reference.

In certain applications, battery, based sensors are impractical due to a number of reasons. For example, in some applications, the size of the battery in a device is prohibitive for its proper implementation. Also, in some applications, the lifespan of a battery is prohibitive for its proper operation and longevity within certain applications. This disclosure describes many examples, embodiments, variants, etc. of batteryless wireless sensor devices. Certain architectures described herein include a very low-power analog to digital converter (ADC) (e.g., a current mode ADC or alternative low-power ADC) with an energy harvesting radio frequency (RF) receiver to collect energy and to power the ADC and the sensor within a batteryless wireless sensor device. The batteryless wireless sensor device is configured to collect sensor data and transmits that sensor data to another wireless device. There are a variety of means by which the sensor data may be provided to the other wireless device (e.g., via an RF transmitter, and RF transceiver, by performing impedance modulated data transmission using one or more components of the batteryless wireless sensor device, etc.). The wireless transmission of sensor data from the batteryless wireless sensor device to another wireless device may be performed using any desired wireless medication system. Examples of such wireless communication systems include a cellular communication system, a Bluetooth communication system, is a be communication system, and/or a wireless local area network (WLAN).

FIG. 37A is a schematic block diagram showing an embodiment 3701 of a batteryless wireless sensor system in accordance with the present disclosure. This diagram includes one or more batteryless wireless sensor devices 3710 that perform energy harvesting and sensor data communication with a computing device 12 that includes an RF transceiver. In an example of operation and implementation, a batteryless wireless sensor device 3710 harvests energy from an RF signal that is transmitted by the RF transceiver of the computing device 12 and generates ADC signal based on the energy harvested from that RF signal. For example, the RF signal is transmitted as a continuous wave signal with sufficient energy that can be harvested by the batteryless wireless sensor device 3710 so as to facilitate operation of one or more components within the batteryless wireless sensor device 3710. The batteryless wireless sensor device is configured to power up and operate an ADC and sensor within the batteryless wireless sensor device based on the DC signal that is generated from the energy harvesting of the RF signal that is transmitted by the RF transceiver of the computing device 12.

In certain examples, the RF signal is provided as a continuous wave signal is included within a frequency band that is designated for unlicensed operation by the United States (US) Federal Communications Commission (FCC). For example, the industrial, scientific, and medical (ISM) radio bands or radio band, portions of the RF spectrum, that are reserved internationally for the use of RF energy for industrial, scientific, and medical (ISM) purposes other than told communications. Certain frequencies within the RF spectrum are specified for and particularly made unavailable based on their assignment for other purposes such as telecommunications, military use, etc. Examples of RF spectrum that are available for unlicensed operation include those within the ranges of 900 MHz, 2.4 GHz, 5.8 GHz. As some specific examples, 915 MHz is often associated with IEEE 802.15.4 ZigBee, 2.450 GHz is often associated with Bluetooth under wireless personal area networks (WPANs) and also IEEE 802.11 WiFi, and 5.8 GHz is often associated with IEEE 802.11 WiFi. Certain other examples include 27 MHz and 49 MHz as being available for remote control toys. Certain more costly and advanced remote control devices operate using 72 MHz, and the 2.4 GHz band is also employed for certain spread spectrum remote control (RC) control systems. Generally speaking, the RF signal may be provided using any desired frequency within a frequency band that is designated for unlicensed operation and is available for public use.

In addition, note that the transmit power of the RF signal may be quite low. For example, consider an RF signal that is transmitted with a maximum power level of 1 W or 30 dBm of power or alternatively 2 W or 33 dBm of power. Considering a wireless communication system that experiences significant loss of power during transmission, the distance of wireless communication may be limited. In such instances, such a batteryless wireless sensor system may be implemented such that the wireless communication between one or more batteryless wireless sensor devices and an RF transceiver are relatively short distances (e.g., less than 1 ft, less than 1 m, less than 5 m, etc.). In other examples when wireless communication is to be made over relatively longer distances, the transmit power of the RF signal is increased so as to facilitate effective energy harvesting by the one or more batteryless wireless sensor devices. By appropriately selecting a frequency band, and an RF signal having appropriate properties (e.g., being a continuous wave signal, having an adequate power for the distance of wireless communication to be performed and to facilitate energy harvesting), the RF signal is provided such that the batteryless wireless sensor device is configured to perform energy harvesting of that RF signal, power up, take one or more measurements based on the sensor of the batteryless wireless sensor device, digitally sample the sensor signal using the ADC of the batteryless wireless sensor device to generate sensor data, and then provide the sensor data sensor data to an RF transceiver.

The batteryless wireless sensor device 3710 is configured to generate sensor data that is based on a sensor voltage of the sensor that corresponds to a physical condition to which the sensor is exposed. Note that the sensor may be any desired type of sensor as described (e.g., in-home automation, industrial systems, healthcare, transportation, etc.) and may be placed in any of a variety of applications including bodies, automobiles, airplanes, boats, ships, trucks, motorcycles, cell phones, televisions, touch-screens, industrial plants, appliances, motors, checkout counters, etc.). The sensor data is output from the ADC based on digital sampling of the sensor voltage of the sensor by the ADC. The batteryless wireless sensor devices configured to transmit the sensor data via an RF transmitter of the batteryless wireless sensor device to the RF transceiver of the computing device 12.

In this diagram, the computing device 12 that provides the RF signal to be used for energy harvesting by the batteryless wireless sensor is also in communication with another computing device 12 on the left-hand side of the diagram that includes an RF transceiver and the data acquisition system. The computing device 12 that provides the RF signal to be used for energy harvesting by the batteryless wireless sensor receives the sensor data from the batteryless wireless sensor and conveys the sensor data to the other computing device 12. Note that this other data acquisition system in the RF transceiver as shown in the other computing device 12 on the left-hand side of the diagram may alternatively be implemented within two separate components instead of being integrated within a particular device such as this other computing device 12. For example, each of the data acquisition system in the RF transceiver may alternatively be implemented within two separate computing devices 12. The data acquisition system in the RF transceiver are in communication via any desired communication medium (e.g., wired, wireless, etc.).

In certain examples, the computing device 12 is configured to provide the RF signal to be used for energy harvesting by the batteryless wireless sensor is a portable and/or wearable device. Also, in certain examples, a batteryless wireless sensor is associated with a user (e.g., wearable by the user, mounted on the user, implanted within the user, and/or alternatively associated with the user). For example, the portable and/or wearable device may be located relatively close to the batteryless wireless sensor devices 3710, such that wireless communication from the batteryless wireless sensor devices 3710 to the portable and/or wearable device is a relatively short distance (e.g., less than 1 ft, less than 1 m, less than 5 m, etc.), and the communication from the portable and/or wearable device to the computing device is a relatively longer distance (e.g., more than 1 ft, more than 1 m, more than 5 m, more than 20 m, etc.).

FIG. 37B is a schematic block diagram showing another embodiment 3702 of a batteryless wireless sensor system in accordance with the present disclosure. In this diagram, a batteryless wireless sensor device 3710 is in communication with a computing device 12. The computing device 12 includes an RF transceiver and a data acquisition system. The batteryless wireless sensor device 3710 includes an ADC that services a sensor. The batteryless wireless sensor device 3710 also includes an RF receiver and DC rectifier that are configured to receive RF energy of an RF signal that is transmitted from the computing device 12 and perform energy harvesting on that RF signal to generate a DC signal to power up and operate the ADC at the sensor. Also, the batteryless wireless sensor device 3710 includes an RF transmitter that is configured to transmit sensor data to the computing device 12. Based on receiving of the RF signal that is transmitted from the computing device 12, the batteryless wireless sensor device is configured to power up and operate via energy harvesting, take one or more measurements using the sensor, digitally sample the signal output from the sensor using the ADC and provide the sensor data via the ADC to an RF transmitter of the batteryless wireless sensor device 3710. The RF transmitter is configured to transmit sensor data to the computing device 12.

In certain examples, the ADC is implemented as a current mode ADC. For example, the ADC is coupled to the sensor via a single line, and a sensor voltage is generated by the sensor based on charging of a capacitor of the ADC by a sensor current of the sensor and a digital to analog converter (DAC) output current from the ADC. For example, such an ADC may be implemented based on the architecture described within any of the various diagrams herein and/or any of the various implementations of various ADCs described in U.S. Utility patent application Ser. No. 17/132, 241 including the additional U.S. Utility Patent Application that are claimed priority therein and/or incorporated by reference.

In an example of operation and implementation, a batteryless wireless sensor system includes a radio frequency (RF) transceiver and a batteryless wireless sensor device. In certain examples, the radio frequency (RF) transceiver in communication with a data acquisition system as well. Note that the data acquisition system may be integrated within a common device as the RF transceiver or implemented in a separate device that is in communication with the RF transceiver. The RF transceiver is configured to transmit a RF signal and to receive sensor data from the batteryless wireless sensor device. The RF transceiver is configured to provide the sensor data to the data acquisition system.

The batteryless wireless sensor device includes a RF transmitter, an analog to digital converter (ADC), and a sensor. The batteryless wireless sensor device is configured to harvest energy from the RF signal and generate a DC signal based on the energy harvested from the RF signal. The batteryless wireless sensor device is configured to power up and operate the ADC and the sensor based on the DC signal. The batteryless wireless sensor device is also configured to generate sensor data that is based on a sensor voltage of the sensor that corresponds to a physical condition to which the sensor is exposed. The sensor data is output from the ADC based on digital sampling of the sensor voltage of the sensor by the ADC. Also, In certain examples, the ADC is coupled to the sensor via a single line, and the sensor voltage is based on charging of a capacitor of the ADC by a sensor current of the sensor and a digital to analog converter (DAC) output current from the ADC. The batteryless wireless sensor device is also configured to transmit the sensor data via the RF transmitter to the RF transceiver.

In certain other examples, the batteryless wireless sensor device is implemented to include a RF receiver configured to receive the RF signal and a DC rectifier operably coupled to the RF receiver and configured to process the RF signal that is received by the RF receiver to generate the DC signal.

In one implementation, the batteryless wireless sensor device is configured to transmit the sensor data via the RF transmitter to the RF transceiver via a wireless communication system. Examples of such a wireless communication system include any one or more of a cellular communication system, a Bluetooth communication system, a ZigBee communication system, and/or a wireless local area network (WLAN).

In yet another example, the batteryless wireless sensor system includes a computing device that includes the data acquisition system and another RF transceiver. This other RF transceiver is in communication with the RF transmitter of the batteryless wireless sensor device. The RF transmitter of the batteryless wireless sensor device is configured to transmit the sensor data to the another RF transceiver of the computing device.

In yet another example, the batteryless wireless sensor system includes a computing device that includes both the data acquisition system and the RF transceiver, and the data acquisition system and the RF transceiver are in communication via a wired communication link within the computing device.

The RF signal is implemented to include a frequency within a frequency band designated for unlicensed operation by the US Federal Communications Commission (FCC) in certain examples (e.g., within the industrial, scientific, and medical (ISM) radio bands or radio band, portions of the RF spectrum, that are reserved internationally for the use of RF energy for industrial, scientific, and medical (ISM) purposes other than told communications.

Note that the sensor of the batteryless wireless sensor device may be of any of a variety of types. Some examples of sensors include those configured to sense a condition associated with a user. Examples of such conditions associated with a user may include any one or more of heart-rate, respiration, blood pressure, movement, and/or oxygen level, etc.

Other examples of sensors include those configured to sense electric service metering, motion detection, Internet Service Provider (ISP) metering, gas line metering, gas metering, door position, window position, environmental temperature, environmental humidity, environmental pressure, and/or wind speed, etc.

In certain specific examples, the ADC is implemented to include the capacitor that is operably coupled to the sensor and configured to produce the sensor voltage based on charging by the sensor current and the DAC output current. The ADC also includes a comparator operably coupled and configured to receive the sensor voltage via a first input of the comparator, receive a reference voltage via a second input of the comparator; and compare the sensor voltage to the reference voltage to generate a comparator output signal. The ADC also includes a digital circuit operably coupled and configured to process the comparator output signal to generate a first digital output signal that is representative of a difference between the sensor voltage and the reference voltage.

The ADC also includes one or more processing modules operably coupled to the digital circuit and memory (e.g., the memory may be included within or coupled to the one or more processing modules). The one or more processing modules is configured to execute operational instructions (e.g., stored in the memory) to process the first digital output signal to generate a second digital output signal that is representative of the difference between the sensor voltage and the reference voltage. The second digital output signal includes a higher resolution than the first digital output signal. The ADC also includes an N-bit digital to analog converter (DAC) that is operably coupled to the one or more processing modules and configured to generate the DAC output current based on the second digital output signal.

Note that N is a positive integer, the DAC output current tracks the sensor current, and the sensor voltage tracks the reference voltage.

In certain examples, the comparator includes a sigma-delta comparator, and the digital circuit includes a clocked flip flop. In certain other examples, the ADC includes a digital comparator that includes both the comparator and the digital circuit. The digital comparator is operably coupled and configured to receive the sensor voltage via a first input of the comparator, receive the reference voltage via a second input of the comparator, and compare the sensor voltage to the reference voltage to generate the first digital output signal that is representative of the difference between the sensor voltage and the reference voltage.

In some alternative implementations, the ADC includes a decimation filter coupled to the one or more processing modules and configured to process the second digital output signal to generate another digital output signal having a lower sampling rate and a higher resolution than the second digital output signal.

In certain other specific examples, the ADC is implemented to include the capacitor that is operably coupled to the sensor and configured to produce the sensor voltage based on charging by the sensor current and the DAC output current. The ADC also includes an M-bit analog to digital converter (ADC) operably coupled and configured to receive the sensor voltage, receive a reference voltage, and compare the sensor voltage to the reference voltage and generate a first digital output signal that is representative of a difference between the sensor voltage and the reference voltage.

The ADC also includes one or more processing modules operably coupled to the M-bit ADC and memory (e.g., the memory may be included within or coupled to the one or more processing modules). The one or more processing modules is configured to execute operational instructions (e.g., stored in the memory) to process the first digital output signal to generate a second digital output signal that is representative of the difference between the sensor voltage and the reference voltage. Note that the second digital output signal includes a higher resolution than the first digital output signal. The ADC also includes an N-bit digital to analog converter (DAC) that is operably coupled to the one or more processing modules and operably coupled and configured to generate the DAC output current based on the second digital output signal. Note that the DAC output current tracks the sensor current, and the sensor voltage tracks the reference voltage. Also, N is a first positive integer, M is a second positive integer greater than or equal to 1, and N is greater than M.

In even other alternative implementations, the ADC includes a decimation filter coupled to the one or more processing modules and configured to process the second digital output signal to generate another digital output signal having a lower sampling rate and a higher resolution than the second digital output signal.

In yet another example of operation and implementation, a batteryless wireless sensor system includes a first computing device, a second computing device, and a batteryless wireless sensor device. The first computing device includes a data acquisition system and a first radio frequency (RF) transceiver operably coupled to the data acquisition system and configured to receive sensor data and to provide the sensor data to the data acquisition system. The second computing device includes a second RF transceiver configured to transmit a RF signal. In certain examples, the RF signal includes a frequency within a frequency band designated for unlicensed operation by the US Federal Communications Commission (FCC). The second RF transceiver is also configured to receive the sensor data and transmit the sensor data to the first RF transceiver of the first computing device. The batteryless wireless sensor system also includes a batteryless wireless sensor device. The batteryless wireless sensor device includes a RF transmitter, an analog to digital converter (ADC), and a sensor. The batteryless wireless sensor device is configured to harvest energy from the RF signal and generate a DC signal based on the energy harvested from the RF signal, and also to power up and operate the ADC and the sensor based on the DC signal. The batteryless wireless sensor device is configured to generate the sensor data that is based on a sensor voltage of the sensor that corresponds to a physical condition to which the sensor is exposed. The sensor data is output from the ADC based on a digital sampling of the sensor voltage of the sensor by the ADC. In certain examples, the ADC is coupled to the sensor via a single line. Also, the sensor voltage is based on charging of a capacitor of the ADC by a sensor current of the sensor and a digital to analog converter (DAC) output current from the ADC. The batteryless wireless sensor device is also configured to transmit the sensor data via the RF transmitter to the second RF transceiver.

Note that the sensor of the batteryless wireless sensor device may be of any of a variety of types. Some examples of sensors include those configured to sense a condition associated with a user. Examples of such conditions associated with a user may include any one or more of heart-rate, respiration, blood pressure, movement, and/or oxygen level, etc.

Other examples of sensors include those configured to sense electric service metering, motion detection, Internet Service Provider (ISP) metering, gas line metering, gas metering, door position, window position, environmental temperature, environmental humidity, environmental pressure, and/or wind speed, etc.

In certain specific examples, the ADC is implemented to include the capacitor operably that is coupled to the sensor and configured to produce the sensor voltage based on charging by the sensor current and the DAC output current. The ADC also includes a comparator operably coupled and configured to receive the sensor voltage via a first input of the comparator, receive a reference voltage via a second input of the comparator; and compare the sensor voltage to the reference voltage to generate a comparator output signal. The ADC also includes a digital circuit operably coupled and configured to process the comparator output signal to generate a first digital output signal that is representative of a difference between the sensor voltage and the reference voltage.

The ADC also includes one or more processing modules operably coupled to the digital circuit and memory (e.g., the memory may be included within or coupled to the one or more processing modules). The one or more processing modules is configured to execute operational instructions (e.g., stored in the memory) to process the first digital output signal to generate a second digital output signal that is representative of the difference between the sensor voltage and the reference voltage. The second digital output signal includes a higher resolution than the first digital output signal. The ADC also includes an N-bit digital to analog converter (DAC) that is operably coupled to the one or more processing modules and configured to generate the DAC output current based on the second digital output signal. Note that N is a positive integer, the DAC output current tracks the sensor current, and the sensor voltage tracks the reference voltage.

In certain examples, the comparator includes a sigma-delta comparator, and the digital circuit includes a clocked flip flop. In certain other examples, the ADC includes a digital comparator that includes both the comparator and the digital circuit. The digital comparator is operably coupled and configured to receive the sensor voltage via a first input of the comparator, receive the reference voltage via a second input of the comparator, and compare the sensor voltage to the reference voltage to generate the first digital output signal that is representative of the difference between the sensor voltage and the reference voltage.

In some alternative implementations, the ADC includes a decimation filter coupled to the one or more processing modules and configured to process the second digital output signal to generate another digital output signal having a lower sampling rate and a higher resolution than the second digital output signal.

In certain other specific examples, the ADC is implemented to include the capacitor that is operably coupled to the sensor and configured to produce the sensor voltage based on charging by the sensor current and the DAC output current. The ADC also includes an M-bit analog to digital converter (ADC) operably coupled and configured to receive the sensor voltage, receive a reference voltage, and compare the sensor voltage to the reference voltage and generate a first digital output signal that is representative of a difference between the sensor voltage and the reference voltage.

The ADC also includes one or more processing modules operably coupled to the M-bit ADC and memory (e.g., the memory may be included within or coupled to the one or more processing modules). The one or more processing modules is configured to execute operational instructions (e.g., stored in the memory) to process the first digital output signal to generate a second digital output signal that is representative of the difference between the sensor voltage and the reference voltage. Note that the second digital output signal includes a higher resolution than the first digital output signal. The ADC also includes an N-bit digital to analog converter (DAC) that is operably coupled to the one or more processing modules and operably coupled and configured to generate the DAC output current based on the second digital output signal. Note that the DAC output current tracks the sensor current, and the sensor voltage tracks the reference voltage. Also, N is a first positive integer, M is a second positive integer greater than or equal to 1, and N is greater than M.

In even other alternative implementations, the ADC includes a decimation filter coupled to the one or more processing modules and configured to process the second digital output signal to generate another digital output signal having a lower sampling rate and a higher resolution than the second digital output signal.

FIGS. 37C, 37D, 37E, 37F, and 37G are schematic block diagrams showing various alternative embodiments 3703, 3704, 3705, 3706, and 3707 of batteryless wireless sensor systems in accordance with the present disclosure.

Figure 37D:
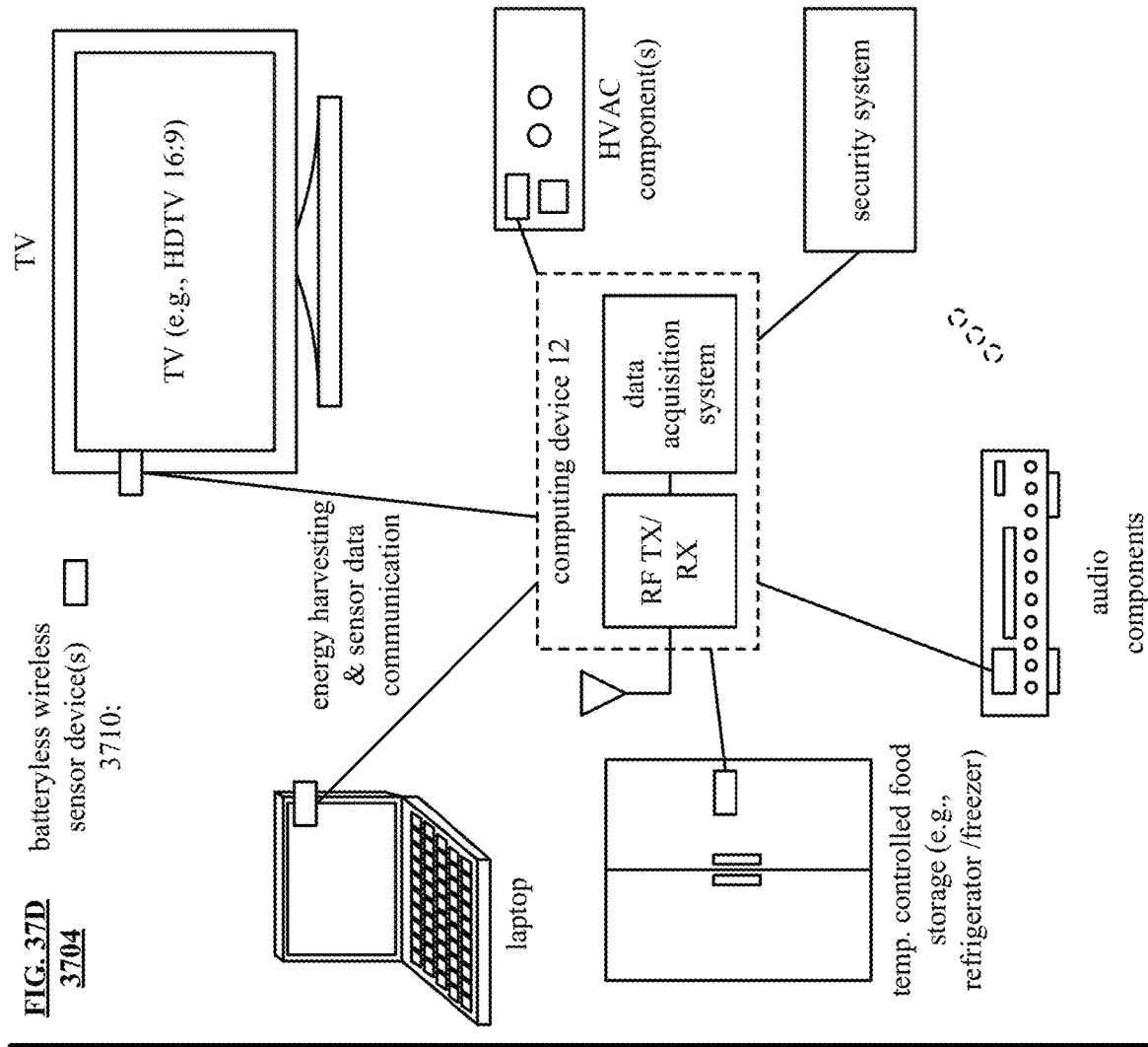
Figure 37C:
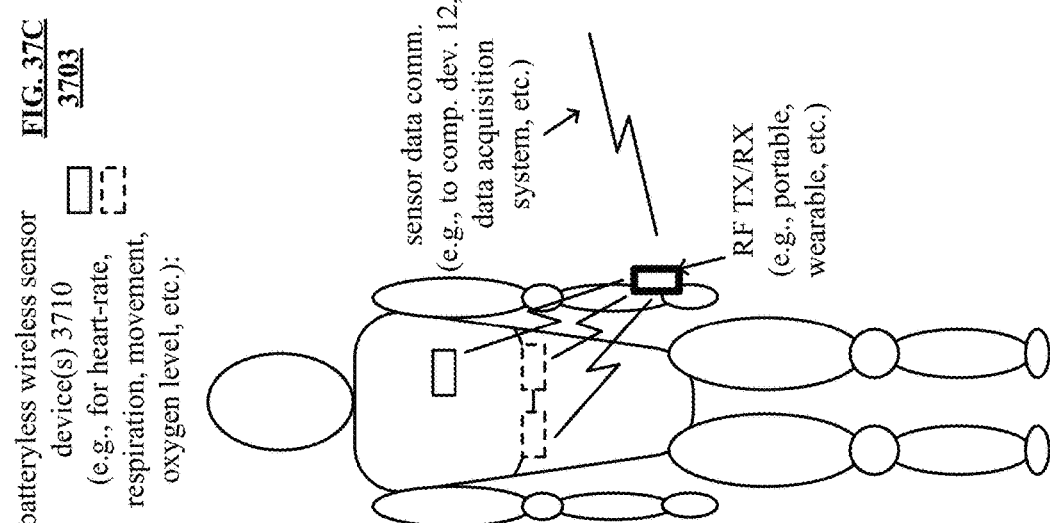

Referring to embodiment 3703 of FIG. 37C, one or more sensors are implemented to monitor various components, characteristics, features, etc. of a person. Note that some applications operate using components associated with a person that deliver products to the person or maintain operation of one or more organs of the person. Considering some possible examples, such components include as a pacemaker operative in accordance with the cardiovascular system, an insulin pump operative in accordance with a diabetic treatment system, a blood treatment component operative in accordance with a hemophilia treatment system, an intravenous system operative in accordance with delivering a one or more medicines, liquids, etc. to a person via that person's bloodstream, a nutrient delivery operative in accordance with delivering food, liquid, nutrients, etc. to a person, etc.

Note that other applications operate primarily by providing feedback information relating to vital statistics of the person. Considering some examples, such components may include any one or more of a heart rate monitor/sensor, a breathing or respiration monitor/sensor, a blood pressure monitor/sensor, a blood sugar/glucose monitor/sensor, a movement monitor/sensor, oxygen level monitor/sensor, etc. An ADC is implemented to service a sensor within a batteryless wireless sensor device 3710. For example, one or more batteryless wireless devices 3710 are associated with a user and perform energy harvesting from a RF signal that is provided from an RF transceiver (e.g., a portable, wearable, etc. RF transceiver that is also associated with the user). The RF transceiver collects sensor data provided by the one or more batteryless wireless sensor devices 3710 and conveys that censored data to another device (e.g., a computing device 12, a data acquisition system, etc.).

Referring to embodiment 3704 of FIG. 37D, a computing device 12 that includes an RF transceiver and the data acquisition system is in wireless communication with one or more other devices that include one or more batteryless wireless sensor devices 3710. For example, the computing device 12 is in communication with one or more of other devices that may include one or more of a laptop computer, television, heating, ventilation, air conditioning (HVAC) components, security system, audio components, and/or temperature controlled food storage such as a refrigerator or freezer, etc. One or more of these other devices includes one or more batteryless wireless sensor devices 3710 that is in communication with the computing device 12 and harvests energy from an RF signal provided by the RF transceiver of the computing device 12.

In an example of operation and implementation, a batteryless wireless sensor device 3710 that is associated with a component of a HVAC system is configured to harvest energy from the RF signal provided from the RF transceiver of the computing device 12, power up and operate an ADC and sensor within the batteryless wireless sensor device 3710, collect data, and provide that data to the computing device 12.

In general, any of the respective devices within the batteryless wireless sensor system is configured to be in communication with computing device 12 based on sensor data communication between the one or more batteryless wireless sensor devices 3710 and the computing device 12. Note that a given device may include one or more batteryless wireless sensor devices 3710. For example, different respective components of a HVAC system may include different batteryless wireless sensor devices 3710 and/or a particular component of the HVAC system may include more than one batteryless wireless sensor device 3710.

An example of operation of a batteryless wireless sensor system may include operating an HVAC system to maintain a desired temperature, humidity, etc. Another example of operation of the automated apparatus 1420 may include operating one or more audio and/or video components of a home, building, facility, etc. Another example of operation of the batteryless wireless sensor system may include operating a security system of a home, building, facility, etc.

Figure 37E:
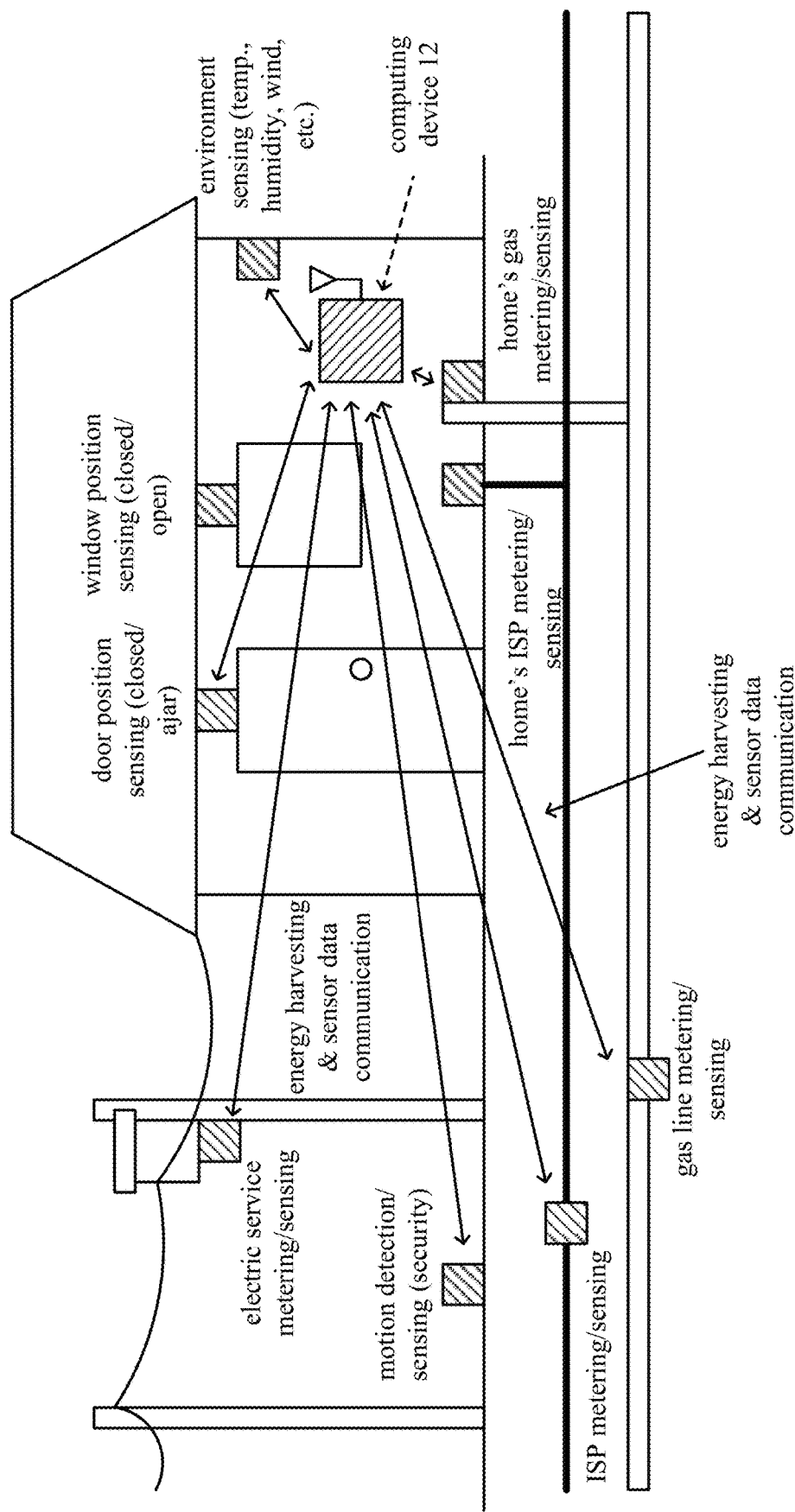

Referring to embodiment 3705 of FIG. 37E, this diagram includes a batteryless wireless sensor system that includes a number of batteryless wireless sensor devices implemented in various locations in an environment including a building or structure. For example, some devices are implemented to support communications associated with monitoring and/or sensing of any of a variety of different conditions, parameters, etc.

In this diagram, multiple respective devices are implemented to forward information related to monitoring and/or sensing to a computing device 12 (e.g., which may include one or more processing module(s) 42) that may be operating as a manager, coordinator, etc. Generally speaking, such devices may be implemented to perform any of a number of data forwarding, monitoring, and/or sensing operations. For example, in the context of a building or structure, there may be a number of services that are provided to that building or structure, including natural gas line service, electrical service (e.g., such as may include heating, ventilation, air conditioning (HVAC) service), television service, Internet service, security system service, etc. Alternatively, different respective monitors and/or sensors may be implemented throughout the environment to perform monitoring and/or sensing related to parameters not specifically related to services. As some examples, motion detection, door ajar detection, temperature measurement (and/or other atmospheric and/or environmental measurements), etc. may be performed by different respective monitors and/or sensors implemented in various locations and for various purposes and optionally not tied into a security system service.

Different respective monitors and/or sensors of the batteryless wireless sensor devices may be implemented to provide information related to such monitoring and/or sensing functions to a manager/coordinator wireless communication device (e.g., computing device 12). Such information may be provided continuously, sporadically, intermittently, etc. as may be desired in certain applications.

In addition, it is noted that such communications between such a manager/coordinator wireless communication device of the different respective monitors and/or sensors may be cooperative in accordance with such bidirectional communications, in that, the manager/coordinator wireless communication device may direct the respective monitors and/or sensors to perform certain related functions at subsequent times.

Figure 37G:
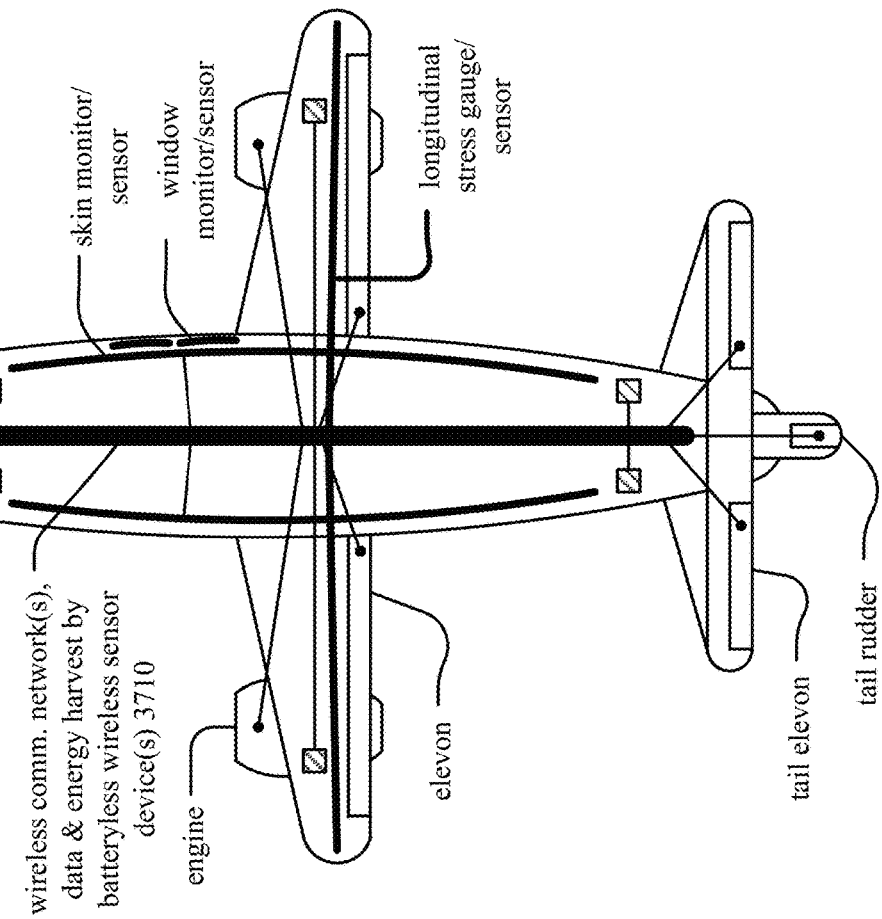
Figure 37F:
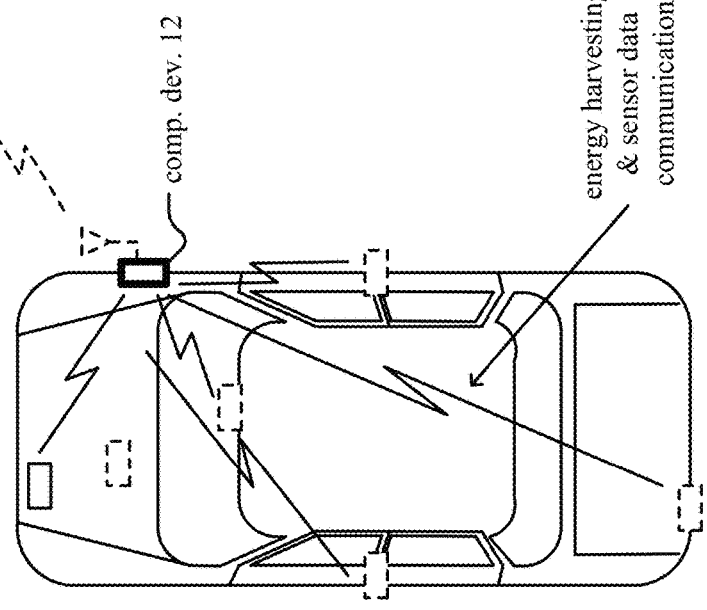

Referring to embodiment 3706 of FIG. 37F, this diagram includes a batteryless wireless sensor system that includes a number of batteryless wireless sensor devices implemented within an automobile. Note that while an automobile is used in this diagram, other examples could include any type of transportation vehicle (e.g., a truck, a bus, a taxi, a manually operated vehicle, an autonomous vehicle, a watercraft, etc.). Considering this example of an automobile, one or more input and/or output devices are implemented around the automobile. The input and/or output devices may include cameras with capability to take still photos, capture video, display information to a user, etc.

In another example, the input devices include Laser Illuminated Detection And Ranging (LIDAR) sensors that have capability to measure distance via limiting a target with a light source such as a laser and analyzing the reflected light. Generally, any of a number of different types of batteryless wireless sensor devices are configured to acquire information regarding the environment in which the automobile is may be implemented to provide sensor date to a computing device 12 within the automobile to determine one or more characteristics of a physical environment around the automobile. In some examples, the automobile includes an integrated local area network (LAN) backbone, a wireless local area network (WLAN) communication network, a Bluetooth communication network, a computing device 12 and/or processing module(s) 42, etc.

In one example, the automobile includes an automotive control system and a number of cameras implemented within the vehicle to capture at least one of photographic and video information of a physical environment around the automobile. These camera(s) generate information that is sensor data (e.g., image and/or video data sensed by the camera(s)) based on the at least one of photographic or video information and provides the sensor data to the computing device 12 implemented within the automobile. In certain examples, the input signals from the cameras may pass through additional respective sensors to generate the sensor data that is compliant for transmission to the computing device 12. In certain examples, the automobile also includes a user interface (e.g., a video screen, a monitor, a navigation screen, a navigation system, a global positioning system (GPS) system, and/or audio speakers, etc.) configured to receive input and/or provide output to a user of the automobile. For example, the user interface receives the control signal from the second sensor and generates and also outputs information corresponding to the physical environment around the automobile based on the control signal. This information may inform a user of the automobile regarding the physical environment around the automobile.

In another example, the automobile includes an automotive control system and one or more laser illuminated detection and ranging (LIDAR) sensors that determines a characteristic that corresponds to a physical environment around the automobile. The LIDAR sensor(s) generate sensor data based on the characteristic and provides the sensor data (e.g., directly or via sensors) to the computing device 12 (e.g., by way of an integrated LAN backbone, WLAN communication network, a Bluetooth communication network, etc.). The automotive control system that includes LIDAR sensor(s) may also include a user interface as described just above for use to receive input and/or provide output to a user of the automobile.

In yet another example, the control system is implemented within an autonomous vehicle. The inputs to such a control system within an autonomous vehicle may include camera(s), LIDAR sensor(s), proximity sensor(s), etc. An autonomous vehicle includes one or more actuators configured to receive control signal(s) (e.g., directly or from sensors) and to adapt operation of the autonomous vehicle based on the control signal(s). For example, the actuator(s) may be implemented to control any one of the accelerator pedal, the brake pedal, the steering wheel, the climate control within the vehicle such as air-conditioning or heating, tinting of windows, and/or any other adjustable, configurable, or adaptive element within the autonomous vehicle. Note that such an autonomous vehicle may include capability for manual override of any element by a user of the automobile.

In another example, the automobile includes one or more display components (e.g., including such displays as may also be implemented to operate as a user interface, a touchscreen (TS), etc.). Note that any of the display, user interface, a touchscreen (TS), etc. may be implemented using any of a variety of optical technologies including light emitting diode (LED), organic light emitting diode (OLED), mini-LED, micro-LED, etc. and/or any combination of such optical devices or other optical devices.

Referring to embodiment 3707 of FIG. 37G, this diagram includes a batteryless wireless sensor system that includes a number of batteryless wireless sensor devices implemented within an aircraft. A computing device 12 is implemented to receive communication from various batteryless wireless sensor devices and to provide other communications to actuators that effectuate the position, status, condition, etc. of one or more control elements within an aircraft flight control system implemented within the aircraft. Examples of elements that provide input signals based on batteryless wireless sensor devices may include any one or more of an accelerometer, a gyroscope, a wind speed sensor, altimeter, a barometric pressure sensor, an optical sensor that detects light and/or darkness, and/or any other instrumentation the may be implemented within an aircraft.

In one example, the control system includes one or both of an accelerometer and a gyroscope that generates sensor data using one or more batteryless wireless sensor devices based on one or both of acceleration and/or rotation of the aircraft and provides the sensor data to the computing device 12 (e.g., by way of an integrated LAN backbone, WLAN communication network, a Bluetooth communication network, etc.). After the computing device 12 has appropriately processed the sensor data and generated control signal(s), computing device 12 transmits the control signal(s) (e.g., directly or via transducers) to actuator(s) that adapt position, status, condition, etc. of one or more flight control surfaces of the aircraft flight control system based on the control signal. For example, the actuator(s) may be implemented to control any one of the various flight control surfaces of the aircraft including an elevon (e.g., such as on a main or centrally located wing), a tail elevon, a tail rudder, an aileron, a trim tab, and/or any other flight control surface. The actuator(s) may be implemented to control any one of the various flight control mechanism such as engine speed, any braking mechanism, and/or any other flight control mechanism. In general, the actuator(s) may be implemented to control any element of the aircraft that is part of the aircraft flight control system including any of those that may be governed by autopilot based operation.

Note also that one or more gauges, monitors, sensors of the batteryless wireless sensor system may be implemented as batteryless wireless sensor devices and may be operative and in communication with the computing device 12. For example, along one or more of the wings of the aircraft, a longitudinal stress gauge/sensor may be implemented as a batteryless wireless sensor device that is in communication with the computing device 12. Such a sensor of a batteryless wireless sensor device may be implemented based on a sensing electrode, film, or other one or more elements that is operative and in communication with the computing device 12. In some examples, such a sensor of a batteryless wireless sensor device is implemented to detect stress, movement, flex, etc. along the length of a wing of the aircraft.

In addition, one or more skin monitors/sensors of one or more batteryless wireless sensor devices may be operative and in communication with computing device 12. In some examples, such one or more skin monitors/sensors may be implemented along one or more portions of the aircraft (e.g., along the fuselage, internal to the aircraft and/or external to the aircraft, etc.) is/are implemented to detect stress, movement, flex, etc. along any desired portion of the aircraft.

In addition, one or more window monitors/sensors of one or more batteryless wireless sensor devices may be operative and in communication with the computing device 12. In some examples, such one or more window monitors/sensors of one or more batteryless wireless sensor devices may be implemented along one or more window portions of the aircraft (e.g., along the one or more widows in a passenger portion of the aircraft, along the one or more widows in a cockpit portion of the aircraft, internal to the aircraft and/or external to the aircraft, etc.) is/are implemented to detect stress, movement, flex, etc. along any window portion of the aircraft.

Note also that other systems may be implemented within either the automobile of FIG. 37F or the aircraft of FIG. 37G. For example, a first subsystem includes communications for a control system, a second subsystem includes communications for a media-based system for passengers, a third subsystem includes communications for pilot(s) and flight attendant(s), etc. Generally speaking, any one or more subsystems may be implemented within either the automobile of FIG. 37F or the aircraft of FIG. 37G.

Any of the respective batteryless wireless sensor devices of either the automobile of FIG. 37F or the aircraft of FIG. 37G is configured to be in communication with the computing device 12. The computing device 12 is configured to execute one or more portions of an automated process associated with the batteryless wireless sensor system. For example, the computing device 12 is configured to receive sensor data from digital signals from at least some of the batteryless wireless sensor devices, to process that sensor data, and to generate an automated process command to be provided to and used in accordance with the automated process.

Note that a batteryless wireless sensor device implemented with any of the various examples described herein is configured to harvest energy from an RF signal provided from a computing device 12 (e.g., from a RF transmitter or RF transceiver of the computing device 12), to power up, to collect sensor data based on a sensor of the batteryless wireless sensor device, and to provide that sensor data to the computing device 12. While several specific examples of applications, contexts, environments, etc. have been described within which such batteryless wireless sensor devices they be implemented, note that these examples are not exhaustive and generally speaking, such a batteryless wireless sensor device may be implemented within any desired application.

FIG. 38 is a schematic block diagram showing an embodiment 3800 of a batteryless wireless sensor system including multiple batteryless wireless sensor devices operative with coordinated data acquisition in accordance with the present disclosure. In this diagram, a computing device 12 is implemented and in communication with two or more batteryless wireless sensor devices 3710. Each of the respective batteryless wireless sensor devices 3710 includes an RF receiver and the DC rectifier to generate a DC signal to be used to power up and operate a corresponding ADC and sensor within that respective batteryless wireless sensor device 3710. In certain examples, the computing device 12 includes an RF transceiver and the data acquisition system. As with respect to other embodiments, examples, diagrams, etc. Note that the RF transceiver and the data acquisition system shown within the computing device 12 in this diagram may alternatively be implemented within two separate components, such as within two separate computing devices 12 that are implementation with one another via some desired communication media or medium (e.g., wired, wireless, etc.).

The RF transceiver transmits an RF signal to be used by the batteryless wireless sensor devices 3710 to perform energy harvesting using the RF receiver and DC rectifier within the multiple batteryless wireless sensor devices 3710. In an example of operation and implementation, a batteryless wireless sensor device 3710 is configured to receive the RF signal provided by the RF transceiver, harvest energy from the RF signal and generate a DC signal based on the energy harvested from the RF signal. The batteryless wireless sensor device 3710 is also configured to power up and operate the ADC and sensor of the batteryless wireless sensor device 3710 based on the DC signal that has been generated. The batteryless wireless sensor device then 3710 generate sensor data using the sensor therein. In certain examples, the batteryless wireless sensor device 3710 is configured to generate the sensor data based on the sensor voltage of the sensor corresponding to a physical condition to which the sensor is exposed. The sensor data is output from the ADC based on digital sampling of the sensor voltage of the sensor by the ADC.

Note that the ADC may be implemented using any of a variety of architectures, configurations, etc. Also, note that while this particular architecture of batteryless wireless sensor device 3710 as including an RF receiver and DC rectifier, and ADC, sensor, and an RF transmitter that is configured to transmit the sensor data to the RF transceiver of the computing device 12 based on sensor data that is generated by digital sampling of the sensor signal by the ADC. Note that other implementations of a batteryless wireless sensor device may alternatively be used in a configuration in which a computing device 12 is it communication with two or more batteryless wireless sensor devices 3710. That is to say, any one of the batteryless wireless sensor devices 3710 showing this diagram may alternatively be implemented using a different architecture of a batteryless wireless sensor device 3710. Many of the subsequent embodiments, examples, diagrams, etc. show various alternative implementations of batteryless wireless sensor devices 3710.

Given that computing device 12 is in communication with two or more batteryless wireless sensor devices 3710 in this diagram, coordinated communication is performed by the respective batteryless wireless sensor devices 3710 to facilitate simultaneous transmission of sensor data from those respective batteryless wireless sensor devices 3710 to the computing device 12. For example, code division multiple access (CDMA) is one particular communication protocol by which multiple batteryless wireless sensor devices 3710 are configured to transmit sensor data to the computing device 12 simultaneously without interfering with one another. For example, two or more batteryless wireless sensor devices 3710 are configured to transmit sensor data simultaneously over a single communication channel. In the context of wireless communications, two or more batteryless wireless sensor devices 3710 are configured to transmit sensor data simultaneously using a given wireless channel, bandwidth, frequency band, etc. CDMA operates in accordance with multiplexing such that each respective batteryless wireless sensor device 3710 is assigned a respective CDMA code. By employing a spread-spectrum technology and such a CDMA coding scheme, multiple respective batteryless wireless sensor devices 3710 are configured to be multiplexed over the same communication channel and transmit simultaneously. CDMA is a form of spread-spectrum signaling such that the modulated coded signals has a much higher bandwidth than the sensor data that is being communicated in this particular implementation.

In an example of operation and implementation, when communicating based on CDMA, different respective locally generated codes are assigned to the respective batteryless wireless sensor devices 3710. As such, each respective batteryless wireless sensor device 3710 uses a different code to modulate its respective sensor data. Appropriately chosen codes for the CDMA system is important to ensure high-performance of the communication therein. Generally speaking, better performance is achieved when there is a good separation between the signal generated based on modulating of sensor data corresponding to a particular batteryless wireless sensor device 3710 when compared to the signals generated based on modulating of other sensor data corresponding to other batteryless wireless sensor devices 3710 within the CDMA system. When this is done, good separation between the respective signals transmitted by the respective batteryless wireless sensor devices 3710 based on appropriately selected CDMA codes for the respective batteryless wireless sensor devices 3710, the receiving device, such as the RF transceiver within the computing device 12 in this diagram, is able to discriminate and distinguish which signal has been transmitted from which batteryless wireless sensor device 3710 so as to distinguish the source of the respective signals and properly discriminate and distinguish which sensor data corresponds to which batteryless wireless sensor device 3710. For example, if a received signal properly matches the expected CDMA code corresponding to a given batteryless wireless sensor device 3710, then the correlation function during the demodulation within the RF transceiver within the computing device 12 will be high, and the RF transceiver is then able to extract the sensor data from that signal. Alternatively, if a received signal does not properly match the expected CDMA code corresponding to a given batteryless wireless sensor device 3710, then the correlation function during the demodulation within the RF transceiver within the computing device 12 will be low, or ideally zero (e.g., referring to cross-correlation and thereby eliminating the signal). Generally speaking, CDMA communication systems generally are categorized into two basic groups including synchronous-CDMA (S-CDMA) that operates using orthogonal CDMA codes for the respective batteryless wireless sensor devices 3710 and asynchronous-CDMA that operates using pseudorandom CDMA codes for the respective batteryless wireless sensor devices 3710.

If desired in other alternative embodiments, note that other multiple access communication means may alternatively be used, such as time division multiple access (TDMA) in which access to the communication channel is governed by dividing access for the respective batteryless wireless sensor devices 3710 by time, such that a first batteryless wireless sensor device 3710 transmits at or during a first time, a second batteryless wireless sensor device 3710 transmits at or during a second time, and so on. Yet another multiple access communication means includes frequency division multiple access (FDMA) in which access to the available communication channel bandwidth is governed by dividing access for the respective batteryless wireless sensor devices 3710 by frequency, such that a first batteryless wireless sensor device 3710 transmits using a first sub-portion of the available communication channel bandwidth, a second batteryless wireless sensor device 3710 transmits using a second sub-portion of the available communication channel bandwidth, and so on. Note that these examples of multiple access communication means are not an exhaustive list, and, generally speaking, any desired multiple access communication means may be used to facilitate communication of different respective sensor data from different respective batteryless wireless sensor devices 3710 to the RF transceiver of the computing device 12.

FIG. 39A is a schematic block diagram showing an embodiment 3901 of a batteryless wireless sensor system including a batteryless wireless sensor device operative to perform impedance modulated data transmission in accordance with the present disclosure. In this diagram, a batteryless wireless sensor device is shown on the right hand side of the diagram in communication with another device on the left-hand side of the diagram. As with respect to other embodiments, examples, diagrams, etc., note that the RF transceiver and data acquisition system may be implemented within a single device (e.g., a computing device 12) or alternatively implemented within two separate devices (e.g., two separate computing devices 12).

As can be seen in this diagram, the batteryless wireless sensor device includes an impedance (Z) matching network that is coupled to or connected to the antenna of the batteryless wireless sensor device and also coupled to or connected to an RF receiver and DC rectifier (shown as RF-DC converter in the diagram). The RF receiver in DC rectifier is configured to generate a DC signal (e.g., a DC voltage, Vdc) that is used to power up and operate the ADC and the sensor of the batteryless wireless sensor device. In this diagram, a data transmission protocol module is implemented between the impedance (Z) matching network and the ADC. As sensor data is generated based on digitally sampling of the sensor signal of the sensor by the ADC, this sensor data is provided to the RF transceiver of the other device based on the data transmission protocol employed within the batteryless wireless sensor device. For example, the data transmission protocol is configured to modulate, modify, change, etc. the impedance of the impedance (Z) matching network so as to facilitate reflection of energy that has been transmitted by the RF transceiver back to the RF transceiver based on such modulation, modification, change, etc. of the impedance of the impedance (Z) matching network.

In an example of operation and implementation, the changes of the impedance (Z) matching network operate to reflect energy back to the RF transceiver to transmit the sensor data to the RF transceiver, and the RF transceiver is configured to interpret this reflected energy to recover the sensor data that has been transmitted from the batteryless wireless sensor device. In an example of operation and implementation, the reflected energy is performed using on/off keying modulation, such that the amplitude shift of the reflected energy is interpreted to distinguish different values (e.g., logical 0 and logical 1 within a bit stream) so as to recover the sensor data provided by the batteryless wireless sensor device. As the impedance of the impedance (Z) matching network is modulated, modified, changed, etc. so as to facilitate reflection of different amounts of energy based on the RF energy that is transmitted from the RF transceiver, the RF transceiver is configured to interpret those different amounts of reflected energy as different values. Looking at the bottom portion of the diagram, consider a digital data stream that includes alternating values of 0 and 1. Consider a modulation signal having a particular timing such that each respective period of time corresponds to one digital value. Based on the current value of the impedance (Z) matching network, the reflected energy will undergo an amplitude shift. In an example of operation and implementation, and amplitude shift to a larger value of the reflected energy corresponds to a digital value of 1, and an amplitude shift to a smaller value of the reflected energy corresponds to a digital value of 0, or vice versa. Based on the different amplitudes of the reflected energy, the RF transceiver is configured to determine of the respective digital values of the sensor data provided by the batteryless wireless sensor device may.

Also, while this particular example shows modulation based on the digital data stream composed of ones and zeros, note also that multiple levels of digital modulation may alternatively be performed such that during each respective time period of the modulation signal, the amplitude shift may take on a value selected from more than two values (e.g., 3 possible values, 4 possible values, 5 possible values, or more possible values). However, in some examples, only two values are used corresponding to a digital value of 1 and a digital value of 0.

In certain examples, note that Class E/F power amplifiers can transmit signals well, they do not specifically include capability to receive and process signals (e.g., demodulate, decode, process, and/or any other operations, etc. employed to recover the sensor data that is transmitted by the batteryless wireless sensor device). In such instances, the RF transceiver (on the left-hand side of the diagram) is implemented to include an RF receiver (RX) that is coupled to or connected to the data acquisition system to receive and process one or more signals transmitted from the batteryless wireless sensor device (e.g., demodulate, decode, process, and/or any other operations, etc. employed to recover the sensor data that is transmitted by the batteryless wireless sensor device). Generally speaking, note that any such implementation of an RF transceiver in these and following diagrams may be implemented to include an RF receiver (RX) that is coupled to or connected to the data acquisition system to receive and process one or more signals transmitted from the batteryless wireless sensor device and to provide recovered sensor data to the data acquisition system. In certain examples, such an RF receiver (RX) is also included within a computing device 12 that includes an embodiment of a Class E/F power amplifier, a data acquisition system, etc. so as to facilitate recovery of sensor data provided from the batteryless wireless sensor device.

Also, note that many of the embodiments, examples, diagrams, etc. show two respective antennas: one for use by the RF transmitter (TX) and one for use by the RF receiver (RX), note that a single antenna may alternatively be implemented within a device such that it may be switched in to service the RF transmitter (TX) for transmission of the RF signal at or during one time and switched in to service the RF receiver (RX) for reception of the sensor data (e.g., modulated RF signal) from the batteryless wireless sensor device from the RF receiver (RX) at or during another time. In certain examples, a computing device 12 that includes two separate antennas, one for use by the RF transmitter (TX) and one for use by the RF receiver (RX), provide for performance such that simultaneous transmission of the RF signal and reception of the sensor data (e.g., modulated RF signal) from the batteryless wireless sensor device may be performed.

Many of the following diagrams show alternative embodiments by which a computing device and/or a batteryless wireless sensor device may be implemented within a batteryless wireless sensor system.

FIGS. 39B, 39C, 39D, 39E, and 39F are schematic block diagrams showing other embodiments 3902, 3903, 3904, 3905, and 3906 of a batteryless wireless sensor system including a batteryless wireless sensor device operative to perform impedance modulated data transmission in accordance with the present disclosure.

Referring to embodiment 3902 of FIG. 39B, this diagram shows an alternative implementation of the RF transceiver (on the left-hand side of the diagram) that in communication with a batteryless wireless sensor device. In this diagram, a DC voltage, Vdc, is provided to a DC to RF converter that is connected to or coupled to an impedance (Z) matching network. The impedance (Z) matching network is also connected to or coupled to a data acquisition system. There are a variety of ways in which DC to RF conversion may be performed. In some examples, this is performed using a Class E/F power amplifier to perform the DC to RF conversion. Also, in certain other examples, note that a Class E/F power rectifier is configured to perform RF to DC conversion within a batteryless wireless sensor device. Certain other embodiments, examples, diagrams, etc. included within this disclosure provide further detail on these options. Generally speaking, such implementations of Class E/F power amplifiers and rectifiers may be implemented to perform DC to AC/RF conversion and also AC/RF to DC conversion, respectively.

Referring to embodiment 3903 of FIG. 39C, this diagram shows another alternative implementation of the RF transceiver (on the left-hand side of the diagram) that in communication with a batteryless wireless sensor device. In this diagram, the RF transceiver is implemented based on a Class E/F power amplifier design that is configured to perform DC to RF conversion. A DC voltage source, Vdc, such as provided from a battery or other source, is provided to an inductor, Lchoke, and the other terminal of the inductor is connected to or coupled to an impedance (Z) matching network. Also, an N-type metal-oxide-semiconductor field-effect transistor (MOSFET) (NMOS) is connected to the node between this other terminal of the inductor and the impedance (Z) matching network. In this example, the drain of the NMOS transistor is connected to that node, an RF clock signal is provided to the gate of the NMOS transistor, and the source of the NMOS transistor is grounded.

Referring to embodiment 3904 of FIG. 39D, this diagram shows an alternative implementation of a batteryless wireless sensor device (on the right hand side of the diagram) that is in communication with an RF transceiver. This alternative implementation of a batteryless wireless sensor device has some similarities to previous implementations, but the RF to DC converter is particularly implemented as a Class E/F power rectifier design that is configured to perform RF to DC conversion. The gate and drain of an NMOS transistor is connected to the impedance (Z) matching network such that the drain is also connected to a first terminal of an inductor, Lchoke, and the other terminal of the inductor is connected to or coupled to an ADC of the batteryless wireless sensor device so as to provide a DC voltage, Vdc, to power up and operate the ADC and the batteryless wireless sensor device. Note that the ADC is also configured to operate based on a data transmission protocol so as to modulate, modify, change, etc. the impedance of the impedance (Z) matching network so as to facilitate reflection of energy that has been transmitted by the RF transceiver back to the RF transceiver based on such modulation, modification, change, etc. of the impedance of the impedance (Z) matching network. Note that the NMOS transistor operates as a rectifier in this particular implementation and in conjunction with the inductor, Lchoke, is configured to perform energy harvesting of the RF signal is transmitted from the RF transceiver so as to generate the DC voltage, Vdc, to power up and operate the ADC and the batteryless wireless sensor device. Note that such an implementation of a Class E/F power rectifier design provides a highly efficient RF-DC rectifier circuit that is much better solution to perform RF to DC conversion when compared to half bridge and/or full bridge diode rectifier circuits, which are shown in embodiment 3907 of FIG. 39G and embodiment 3908 of FIG. 39H.

Referring to embodiment 3905 of FIG. 39E, this diagram shows the other alternative implementation of the RF transceiver (on the left-hand side of the diagram) based on the embodiment 3903 of FIG. 39C and the alternative implementation of a batteryless wireless sensor device (on the right hand side of the diagram) that is in communication with an RF transceiver based on the embodiment 3904 of FIG. 39D. This diagram shows an example that includes both a Class E/F power amplifier design that is configured to perform DC to RF conversion within the RF transceiver and also a Class E/F power rectifier design that is configured to perform RF to DC conversion within the batteryless wireless sensor device. Again, note that such Class E/F power amplifier designs and Class E/F power rectifier designs are highly efficient to facilitate conversion of DC to RF and RF DC, respectively.

Referring to embodiment 3906 of FIG. 39F, this diagram shows another alternative implementation of the RF transceiver (on the left-hand side of the diagram) that in communication with a batteryless wireless sensor device. In this diagram, the RF transceiver is implemented based on a Class E power amplifier design that is configured to perform DC to RF conversion. A DC voltage source, Vdc, such as provided from a battery or other source, is provided to a first inductor, L1, and the other terminal of the inductor is connected to or coupled to an impedance (Z) matching network. Also, an N-type metal-oxide-semiconductor field-effect transistor (MOSFET) (NMOS) is connected to the node between this other terminal of the inductor and the impedance (Z) matching network. In this example, the drain of the NMOS transistor is connected to that node, an RF clock signal is provided to the gate of the NMOS transistor, and the source of the NMOS transistor is grounded. This diagram also shows a specific implementation of the impedance (Z) matching network. The impedance (Z) matching network includes a first capacitor, C1, that is connected between input node of the impedance (Z) matching network that is also connected to or coupled to the second terminal of the inductor, L1. In addition, the impedance (Z) matching network includes a second capacitor, C2, that is connected in series with another inductor, L2, and the other terminal of this other inductor, L2, is connected to the antenna of the RF transceiver.

The right-hand side of this diagram includes an alternative implementation of a batteryless wireless sensor device (on the right hand side of the diagram) that is in communication with an RF transceiver based on the embodiment 3904 of FIG. 39D.

FIG. 39G is a schematic block diagram showing an embodiment 3907 of a batteryless wireless sensor system including a batteryless wireless sensor device that includes a half-bridge diode rectifier and is operative to perform impedance modulated data transmission in accordance with the present disclosure. On the right-hand side of the diagram, the batteryless wireless sensor device performs RF to DC conversion using a half-bridge diode rectifier. This includes two (2) diodes such that the output of a first diode, D1, is connected to the output of the impedance (Z) matching network and also to the input of a second diode, D2, that is connected such that the output of the second diode, D2, is connected to a first terminal of a capacitor, C, and is configured to generate a DC voltage, Vdc, that is operative to power up and operate the ADC and the sensor of the batteryless wireless sensor device. Note that the input terminal of the first diode, D1, and the second terminal the capacitor, C, are grounded. The capacitor, C, is configured to discharge from a peak RF/AC signal to the next portion of the rectified output signal to generate the overall DC signal, Vdc, that is provided to the ADC.

FIG. 39H is a schematic block diagram showing an embodiment 3908 of a batteryless wireless sensor system including a batteryless wireless sensor device that includes a full-bridge diode rectifier and is operative to perform impedance modulated data transmission in accordance with the present disclosure. On the right-hand side of the diagram, the batteryless wireless sensor device performs RF to DC conversion using a full-bridge diode rectifier. This includes four (4) diodes, D1 to D4, that are arranged in series pairs such that only two of the diodes are conducting current during each half cycle. For example, during a positive half cycle of the RF/AC signal that is provided from the impedance (Z) matching network, the diodes D1 and D2 conduct in series with one another and the ADC while the diodes D3 and D4 or reverse biased (e.g., off) so that no current flows through diodes D3 and D4. Alternatively, during a negative half cycle of the RF/AC signal that is provided from the impedance (Z) matching network, the diodes D3 and D4 conduct in series with one another and the ADC while the diodes D1 and D2 or reverse biased (e.g., off) so that no current flows through diodes D1 and D2. Similarly, the capacitor, C, is configured to discharge from a peak RF/AC signal to the next portion of the rectified output signal to generate the overall DC signal, Vdc, that is provided to the ADC.

FIG. 39I is a schematic block diagram showing an embodiment 3909 of a batteryless wireless sensor system including a batteryless wireless sensor device operative to perform clock extraction and impedance modulated data transmission in accordance with the present disclosure. In this diagram, a batteryless wireless sensor device is in communication with an RF transceiver. The batteryless wireless sensor device includes an impedance (Z) matching network, and an RF to DC power rectifier that is configured to generate a DC signal, Vdc, to be used to power up and operate a wireless sensor device. The power rectifier includes an NMOS transistor, an inductor, Lchoke, and a capacitor, C, that provides a signal to a voltage regulator to generate the DC signal, Vdc. The wireless sensor device includes a clock extraction circuit that is configured to generate a sample clock, CLK, that is provided to the ADC that is configured digitally to sample a sensor signal from the sensor. In addition, the ADC operates to provide sensor data based on a data transmission protocol that is operative to modulate the impedance (Z) matching network to reflect energy back to the RF transceiver.

Generally speaking, for maximum power transfer between two devices, the source impedance is matched to the load impedance. Maximum power transfer is achieved when these two impedances match one another. With respect to this diagram, when the impedance of the impedance (Z) matching network of the RF to DC power rectifier is matched to the impedance of the antenna of the batteryless wireless sensor device (e.g., in certain examples, the impedance of the antenna of the batteryless wireless sensor devices 50 ohms), no RF energy is reflected back from the batteryless wireless sensor device to the RF transceiver. In such a situation, the RF to DC power rectifier is configured to receive all the power from the antenna.

However, if the impedance of the impedance (Z) matching network of the RF to DC power rectifier is modified from the impedance matching point (e.g., impedance modified from the optimum impedance matching point that facilitates maximum power transfer), some of the energy that is transmitted from the RF transceiver to the batteryless wireless sensor device is reflected back to the RF transceiver, and some of the energy that is transmitted from the RF transceiver to the batteryless wireless sensor device is provided to the RF to DC power rectifier. When the impedance of the impedance (Z) matching network is completely unmatched to the impedance of the intent of the batteryless wireless sensor device, no energy is passed to the RF to DC power rectifier, and all of the energy is reflected back from the batteryless wireless sensor device to the RF transceiver.

This diagram shows the batteryless wireless sensor device that is configured to receive an RF signal and to perform RF to DC conversion to harvest energy from the RF signal. The DC signal, Vdc, is used to power up and operate the ADC, the clock extraction circuit, and the data transmission protocol that is operative to modulate the impedance of the impedance (Z) matching network to facilitate transmission of sensor data back to the RF transceiver.

In an example of operation and implementation, the clock extraction circuit is configured to receive the RF signal and to extract an RF frequency therefrom (e.g., a frequency in the range of 100 s of MHz to GHz) as an input clock and to divide it down to a sample clock to be used by the ADC to perform digital sampling of a sensor signal of the sensor. In certain examples, the sample clock for the ADC is below a few 10 s of MHz. In an alternative implementation, such as within FIG. 40, the ADC includes a built-in low-power clock generator that is configured to generate the sample clock for the ADC. One possible implementation of the data transmission protocol circuit is to encode the sensor data provided from the ADC into a bitstream of 0 s and 1 s. This bitstream of 0 s and 1 s is then used to modulate the impedance of the impedance (Z) matching network of the RF to DC power rectifier and to transmit the sensor data back to the RF transceiver to be provided to a data acquisition system. Note that this approach to translating sensor data from the batteryless wireless sensor device to the RF transceiver is a very low-power approach as it operates to transmit sensor data back to the RF transceiver based on reflection of energy that has been transmitted by the RF transceiver. This transmission of data based on the reflected energy is performed may be performed using on/off keying modulation, such that the amplitude shift of the reflected energy is interpreted to distinguish different values (e.g., logical 0 and logical 1 within a bit stream) so as to recover the sensor data provided by the batteryless wireless sensor device. In an example of operation and implementation, by changing the matching of impedance between the impedance (Z) matching network and the RF to DC power rectifier via NMOS transistor, the change of reflection of energy between two or more various degrees of energy reflection is operative to facilitate the transmission of sensor data from the batteryless wireless sensor device to the RF transceiver.

FIG. 40 is a schematic block diagram showing an embodiment 4000 of a batteryless wireless sensor system including a batteryless wireless sensor device with built-in clock generation and is operative to perform impedance modulated data transmission in accordance with the present disclosure. This diagram is similar to the previous diagram with at least one difference being that this batteryless wireless sensor device does not include a clock extraction circuit and instead includes a built-in clock generator that is configured to generate the sample clock to be used by the ADC digitally to sample a sensor signal of the sensor. Instead of extracting an RF frequency from the RF signal that is provided from the RF transceiver to the batteryless wireless sensor device, this batteryless wireless sensor device generates the sample clock internally.

FIG. 41 is a schematic block diagram showing an embodiment 4100 of a batteryless wireless sensor system including a batteryless wireless sensor device operative to perform clock extraction and impedance modulated data transmission based on full energy reflection in accordance with the present disclosure. In this diagram, an additional NMOS transistor, T2, is implemented such that the drain is connected to the gate of a NMOS transistor, T1, so as to short the gate of the NMOS transistor, T1, based on the data transmission protocol to stop completely any conversion of RF energy to DC. When the gate of the NMOS transistor, T1, is shorted, 100% of the energy is transmitted from the RF transceiver to the batteryless wireless sensor device is reflected back to the RF transceiver. This is an alternative means by which sensor data transmission may be performed via turning on and off the NMOS transistor, T1. In an example of operation and implementation, when the NMOS transistor, T1, is turned off by shorting the gate of the NMOS transistor, T1, to ground, then the full energy reflection is performed by the batteryless wireless sensor device to convey a data value of 1, and when the NMOS transistor, T1, is turned on, then no or little energy reflection is performed by the batteryless wireless sensor device to convey a data value of 0, or vice versa. In an example of operation and implementation, by creating a mismatch between the impedance (Z) matching network and the RF to DC power rectifier by turning off the NMOS transistor, T1, the change of reflection of energy between full reflection and full absorption is operative to facilitate the transmission of sensor data from the batteryless wireless sensor device to the RF transceiver.

Note that an alternative implementation of this particular batteryless wireless sensor device may be made such that a built-in clock generator is included instead of a clock extraction circuit to generate a sample clock to be used by the ADC to perform digital sampling of a sensor signal provided by the sensor.

FIG. 42 is a schematic block diagram showing an embodiment 4200 of a batteryless wireless sensor system including a dual radio frequency (RF)-DC receiver batteryless wireless sensor device in accordance with the present disclosure. This diagram includes multiple parallel RF to DC power rectifiers. For example, two or more RF to DC power rectifiers are implemented respectively with two or more antennas and impedance (Z) matching networks. In this implementation, each of the RF to DC power rectifiers includes a impedance (Z) matching network, and NMOS transistor, and an inductor, Lchoke, A capacitor, C, is also implemented to perform smoothing of the DC signal that is generated by the RF to DC power rectifiers that is provided to a voltage regulator that is configured to output a DC signal, Vdc. The wireless sensor device includes an ADC that is configured to sample digitally a sensor signal provided by the sensor based on a sample clock that is provided by a built-in clock generator. Sensor data transmission is performed based on a data transmission protocol that is configured to modulate the impedance of the two or more impedance (Z) matching networks.

Note that an alternative implementation of this particular batteryless wireless sensor device may be made such that a clock extraction circuit is configured to process an RF signal that is received by the batteryless wireless sensor device to generate a sample clock to be used by the ADC to perform digital sampling of a sensor signal provided by the sensor instead of using a built-in clock generator to generate the sample clock.

In this implementation, by using two or more antennas, any adverse effects of a polarized antenna are eliminated mitigated thereby improving the operation of the batteryless wireless sensor device. In some instances, different polarization of the transmit and receive antennas within a wireless communication path can result and lower RF energy absorption in the receive antenna. By using two or more antennas, RF energy absorption by the batteryless wireless sensor device is significantly improved. In addition, by using two or more antennas, two or more corresponding RF to DC power rectifiers may be implemented such that one RF to DC power rectifiers is implemented for each respective antenna. In an example of operation and implementation, each of the antennas and corresponding RF to DC power rectifiers can have a different orientation (e.g., each of the antennas having a different orientation) to provide for spatial diversity and improved RF energy absorption by the batteryless wireless sensor device.

Also, while many of the examples, embodiments, diagrams, etc. herein describe various implementations in which sensor data is provided from a batteryless wireless sensor device to another device (e.g., a computing device, a data acquisition system, etc.), note that any desired communication may be made between these various devices. Examples of such communication may include communication between the devices such as to perform association, hand-shaking, coordination, control signaling, etc.

It is noted that terminologies as may be used herein such as bit stream, stream, signal sequence, etc. (or their equivalents) have been used interchangeably to describe digital information whose content corresponds to any of a number of desired types (e.g., data, video, speech, text, graphics, audio, etc. any of which may generally be referred to as 'data').

As may be used herein, the terms "substantially" and "approximately" provide an industry-accepted tolerance for its corresponding term and/or relativity between items. For some industries, an industry-accepted tolerance is less than one percent and, for other industries, the industry-accepted tolerance is 10 percent or more. Other examples of industry-accepted tolerance range from less than one percent to fifty percent. Industry-accepted tolerances correspond to, but are not limited to, component values, integrated circuit process variations, temperature variations, rise and fall times, thermal noise, dimensions, signaling errors, dropped packets, temperatures, pressures, material compositions, and/or performance metrics. Within an industry, tolerance variances of accepted tolerances may be more or less than a percentage level (e.g., dimension tolerance of less than +/−1%). Some relativity between items may range from a difference of less than a percentage level to a few percent. Other relativity between items may range from a difference of a few percent to magnitude of differences.

As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to".

As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may be used herein, one or more claims may include, in a specific form of this generic form, the phrase "at least one of a, b, and c" or of this generic form "at least one of a, b, or c", with more or less elements than "a", "b", and "c". In either phrasing, the phrases are to be interpreted identically. In particular, "at least one of a, b, and c" is equivalent to "at least one of a, b, or c" and shall mean a, b, and/or c. As an example, it means: "a" only, "b" only, "c" only, "a" and "b", "a" and "c", "b" and "c", and/or "a", "b", and "c".

As may also be used herein, the terms "processing module", "processing circuit", "processor", "processing circuitry", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, processing circuitry, and/or processing unit may be, or further include, memory and/or an integrated memory element, which may be a single memory device, a plurality of memory devices, and/or embedded circuitry of another processing module, module, processing circuit, processing circuitry, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, processing circuitry, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, processing circuitry and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, processing circuitry and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with one or more other routines. In addition, a flow diagram may include an "end" and/or "continue" indication. The "end" and/or "continue" indications reflect that the steps presented can end as described and shown or optionally be incorporated in or otherwise used in conjunction with one or more other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid-state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A batteryless wireless sensor system, the system comprising:
   data acquisition system;
   a portable computing device that is associated with a user, in communication with the data acquisition system, and configured to:
      transmit a radio frequency (RF) signal; and
      receive sensor data; and
   a batteryless wireless sensor device including an RF transmitter, an analog to digital converter (ADC), and a sensor, the batteryless wireless sensor device configured to:
      harvest energy from the RF signal and generate a DC signal based on the energy harvested from the RF signal;
      power up and operate the ADC and the sensor based on the DC signal;
      generate the sensor data that is based on a sensor voltage of the sensor that corresponds to a condition associated with the user to which the sensor is exposed, wherein the sensor data is output from the ADC based on digital sampling of the sensor voltage of the sensor by the ADC, wherein the ADC is coupled to the sensor via a single line, and wherein the sensor voltage is based on charging of a capacitor of the ADC by a sensor current of the sensor and a digital to analog converter (DAC) output current from the ADC; and
      transmit the sensor data via the RF transmitter to the portable computing device, wherein the portable computing device is configured to provide the sensor data to the data acquisition system.

2. The system of claim 1, further comprising:
another batteryless wireless sensor device including another RF transmitter, another ADC, and another sensor, the another batteryless wireless sensor device configured to:
harvest other energy from the RF signal and generate another DC signal based on the other energy harvested from the RF signal;
power up and operate the another ADC and the another sensor based on the another DC signal;
generate other sensor data that is based on another sensor voltage of the another sensor that corresponds to another condition associated with the user to which the another sensor is exposed, wherein the other sensor data is output from the another ADC based on digital sampling of the another sensor voltage of the another sensor by the another ADC, wherein the another ADC is coupled to the another sensor via another single line, and wherein the another sensor voltage is based on charging of another capacitor of the another ADC by another sensor current of the another sensor and another DAC output current from the another ADC; and
transmit the other sensor data via the another RF transmitter to the portable computing device, wherein the portable computing device is configured to provide the another sensor data to the data acquisition system.

3. The system of claim 1, wherein the portable computing device that is associated with the user is wearable on the user.

4. The system of claim 1, wherein the portable computing device that is associated with the user is a social networking device, a gaming device, a cell phone, a smart phone, a digital assistant, a digital music player, a digital video player, a laptop computer, a handheld computer, a tablet, or a video game controller.

5. The system of claim 1, wherein the batteryless wireless sensor device further comprising:
an RF receiver configured to receive the RF signal; and
a DC rectifier operably coupled to the RF receiver and configured to process the RF signal that is received by the RF receiver to generate the DC signal.

6. The system of claim 1, wherein the batteryless wireless sensor device is configured to transmit the sensor data via the RF transmitter to the computing device via a wireless communication system that includes one or more of a cellular communication system, a Bluetooth communication system, a ZigBee communication system, or a wireless local area network (WLAN).

7. The system of claim 1, wherein the RF signal includes a frequency within a frequency band designated for unlicensed operation by the US Federal Communications Commission (FCC).

8. The system of claim 1, wherein the condition associated with the user corresponds to heart-rate, respiration, blood pressure, movement, or oxygen level.

9. The system of claim 1, wherein the ADC further comprising:
the capacitor operably coupled to the sensor and configured to produce the sensor voltage based on charging by the sensor current and the DAC output current;
a comparator operably coupled and configured to:
receive the sensor voltage via a first input of the comparator;
receive a reference voltage via a second input of the comparator; and
compare the sensor voltage to the reference voltage to generate a comparator output signal;
a digital circuit operably coupled and configured to process the comparator output signal to generate a first digital output signal that is representative of a difference between the sensor voltage and the reference voltage;
memory that stores operational instructions;
one or more processing modules operably coupled to the digital circuit and the memory and configured to execute the operational instructions to process the first digital output signal to generate a second digital output signal that is representative of the difference between the sensor voltage and the reference voltage, wherein the second digital output signal includes a higher resolution than the first digital output signal; and
an N-bit digital to analog converter (DAC) that is operably coupled to the one or more processing modules and configured to generate the DAC output current based on the second digital output signal, wherein N is a positive integer, the DAC output current tracks the sensor current, and the sensor voltage tracks the reference voltage.

10. The system of claim 9, wherein:
the comparator includes a sigma-delta comparator; and
the digital circuit includes a clocked flip flop.

11. The system of claim 9, wherein a digital comparator includes both the comparator and the digital circuit, wherein the digital comparator operably coupled and configured to:
receive the sensor voltage via a first input of the comparator;
receive the reference voltage via a second input of the comparator; and
compare the sensor voltage to the reference voltage to generate the first digital output signal that is representative of the difference between the sensor voltage and the reference voltage.

12. The system of claim 9 further comprising:
a decimation filter coupled to the one or more processing modules and configured to process the second digital output signal to generate another digital output signal having a lower sampling rate and a higher resolution than the second digital output signal.

13. The system of claim 1, wherein the ADC further comprising:
the capacitor operably coupled to the sensor and configured to produce the sensor voltage based on charging by the sensor current and the DAC output current;
an M-bit analog to digital converter (ADC) operably coupled and configured to:
receive the sensor voltage;
receive a reference voltage; and
compare the sensor voltage to the reference voltage and generate a first digital output signal that is representative of a difference between the sensor voltage and the reference voltage;
memory that stores operational instructions;
one or more processing modules operably coupled to the M-bit ADC and the memory and configured to execute the operational instructions to process the first digital output signal to generate a second digital output signal that is representative of the difference between the sensor voltage and the reference voltage, wherein the second digital output signal includes a higher resolution than the first digital output signal; and an N-bit digital to analog converter (DAC) that is operably coupled to the one or more processing modules and operably coupled and configured to generate the DAC output current based on the second digital output signal, the DAC output current tracks the sensor current, and the sensor voltage tracks the reference voltage, wherein:

N is a first positive integer;

M is a second positive integer greater than or equal to 1; and

N is greater than M.

14. The system of claim 13 further comprising:
a decimation filter coupled to the one or more processing modules and configured to process the second digital output signal to generate another digital output signal having a lower sampling rate and a higher resolution than the second digital output signal.

15. A batteryless wireless sensor system, the system comprising:

data acquisition system;

a portable computing device that is associated with a user, wearable on the user, in communication with the data acquisition system, and configured to:
 transmit a radio frequency (RF) signal that includes a frequency within a frequency band designated for unlicensed operation by the US Federal Communications Commission (FCC); and
 receive sensor data; and a batteryless wireless sensor device including an RF transmitter, an analog to digital converter (ADC), and a sensor, the batteryless wireless sensor device configured to:
 harvest energy from the RF signal and generate a DC signal based on the energy harvested from the RF signal;
 power up and operate the ADC and the sensor based on the DC signal;
 generate the sensor data that is based on a sensor voltage of the sensor that corresponds to a condition associated with the user to which the sensor is exposed, wherein the sensor data is output from the ADC based on digital sampling of the sensor voltage of the sensor by the ADC, wherein the ADC is coupled to the sensor via a single line, and wherein the sensor voltage is based on charging of a capacitor of the ADC by a sensor current of the sensor and a digital to analog converter (DAC) output current from the ADC; and
 transmit the sensor data via the RF transmitter to the portable computing device, wherein the portable computing device is configured to provide the sensor data to the data acquisition system.

16. The system of claim 15, wherein the condition associated with the user corresponds to heart-rate, respiration, blood pressure, movement, or oxygen level.

17. The system of claim 15, wherein the ADC further comprising:
the capacitor operably coupled to the sensor and configured to produce the sensor voltage based on charging by the sensor current and the DAC output current;
a comparator operably coupled and configured to:
 receive the sensor voltage via a first input of the comparator;
 receive a reference voltage via a second input of the comparator; and
 compare the sensor voltage to the reference voltage to generate a comparator output signal;
a digital circuit operably coupled and configured to process the comparator output signal to generate a first digital output signal that is representative of a difference between the sensor voltage and the reference voltage;
memory that stores operational instructions;
one or more processing modules operably coupled to the digital circuit and the memory and configured to execute the operational instructions to process the first digital output signal to generate a second digital output signal that is representative of the difference between the sensor voltage and the reference voltage, wherein the second digital output signal includes a higher resolution than the first digital output signal; and
an N-bit digital to analog converter (DAC) that is operably coupled to the one or more processing modules and configured to generate the DAC output current based on the second digital output signal, wherein N is a positive integer, the DAC output current tracks the sensor current, and the sensor voltage tracks the reference voltage.

18. The system of claim 17, wherein:
the comparator includes a sigma-delta comparator; and
the digital circuit includes a clocked flip flop.

19. The system of claim 17, wherein a digital comparator includes both the comparator and the digital circuit, wherein the digital comparator operably coupled and configured to:
receive the sensor voltage via a first input of the comparator;
receive the reference voltage via a second input of the comparator; and
compare the sensor voltage to the reference voltage to generate the first digital output signal that is representative of the difference between the sensor voltage and the reference voltage.

20. The system of claim 17 further comprising:
a decimation filter coupled to the one or more processing modules and configured to process the second digital output signal to generate another digital output signal having a lower sampling rate and a higher resolution than the second digital output signal.

* * * * *